US006831459B2

(12) United States Patent
Szyperski et al.

(10) Patent No.: US 6,831,459 B2
(45) Date of Patent: Dec. 14, 2004

(54) METHOD OF USING G-MATRIX FOURIER TRANSFORMATION NUCLEAR MAGNETIC RESONANCE (GFT NMR) SPECTROSCOPY FOR RAPID CHEMICAL SHIFT ASSIGNMENT AND SECONDARY STRUCTURE DETERMINATION OF PROTEINS

(75) Inventors: Thomas A. Szyperski, Amherst, NY (US); Seho Kim, Highland Park, NJ (US); Hanudatta S. Atreya, Amherst, NY (US)

(73) Assignee: The Research Foundation of State University of New York, Amherst, NY (US)

( * ) Notice: Subject to any disclaimer, the term of this patent is extended or adjusted under 35 U.S.C. 154(b) by 0 days.

(21) Appl. No.: 10/617,482

(22) Filed: Jul. 11, 2003

(65) Prior Publication Data

US 2004/0061497 A1 Apr. 1, 2004

Related U.S. Application Data

(60) Provisional application No. 60/395,591, filed on Jul. 11, 2002, and provisional application No. 60/441,385, filed on Jan. 16, 2003.

(51) Int. Cl.[7] .............................................. G01V 3/00
(52) U.S. Cl. ....................................... 324/309; 324/310
(58) Field of Search ................................ 324/300, 307, 324/309, 310; 600/410

(56) References Cited

U.S. PATENT DOCUMENTS

| | | | | |
|---|---|---|---|---|
| 4,480,228 A | * | 10/1984 | Bottomley ................... | 324/309 |
| 4,506,223 A | * | 3/1985 | Bottomley et al. .......... | 324/309 |
| 4,509,015 A | * | 4/1985 | Ordidge et al. ............. | 324/309 |
| 4,682,106 A | * | 7/1987 | Vatis et al. .................. | 324/307 |
| 4,703,270 A | * | 10/1987 | Hall et al. ................... | 324/309 |
| 5,081,417 A | * | 1/1992 | Bovee et al. ................ | 324/307 |
| 5,657,758 A | * | 8/1997 | Posse et al. ................. | 600/413 |
| 5,709,208 A | * | 1/1998 | Posse et al. ................. | 600/410 |
| 5,879,299 A | * | 3/1999 | Posse et al. ................. | 600/410 |
| 2004/0095140 A1 | * | 5/2004 | Szyperski et al. .......... | 324/318 |

OTHER PUBLICATIONS

Szyperski et al., "Reduced Dimensionality in Triple–Resonance NMR Experiments," *J. Am. Chem. Soc.*, 115:9307–9308 (1993).

Brutscher et al., "Determination of an Initial Set of NOE–Derived Distance Constraints for the Structure Determination of $^{15}N/^{13}C$–Labeled Proteins," *J. Magn. Reson. Ser. B* 109:238–242 (1995).

Szyperski et al., "Useful Information from Axial Peak Magnetization in Projected NMR Experiments," *J. Am. Chem. Soc.*, 118:8146–8147 (1996).

(List continued on next page.)

*Primary Examiner*—Diego Gutierrez
*Assistant Examiner*—Dixomara Vargas
(74) *Attorney, Agent, or Firm*—Nixon Peabody LLP

(57) ABSTRACT

The present invention presents a new approach to rapidly obtaining precise high-dimensional NMR spectral information, named "GFT NMR spectroscopy", which is based on the phase sensitive joint sampling of the indirect dimensions spanning a subspace of a conventional NMR experiment. The phase-sensitive joint sampling of several indirect dimensions of a high-dimensional NMR experiment leads to largely reduced minimum measurement times when compared to FT NMR. This allows one to avoid the "sampling limited" data collection regime. Concomitantly, the analysis of the resulting chemical shift multiplets, which are edited by the G-matrix transformation, yields increased precision for the measurement of the chemical shifts. Additionally, methods of conducting specific GFT NMR experiments as well as methods of conducting a combination of GFT NMR experiments for rapidly obtaining precise chemical shift assignment and determining the structure of proteins or other molecules are disclosed.

56 Claims, 30 Drawing Sheets

OTHER PUBLICATIONS

Lohr, et al., "A New Triple–Resonance Experiment for the Sequential Assignment of Backbone Resonances in Proteins," *J. Biomol. NMR*, 6:189–197 (1995).

Szyperski et al., "Reduced–Dimensionality NMR Spectroscopy for High–Throughput Protein Resonance Assignment," *Proc. Natl. Acad. Sci. USA*, 99:8009–8014 (2002).

Ding et al., "Novel 2D Triple–Resonance NMR Experiments for Sequential Resonance Assignments of Proteins," *J. Magn. Reson.*, 156:262–268 (2002).

Kozminski et al., "Multiple Quadrature Detection in Reduced Dimensionality Experiments," *J. Biomol. NMR*, 26:157–166 (2003).

Kim et al., "GFT NMR, a New Approach to Rapidly Obtain Precise High–Dimensional NMR Spectral Information," *J. Am. Chem. Soc.*, 125:1385–1393 (2003).

* cited by examiner

Figures 5 A-G (A) (5,2)D HACA,CONHN
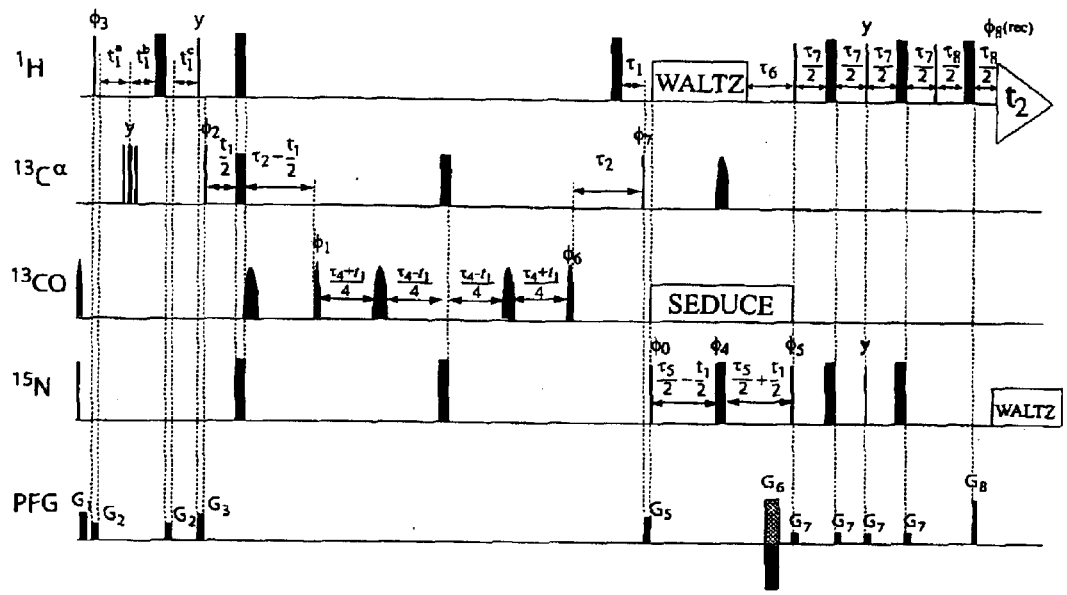
(B) (4,3)D CBCA,CONHN
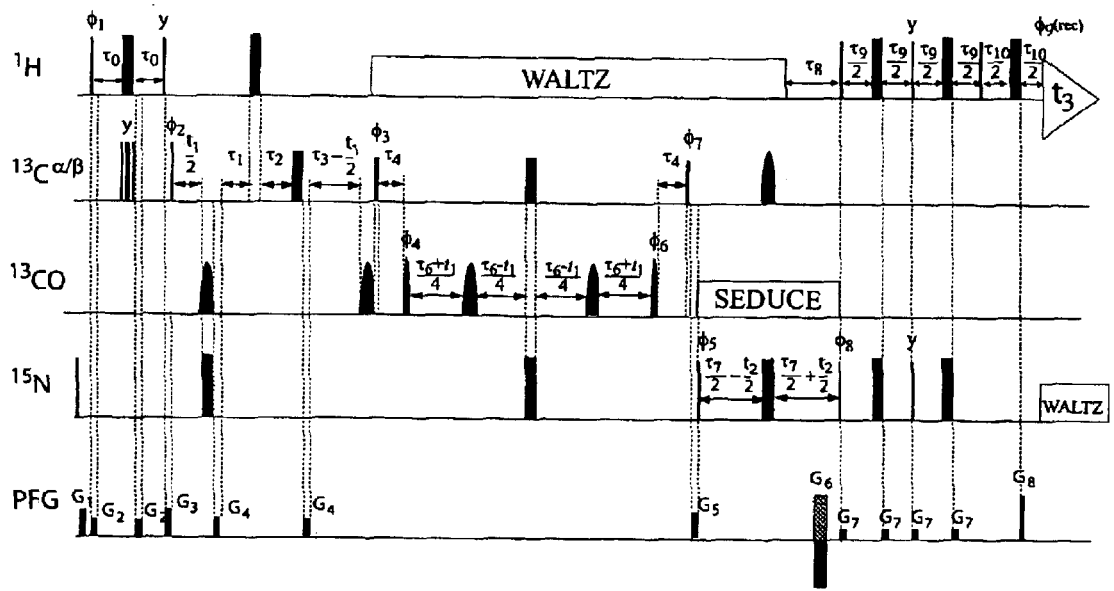
Figures 7 A-B

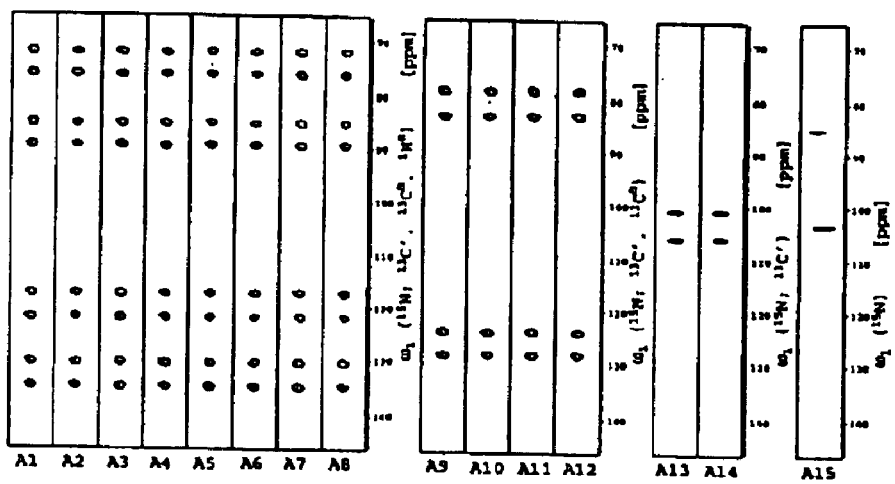
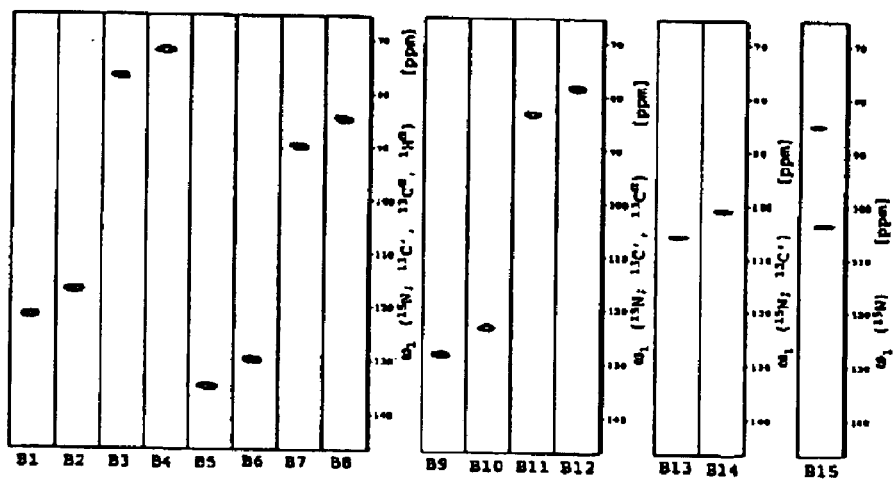
Figures 16 A-B

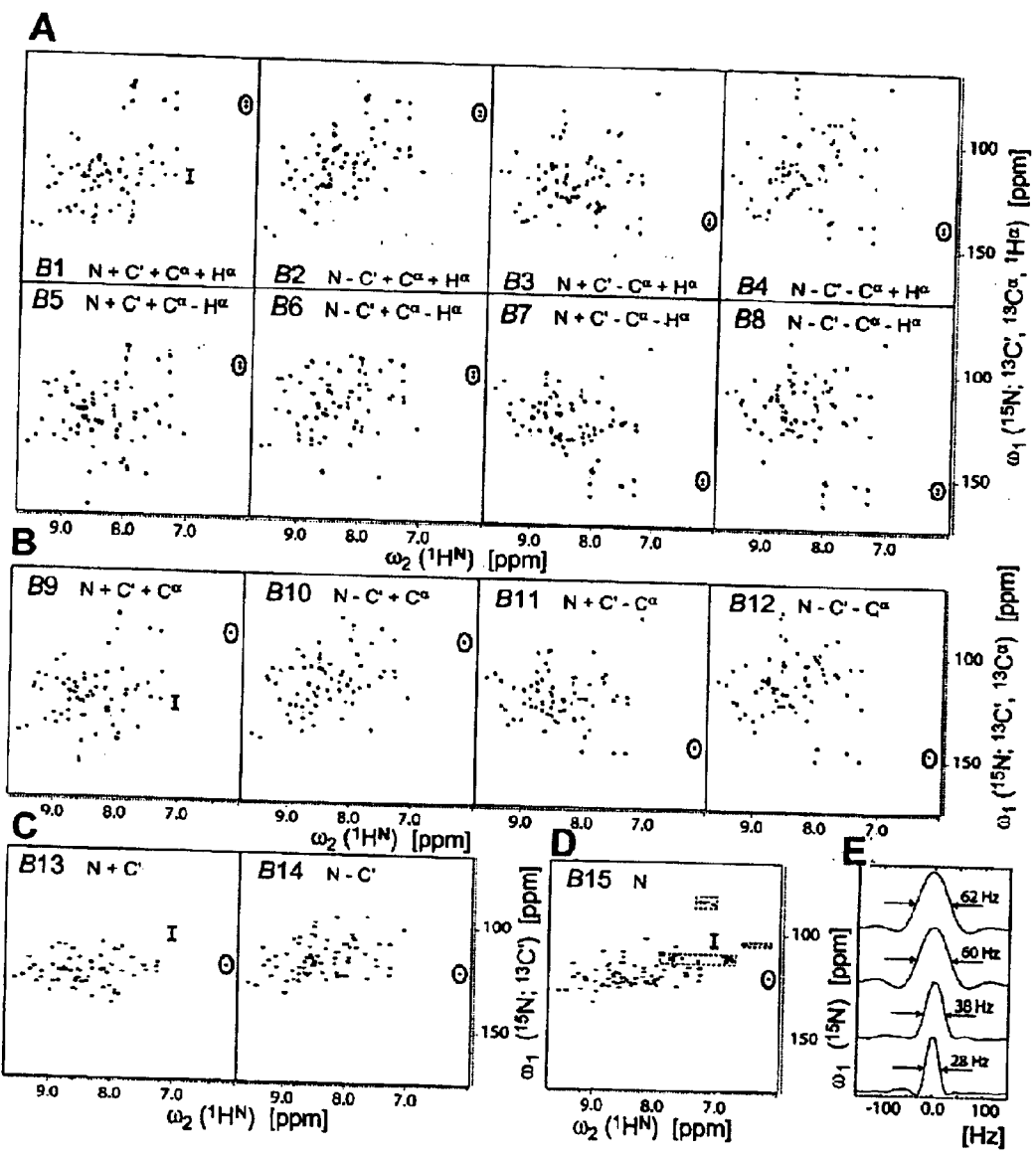
Figures 17 A-E

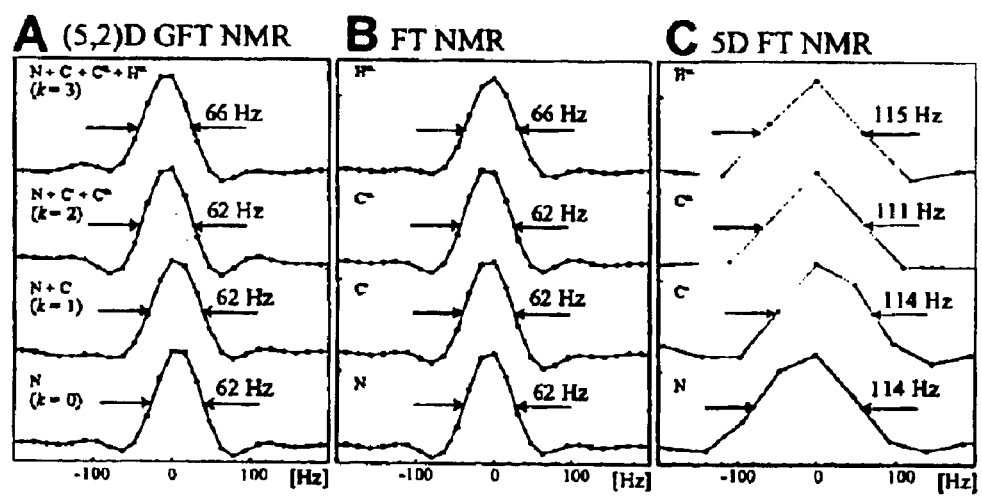
Figures 18 A-C

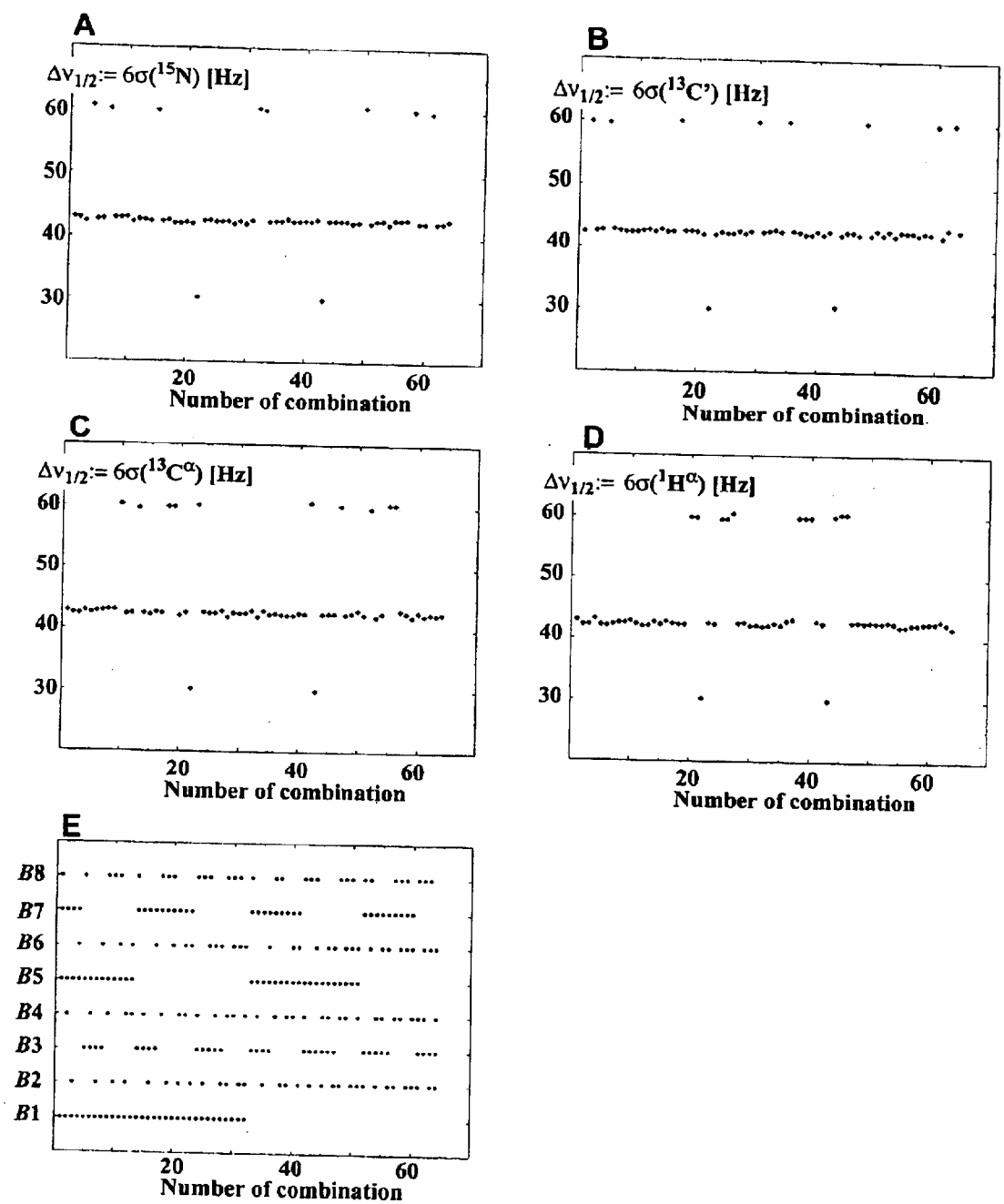
Figures 20 A-E

A  (5,2)D HACA,CONHN
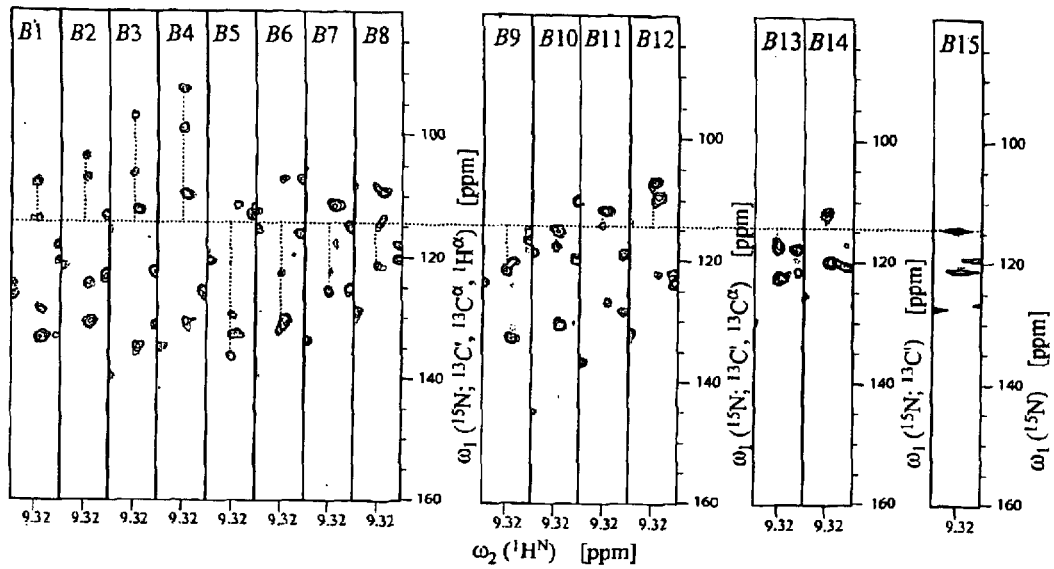
B  (5,2)D HACACONHN
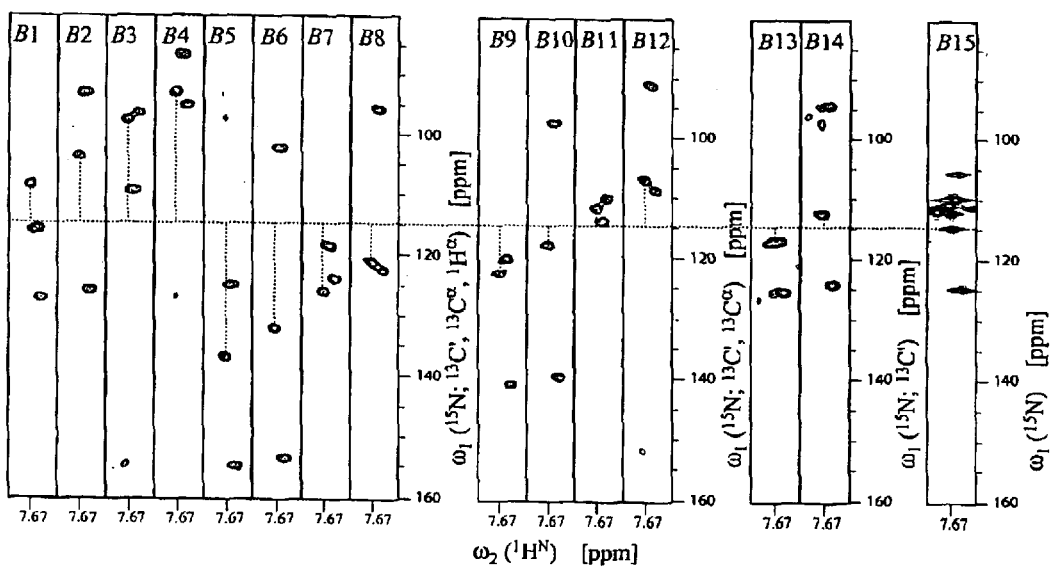
Figures 21 A-B

METHOD OF USING G-MATRIX FOURIER TRANSFORMATION NUCLEAR MAGNETIC RESONANCE (GFT NMR) SPECTROSCOPY FOR RAPID CHEMICAL SHIFT ASSIGNMENT AND SECONDARY STRUCTURE DETERMINATION OF PROTEINS

The present invention claims the benefit of U.S. Provisional Patent Application Serial Nos. 60/395,591, filed Jul. 11, 2002, and 60/441,385, filed Jan. 16, 2003, which are hereby incorporated by reference in their entirety.

This invention arose out of research sponsored by the National Science Foundation (Grant No. MCB 0075773) and National Institutes of Health (Grant No. P50 GM62413-01). The U.S. Government may have certain rights in this invention.

FIELD OF THE INVENTION

The present invention relates to methods of using G-matrix Fourier transformation nuclear magnetic resonance (GFT NMR) spectroscopy for rapidly obtaining and connecting precise chemical shift values and determining the structure of proteins and other molecules.

BACKGROUND OF THE INVENTION

Nuclear magnetic resonance (NMR) (Ernst et al., *Principles of Nuclear Magnetic Resonance in One and Two Dimensions*, Clarendon, Oxford (1987); Wüthrich, *NMR of Proteins and Nucleic Acids*, Wiley, New York (1986); Cavanagh et al., *Protein NMR Spectroscopy*, Academic Press, San Diego (1996))-based structural studies rely on two broad classes of experimental radio-frequency pulse schemes for recording two-dimensional (2D) (Ernst et al., *Principles of Nuclear Magnetic Resonance in One and Two Dimensions*, Clarendon, Oxford (1987)), three-dimensional (3D) (Oschkinat et al., *Nature*, 332:374–376 (1988)), or four-dimensional (4D) (Kay et al., *Science*, 249:411–414 (1990)) Fourier transformation (FT) NMR spectra. Correlation spectroscopy (COSY) delineates exclusively scalar coupling connectivities to measure chemical shifts, and (heteronuclear resolved) $^1$H, $^1$H-nuclear Overhauser enhancement spectroscopy (NOESY) reveals the strength of through-space dipolar couplings of $^1$H spins to estimate distances (Ernst et al., *Principles of Nuclear Magnetic Resonance in One and Two Dimensions*, Clarendon, Oxford (1987); Wüthrich, *NMR of Proteins and Nucleic Acids*, Wiley, New York (1986)). NMR spectra need to exhibit (i) signal-to-noise (S/N) ratios warranting reliable data interpretation, (ii) digital resolutions ensuring adequate precision for the measurement of NMR parameters such as chemical shifts, and (iii) a dimensionality at which a sufficient number of NMR parameters is correlated (Ernst et al., *Principles of Nuclear Magnetic Resonance in One and Two Dimensions*, Clarendon, Oxford (1987); Cavanagh et al., *Protein NMR Spectroscopy*, Academic Press, San Diego (1996)). While increased intensity of NOESY peaks ensures their more accurate integration (which, in turn, may translate into increased accuracy of the NMR structure), the mere identification of COSY peaks suffices to obtain the desired chemical shifts. Hence, COSY peak signal-to noise ratios larger that ~3:1 reflect, in essence, inappropriately long measurement times. Moreover, the total number of peaks in COSY grows only linearly with the number of spins involved and is, for a defined magnetization transfer pathway, "independent" of the dimensionality N. Thus, a minimal "target dimensionality" $N_t$ at which most of the COSY peaks detected for a given molecule are resolved can be defined. Further increased dimensionality does not aim at resolving peak overlap but at increasing the number of correlations obtained in a single data set. This eliminates ambiguities when several multidimensional NMR spectra are combined for resonance assignment, for example, when using $^1$H, $^{13}$C, $^{15}$N triple-resonance NMR to assign protein resonances (Cavanagh et al., *Protein NMR Spectroscopy*, Academic Press, San Diego (1996)).

An increase in dimensionality is, however, limited by the need to independently sample the indirect dimensions, because this leads to longer measurement times. Although the measurement time can be somewhat reduced by aliasing signals (Cavanagh et al., *Protein NMR Spectroscopy*, Academic Press, San Diego (1996)) or accepting a lower digital resolution in the indirect dimensions, high dimensionality often prevents one from tuning the measurement time to a value that ensures to obtain sufficient, but not unnecessarily large S/N ratios.

In view of these considerations, "sampling" and "sensitivity limited" data collection regimes are defined (Szyperski et al., *Proc. Natl. Acad. Sci. USA*, 99:8009–8014 (2002)), depending on whether the sampling of the indirect dimensions or the sensitivity of the FT NMR experiment determines the minimal measurement time. In the sensitivity limited regime, long measurement times are required to achieve sufficient S/N ratios, so that the sampling of indirect dimensions is not necessarily constraining the adjustment of the measurement time. In the sampling limited regime, some or even most of the instrument time is invested for sampling, which yields excessively large S/N ratios. In view of the ever increasing sensitivity of NMR instrumentation, new methodology to avoid the sampling limited regime is needed. (Szyperski et al., *Proc. Natl. Acad. Sci. USA*, 99:8009–8014 (2002)).

In general, phase-sensitive acquisition of an N-dimensional (ND) FT NMR experiment (Ernst et al., *Principles of Nuclear Magnetic Resonance in One and Two Dimensions*, Clarendon, Oxford (1987); Cavanagh et al., *Protein NMR Spectroscopy*, Academic Press, San Diego (1996)) requires sampling of N−1 indirect dimensions with $n_1 \times n_2 \ldots n_{N-1}$ complex points representing $$n_{FID} = 2^{N-1} \cdot \prod_{j=1}^{N-1} n_j$$

free induction decays (FIDs). The resulting steep increase of the minimal measurement time, $T_m$, with dimensionality prevents one from recording five- or higher-dimensional FT NMR spectra: acquiring 16 complex points in each indirect dimension (with one scan per FID each second) yields $T_m(3D)=0.5$ hour, $T_m(4D)=9.1$ hours, $T_m(5D)=12$ days, and $T_m(6D)=1.1$ years.

Thus, higher-dimensional FT NMR spectroscopy suffers from two major drawbacks: (i) The minimal measurement time of an ND FT NMR experiment, which is constrained by the need to sample N−1 indirect dimensions, may exceed by far the measurement time required to achieve sufficient signal-to-noise ratios. (ii) The low resolution in the indirect dimensions severely limits the precision of the indirect chemical shift measurements.

The present invention is directed to overcoming the deficiencies in the art.

SUMMARY OF THE INVENTION

The present invention relates to a method of conducting a (N,N−K) dimensional (D) G-matrix Fourier transformation (GFT) nuclear magnetic resonance (NMR) experiment, where N is the dimensionality of an N-dimensional (ND) Fourier transformation (FT) NMR experiment and K is the desired reduction in dimensionality relative to N. The method involves providing a sample and applying radiofrequency pulses for the ND FT NMR experiment to the sample. Then, m indirect chemical shift evolution periods of the ND FT NMR experiment are selected, where m equals K+1, and the m indirect chemical shift evolution periods are jointly sampled. Next, NMR signals detected in a direct dimension are independently cosine and sine modulated to generate (N–K)D basic NMR spectra containing frequency domain signals with $2^K$ chemical shift multiplet components, thereby enabling phase-sensitive sampling of all jointly sampled m indirect chemical shift evolution periods. Finally, the (N–K) D basic NMR spectra are transformed into (N–K) D phase-sensitively edited basic NMR spectra, where the $2^K$ chemical shift multiplet components of the (N–K) D basic NMR spectra are edited to yield (N–K) D phase-sensitively edited basic NMR spectra having individual chemical shift multiplet components.

Another aspect of the present invention relates to a method for sequentially assigning chemical shift values of an α-proton, $^1H^\alpha$, an α-carbon, $^{13}C^\alpha$, a polypeptide backbone carbonyl carbon, $^{13}C'$, a polypeptide backbone amide nitrogen, $^{15}N$, and a polypeptide backbone amide proton, $^1H^N$, of a protein molecule. The method involves providing a protein sample and conducting a set of G matrix Fourier transformation (GFT) nuclear magnetic resonance (NMR) experiments on the protein sample including: (1) a (5,2)D [HACACONHN] GFT NMR experiment to measure and connect the chemical shift values of the α-proton of amino acid residue i–1, $^1H^\alpha_{i-1}$, the α-carbon of amino acid residue i–1, $^{13}C^\alpha_{i-1}$, the polypeptide backbone carbonyl carbon of amino acid residue i–1, $^{13}C'_{i-1}$, the polypeptide backbone amide nitrogen of amino acid residue i, $^{15}N_i$, and the polypeptide backbone amide proton of amino acid residue i, $^1H^N_i$ and (2) a (5,2)D [HACA,CONHN] GFT NMR experiment to measure and connect the chemical shift values of $^1H^\alpha_{i-1}$, $^{13}C^\alpha_{i-1}$, $^{13}C'_{i-1}$, the polypeptide backbone amide nitrogen of amino acid residue i–1, $^{15}N_{i-1}$, and the polypeptide backbone amide proton of amino acid residue i–1, $^1H^N_{i-1}$. Then, sequential assignments of the chemical shift values of $^1H^\alpha$, $^{13}C^\alpha$, $^{13}C'$, $^{15}N$, and $^1H^N$ are obtained by (i) matching the chemical shift values of $^1H^\alpha_{i-1}$, $^{13}C^\alpha_{i-1}$, and $^{13}C'_{i-1}$ measured by the (5,2)D [HACACONHN] GFT NMR experiment with the chemical shift values of $^1H^\alpha_{i-1}$, $^{13}C^\alpha_{i-1}$, and $^{13}C'_{i-1}$ measured by the (5,2)D [HACA,CONHN] GFT NMR experiment, (ii) using the chemical shift values of $^1H^\alpha_{i-1}$, $^{13}C^\alpha_{i-1}$, and $^{13}C'_{i-1}$ to identify the type of amino acid residue i–1, and (iii) mapping sets of sequentially connected chemical shift values to the amino acid sequence of the polypeptide chain and using the chemical shift values to locate secondary structure elements within the polypeptide chain.

Yet another aspect of the present invention relates to a method for sequentially assigning chemical shift values of an α-proton, $^1H^\alpha$, an α-carbon, $^{13}C^\alpha$, a polypeptide backbone carbonyl carbon, $^{13}C'$, a polypeptide backbone amide nitrogen, $^{15}N$, and a polypeptide backbone amide proton, $^1H^N$, of a protein molecule. The method involves providing a protein sample and conducting a set of G matrix Fourier transformation (GFT) nuclear magnetic resonance (NMR) experiments on the protein sample including: (1) a (5,3)D [HACACONHN] GFT NMR experiment to measure and connect the chemical shift values of the α-proton of amino acid residue i–1, $^1H^\alpha_{i-1}$, the α-carbon of amino acid residue i–1, $^{13}C^\alpha_{i-1}$, the polypeptide backbone carbonyl carbon of amino acid residue i–1, $^{13}C'_{i-1}$, the polypeptide backbone amide nitrogen of amino acid residue i, $^{15}N_i$, and the polypeptide backbone amide proton of amino acid residue i, $^1H^N_i$ and (2) a (5,3)D [HACA,CONHN] GFT NMR experiment to measure and connect the chemical shift values of $^1H^\alpha_{i-1}$, $^{13}C^\alpha_{i-1}$, $^{13}C'_{i-1}$, the polypeptide backbone amide nitrogen of amino acid residue i–1, $^{15}N_{i-1}$, and the polypeptide backbone amide proton of amino acid residue i–1, $^1H^N_{i-1}$. Then, sequential assignments of the chemical shift values of $^1H^\alpha$, $^{13}C^\alpha$, $^{13}C'$, $^{15}N$, and $^1H^N$ are obtained by (i) matching the chemical shift values of $^1H^\alpha_{i-1}$, $^{13}C^\alpha_{i-1}$, and $^{13}C'_{i-1}$ measured by the (5,3)D [HACACONHN] GFT NMR experiment with the chemical shift values of $^1H^\alpha_{i-1}$, $^{13}C^\alpha_{i-1}$, and $^{13}C'_{i-1}$ measured by the (5,3)D [HACA,CONHN] GFT NMR experiment, (ii) using the chemical shift values of $^1H^\alpha_{i-1}$, $^{13}C^\alpha_{i-1}$, and $^{13}C'_{i-1}$ to identify the type of amino acid residue i–1, and (iii) mapping sets of sequentially connected chemical shift values to the amino acid sequence of the polypeptide chain and using the chemical shift values to locate secondary structure elements within the polypeptide chain.

A further aspect of the present invention relates to a method for sequentially assigning chemical shift values of α- and β-carbons, $^{13}C^{\alpha/\beta}$, a polypeptide backbone carbonyl carbon, $^{13}C'$, a polypeptide backbone amide nitrogen, $^{15}N$, and a polypeptide backbone amide proton, $^1H^N$, of a protein molecule. The method involves providing a protein sample and conducting a set of G matrix Fourier transformation (GFT) nuclear magnetic resonance (NMR) experiments on the protein sample including: (1) a (4,3)D [CBCACONHN] GFT NMR experiment to measure and connect the chemical shift values of the α- and β-carbons of amino acid residue i–1, $^{13}C^{\alpha/\beta}_{i-1}$, the polypeptide backbone carbonyl carbon of amino acid residue i–1, $^{13}C'_{i-1}$, the polypeptide backbone amide nitrogen of amino acid residue i, $^{15}N_i$, and the polypeptide backbone amide proton of amino acid residue i, $^1H^N_i$ and (2) a (4,3)D [CBCA,CONHN] GFT NMR experiment to measure and connect the chemical shift values of $^{13}C^{\alpha/\beta}_{i-1}$, $^{13}C'_{i-1}$, the polypeptide backbone amide nitrogen of amino acid residue i–1, $^{15}N_{i-1}$, and the polypeptide backbone amide proton of amino acid residue i–1, $^1H^N_{i-1}$. Then, sequential assignments of the chemical shift values of $^{13}C^{\alpha/\beta}$, $^{13}C'$, $^{15}N$, and $^1H^N$ are obtained by (i) matching the chemical shift values of $^{13}C^{\alpha/\beta}_{i-1}$ and $^{13}C'_{i-1}$ measured by the (4,3)D [CBCACONHN] GFT NMR experiment with the chemical shift values of $^{13}C^{\alpha/\beta}_{i-1}$ and $^{13}C'_{i-1}$ measured by the (4,3)D [CBCA,CONHN] GFT NMR experiment, (ii) using the chemical shift values of $^{13}C^{\alpha/\beta}_{i-1}$, and $^{13}C'_{i-1}$ to identify the type of amino acid residue i–1, and (iii) mapping sets of sequentially connected chemical shift values to the amino acid sequence of the polypeptide chain and using the chemical shift values to locate secondary structure elements within the polypeptide chain.

The present invention also relates to a method for sequentially assigning chemical shift values of α- and β-carbons, $^{13}C^{\alpha/\beta}$, a polypeptide backbone amide nitrogen, $^{15}N$, and a polypeptide backbone amide proton, $^1H^N$, of a protein molecule. The method involves providing a protein sample and conducting a set of G matrix Fourier transformation (GFT) nuclear magnetic resonance (NMR) experiments on the protein sample including: (1) a (4,3)D [HNNCACBCA] GFT NMR experiment to measure and connect the chemical shift values of the α- and β-carbons of amino acid residue i–1, $^{13}C^{\alpha/\beta}_{i-1}$, the α-carbon of amino acid residue i–1, $^{13}C^\alpha_{i-1}$, the polypeptide backbone amide nitrogen of amino acid residue i–1, $^{15}N_{i-1}$, and the polypeptide backbone amide proton of amino acid residue i–1, $^1H^N_{i-1}$ and (2) a GFT NMR experiment selected from the group consisting of a (4,3)D [HNN(CO)CACBCA] GFT NMR experiment, a (4,3)D [CBCACA(CO)NHN] GFT NMR experiment, and a (5,3)D [HBHACBCACA(CO)NHN] GFT NMR experiment to measure and connect the chemical shift values of $^{13}C^{\alpha/\beta}_{i-1}$, $^{13}C^{\alpha}_{i-1}$, the polypeptide backbone amide nitrogen of amino acid residue i, $^{15}N_i$, and the polypeptide backbone amide proton of amino acid residue i, $^1H^N_i$. Then, sequential assignments of the chemical shift values of $^{13}C^{\alpha/\beta}$, $^{15}N$, and $^1H^N$ are obtained by (i) matching the chemical shift values of $^{13}C^{\alpha/\beta}_{i-1}$ measured by the GFT NMR experiment selected from the group consisting of a (4,3)D [HNN(CO)CACBCA] GFT NMR experiment, a (4,3)D [CBCACA(CO)NHN] GFT NMR experiment, and a (5,3)D [HBHACBCACA(CO)NHN] GFT NMR experiment with the chemical shift values of $^{13}C^{\alpha/\beta}_{i-1}$ measured by the (4,3)D [HNNCACBCA] GFT NMR experiment, (ii) using the chemical shift values of $^{13}C^{\alpha/\beta}_{i-1}$ to identify the type of amino acid residue i–1, and (iii) mapping sets of sequentially connected chemical shift values to the amino acid sequence of the polypeptide chain and using the chemical shift values to locate secondary structure elements within the polypeptide chain.

Another aspect of the present invention relates to a method for assigning chemical shift values of γ-, δ-, and ε-aliphatic sidechain protons, $^1H^{\gamma/\delta/\epsilon}$, and chemical shift values of γ-, δ-, and ε-aliphatic sidechain carbons located peripheral to β-carbons, $^{13}C^{\gamma/\delta/\epsilon}$, of a protein molecule. The method involves providing a protein sample and conducting a set of G matrix Fourier transformation (GFT) nuclear magnetic resonance (NMR) experiments on the protein sample including: (1) a (5,3)D [HCC,CH-COSY] GFT NMR experiment to measure and connect the chemical shift values of a proton of amino acid residue i–1, $^1H_{i-1}$, a carbon of amino acid residue i–1 coupled to $^1H_{i-1}$, $^{13}C_{i-1}$, a carbon coupled to $^{13}C_{i-1}$, $^{13}C_{i-1}^{coupled}$, and a proton coupled to $^{13}C_{i-1}^{coupled}$, $^1H_{i-1}^{coupled}$, and (2) a (5,3)D [HBHACBCACA(CO)NHN] GFT NMR experiment to measure and connect the chemical shift values of α- and β-protons of amino acid residue i–1, $^1H^{\alpha/\beta}_{i-1}$, and α- and β-carbons of amino acid residue i–1, $^{13}C^{\alpha/\beta}_{i-1}$. Then, assignments of the chemical shift values of $^1H^{\gamma/\delta/\epsilon}$ and $^{13}C^{\gamma/\delta/\epsilon}$ are obtained by (i) identifying $^1H_{i-1}$, $^{13}C_{i-1}$, $^{13}C_{i-1}^{coupled}$, and $^1H_{i-1}^{coupled}$ measured by the (5,3)D [HCC,CH-COSY] GFT NMR experiment as $^1H^{\alpha}_{i-1}$, $^{13}C^{\alpha}_{i-1}$, $^{13}C^{\beta}_{i-1}$, and $^1H^{\beta}_{i-1}$, respectively, and thereby matching the chemical shift values of $^1H^{\alpha/\beta}_{i-1}$ and $^{13}C^{\alpha/\beta}_{i-1}$ with the chemical shift values of $^1H^{\alpha/\beta}_{i-1}$ and $^{13}C^{\alpha/\beta}_{i-1}$ measured by the (5,3)D HBHACBCACA(CO)NHN] GFT NMR experiment, and (ii) using the chemical shift values of $^1H^{\alpha/\beta}_{i-1}$ and $^{13}C^{\alpha/\beta}_{i-1}$ in conjunction with other chemical shift connections from the (5,3)D [HCC,CH-COSY] GFT NMR experiment to measure the chemical shift values of $^1H^{\gamma/\delta/\epsilon}_{i-1}$ and $^{13}C^{\gamma/\delta/\epsilon}_{i-1}$.

Yet another aspect of the present invention relates to a method for assigning chemical shift values of γ-, δ-, and ε-aliphatic sidechain protons, $^1H^{\gamma/\delta/\epsilon}$, and chemical shift values of γ-, δ-, and ε-aliphatic sidechain carbons located peripheral to β-carbons, $^{13}C^{\gamma/\delta/\epsilon}$, of a protein molecule. The method involves providing a protein sample and conducting a set of G matrix Fourier transformation (GFT) nuclear magnetic resonance (NMR) experiments on the protein sample including: (1) a (4,2)D [HCCH-COSY] GFT NMR experiment to measure and connect the chemical shift values of a proton of amino acid residue i–1, $^1H_{i-1}$, a carbon of amino acid residue i–1 coupled to $^1H_{i-1}$, $^{13}C_{i-1}$, a carbon coupled to $^{13}C_{i-1}$, $^{13}C_{i-1}^{coupled}$, and a proton coupled to $^{13}C_{i-1}^{coupled}$, $^1H_{i-1}^{coupled}$, and (2) a (5,3)D [HBHACBCACA(CO)NHN] GFT NMR experiment to measure and connect the chemical shift values of α- and β-protons of amino acid residue i–1, $^1H^{\alpha/\beta}_{i-1}$, and α- and β-carbons of amino acid residue i–1, $^{13}C^{\alpha/\beta}_{i-1}$. Then, assignments of the chemical shift values of $^1H^{\gamma/\delta/\epsilon}$ and $^{13}C^{\gamma/\delta/\epsilon}$ are obtained by (i) identifying $^1H_{i-1}$, $^{13}C_{i-1}$, $^{13}C_{i-1}^{coupled}$, and $^1H_{i-1}^{coupled}$ measured by the (4,2)D [HCCH-COSY] GFT NMR experiment as $^1H^{\alpha}_{i-1}$, $^{13}C^{\alpha}_{i-1}$, $^{13}C^{\beta}_{i-1}$, and $^1H^{\beta}_{i-1}$ respectively, and thereby matching the chemical shift values of $^1H^{\alpha/\beta}_{i-1}$ and $^{13}C^{\alpha/\beta}_{i-1}$ with the chemical shift values of $^1H^{\alpha/\beta}_{i-1}$ and $^{13}C^{\alpha/\beta}_{i-1}$ measured by the (5,3)D HBHACBCACA(CO)NHN] GFT NMR experiment, and (ii) using the chemical shift values of $^1H^{\alpha/\beta}_{i-1}$ and $^{13}C^{\alpha/\beta}_{i-1}$ in conjunction with other chemical shift connections from the (4,2)D [HCCH-COSY] GFT NMR experiment to measure the chemical shift values of $^1H^{\gamma/\delta/\epsilon}_{i-1}$ and $3C^{\gamma/\delta/\epsilon}_{i-1}$.

A further aspect of the present invention relates to a method for assigning chemical shift values of a γ-carbon, $^{13}C^\gamma$, a δ-carbon, $^{13}C^\delta$, and a δ-proton, $^1H^\delta$, of an amino acid residue containing an aromatic spin system in a protein molecule. The method involves providing a protein sample and conducting a set of G matrix Fourier transformation (GFT) nuclear magnetic resonance (NMR) experiments on the protein sample including: (1) a (5,3)D [HBCBCG CDHD] GFT NMR experiment to measure and connect the chemical shift values of a β-proton of amino acid residue i–1, $^1H^\beta_{i-1}$, a β-carbon of amino acid residue i–1, $^{13}C^\beta_{i-1}$, a γ-carbon of amino acid residue i–1, $^{13}C^\gamma_{i-1}$, a δ-carbon of amino acid residue i–1, $^{13}C^\delta_{i-1}$, and a δ-proton of amino acid residue i–1, $^1H^\delta_{i-1}$, and (2) a (5,3)D [HBHACBCACA(CO)NHN] GFT NMR experiment to measure and connect the chemical shift values of $^1H^\beta_{i-1}$ and $^{13}C^\beta_{i-1}$. Then, assignments of the chemical shift values of $^{13}C^\gamma$, $^{13}C^\delta$, and $^1H^\delta$ are obtained by (i) matching the chemical shift values of $^1H^\beta_{i-1}$ and $^{13}C^\beta_{i-1}$ measured by the (5,3)D HBCBCACA(CO)NHN GFT NMR experiment with the chemical shift values of $^1H^\beta_{i-1}$ and $^{13}C^\beta_{i-1}$, measured by the (5,3)D [HBCBCGCDHD] GFT NMR experiment, and (ii) using the chemical shift values of $^{13}C^\gamma$, $^{13}C^\delta$, and $^1H^\delta$ to identify the type of amino acid residue containing the aromatic spin system.

The present invention also relates to a method for assigning chemical shift values of aliphatic and aromatic protons and aliphatic and aromatic carbons of an amino acid residue containing aliphatic and aromatic spin systems in a protein molecule. The method involves providing a protein sample and conducting a set of G matrix Fourier transformation (GFT) nuclear magnetic resonance (NMR) experiments on the protein sample including: (1) a first GFT NMR experiment, which is selected from the group consisting of a (5,3)D [HCC,CH-COSY] GFT NMR experiment, a (4,2)D [HCCH-COSY] GFT NMR experiment, a (5,2)D [HCCCH-COSY] GFT NMR experiment, and a (5,3)D [HCCCH-COSY] GFT NMR experiment and is acquired for the aliphatic spin system, to measure and connect the chemical shift values of α- and β-protons of amino acid residue i, $^1H^{\alpha/\beta}_i$, α- and β-carbons of amino acid residue i, $^{13}C^{\alpha/\beta}_i$, a δ-carbon of amino acid residue i, $^{13}C^\gamma_i$, and (2) a second GFT NMR experiment, which is selected from the group consisting of a (5,3)D [HCC,CH-COSY] GFT NMR experiment, a (4,2)D [HCCH-COSY] GFT NMR experiment, a (5,2)D [HCCCH-COSY] GFT NMR experiment, and a (5,3)D [HCCCH-COSY] GFT NMR experiment and is acquired for the aromatic spin system, to measure and connect the chemical shift values of $^{13}C^\gamma_i$ and other aromatic protons and carbons of amino acid residue i. Then, assignments of the chemical shift values of the aliphatic and aromatic protons and aliphatic and aromatic carbons are obtained by matching the chemical shift value of $^{13}C^\gamma_i$ measured by the first GFT NMR experiment with the chemical shift value of $^{13}C^\gamma_i$ measured by the second GFT NMR experiment.

Another aspect of the present invention relates to a method for obtaining assignments of chemical shift values of $^1H$, $^{13}C$, and $^{15}N$ of a protein molecule. The method involves providing a protein sample and conducting five G matrix Fourier transformation (GFT) nuclear magnetic resonance (NMR) experiments on the protein sample, where (1) a first experiment is a (4,3)D [HNNCACBCA] GFT NMR experiment for obtaining intraresidue correlations of chemical shift values; (2) a second experiment is a (5,3)D [HBHACBCACA(CO)NHN] GFT NMR experiment for obtaining interresidue correlations of chemical shift values; (3) a third experiment is a (5,3)D [HCC,CH-COSY] GFT NMR experiment for obtaining assignments of aliphatic sidechain chemical shift values; (4) a fourth experiment is a (5,3)D [HBCBCGCDHD] GFT NMR experiment for linking chemical shift values of aliphatic protons, $^1H^\beta$ and $^{13}C^\beta$, and aromatic protons, $^{13}C^\delta$ and $^1H^\delta$; and (5) a fifth experiment is a (4,2)D [HCCH-COSY] GFT NMR experiment for obtaining assignments of aromatic sidechain chemical shift values.

The present invention discloses a number of specific GFT NMR experiments and different combinations of those experiments which allows one to obtain sequential backbone chemical shift assignments for determining the secondary structure of a protein molecule and complete assignments of chemical shift values for a protein molecule including aliphatic and aromatic sidechain spin systems.

The present invention provides a generally applicable approach for NMR data acquisition and processing named "GFT NMR spectroscopy". This approach is based on the phase-sensitive joint sampling of several indirect dimensions while ensuring that all chemical shift correlations are retained. The employment of GFT NMR focuses on the sampling limited data collection regime and, considering that NMR measurements longer than about a week are impracticable, on the acquisition of five- or higher-dimensional spectral information.

GFT NMR relaxes on constraints arising from two major drawbacks of FT NMR, that is, the problem of having excessive or prohibitively long measurement times due to sampling of indirect dimensions and the limited precision of chemical shift measurements in the indirect dimensions arising from comparably low digital resolution. Within a few hours or less, GFT NMR spectroscopy affords the correlations of even five- or higher-dimensional FT NMR spectra acquired with high digital resolution. Thus, GFT NMR spectroscopy allows one to tune measurement times to sensitivity requirements without compromising on the dimensionality or the digital resolution. High-throughput efforts such as NMR-based structural genomics (Montelione et al., *Nat. Struct. Biol.*, 7:982–984 (2000), which is hereby incorporated by reference in its entirety) will profit from this feature, because automated resonance assignment (Szyperski et al., *J. Biomol. NMR*, 11:387–405 (1998); Moseley et al, *Curr. Opin. Struct. Biol.*, 9:635–642 (1999); Moseley et al., *Methods Enzymol.*, 339:91–108 (2001), which are hereby incorporated by reference in their entirety) benefits from maximizing the number of correlations obtained from in a single NMR experiment. Moreover, the rapid sampling realized with GFT NMR spectroscopy will allow researchers to obtain highest dimensional NMR information with exceptional time resolution when, for example, studying slow protein folding in real time (Dyson et al., *Annu. Rev. Phys. Chem.*, 47:369–395 (1996), which is hereby incorporated by reference in its entirety). The high precision of the chemical shift measurements is of potential importance for a broad range of NMR applications in natural sciences and engineering, for example, for automated assignment, or when studying systems with high chemical shift degeneracy such as RNA ribose spin systems (Cromsigt et al., *Methods Enzymol.*, 338:371–399 (2001), which is hereby incorporated by reference in its entirety), (partially) unfolded proteins (Neri et al., *FEBS Lett.*, 303:129–135 (1992), which is hereby incorporated by reference in it its entirety), or lipids (Wang et al., *Biochemistry*, 41:5453–5461 (2002), which is hereby incorporated by reference in its entirety). Finally, the high precision of the shift measurements may be recruited to accurately measure other NMR parameters such as residual dipolar couplings for structural refinement (Tjandra et al., *Science*, 278:1111–1114 (1997); Prestegard, *Nat. Struct. Biol.*, 5:517–522 (1998), which are hereby incorporated by reference in their entirety), and transverse relaxation optimized (Pervushin et al., *Proc. Natl. Acad. Sci. USA*, 94:12366–12371 (1997), which is hereby incorporated by reference in its entirety) GFT NMR may develop into a powerful approach to investigate larger systems.

In the sensitivity limited regime, GFT NMR may be advantageous in cases where an extended radiofrequency (rf) phase cycle is desirable for spectral editing and/or improved artifact suppression (Cavanagh et al., *Protein NMR Spectroscopy*, Academic Press, San Diego (1996), which is hereby incorporated by reference in its entirety).

BRIEF DESCRIPTION OF THE DRAWINGS

FIG. 2A shows the basic spectra yielding the following linear combinations: B1 [$\Omega_0$+$\Omega_1$+$\Omega_2$+$\Omega_3$]=A1+A2+A3+A4+A5+A6+A7+A8; B2 [$\Omega_0$+$\Omega_1$+$\Omega_2$+$\Omega_3$]=A1+A2+A3+A4+A5+A6+A7+A8; B3 [$\Omega_0$+$\Omega_1$+$\Omega_2$+$\Omega_3$]=A1+A2+A3+A4+A5+A6+A7+A8; B4 [$\Omega_0$+$\Omega_1$+$\Omega_2$+$\Omega_3$]=A1+A2+A3+A4+A5+A6+A7+A8; B5 [$\Omega_0$+$\Omega_1$+$\Omega_2$+$\Omega_3$]=A1+A2+A3+A4+A5+A6+A7+A8; B6 [$\Omega_0$+$\Omega_1$+$\Omega_2$+$\Omega_3$]=A1+A2+A3+A4+A5+A6+A7+A8; B7 [$\Omega_0$+$\Omega_1$+$\Omega_2$+$\Omega_3$]=A1+A2+A3+A4+A5+A6+A7+A8; B8 [$\Omega_0$+$\Omega_1$+$\Omega_2$+$\Omega_3$]=A1+A2+A3+A4+A5+A6+A7+A8. FIG. 2B shows the first order central peak spectra: B9 [$\Omega_0$+$\Omega_1$+$\Omega_2$]=A9+A10+A11+A12; B10 [$\Omega_0$-$\Omega_1$+$\Omega_2$]=A9-A10+A11-A12; B11 [$\Omega_0$+$\Omega_1$-$\Omega_2$]=A9+A10-A11-A12; B12 [$\Omega_0$-$\Omega_1$-$\Omega_2$]=A9-A10-A11+A12. FIG. 2C shows the second order centralpeak spectra: B13 [$\Omega_0$+$\Omega_1$]=A13+A14; B14 [$\Omega_0$-$\Omega_1$]=A13-A14. FIG. 2D shows the third order central peak spectra: B15=A15. For the calculation of the matrices F(K), see Example 1. To facilitate the comparison of the left and the right section the positions of multiplet components are indicated with thin lines.

FIG. 3A shows that two spin systems exhibiting degenerate chemical shifts in all other conventionally sampled $N_t$-1 dimensions give rise to basic, first order central and second order central peaks shown in bold (spin system 1) and lighter shade (spin system 2), respectively. Knowledge of the position of the second order central peak of spin system 1 allows identification of the corresponding first order central peaks of spin system 1. In turn, their knowledge allows unambiguous identification of the corresponding peaks of spin system 1 in the basic spectra. As indicated by the dashed line on the left in FIG. 3A, the peaks in B1 and B3 (shown in bold) are centered around the peak in B5 (shown in bold), while, as indicated by the dashed line on the right in FIG. 3A, the peaks in B2 and B4 (shown in bold) are centered around the peak in B5 (shown in bold). This strategy can readily be extended for K>2. In practice, the identification of components belonging to a given shift multiplets is greatly facilitated by inspection of peak intensities: the components forming a given multiplet are expected to exhibit (nearly) the same intensity. To illustrate this point, the resonance lines of spin system 2 were assumed to be more intense than those of spin system 1. FIG. 3B shows that, in addition to chemical shift degeneracy in the conventionally sampled $N_t$-1 dimensions, the central peaks of spin system 1 (as described in FIG. 3A) and those of spin system 3 (peaks shown in lighter shade) overlap. In this case, the two spin systems exhibit degenerate chemical shifts in all but one dimension of an ND FT NMR spectrum. In (N,$N_t$)D GFT NMR, the bottom-up identification of multiplet components resolves and groups the signals of the two spin systems in the basic spectra, thus yielding the equivalent of the ND chemical shift correlation.

In FIG. 4B, the chemical shifts of nitrogen spins shown in circles are measured is a separate dimension.

FIGS. 7A–B depict the experimental scheme for the (5,2)D HACA,CONHN (FIG. 7A) and (4,3)D CBCA,CO NHN GFT NMR (FIG. 7B) experiments. Rectangular 90° and 180° pulses are indicated by filled and open vertical bars or shaped pulses, respectively, and phases are indicated above the pulses. Where no radio-frequency (rf) phase is marked, the pulse is applied along x. The high power 90° pulse lengths were: 5.8 μs for $^1H$ and 15.4 μs for $^{13}C$, and 38 μs for $^{15}N$. In FIG. 7A, pulses on $^{13}C$ prior to $t_1(^{13}C)$ are applied at high power, and $^{13}C$ decoupling during $t_1(^1H)$ is achieved using a ($90_x$-$180_y$-$90_x$) composite pulse (Cavanagh et al., *Protein NMR spectroscopy*, Wiley, New York (1996), which is hereby incorporated by reference in its entirety). Subsequently, the 90° and 180° pulse lengths of $^{13}C^\alpha$ are adjusted to 51.5 μs and 46 μs, respectively, to minimize perturbation of the $^{13}CO$ spins. The width of the 90° pulses applied to $^{13}CO$ pulse is 52 μs and the corresponding 180° pulses are applied with same power. A SEDUCE (Cavanagh et al., *Protein NMR spectroscopy*, Wiley, New York (1996), which is hereby incorporated by reference in its entirety) 180° pulse with a length 252 μs is used to decouple $^{13}CO$ during $t_1(^{13}C^\alpha)$. WALTZ16 (Cavanagh et al., *Protein NMR spectroscopy*, Wiley, New York (1996), which is hereby incorporated by reference in its entirety) is employed to decouple $^1H$ (rf field strength=9.2 kHz) during the heteronuclear magnetization transfers as well as to decouple $^{15}N$ (rf=1.78 kHz) during acquisition. The SEDUCE sequence (rf=1.0 kHz) is used for decoupling of $^{13}C^\alpha$ during the $^{15}N$ chemical shift evolution period. The $^1H$ rf carrier is placed at 4.78 ppm. The $^{13}C^\alpha$ and $^{15}N$ rf carriers are set to 56.3 ppm and 119.3 ppm, respectively. All $^{13}C'$ pulses are laminar shifted (Cavanagh et al., *Protein NMR spectroscopy*, Wiley, New York (1996), which is hereby incorporated by reference in its entirety) by 118 ppm relative to the $^{13}C^\alpha$ carrier position. By setting the spectral width of the jointly sampled dimension to one half of 118 ppm, the apparent carrier position for sampling of $^{13}C'$ chemical shift (174.3 ppm) is folded on the position of the $^{13}C^\alpha$ carrier position at 56.3 ppm. The duration and strengths of the pulsed z-field gradients (PFGs) are: $G_1$ (1 ms, 24 G/cm); $G_2$ (100 μs, 16 G/cm); $G_3$ (1 ms, 24 G/cm); $G_5$ (1.5 ms, 20 G/cm); $G_6$ (1.25 ms, 30 G/cm); $G_7$ (500 μs, 8 G/cm); $G_8$ (125 μs, 29.5 G/cm). All PFG pulses are of rectangular shape. The delays are: $\tau_1$=1.6 ms, $\tau_2$=9.0 ms, $\tau_4$=11.0 ms, $\tau_5$=22.0 ms, $\tau_6$=5.5 ms, $\tau_7$=4.6 ms, $\tau_8$=1 ms. $^1H$-frequency labeling is achieved in a semi constant-time fashion with $t_1^a$ (0)=1.7 ms, $t_1^b$ (0)=1 μs, $t_1^c$ (0)=1.701 ms, $\Delta t_1^a$=60 μs, $\Delta t_1^b$=35.4 μs, $\Delta t_1^c$=-24.6 μs. Hence, the fractional increase of the semi constant-time period with $t_1$ equals to $\lambda$=1+$\Delta t_1^c$/$\Delta t_1^a$=0.58. Phase cycling for artefact suppression: $\phi_0$=x; $\phi_1$=x, -x; $\phi_2$=x, x, -x, -x; $\phi_3$=x; $\phi_4$=4x, 4(-x); $\phi_5$=x; $\phi_6$=$\phi_7$=x; $\phi_8$(receiver)=2(x,-x,-x,x). Phases $\phi_6$ and $\phi_7$ are shifted by 500 to compensate for non-resonance effects. GFT NMR super phase-cycling for recording the 8 basic spectra: $\phi_1$=x,y; $\phi_2$=2x,2y; $\phi_3$=4x,4y (the G-matrix required for time domain editing is shown in equation 15 in Example 5). For acquisition of central peaks derived from $^{13}C$ steady state magnetization, a second set of data sets with a 180° shift for $\phi_3$ is collected and data are "pre-processed" as described (see equations 13 and 14 in Example 5). For second order central peak detection, the $^1H^\alpha$ and $^{13}C^\alpha$ chemical shift evolution periods are omitted and $\phi_1$=x,y; $\phi_2$=x; $\phi_3$=x. Third order central peaks were detected in 2D [$^{15}N$, $^1H$]-HSQC (Cavanagh et al., *Protein NMR spectroscopy*, Wiley, New York (1996), which is hereby incorporated by reference in its entirety). (The G-matrices required for the central peak spectra are shown in equations 16–18 in Example 5). The sensitivity enhancement scheme of Kay et al., *J. Am. Chem. Soc.* 114:10663–10665 (1992), which is hereby incorporated by reference in its entirety, is employed, i.e., the sign of G6 is inverted in concert with a 180° shift of $\phi_5$. For implementation of (5,3)D HACA,CONHN, $t_1(^{15}N)$ is replaced by $t_2(^{15}N)$, and quadrature detection in $t_1$ is accomplished by altering the phase $\phi_I$ according to States-TPPI. GFT NMR super phase cycle for the 4 basic spectra: $\phi_2$=x,y; $\phi_3$=2x,2y (the G-matrix required for time domain editing is shown in equation 16 of Example 5). First order central peaks are derived from $^{13}C$ magnetization and are obtained by acquiring a second set of data sets with a 180° shift for $\phi_3$. For second order central peak detection, $t_1(^1H^\alpha)$ and $t_1(^{13}C^\alpha)$ are omitted. (The G-matrices required for time domain editing of the central peak spectra are shown in equations 17 and 18 of Example 5). In FIG. 7B, pulses on $^{13}C$ prior to $t_1(^{13}C)$ are applied at high power. Subsequently, the 90° and 180° pulse lengths applied for $^{13}C^{\alpha/\beta}$ are adjusted to 47.5 μs and 42.5 μs, respectively, to minimize perturbation of $^{13}CO$ spins. The width of the 90° pulses applied to $^{13}CO$ pulse is 52 μs and the corresponding 180° pulses are applied with same power. SEDUCE 180° pulses of 200 µs pulse length are used to decouple $^{13}$CO during $t_1$ and $\tau_4$. WALTZ16 is employed to decouple $^1$H (rf field strength=9.2 kHz) during the heteronuclear magnetization transfers, as well as to decouple $^{15}$N (rf=1.78 kHz) during acquisition. The SEDUCE sequence is used for decoupling of $^{13}$C' during the $^{15}$N chemical shift evolution period (rf=1.0 kHz). The $^1$H rf carrier is placed at 4.78 ppm. Initially, the $^{13}$C and $^{15}$N rf carriers are set to 41.3 ppm and 119.3 ppm, respectively. The $^{13}$C' carrier position is folded from 174.3 to 41.3 ppm by setting the spectral width in $\omega_1$ to one half of 133 ppm (=174.3 ppm–41.3 ppm). The $^{13}$C carrier is set to 56.3 ppm during the $\tau_7$ delay. The duration and strengths of the pulsed z-field gradients (PFGs) are: $G_1$ (1 ms, 24 G/cm); $G_2$ (100 µs, 16 G/cm); $G_3$ (250 µs, 29.5 G/cm); $G_4$ (250 µs, 30 G/cm); $G_5$ (1.5 ms, 20 G/cm); $G_6$ (1.25 ms, 30 G/cm); $G_7$ (500 µs, 8 G/cm); $G_8$ (125 µs, 29.5 G/cm). All PFG pulses are of rectangular shape. The delays are: $\tau_0$=1.7 ms, $\tau_1$=800 µs, $\tau_2$=2.8 ms, $\tau_3$32 3.3 ms, $\tau_4$=6.6 ms, $\tau_6$=8.8 ms, $\tau_7$=24 ms, $\tau_8$=5.5 ms, $\tau_9$=4.6 ms, $\tau_{10}$=1.0 ms. Phase cycling for artefact suppression: $\phi_1$=x; $\phi_2$=2(x), 2(-x); $\phi_3$=x; $\phi_4$=x, -x; $\phi_5$=$\phi_6$=$\phi_7$=$\phi_8$=x; $\phi_9$(receiver)=x,-x,-x,x. Phases $\phi_6$ and $\phi_7$ are shifted by 120° to compensate for non-resonance effects. GFT NMR super phase-cycling for recording the two basic spectra: $\phi_2$=x,y (the G-matrix required for time domain editing is shown in equation 17 of Example 5). The sensitivity enhancement scheme of Kay et al., *J. Am. Chem. Soc.* 114:10663–10665 (1992), which is hereby incorporated by reference in its entirety, is employed, i.e., the sign of G6 is inverted in concert with a 180° shift of $\phi_8$. Quadrature detection in $t_1$($^{13}$C') is accomplished by altering the phase $\phi_6$ according to States-TPPI (Cavanagh et al., *Protein NMR spectroscopy*, Wiley, New York (1996), which is hereby incorporated by reference in its entirety).

FIGS. 16A–B show the $\omega_1[(^{15}N;^{13}C', ^{13}C^\alpha, ^1H^\alpha)$, $\omega_2(^1H^N)]$-, $[\omega_1(^{15}N;^{13}C', ^{13}C^\alpha), \omega_2(^1H^N)]$-, $[\omega_1(^{15}N;^{13}C')$, $\omega_2(^1H^N)]$-, and $[\omega_1(^{15}N), \omega_2(^1H^N)]$-strips taken from the (5,2)D HACACONHN GFT NMR experiment (see FIG. 17). The signals were detected on the amide proton chemical shift of Ser 20. FIG. 16A shows spectra A1–A15 containing the chemical shift multiplets. FIG. 16B shows spectra B1–B15 containing the individual edited chemical shift multiplet components. Note that when compared with FIG. 2 the order of the chemical shift multiplets appears to have changed. However, this is because $\omega_1(^1H^\alpha)$<0 ppm (i.e., upfield relative to the carrier position) for Ser 20, and $\omega_1(^{13}C')$, $\omega_1(^{13}C^\alpha)$ and $\omega_1(^{15}N)$ >0 ppm (i.e, downfield relative to the respective carrier position). For simplicity, FIG. 2 was designed with the assumption that all resonances are located downfield to the respective carrier positions. The signals located at higher field in A15 and B15 arise from a side chain moiety and have thus no corresponding peaks in the other spectra (see also FIG. 17D). To facilitate the comparison of FIGS. 16A and 16B, the positions of multiplet components are indicated with thin lines.

FIGS. 17A-E show the 15 2D planes constituting the (5,2)D HACACONHN GFT NMR experiment (K=3)

recorded for the 8.6 kDa protein ubiquitin. The linear combination of chemical shifts detected in a given plane is indicated. FIG. 17A shows the basic spectra B1 to B8. FIG. 17B shows the first order central peak spectra B9 to B12. FIG. 17C shows the second order central peak spectra B13 and B14. FIG. 17D shows the third order central peak spectrum B15. Signals arising from side chain moieties are in dashed boxes. FIG. 17E shows cross sections taken along $\omega_1(^{15}N;^{13}C', ^{13}C^\alpha, ^1H^\alpha)$ at the peak of Ser 20 in B1 (at the top), along $\omega_1(^{15}N;^{13}C', ^{13}C^\alpha)$ in B9 (second from top), along $\omega_1(^{15}N;^{13}C')$ in B13 (third from top), and along $\omega_1(^{15}N)$ in B15 (at the bottom). The sections are indicated in green in the corresponding panel. Comparison of sections from B1 and B9 shows that signals do not broaden with increasing K (FIG. 18), while the smaller line widths observed in spectra B13 to B15 result from longer $t_{max}$ values (see Example 4). The 15 signals detected on the backbone amide proton of Ile 36 are circled. Doublets are observed in B1–B8 since Gly 35 exhibits non-degenerate $^1H^\alpha$ chemical shifts, yielding the correlation of six shifts: $\delta(^1H^{\alpha2})$=4.135±0.006 ppm, $\delta(^1H^{\alpha1})$=3.929±0.006 ppm, $\delta(^{13}C^\alpha)$=46.10±0.019 ppm, $\delta(^{13}C')$=173.911±0.017 ppm for Gly 35, and $\delta(^{15}N)$=120.295±0.043 ppm and $\delta(^1H^N)$=6.174±0.005 ppm for Ile 36 (Table 2). The standard deviations of the indirectly detected chemical shifts were estimated from a Monte Carlo simulation (see description of FIG. 19). In accordance, the $\omega_2(^1H^N)$ line width of the directly detected amid proton (20 Hz) was identified with±3σ (99.5% confidence interval) for locating the peak positions. Notably, phase sensitive editing of the chemical shift multiplets yields increasing peak dispersion (and thus resolution) in each of the constituent spectra compared to 2D [$^{15}N, ^1H$]-HSQC (panel B15). Nearly the same number of peaks is detected in each of 15 spectra, while the spectral width increases from $SW_1(^{15}N)$=1,440 Hz in B15 to $SW_1(^{15}N/^{13}C'/^{13}C^\alpha/^1H^\alpha)$=8,000 Hz in B1 . . . B8.

FIGS. 18A-C compare line widths and digital resolution of peaks detected in GFT and FT NMR. FIG. 18A shows (5,2)D HACACONHN GFT NMR: cross sections taken along $\omega_1(^{15}N;^{13}C', ^{13}C^\alpha, ^1H^\alpha)$ at the peak of Ser 20 in spectrum B1 (at the top), along $\omega_1(^{15}N;^{13}C', ^{13}C^\alpha)$ in spectrum B9 (second from top), along $\omega_1(^{15}N;^{13}C')$ in spectrum B13 (third from top), and along $\omega_1(^{15}N)$ in spectrum B15 (at the bottom). The same $t_{max}$ value was chosen for all spectra in order to demonstrate that resonances do not broaden when increasing K from 0 to 3. FIG. 18B shows HACACONHN FT NMR: $\omega_1(^1H^\alpha)$, $\omega_1(^{13}C^\alpha)$, $\omega_1(^{13}C')$, and $\omega_1(^{15}N)$ cross sections taken from 2D [$\omega_1, \omega_2(^1H^N)$]-planes obtained with the HACACONHN rf pulse scheme which were (i) recorded with the same $t_{max}$ values and spectral widths, and (ii) were processed as (5,2)D HACACONHN. Comparison of FIG. 18A and FIG. 18B shows that the linewidth registered in the GFT NMR experiment equals the linewidth in the FT NMR experiment. FIG. 18C shows the same cross sections as in FIG. 18B are shown except that the planes were recorded and processed as a conventional 5D NMR spectrum would be [same maximal evolution times as in the basic spectra, $10(t_1)*11(t_2)*22(t_3)*13(t_4)*512(t_5)$ complex points with spectral widths of $SW_1(^{15}N)$=1,440 Hz, $SW_2(^{13}C')$=1,500 Hz, $SW_3(^{13}C^\alpha)$=3,260 Hz, and $SW_4(^1H^\alpha)$=1,800 Hz and linear prediction to $20(t_1)*22(t_2)*32(t_3)*26(t_4)*512(t_5)$ complex points]. This would yield a frequency domain data set of $32(\omega_1)*32(\omega_2)*32(\omega_3)*32(\omega_4)*512(\omega_5)$ real points of 2.1 GByte size as compared to 16.8 MByte for (5,2)D HACACONHN. Comparison with FIG. 18B and FIG. 18C makes the relatively poor resolution obtainable in 5D FT NMR apparent. Note that linear prediction and zero filling to $^{96}(\omega_1)*96(\omega_2)*256(\omega_3)*128(\omega_4)*512(\omega_5)$ real points, which would be the closest match to the digital resolution obtained in (5,2)D HACACONHN, would result in an unrealistically large data size of 618 GByte.

FIG. 20) (ii) B1–B8, (iii) B1–B12, (iv) B1–B14, or (v) B1–B15. Peak positions were randomly varied 10,000 times according to Gaussian distributions characterized by σ(basic), σ(second) and σ(third). Subsequently, the systems of equations were solved using a least-squares fitting routine, and the deviations among the 10,000 solutions yielded $\sigma(^1H^\alpha)$, $\sigma(^{13}C^\alpha)$, $\sigma(^{13}C')$ and $\sigma(^{15}N)$. Note that $\sigma(^1H^\alpha)$ is not further reduced when central peaks are involved since those do not encode $\Omega(^1H^\alpha)$. Similarly, $\sigma(^{13}C^\alpha)$ and $\sigma(^{13}C')$ are not further reduced when second and third order central peaks are considered for calculation of chemical shifts. Notably, the standard deviations (labeled with an asterisk) obtained with four spectra critically depend on the particular selection (FIG. 20). The highest precision is obtained when choosing either B1, B4, B6 and B7, or B2, B3, B5 and B8 (FIGS. 20 and 17). The simulations are in neat agreement with calculations using the Gaussian law of error propagation (see FIG. 20).

FIGS. 20A–E show the results of Monte-Carlo simulations for the case that only four out of eight basic spectra of (5,2)D HACACONHN (FIG. 17A) are selected to calculate the chemical shifts. The standard deviations for the chemical shift measurements are plotted versus the number assigned to a particular combination. FIGS. 20A–D show $\sigma(^{15}N)$, $\sigma(^{13}C')$, $\sigma(^{13}C^\alpha)$ and $\sigma(^1H^\alpha)$, respectively, which represent the standard deviations for the measurement of the chemical shifts $\Omega_0(^{15}N)$, $\Omega_1(^{13}C')$, $\Omega_2(^{13}C^\alpha)$ and $\Omega_3(^1H^\alpha)$, respectively. FIG. 20E illustrates the assignment of numbers to the selections of four out of the 64 possible combinations $$\left\{\binom{8}{4} - 6 = (8 \cdot 7 \cdot 6 \cdot 5)/(4 \cdot 3 \cdot 2 \cdot 1) - 6 = 64\right\}.$$

The six combinations which are subtracted from the binomial coefficient $$\binom{8}{4}$$

correspond to the cases where one of the three chemical shifts $\Omega_1$, $\Omega_2$ or $\Omega_3$ is added to or subtracted from $\Omega_0$ in all of the four selected spectra (i.e., no splitting is present among the four selected spectra which encodes the respective chemical shift). The spectra selected for a particular combination number are indicated as dots. The statistical model used for the Monte Carlo simulations is the same as described in the legend of FIG. 19.

FIGS. 21A–B show the composite plot of $[\omega_1,\omega_2]$-strips taken from (5,2)D HACA,CONHN (FIG. 21A) and HACACONHN data (FIG. 21B) collected for the 8.6 kDa protein ubiquitin with a total measurement time of 10.5 hours. The 2D data were acquired with $58(t_1):512(t_2)$ complex points and $t_{1max}(^{15}N; ^{13}C', ^{13}C^\alpha, ^{1}H^\alpha)=6.5$ ms and $t_{2max}(^{1}H^N)=73.2$ ms. In FIG. 21A, the strips were taken from basic spectra (B1 to B8), first order central peak spectra (B9 to B12), second order central peak spectra (B13 and B14) and third order central peak spectra (B15) and are centered about the amide proton chemical shift of Glu 64. The position of the backbone $^{15}N$ chemical shift of Glu 64 is indicated by a dashed horizontal line, and the type of linear combination of chemical shifts detected for a given strip along $\omega_1$ is indicated at the top of the strip: B1 $[\Omega_0+\Omega_1+\Omega_2+\Omega_3]$; B2 $[\Omega_0-\Omega_1+\Omega_2+\Omega_3]$; B3 $[\Omega_0+\Omega_1-\Omega_2+\Omega_3]$; B4 $[\Omega_0-\Omega_1-\Omega_2+\Omega_3]$; B5 $[\Omega_0+\Omega_1+\Omega_2-\Omega_3]$; B6 $[\Omega_0-\Omega_1+\Omega_2-\Omega_3]$; B7 $[\Omega_0+\Omega_1-\Omega_2-\Omega_3]$; B8 $[\Omega_0-\Omega_1-\Omega_2-\Omega_3]$; B9 $[\Omega_0+\Omega_1+\Omega_2]$; B10 $[\Omega_0-\Omega_1+\Omega_2]$; B11 $[\Omega_0+\Omega_1-\Omega_2]$; B12 $[\Omega_0-\Omega_1-\Omega_2]$; B13 $[\Omega_0+\Omega_1]$; B14 $[\Omega_0-\Omega_1]$; B15 $[\Omega_0]$. In FIG. 21 B, the corresponding strips are centered about the amide proton chemical shift of Ser 65. The variation of the 15 peaks relative to the $^{15}N$ chemical shift of Ser 65 (indicated by a dashed horizontal line) matches the variation about the $^{15}N$ chemical shift of Glu 64 in FIG. 21A. This allows one to establish the sequential connectivity between Glu 64 and Ser 65 based on the measurement of three chemical shifts, i.e., $\Omega(^{13}C')$,$\Omega(^{13}C^\alpha)$ and $\Omega(^{1}H^\alpha)$. The shifts are obtained with high precision (Table 3) since the errors are reduced by the following factors when compared with FT NMR. For $\Omega(^{15}N)$: $\sqrt{15}=3.9$; $\Omega(^{13}C')$: $\sqrt{14}=3.7$; $\Omega(^{13}C^\alpha)$: $\sqrt{12}=3.5$; $\Omega(^{1}H^\alpha)$: $\sqrt{8}=2.8$. $^{1}H$ and $^{13}C$ chemical shifts are in ppm relative to 2,2-dimethyl-2-silapentane-5-sulfonate sodium salt (DSS).

Figure 22:
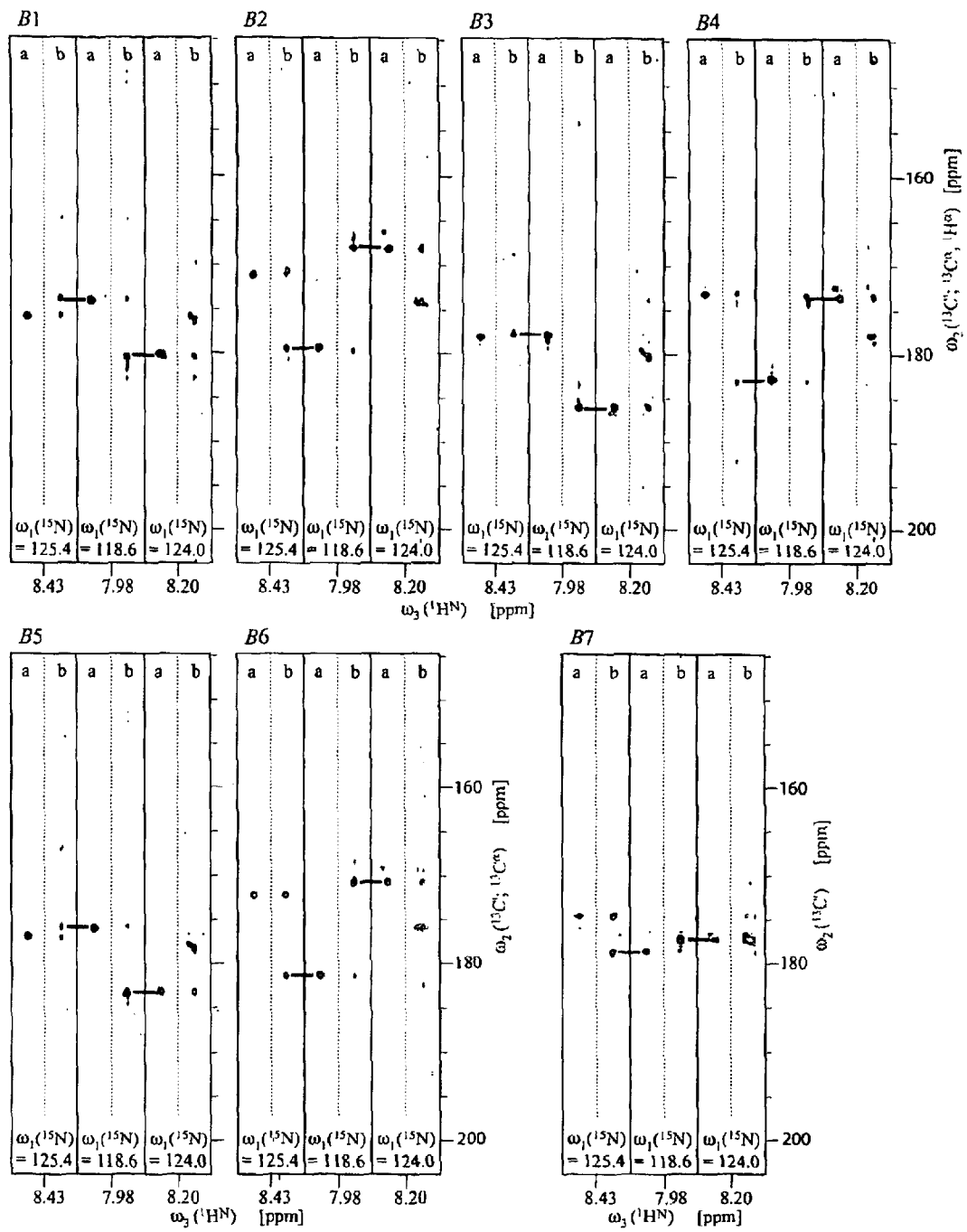

FIG. 22 shows the composite plot of $[\omega_1,\omega_3]$-strips taken from (5,3)D HACACONHN (strips labeled with 'a') and (5,3)D HACA,CONHN data (strips labeled with 'b') collected for the 14 kDa NESG consortium target protein TT212 with a total measurement time of 60 hours. The 3D data were acquired with $56(t_1):24(t_2):512(t_3)$ complex points and $t_{1max}(^{13}C'; ^{13}C^\alpha, ^{1}H^\alpha)=6.2$ ms, $t_{2max}(^{15}N)=16.4$ ms and $t_{3max}(^{1}H^N)=73.2$ ms. The first, second and third pair of strips in each block has been taken, respectively, at the $^{15}N$ chemical shift of Ala 24, Ile 25 and Glu 26 along $\omega_2(^{15}N)$. The strips are centered about the corresponding amide proton shifts detected along $\omega_3(^{1}H^N)$. The $^{15}N$ shifts are given at the bottom of each pair of strips, which were taken from basic spectra (B1 to B4), the first order central peak spectra (B5 and B6) and the second order central peak spectra (B7). The type of linear combination of chemical shifts detected along $\omega_1$ is indicated at the top of the strips: B1 $[\Omega_0+\Omega_1+\Omega_2]$; B2 $[\Omega_0-\Omega_1+\Omega_2]$; B3 $[\Omega_0+\Omega_1-\Omega_2]$; B4 $[\Omega_0-\Omega_1-\Omega_2]$; B5 $[\Omega_0+\Omega_1]$; B6 $[\Omega_0-\Omega_1]$; B7 $[\Omega_0]$. Sequential connectivities are indicated by horizontal lines and are established based on the measurement of three chemical shifts, i.e., $\Omega(^{13}C')$, $\Omega(^{13}C^\alpha)$, and $\Omega(^{1}H^\alpha)$. The chemical shifts were obtained with high precision (Table 4), since the errors are reduced by the following factors when compared with FT NMR. For $\Omega(^{13}C')$: $\sqrt{7}=2.6$; $\Omega(^{13}C^\alpha)$: $\sqrt{4}=2.4$; $\Omega(^{1}H^\alpha)$: $\sqrt{4}=2$. $^{1}H$ and $^{13}C$ chemical shifts are in ppm relative to 2,2-dimethyl-2-silapentane-5-sulfonate sodium salt (DSS).

Figure 23:
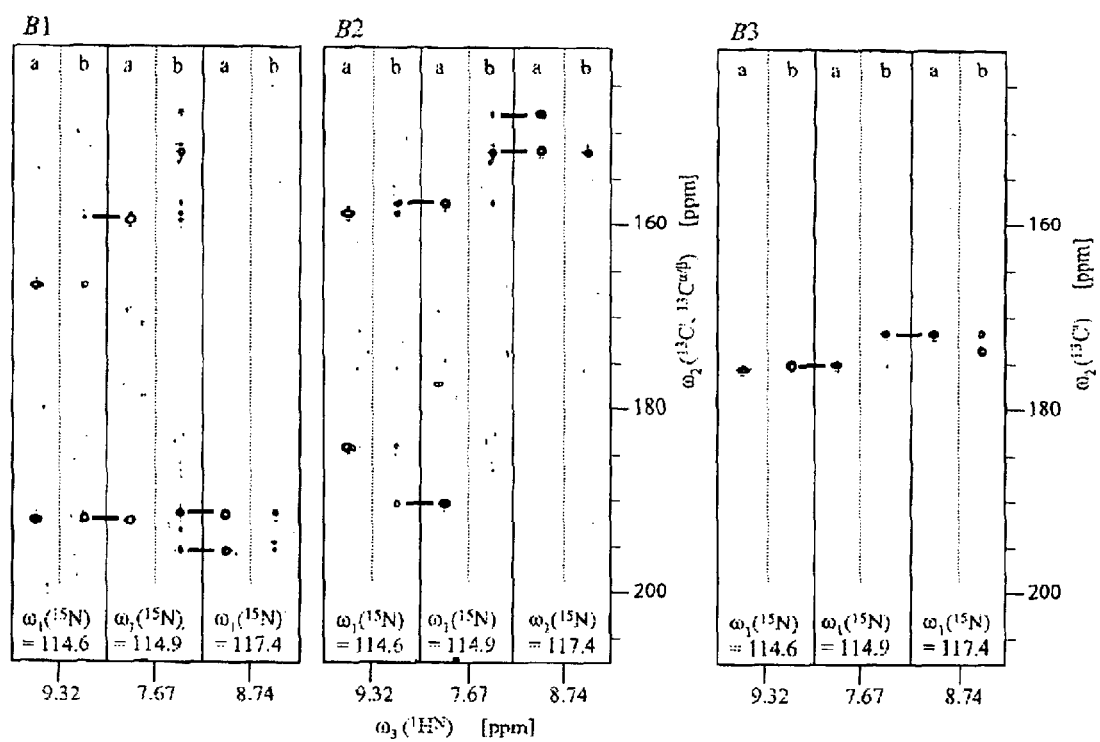

FIG. 23 shows the composite plot of $[\omega_1,\omega_3]$-strips taken from (4,3)D CBCACONHN (strips labeled with 'a') and (4,3)D CBCA,CONHN data (strips labeled with 'b') collected for the 8.6 kDa protein ubiquitin with a total measurement time of 11.2 hours. The 3D data were acquired with $60(t_1):24(t_2):512(t_3)$ complex points and $t_{1max}(^{13}C'; ^{13}C^{\alpha/\beta})=5.9$ ms, $t_{2max}(^{15}N)=17.2$ ms and $t_{3max}(^{1}H^N)=73.2$ ms. The first, second, and third pair of strips in each block has been taken, respectively, at the $^{15}N$ chemical shift of Glu 64, Ser 65, and Thr 66 along $\omega_2(^{15}N)$. The strips are centered about the corresponding amide proton shifts detected along $\omega_3(^{1}H^N)$. The $^{15}N$ shifts are given at the bottom of each pair of strips, which were taken from basic spectra (B1 and B2) and the first order central peak spectra (B3). The type of linear combination of chemical shifts detected along $\omega_1$ is indicated at the top of the strips: B1 $[\Omega_0+\Omega_1]$; B2 $[\Omega_0-\Omega]$; B3 $[\Omega_0]$. Sequential connectivities are indicated by horizontal lines and are established based on the measurement of three chemical shifts, i.e., $\Omega(^{13}C')$,$\Omega(^{13}C^\alpha)$ and $\Omega(^{13}C^\beta)$. [Since the $^{13}C^{\alpha/\beta}$ carrier was set in between the $^{13}C^\alpha$, and $^{13}C^\beta$ chemical shift ranges (FIG. 7), one has that peaks at $\omega_2(^{13}C'+^{13}C^\alpha)$ and $\omega_1(^{13}C'+^{13}C^\beta)$ in B1 appear in a "reversed order" when compared with B2, which exhibits peaks at $\omega_2(^{13}C'-^{13}C^\alpha)$ and $\omega_3(^{13}C'-^{13}C^\beta)$.] The chemical shifts were obtained with high precision (Table 5) since the errors are reduced by the following factors when compared with FT NMR. For $\Omega(^{13}C')$: $\sqrt{3}=1.7$; $\Omega(^{13}C^\alpha)$: $\sqrt{2}=1.4$; $\Omega(^{13}C^\beta)$: $\sqrt{2}=1.4$. $^{1}H$ and $^{13}C$ chemical shifts are in ppm relative to 2,2-dimethyl-2-silapentane-5-sulfonate sodium salt (DSS).

Figure 24:
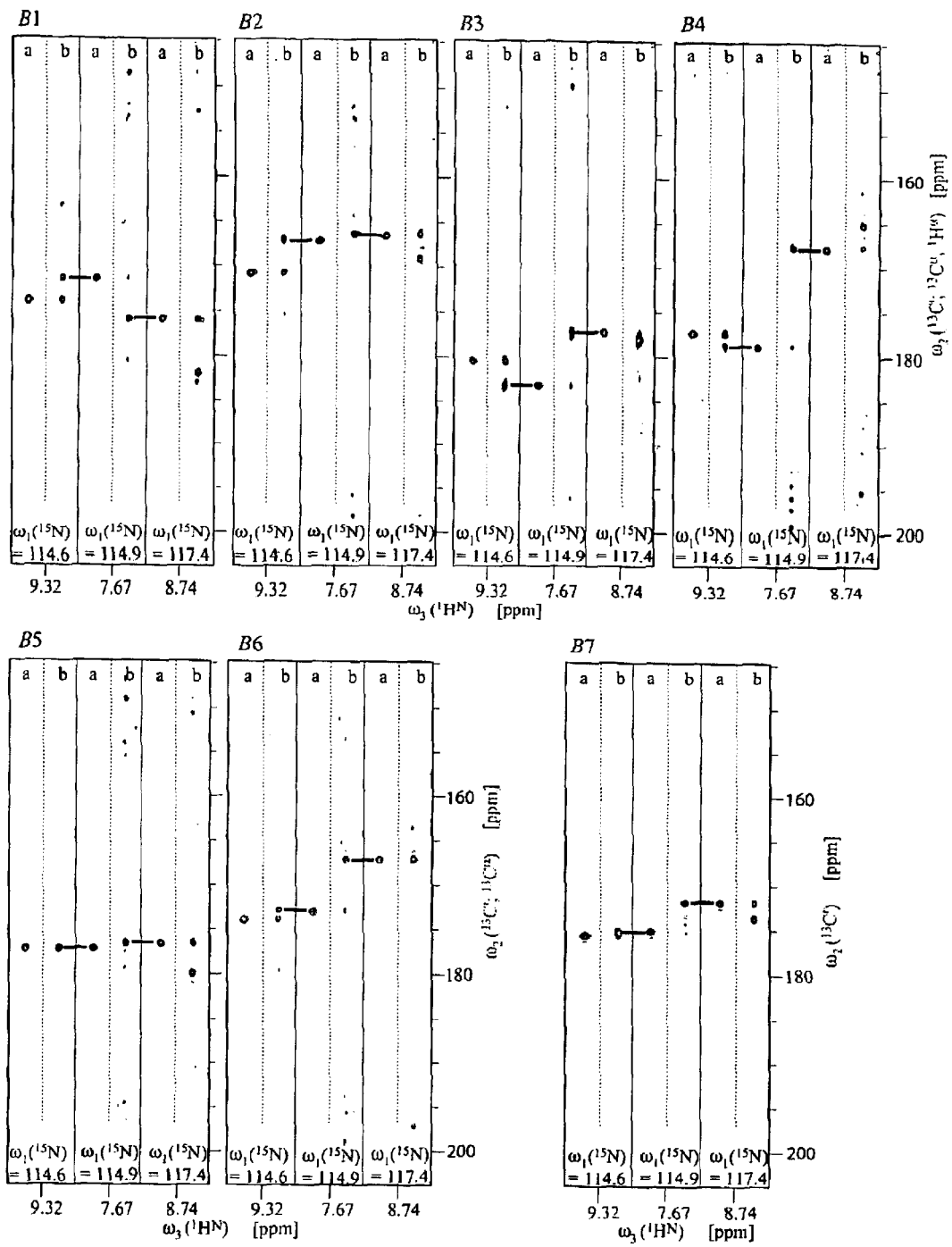

FIG. 24 shows a composite plot of $[\omega_1,\omega_3]$-strips taken from (5,3)D HACACONHN (strips labeled with 'a') and (5,3)D HACA,CONHN data (strips labeled with 'b') collected for ubiquitin with a total measurement time of 20.8 hours. The 3D data were acquired with $56(t_1):24(t_2):512(t_3)$ complex points and $t_{1max}(^{13}C'; ^{13}C^\alpha, ^{1}H^\alpha)=6.2$ ms, $t_{2max}(^{15}N)=17.2$ ms and $t_{3max}(^{1}H^N)=73.2$ ms. The first, second, and third pair of strips in each block has been taken, respectively, at the $^{15}N$ chemical shift of Lys 63, Glu 64, and Ser 65 along $\omega_2(^{15}N)$. The strips are centered about the corresponding amide proton shifts detected along $\omega_3(^{1}H^N)$. The $^{15}N$ shifts are given at the bottom of each pair of strips, which were taken from basic spectra (B1 to B4), the first order central peak spectra (B5 and B6) and the second order central peak spectra (B7). The type of linear combination of chemical shifts detected along $\omega_1$ is indicated at the top of the strips: B1 $[\Omega_0+\Omega_1+\Omega_2]$; B2 $[\Omega_0-\Omega_1+\Omega_2]$; B3 $[\Omega_0+\Omega_1-\Omega_2]$; B4 $[\Omega_0-\Omega_1-\Omega_2]$; B5 $[\Omega_0+\Omega_1]$; B6 $[\Omega_0-\Omega_1]$; B7 $[\Omega_0]$. Sequential connectivities are indicated by horizontal lines and are established based on the measurement of three chemical shifts, i.e., $\Omega(^{13}C')$,$(^{13}C^\alpha)$ and $\Omega(^{1}H^\alpha)$. The chemical shifts were obtained with high precision (Table 6), since the errors are reduced by the following factors when compared with FT NMR. For $\Omega(^{13}C')$:; $\Omega(^{13}C^\alpha)$:; $\Omega(^1H^\alpha)$:. $^1H$ and $^{13}C$ chemical shifts are in ppm relative to 2,2-dimethyl-2-silapentane-5-sulfonate sodium salt (DSS).

Figure 25:
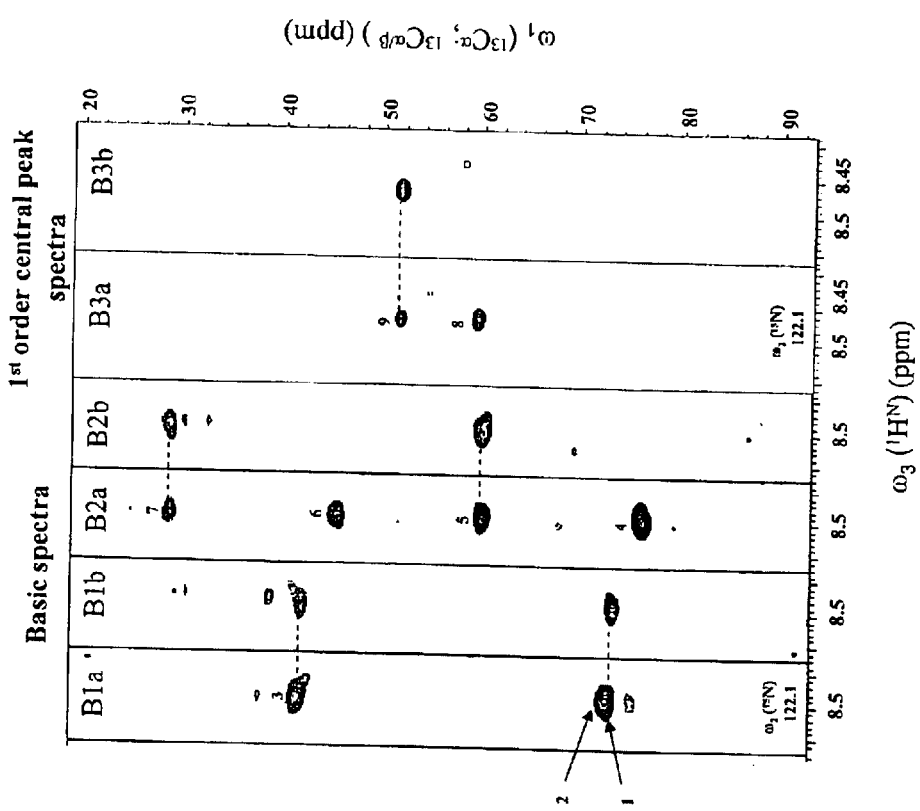
Figure 26:
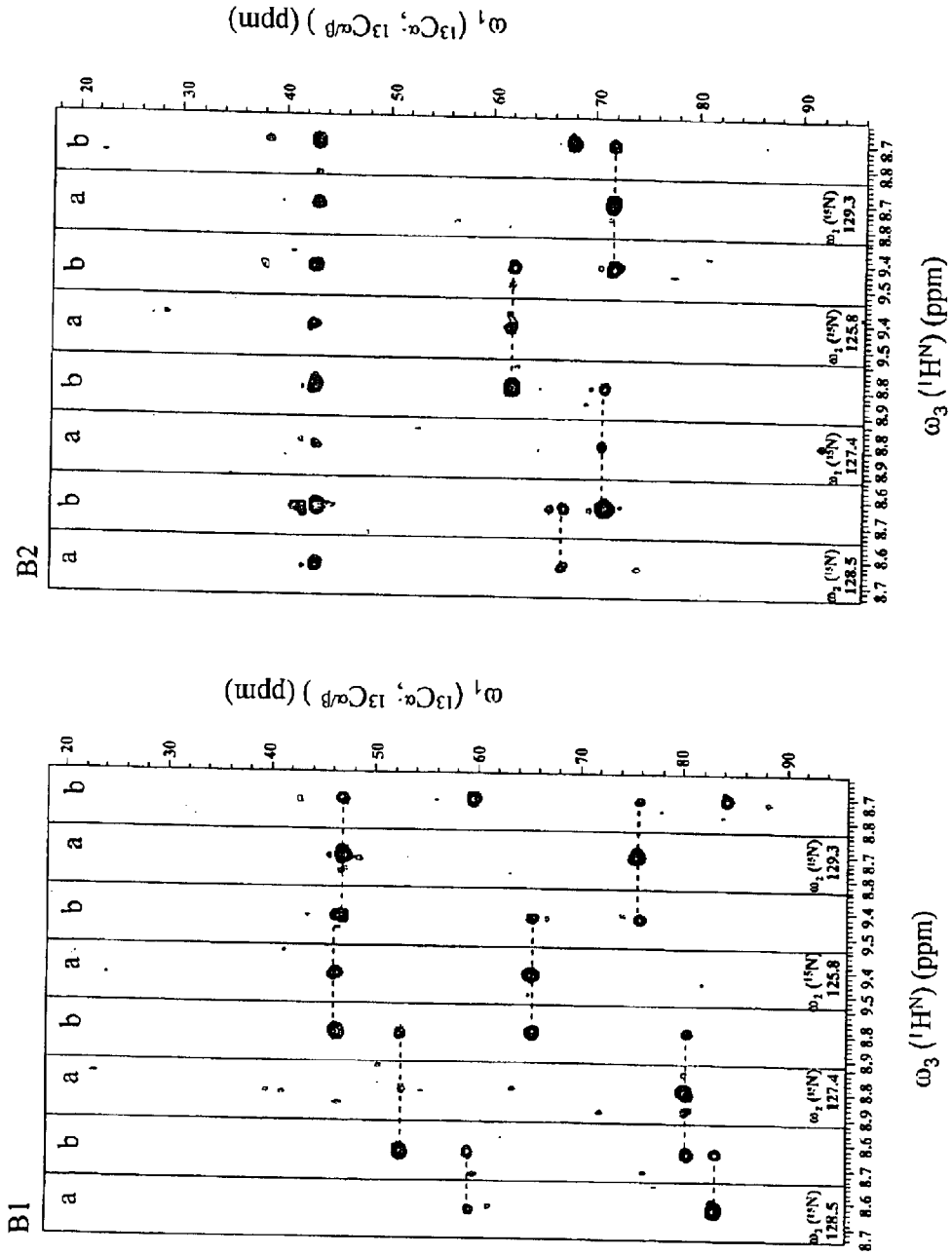

FIG. 25 shows the composite plot of $[\omega_1(^{13}C^\alpha; {}^{13}C^{\alpha/\beta}), \omega_3(^1H^N)]$ strips taken from the basic spectra of (a) (4,3)D HNNCACBCA (B1a, B2a) and (b) (4,3)D HNN(CO)CACBCA (B1b, B2b). The $[\omega_1(^{13}C^\alpha), \omega_3(^1H^N)]$ strips taken from 3D HNNCA (B3a) and 4D HNN(CO)CA (B3b) spectra represent the first order central peaks for (4,3)D HNN CACBCA and (4,3)D HNN(CO)CACBCA, respectively. As an example, strips corresponding to $\Omega_2(^{15}N)$ and $\Omega_3(^1H^N)$ chemical shifts for the residue Glu 73 of the 16 kDa protein ER75 are shown. Dashed lines connecting peaks establish sequential connectivities. Peaks labeled 1 to 9 in the figure correspond to the following linear combination of chemical shifts (i≡Glu 73; i−1≡Ala 71):

1: $\Omega_0(^{13}C_{i-1}{}^\alpha)+\Omega_1(^{13}C_{i-1}{}^\alpha)$;
2: $\Omega_0(^{13}C_i{}^\alpha)+\Omega_1(^{13}C_{i-1}{}^\alpha)$
3: $\Omega_0(^{13}C_i{}^\alpha)+\Omega_1(^{13}C_i{}^\alpha)$, $\Omega_0(^{13}C_{i-1}{}^\alpha)+\Omega_1(^{13}C_{i-1}{}^\alpha)$
4: $\Omega_0(^{13}C_i{}^\alpha)-\Omega_1(^{13}C_i{}^\alpha)$
5: $\Omega_0(^{13}C_{i-1}{}^\alpha)-\Omega_1(^{13}C_{i-1}{}^\alpha)$
6: $\Omega_0(^{13}C_i{}^\alpha)-\Omega_1(^{13}C_i{}^\beta)$
7: $\Omega_0(^{13}C_{i-1}{}^\alpha)-\Omega_1(^{13}C_{i-1}{}^\beta)$
8: $\Omega_0(^{13}C_i{}^\alpha)$
9: $\Omega_0(^{13}C_{i-1}{}^\alpha)$ FIG. 26 shows the composite plot of $[\omega_1(^{13}C^\alpha; {}^{13}C^{\alpha/\beta}), \omega_3(^1H^N)]$ strips taken from the basic spectra of (a) (4,3)D CBCACA(CO)NHN (B1a and B2a) and (b) (4,3)D HNN CACBCA (B1b and B2b) illustrating how sequential resonance assignments along the polypeptide chain are obtained. As an example, the sequential walk for residues Val 27 to Ile 30 of the 7 kDa protein GR2 is shown. For simplicity, only the sequential connectivities inferred from the basic spectra are shown. The observed peak patterns are as described in FIG. 25.

Figure 27:
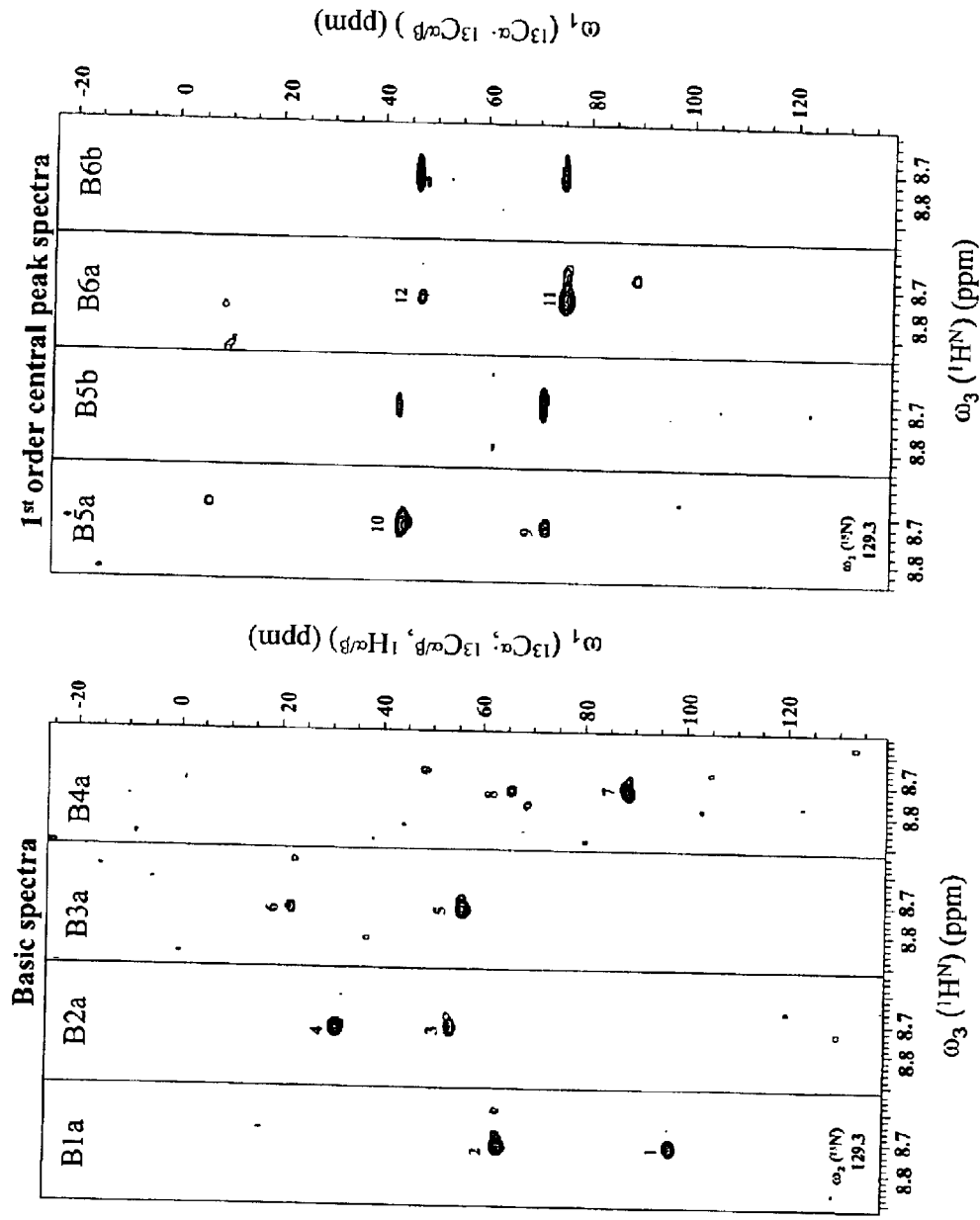
Figure 28:
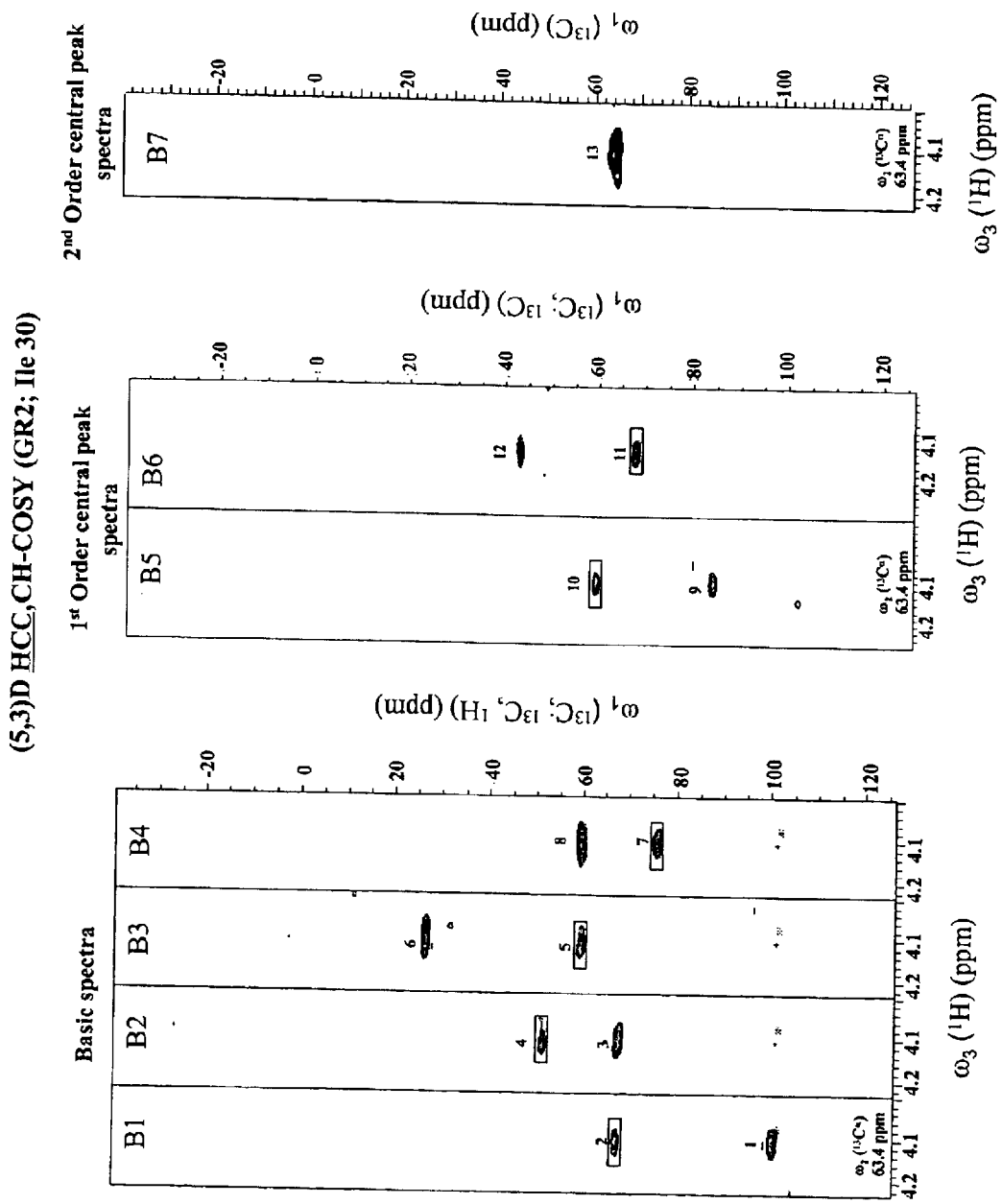

FIG. 27 shows the composite plot of $[\omega_1(^{13}C^\alpha; {}^{13}C^{\alpha/\beta}, {}^1H^{\alpha/\beta}), \omega_3(^1H^N)]$ strips taken from the basic and first order central peak spectra of (5,3)D HBHACBCACA(CO)NHN (B1a, B2a, B3a and B4a). Note that $[\omega_1(^{13}C^\alpha; {}^{13}C^{\alpha/\beta}), \omega_3(^1H^N)]$ strips taken from the basic spectra of (4,3)D CBCACA(CO)NHN (B5b and B6b) show the same peak patterns as those observed in the first order central peak spectra of (5,3)D HBHACBCACA(CO)NHN (B5a and B6a). As an example, strips corresponding to $\omega_2(^{15}N)$ and $\omega_3(^1H^N)$ chemical shifts for Ile 30 of GR2 are shown. Peaks labeled 1 to 12 in the figure correspond to the following linear combination of chemical shifts for residue Ile 29:

1: $\Omega_0(^{13}C^\alpha)+\Omega_1(^{13}C^\alpha)+\Omega_2(^1H^\alpha)$
2: $\Omega_0(^{13}C^\alpha)+\Omega_1(^{13}C^\beta)+\Omega_2(^1H^\beta)$
3: $\Omega_0(^{13}C^\alpha)+\Omega_1(^{13}C^\alpha)-\Omega_2(^1H^\alpha)$
4: $\Omega_0(^{13}C^\alpha)+\Omega_1(^{13}C^\beta)-\Omega_2(^1H^\beta)$
5: $\Omega_0(^{13}C^\alpha)-\Omega_1(^{13}C^\beta)-\Omega_2(^1H^\beta)$
6: $\Omega_0(^{13}C^\alpha)-\Omega_1(^{13}C^\alpha)-\Omega_2(^1H^\alpha)$
7: $\Omega_0(^{13}C^\alpha)-\Omega_1(^{13}C^\beta)+\Omega_2(^1H^\beta)$
8: $\Omega_0(^{13}C^\alpha)-\Omega_1(^{13}C^\alpha)+\Omega_2(^1H^\alpha)$
9: $\Omega_0(^{13}C^\alpha)-\Omega_1(^{13}C^\beta)$
10: $\Omega_0(^{13}C^\alpha)-\Omega_1(^{13}C^\alpha)$
11: $\Omega_0(^{13}C^\alpha)+\Omega_1(^{13}C^\alpha)$
12: $\Omega_0(^{13}C^\alpha)+\Omega_1(^{13}C^\beta)$ FIG. 28 shows the composite plot of $[\omega_1(^{13}C; {}^{13}C, {}^1H), \omega_3(^1H)]$ strips taken from the basic (B1–B4) and first order central peak (B5 and B6) spectra of (5,3)D HCC,CH-COSY. The $[\omega_1(^{13}C), \omega_3(^1H)]$ strips taken from 3D (H)C,CH—COSY (B7) represents the second order central peak spectra of (5,3)D HCC,CH-COSY. As an example, strips corresponding to $\omega_2(^{13}C^\alpha)$ and $\omega_3(^1H^\alpha)$ chemical shifts for residue Ile 30 of GR2 are shown. Peaks shown in rectangular boxes correspond to cross peaks in a conventional 4D HCCH-COSY. Peaks labeled 1 to 13 correspond to the following linear combination of chemical shifts:

| Corresponding peak type in 4D HCCH-COSY (peaks 1–8) and 3D CCH-COSY (peaks 9–12) |
| --- |
| 1: $\Omega_0(^{13}C^\alpha) + \Omega_1(^{13}C^\alpha) + \Omega_2(^1H^\alpha)$ "Diagonal peak" |
| 2: $\Omega_0(^{13}C^\alpha) + \Omega_1(^{13}C^\beta) + \Omega_2(^1H^\beta)$ "Cross peak" |
| 3: $\Omega_0(^{13}C^\alpha) + \Omega_1(^{13}C^\alpha) - \Omega_2(^1H^\alpha)$ "Diagonal peak" |
| 4: $\Omega_0(^{13}C^\alpha) + \Omega_1(^{13}C^\beta) - \Omega_2(^1H^\beta)$ "Cross peak" |
| 5: $\Omega_0(^{13}C^\alpha) - \Omega_1(^{13}C^\beta) + \Omega_2(^1H^\beta)$ "Cross peak" |
| 6: $\Omega_0(^{13}C^\alpha) - \Omega_1(^{13}C^\alpha) + \Omega_2(^1H^\alpha)$ "Diagonal peak" |
| 7: $\Omega_0(^{13}C^\alpha) - \Omega_1(^{13}C^\beta) - \Omega_2(^1H^\beta)$ "Cross peak" |
| 8: $\Omega_0(^{13}C^\alpha) - \Omega_1(^{13}C^\alpha) - \Omega_2(^1H^\alpha)$ "Diagonal peak" |
| 9: $\Omega_0(^{13}C^\alpha) + \Omega_1(^{13}C^\alpha)$ "Diagonal peak" |
| 10: $\Omega_0(^{13}C^\alpha) + \Omega_1(^{13}C^\beta)$ "Cross peak" |
| 11: $\Omega_0(^{13}C^\alpha) - \Omega_1(^{13}C^\beta)$ "Cross peak" |
| 12: $\Omega_0(^{13}C^\alpha) - \Omega_1(^{13}C^\alpha)$ "Diagonal peak" |
| 13: $\Omega_0(^{13}C^\alpha)$ |

Figure 29:
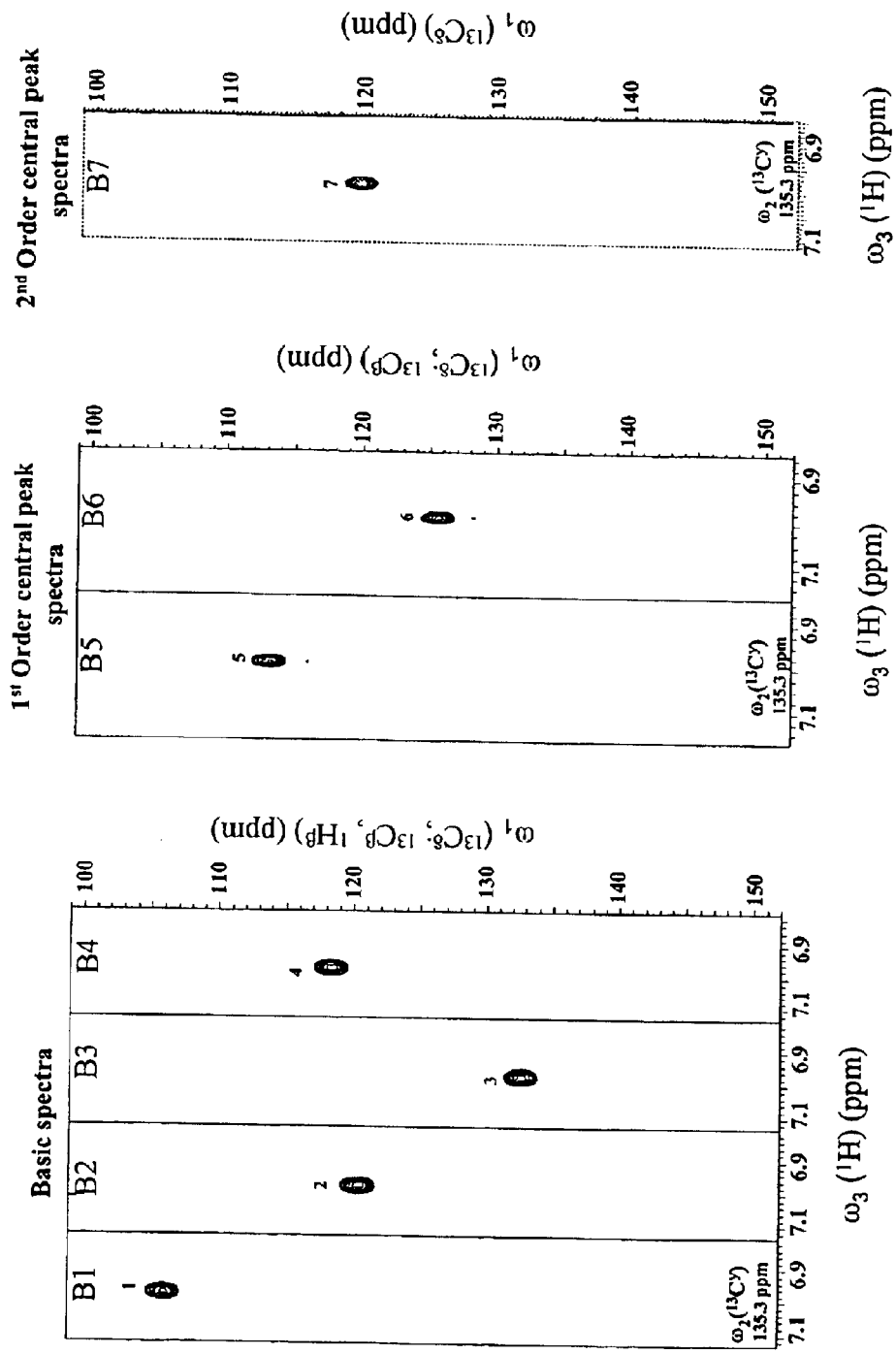
Figure 30:
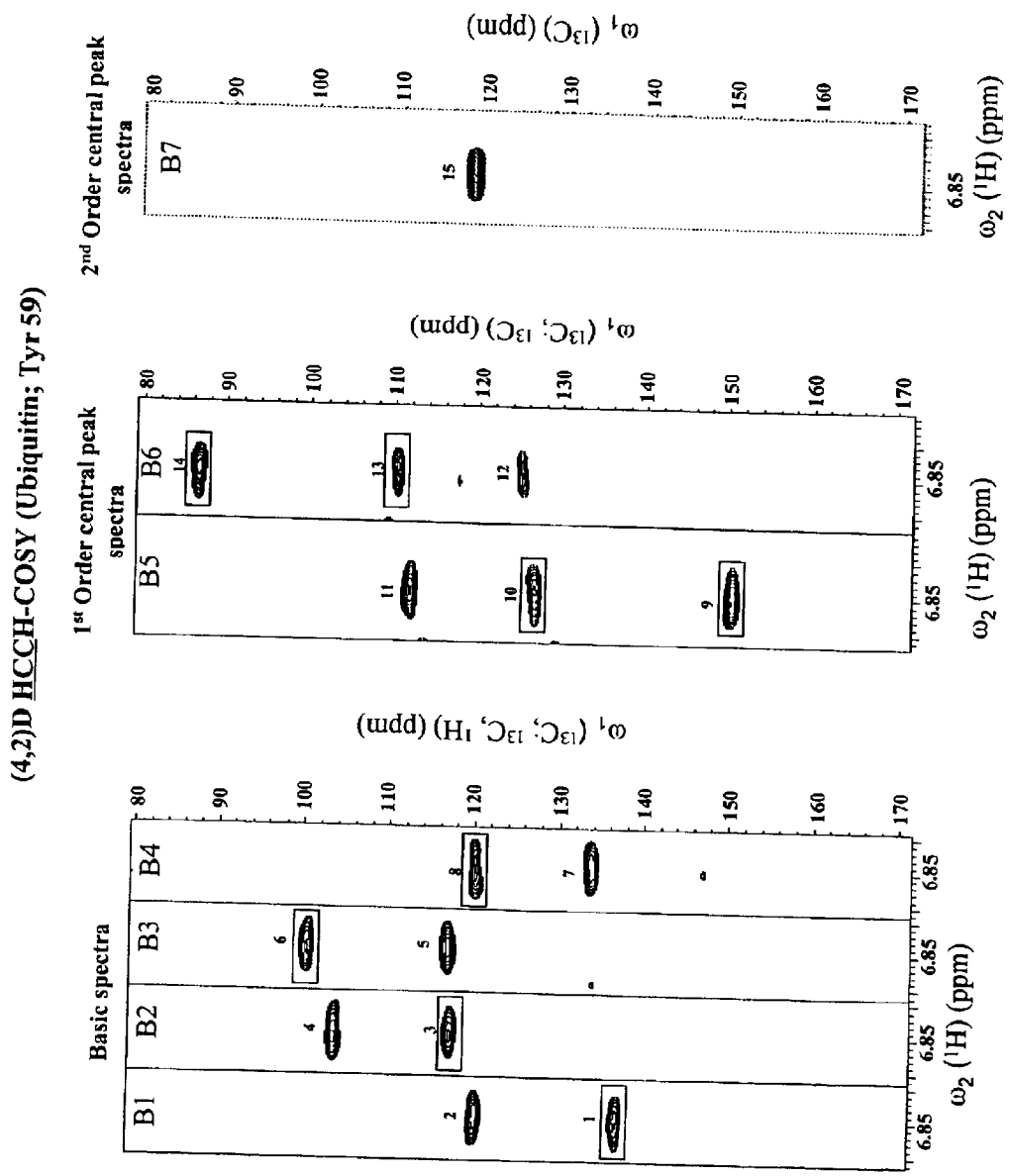

FIG. 29 shows the composite plot of $[\omega_1(^{13}C^\delta; {}^{13}C^\beta, {}^1H^\beta), \omega_3(^1H^\beta)]$ strips taken from the basic (B1–B4) and first order central peak (B5 and B6) spectra of (5,3)D HBCBCGCDHD illustrating how resonance assignments for aromatic side-chain spins are obtained. The $[\omega_1(^{13}C^\delta; {}^{13}C^\beta), \omega_3(^1H^\delta)]$ strips taken from 3D $[^{13}C^\delta, {}^{13}C^\gamma, H^\delta]$-COSY represent the second order central peak spectra of (5,3)D HBCBCG CDHD. As an example, strips corresponding to $\omega_2(^{13}C^\gamma)$ and $\omega_3(^1H^\delta)$ chemical shifts for His 68 of Ubiquitin are shown. Peaks labeled 1 to 7 correspond to the following linear combination of chemical shifts:

1: $\Omega_0(^{13}C^{\delta 2})-\Omega_1(^{13}C^\beta)-\Omega_2(^1H^\beta)$
2: $\Omega_0(^{13}C^{\delta 2})-\Omega_1(^{13}C^\beta)+\Omega_2(^1H^\beta)$
3: $\Omega_0(^{13}C^{\delta 2})+\Omega_1(^{13}C^\beta)+\Omega_2(^1H^\beta)$
4: $\Omega_0(^{13}C^{\delta 2})+\Omega_1(^{13}C^\beta)-\Omega_2(^1H^\beta)$
5: $\Omega_0(^{13}C^{\delta 2})-\Omega_1(^{13}C^\beta)$
6: $\Omega_0(^{13}C^{\delta 2})+\Omega_1(^{13}C^\beta)$
7: $\Omega_0(^{13}C^{\delta 2})$ FIG. 30 shows the composite plot of $[\omega_1(^{13}C; {}^{13}C, {}^1H), \Omega_2(^1H)]$ strips taken from the basic (B1–B4) and first order central peak (B5 and B6) spectra of (4,2)D HCCH-COSY spectra illustrating how resonance assignments for aromatic side-chain spins are obtained. The $[\omega_1(^{13}C), \omega_2(^1H)]$ strip taken from 2D $[^{13}C^{-1}H]$ HSQC (B7) represents the second order central peak spectra for (4,2)D HCCH-COSY. As an example, strips corresponding to $\omega_2(H^\delta)$ chemical shift for residue Tyr 59 of the 8.6 kDa protein Ubiquitin are shown. Peaks shown in rectangular boxes correspond to cross peaks in the conventional 4D HCCH-COSY. Peaks labeled 1 to 15 correspond to the following linear combination of chemical shifts:

| Corresponding peak type in 4D HCCH-COSY (peaks 1–8) and 3D CCH-COSY (peaks 9–14) |
| --- |
| 1: $\Omega_0(^{13}C^\epsilon) - \Omega_1(^{13}C^\delta) - \Omega_2(^1H^\delta)$ "Cross peak" |
| 2: $\Omega_0(^{13}C^\epsilon) - \Omega_1(^{13}C^\epsilon) - \Omega_2(^1H^\epsilon)$ "Diagonal peak" |
| 3: $\Omega_0(^{13}C^\epsilon) - \Omega_1(^{13}C^\delta) + \Omega_2(^1H^\delta)$ "Cross peak" |
| 4: $\Omega_0(^{13}C^\epsilon) - \Omega_1(^{13}C^\epsilon) + \Omega_2(^1H^\epsilon)$ "Diagonal peak" |
| 5: $\Omega_0(^{13}C^\epsilon) + \Omega_1(^{13}C^\epsilon) - \Omega_2(^1H^\epsilon)$ "Diagonal peak" |
| 6: $\Omega_0(^{13}C^\epsilon) + \Omega_1(^{13}C^\delta) + \Omega_2(^1H^\delta)$ "Cross peak" |
| 7: $\Omega_0(^{13}C^\epsilon) + \Omega_1(^{13}C^\epsilon) - \Omega_2(^1H^\epsilon)$ "Diagonal peak" |
| 8: $\Omega_0(^{13}C^\epsilon) + \Omega_1(^{13}C^\delta) - \Omega_2(^1H^\delta)$ "Cross peak" |
| 9: $\Omega_0(^{13}C^\epsilon) - \Omega_1(^{13}C^\epsilon)$ "Cross peak" |

-continued

| | Corresponding peak type in 4D HCCH-COSY (peaks 1–8) and 3D CCH-COSY (peaks 9–14) |
|---|---|
| 10: $\Omega_0(^{13}C^\varepsilon) - \Omega_1(^{13}C^\delta)$ | "Cross peak" |
| 11: $\Omega_0(^{13}C^\varepsilon) - \Omega_1(^{13}C^\varepsilon)$ | "Diagonal peak" |
| 12: $\Omega_0(^{13}C^\varepsilon) + \Omega_1(^{13}C^\varepsilon)$ | "Diagonal peak" |
| 13: $\Omega_0(^{13}C^\varepsilon) + \Omega_1(^{13}C^\delta)$ | "Cross peak" |
| 14: $\Omega_0(^{13}C^\varepsilon) + \Omega_1(^{13}C^\zeta)$ | "Cross peak" |
| 15: $\Omega_0(^{13}C^\varepsilon)$ | |

DETAILED DESCRIPTION OF THE INVENTION

The present invention provides an NMR data acquisition scheme which is based on the phase sensitive joint sampling of the indirect dimensions spanning a subspace of a conventional NMR experiment. This allows one to very rapidly obtain high dimensional NMR spectral information. Since the phase-sensitive joint sampling yields subspectra containing "chemical shift multiplets", alternative data processing is required for editing the components of the multiplets. The subspectra are linearly combined using a so-called "G-matrix" and subsequently Fourier transformed. The chemical shifts are multiply encoded in the resonance lines constituting the shift multiplets. This corresponds to performing statistically independent multiple measurements, and the chemical shifts can thus be obtained with high precision. To indicate that a combined G-matrix and FT is employed, the new approach is named "GFT NMR spectroscopy".

Figure 1:
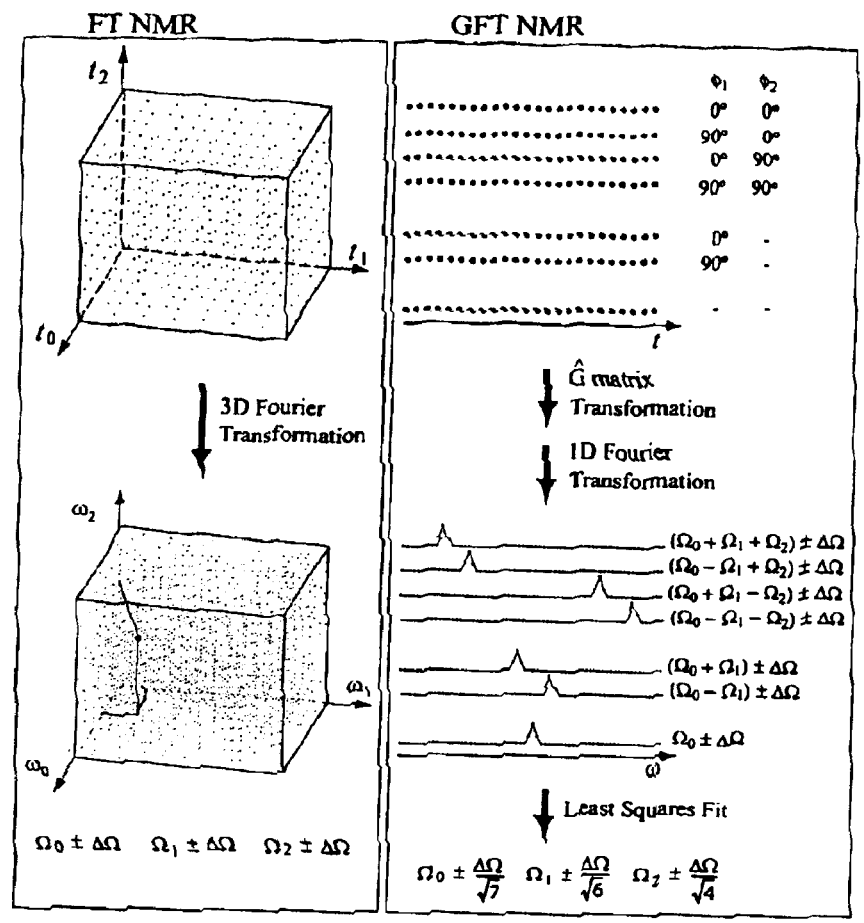
FIG. 1 compares the conventional sampling of a 3D time domain subspace of an ND FT NMR experiment (on the left) with the phase-sensitive joint sampling of the three dimensions in an (N,N-2)D GFT NMR (on the right), that is, with K=2. Processing of the FT NMR experiment requires a 3D FT of the subspace, while the GFT NMR experiment requires time domain editing of chemical shift multiplet components by application of the so-called G-matrix (see equation 1 in the "Detailed Description of the Invention") and ID FT of the resulting $p=2^{K+1}$ data sets. For the GFT NMR experiment, the phase settings of $\phi_1$ and $\phi_2$ of the rf pulses creating transverse magnetization for frequency labeling with $\Omega_1$ and $\Omega_2$ are indicated for basic spectra (top four rows), first-order central peak spectra (two rows in the middle), and the second-order central peak spectrum (bottom row). Instead of a single peak in FT NMR which encodes three chemical shifts, one obtains a p-fold overdetermined system of equations. A least-squares fit calculation yields the three shifts from the position of seven peaks. In a GFT NMR experiment with constant-time chemical shift evolution periods, the lines forming the chemical shift multiplets have the same width as the resonances in FT NMR (if recorded with corresponding maximal evolution times; see also FIGS. 18A-B). (The width at half height of the frequency domain sinc centre lobe resulting from truncation in the time domain at $t_{max}$ is given (Ernst et al., *Principles of Nuclear Magnetic Resonance in One and Two Dimensions*, Clarendon, Oxford (1987), which is hereby incorporated by reference in its entirety) by $0.604/t_{max}$. In the current implementation of (5,2)D HACACONHN (FIG. 6) all indirect evolution periods except for $\Omega(^1H^\alpha)$ are constant-time periods. The evolution of $\Omega(^1H^\alpha)$ is implemented in a semiconstant-time manner (Cavanagh et al., *Protein NMR Spectroscopy*, Academic Press, San Diego (1996), which is hereby incorporated by reference in its entirety), so that signal losses due to transverse relaxation of $^1H^\alpha$ are negligible for 8.6 kDa ubiquitin at short $t_{max}$ values around 6.5 ms. For larger systems with short $T_2(^1H^\alpha)$, however, the semiconstant-time frequency labeling may lead to a detectable increase of $\omega_1$-line widths in the basic when compared to central peak spectra.) This yields the same standard deviation $\Delta\Omega$ for the identification of peak positions in the two experiments. Hence, the standard deviation of the chemical shift measurements obtained "after" the least-squares fit is reduced (Eadie et al., *Statistical Methods in Experimental Physics*, North-Holland, N.Y. (1982), which is hereby incorporated by reference in its entirety) by a factor $1/\sqrt{n}$ in GFT NMR. For simplicity, it is assumed that the n peaks which contribute to the calculation of a given shift exhibit the same line widths (see descriptions of FIGS. 19–20).

In GFT NMR spectroscopy, the chemical shift evolution periods spanning a given multidimensional subspace of an FT NMR experiment are "jointly" sampled (FIG. 1). Thereby, the dimensionality N of an FT NMR spectrum can be adjusted to a given target dimensionality, $N_t$, by combined sampling of K+1 chemical shifts $\Omega_0, \Omega_1, \ldots \Omega_K$ encoded in K+1 indirect dimensions of the ND FT NMR experiment (K=N−N$_t$). Assuming that $\Omega_0$ is detected in quadrature (Ernst et al., *Principles of Nuclear Magnetic Resonance in One and Two Dimensions*, Clarendon, Oxford (1987), which is hereby incorporated by reference in its entirety) and that the setting of the phases $\phi_j$ of the radiofrequency pulses exciting the spins of dimensions (j=1 ... K) ensures cosine modulation, the transfer amplitude (Ernst et al., *Principles of Nuclear Magnetic Resonance in One and Two Dimensions*, Clarendon, Oxford (1987), which is hereby incorporated by reference in its entirety) of the $N_tD$ experiment is proportional to $$e^{i\Omega_0 t} \cdot \prod_{j=1}^{K} \cos(\Omega_j t).$$

Figure 2:
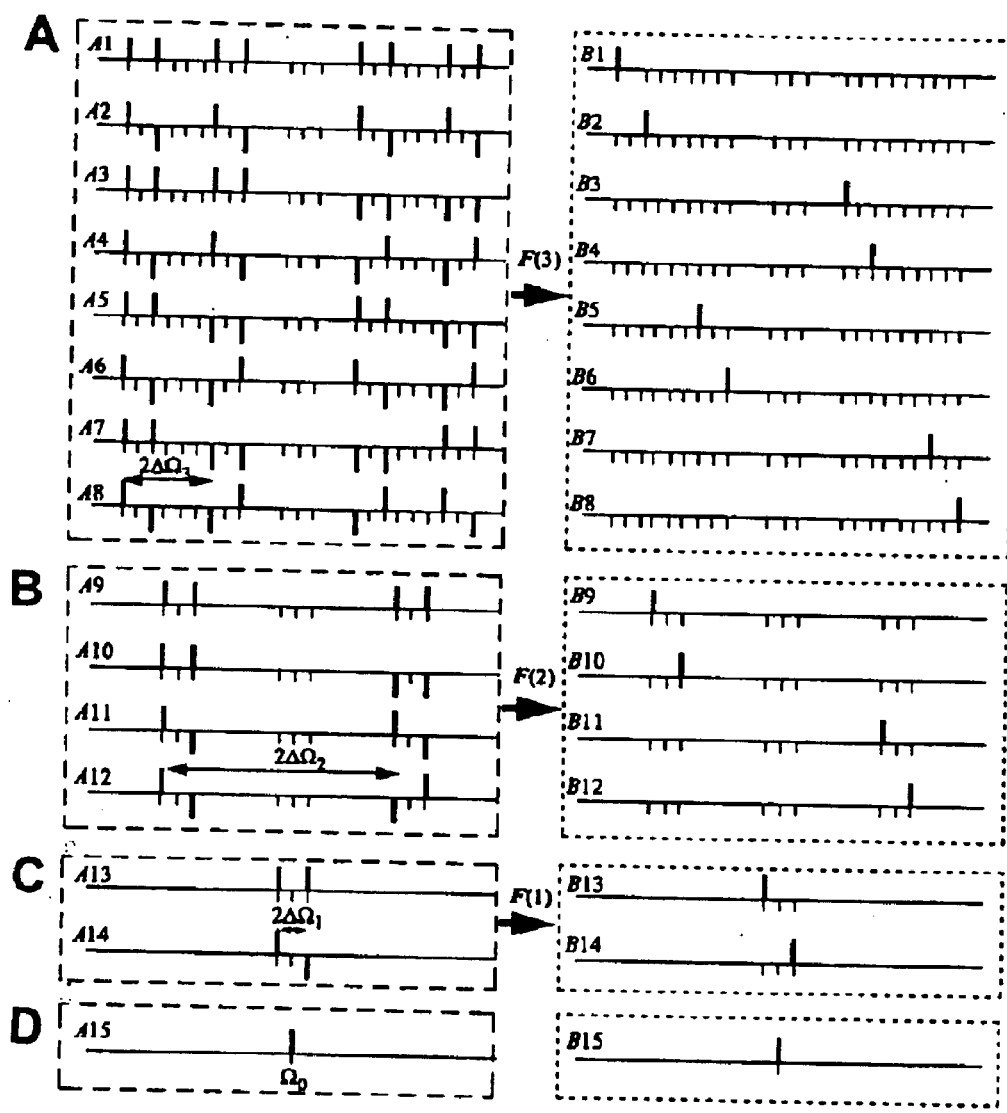
FIGS. 2A–D show a stick diagram exemplifying the formation of chemical shift multiplets (on the left) for K=3 and phase-sensitively edited multiplet components (on the right) in the frequency domain.

The resulting peak centered around $\Omega_0$ contains $2^K$ components and is designated a "chemical shift multiplet" (FIG. 2).

A shift of $\phi_j$ by 90° yields a $\sin(\Omega_j t)$ instead of a $\cos(\Omega_j t)$ modulation, (Ernst et al., *Principles of Nuclear Magnetic Resonance in One and Two Dimensions*, Clarendon, Oxford (1987), which is hereby incorporated by reference in its entirety), and $2^K$ $N_tD$ spectra are recorded if all phases $\phi k$ are systematically varied between 0° and 90° (FIG. 1). In turn, a linear combination of these $2^K$ spectra allows for the editing of the chemical shift multiplet components (FIG. 2).

For brevity, $c_j = \cos(\Omega_j \cdot t)$, $s_j = \sin(\Omega_j \cdot t)$, and $e^{i\Omega_j t} = e^{ij}$ are defined, so that $$e^{ij} = c_j + i \cdot s_j = [1 i] \cdot \begin{bmatrix} c_j \\ s_j \end{bmatrix}.$$

With K=1, one obtains for the time evolution of the two shift multiplet components encoding sum and difference of $\Omega_0$ and $\Omega_1$.

$$\begin{bmatrix} e^{j1} \\ e^{-i1} \end{bmatrix} \otimes e^{j0} = e^{i0} = \begin{bmatrix} e^{i1} \cdot e^{i1} \\ e^{-i1} \cdot e^{i0} \end{bmatrix}$$

$$= \begin{bmatrix} [1 i] \otimes [1 i] \\ [1 -i] \otimes [1 i] \end{bmatrix} \cdot \left[ \begin{bmatrix} c_1 \\ s_1 \end{bmatrix} \otimes \begin{bmatrix} c_0 \\ s_0 \end{bmatrix} \right]$$

$$= \left[ \begin{bmatrix} 1 i \\ 1 -i \end{bmatrix} \otimes [1 i] \right] \cdot \left[ \begin{bmatrix} c_1 \\ s_1 \end{bmatrix} \otimes \begin{bmatrix} c_0 \\ s_0 \end{bmatrix} \right]$$

Accordingly, one obtains with K=2 for three chemical shifts $\Omega_0$, $\Omega_1$, and $\Omega_2$:

$$\begin{bmatrix} e^{i2} \\ e^{-i2} \end{bmatrix} \otimes \begin{bmatrix} e^{i1} \\ e^{-i1} \end{bmatrix} \otimes$$

$$e^{io} = \left[ \begin{bmatrix} 1 i \\ 1 -i \end{bmatrix} \otimes \begin{bmatrix} 1 i \\ 1 -i \end{bmatrix} \otimes [1 i] \right] \cdot \left[ \begin{bmatrix} c_2 \\ s_2 \end{bmatrix} \otimes \begin{bmatrix} c_1 \\ s_1 \end{bmatrix} \otimes \begin{bmatrix} c_0 \\ s_0 \end{bmatrix} \right],$$

and, in general, for K+1 chemical shifts $\Omega_0, \Omega_1, \ldots \Omega_K$:

$$\begin{bmatrix} e^{iK} \\ e^{-iK} \end{bmatrix} \otimes \ldots \otimes \begin{bmatrix} e^{i1} \\ e^{-i1} \end{bmatrix} \otimes$$

$$e^{io} = \left[ \begin{bmatrix} 1 i \\ 1 -i \end{bmatrix} \otimes \ldots \otimes \begin{bmatrix} 1 i \\ 1 -i \end{bmatrix} \otimes [1 i] \right] \cdot \left[ \begin{bmatrix} c_K \\ s_K \end{bmatrix} \otimes \ldots \otimes \begin{bmatrix} c_1 \\ s_1 \end{bmatrix} \otimes \begin{bmatrix} c_0 \\ s_0 \end{bmatrix} \right]$$

The $2^K$ dimensional complex vector on the left side of the equation is proportional to the vector $\hat{T}_c(K)$ comprising the desired edited spectra with the individual components of the chemical shift multiplets, that is, $$\hat{T}_c(K) \sim \begin{bmatrix} e^{iK} \\ e^{-iK} \end{bmatrix} \otimes \ldots \otimes \begin{bmatrix} e^{i1} \\ e^{-i1} \end{bmatrix} \otimes e^{io}$$

The $2^{K+1}$ dimensional real vector of the $2^{K+1}$ trigonometric modulations on the right side of the equation is proportional to the vector containing the spectra with the chemical shift multiplets in the real, Sjr, and imaginary parts, Sji, of the $2^K$ $N_tD$ spectra (J=1 ... $2^K$). Hence, with $\hat{S}(K) = [S_{1r}, S_{1i}, S_{2r}, S_{2i} \ldots S_{2^K r}, S_{2^K i}]^T$, $$\hat{S}(K) \sim \begin{bmatrix} c_K \\ s_K \end{bmatrix} \otimes \ldots \otimes \begin{bmatrix} c_1 \\ s_1 \end{bmatrix} \otimes \begin{bmatrix} c_0 \\ s_0 \end{bmatrix}$$

For the $2^K \times 2^{K+1}$ complex G-matrix, which transforms $\hat{S}(K)$ into $\hat{T}(K)$ according to the following equation (1):

$$\hat{T}_c(K) 32 \; \hat{G}_c(K) 19 \; \hat{S}(K) \tag{1}$$

one then obtains $$G_c(K) = \left[\begin{bmatrix} 1 & i \\ 1 & -i \end{bmatrix} \otimes \ldots \otimes \begin{bmatrix} 1 & i \\ 1 & -i \end{bmatrix} \otimes [1\ i]\right]$$

Alternatively, the multiplet components may be edited in the frequency domain (FIG. 2). The spectra of $\hat{S}(K)$ are Fourier transformed and a zero-order phase correction of $n \cdot 90°$ is applied, depending on the number n of chemical shift sine modulations (see Example 1). The resulting real parts contain purely absorptive chemical shift multiplets and form the $2^K$ dimensional real vector $\hat{A}(K)$. Their linear combination yields the edited spectra contained in the $2^K$ dimensional real vector according to the following equation (2):

$$\hat{B}(K) = \hat{F}(K) \cdot \hat{A}(K) \quad (2)$$

Hence, $\hat{B}(K)$ represents spectra which contain the edited $2^K$ individual multiplet components at $\Omega_0 \pm \Omega_1 \pm \ldots \Omega_K$ encoding the desired K+1 chemical shifts. $\hat{F}(K)$ can be readily obtained from $\hat{F}(K-1)$ by tensor product formation using the relation $\hat{F}(K) = \hat{F}(K-1) \otimes \hat{F}(1)$, with $$F(1) = \begin{bmatrix} 1 & 1 \\ 1 & -1 \end{bmatrix}$$

for details and the relation between F and the G-matrix see Example 1).

Figure 3:
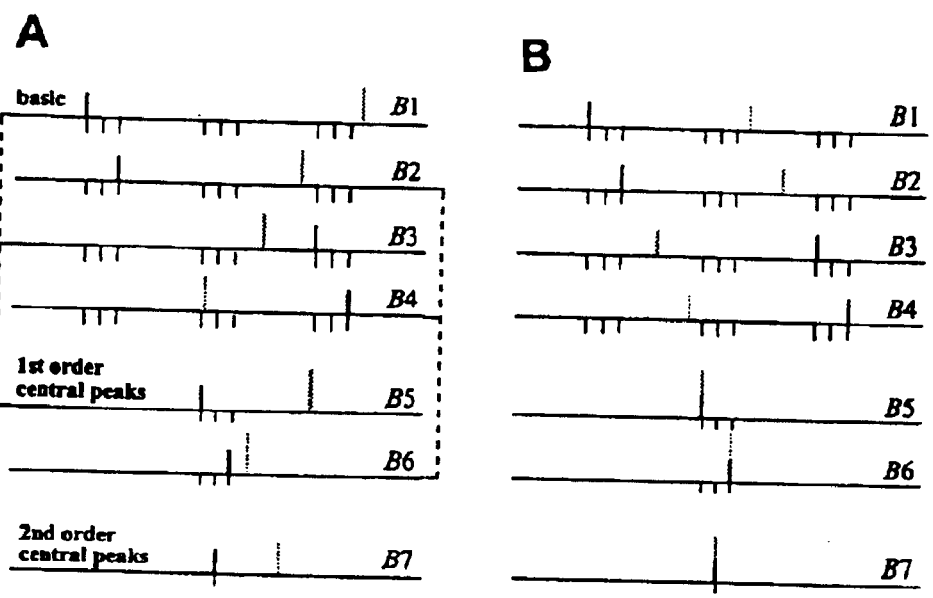
FIGS. 3A–B illustrate the "bottom-up" identification of the peaks forming a chemical shift multiplet in GFT NMR, provided that three indirect dimensions of a FT NMR experiment are jointly sampled (FIG. 1; K=2).

The $2^K$ spectra of $\hat{T}_c(K)$ and $\hat{B}(K)$ are designated "basic spectra". Additional information is required to unambiguously derive all shift correlations of the parent ND experiment (which resolves degeneracy in up to N−1 dimensions) if two multiplets exhibit degenerate chemical shifts in all of the "conventionally" sampled $N_t$−1 dimensions. The acquisition of peaks defining the centers of the chemical shift splittings ("central peaks") at the frequencies $\Omega_0 + \Omega_1 \pm \ldots \pm \Omega_{K-1}, \Omega_0 \pm \Omega_1 \pm \ldots \Omega_{K-2}, \ldots, \Omega_0 \pm \Omega_1$, and $\Omega_0$ is then needed for identifying the components forming a given multiplet (FIG. 3A). Such "central peak acquisition" has been introduced in the framework of the reduced-dimensionality NMR approach (Szyperski et al., *Proc. Natl. Acad. Sci. USA*, 99:8009–8014 (2002); Szyperski et al. *J. Biomol. NMR.* 3:127–132 (1993); Szyperski et al., *J. Am. Chem. Soc.* 115:9307–9308 (1993); Szyperski et al., *J. Magn. Reson. B* 105:188–191 (1994); Brutscher et al., *J. Magn. Reson. B* 105:77–82 (1994); Szyperski et al., *J. Magn. Reson. B* 108:197–203 (1995); Brutscher et al., *J. Magn. Reson. B* 109:238–242 (1995); Szyperski et al., *J. Am. Chem. Soc.* 118:8146–8147 (1996); Bracken et al., *J. Biomol. NMR* 9:94–100 (1997); Szyperski et al., *J. Biomol NMR*, 11:387–405 (1998); Astrof et al., *J. Magn. Reson.* 152:303–307 (2001); Xia et al., *J. Biomol. NMR* 24:41–40 (2002), which are hereby incorporated by reference in their entirety). The shift correlations of the ND spectrum can be obtained by "bottom-up" identification of the shift multiplets. This procedure essentially groups the peaks of the basic spectra into sets each belonging to one multiplet (FIG. 3). Because the basic peaks of two spin systems can be grouped even if central peaks overlap (FIG. 3B), this approach ensures that all correlations of the ND experiment are retained. GFT NMR (FIG. 1) thus requires one to record a total of $$p = \sum_{k=0}^{K} 2^k = 2^{K+1} - 1$$

$N_tD$ spectra, including $2^K$ basic spectra and $2^K-1$ central peak spectra. The p data sets constitute an "$(N,N_t)D$ GFT NMR experiment", and central peaks arising from omission of m chemical shifts are denoted to be of m-th order. For practical purposes, it is important to note that all components of a given multiplet have quite similar intensities since they are generated by multiple sine or cosine modulation of the transfer amplitude. Usually this does not hold for two peaks belonging to two different spin systems (FIG. 3A), because the nuclear spin relaxation times determining the peak intensities vary from spin system to spin system. Hence, inspection of peak intensities greatly facilitates the grouping of the peaks.

The joint sampling of several indirect dimensions reduces the minimal measurement time, $T_m$, of an $(N,N_t)D$ GFT NMR experiment when compared with the parent ND FT experiment. The K+1 dimensions of an FT NMR spectrum exhibiting the spectral widths $SW_0, SW_1, \ldots, SW_K$ are sampled with $n_0, n_1, \ldots n_K$ complex points and yield maximal evolution times of $t_{0,max}, t_{1,max}, \ldots t_{K,max}$. In the $(N,N_t)D$ GFT NMR experiment, the same maximal evolution times of the parent ND experiment can be realized by appropriate scaling of increments. (Szyperski et al. *J. Biomol. NMR.* 3:127–132 (1993); Szyperski et al., *J. Magn. Reson. B* 105:188–191 (1994), which are hereby incorporated by reference in their entirety). The acquisition of both cosine and sine modulated spectra for all jointly sampled chemical shifts (equation 1) corresponds to their phase-sensitive acquisition (Brutscher et al., *J. Magn. Reson. B* 109:238–242 (1995), which is hereby incorporated by reference in its entirety) and allows one to place the rf carrier positions in the center of the spectral ranges. Hence, the spectral width required for combined sampling is given by $$SW = \sum_{j=0}^{K} \kappa_j \cdot SW_j,$$

where $\kappa_j$ represents the factor to scale (Szyperski et al. *J. Am. Chem. Soc.* 115:9307–9308 (1993); Szyperski et al., *J. Magn. Reson. B* 105:188–191 (1994), which are hereby incorporated by reference in their entirety) the sampling increments of the jth dimension to adjust maximal evolution times. If the same maximal evolution time is chosen for all dimensions and assuming, for simplicity, that delayed acquisition starts $$\text{at } 1/SW_j, n = \sum_{j=0}^{K} n_j$$

complex points are required to sample the resulting single dimension [if acquisition starts at t=0, one obtains that $$n = \left(\sum_{j=0}^{K} n_j\right) - K].$$

The ratio $\epsilon$ of the minimal measurement time of an FT NMR experiment, $T_m(FT)$, and the corresponding GFT NMR experiment, $T_m(GFT)$, is then given by the number of FIDs that are required to sample the K+1 FT NMR dimensions divided by p times the number of FIDs required to sample the resulting single dimension:

$$\varepsilon = \frac{T_m(FT)}{T_m(GFT)} = (2^K/(2^{K+1}-1)) \cdot \left(\prod_{j=0}^{K} n_j\right) / \left(\sum_{j=0}^{K} n_j\right) \quad (3)$$

This ratio scales with the product of the number of points over the corresponding sum and, thus, predicts large reductions in $T_m$ (see Table 1 in Example 3; different ways to implement central peak acquisition as well as the impact of a particular implementation on $\varepsilon$ are described in Examples 2 and 3). (The GFT NMR scheme can be generalized by its M-fold application. Since this would involve M different G-matrices, such an experiment could be designated a $G^M$FT NMR experiment. For example, two groups of dimensions can be identified with each group being combined to a single dimension. First an (N,N')D experiment is devised in which dimensions 1,2 . . . i are jointly sampled. Subsequently, the dimensionality of this experiment is to reduced to an (N,N$_t$) experiment by jointly sampling dimensions i+1, i+2, . . . K+2. For M projection steps, each invoking different sets of dimensions combined to a single one, the total reduction in minimal measurement time is then given by $$\varepsilon^{tot} = \prod_{j=1}^{M} \varepsilon_j,$$

where $\varepsilon_j$ is the reduction due to the j-th projection (equation 3)). The S/N of each of the $2^K$ components in the basic spectra is reduced by $(1/\sqrt{2})^K$ compared to the single peak in FT NMR. This is because each chemical shift splitting reduces the S/N by a factor of 2 relative to the FT NMR spectrum, while a factor of $\sqrt{2}$ is gained, because frequency discrimination is not associated with a FT (see FIG. 2: both cosine and sine modulated parts contribute equally to the signal intensity in the edited spectra) (The S/N ratio of FT NMR can be recovered by symmetrization about central peaks as described for reduced-dimensionality NMR (Szyperski et al., *J. Magn. Reson.* B 108:197–203 (1995), which is hereby incorporated by reference in its entirety) using the "bottom up" strategy employed for identification of shift multiplets (FIG. 3). Note that a reduced sensitivity is not relevant in the sampling limited regime.)

GFT NMR spectroscopy combines (i) multiple phase sensitive RD NMR, (ii) multiple 'bottom-up' central peak detection, and (iii) (time domain) editing of the components of the chemical shift multiplets. The resulting formalism embodies a flexible, generally applicable NMR data acquisition scheme. Provided that m=K+1 chemical shift evolution periods of an ND experiments are jointly sampled in a single indirect "GFT dimension", p=$2^m$−1 different (N−K)D spectra represent the GFT NMR experiment containing the information of the parent ND experiment. Hence, such a set of p spectra is named an (N,N−K)D GFT NMR experiment.

Thus, the present invention relates to a method of conducting a (N,N−K) dimensional (D) G-matrix Fourier transformation (GFT) nuclear magnetic resonance (NMR) experiment, where N is the dimensionality of an N-dimensional (ND) Fourier transformation (FT) NMR experiment and K is the desired reduction in dimensionality relative to N. The method involves providing a sample and applying radiofrequency pulses for the ND FT NMR experiment to the sample. Then, m indirect chemical shift evolution periods of the ND FT NMR experiment are selected, where m equals K+1, and the m indirect chemical shift evolution periods are jointly sampled. Next, NMR signals detected in a direct dimension are independently cosine and sine modulated to generate (N−K)D basic NMR spectra containing frequency domain signals with $2^K$ chemical shift multiplet components, thereby enabling phase-sensitive sampling of all jointly sampled m indirect chemical shift evolution periods. Finally, the (N−K) D basic NMR spectra are transformed into (N−K) D phase-sensitively edited basic NMR spectra, where the $2^K$ chemical shift multiplet components of the (N−K) D basic NMR spectra are edited to yield (N−K) D phase-sensitively edited basic NMR spectra having individual chemical shift multiplet components.

As described earlier, the (N−K) D basic NMR spectra can be transformed into (N−K) D phase-sensitively edited basic NMR spectra by applying a G-matrix defined as $$\hat{G}(K) = \left[\begin{bmatrix} 1 & i \\ 1 & -i \end{bmatrix} \otimes \cdots \otimes \begin{bmatrix} 1 & i \\ 1 & -i \end{bmatrix} \otimes [1\ i]\right],$$

where $i=\sqrt{-1}$, under conditions effective to edit the chemical shift multiplet components in the time domain. Alternatively, the transforming can be carried out by applying a F-matrix defined as $\hat{F}(K)=\hat{F}(K-1)\otimes\hat{F}(1)$, where $$\hat{F}(1) = \begin{bmatrix} 1 & 1 \\ 1 & -1 \end{bmatrix},$$

under conditions effective to edit the chemical shift multiplet components in the frequency domain.

In an alternate embodiment, the method of conducting a (N,N−K)D GFT NMR experiment can further involve selecting m' indirect chemical shift evolution periods of the (N−K)D FT NMR experiment, where m' equals K'+1. Then, the m' indirect chemical shift evolution periods are jointly sampled. Next, NMR signals detected in a direct dimension are independently cosine and sine modulated to generate (N−K−K')D basic NMR spectra containing frequency domain signals with $2^{K'}$ chemical shift multiplet components, thereby enabling phase-sensitive sampling of all jointly sampled m' indirect chemical shift evolution periods. Finally, the (N−K−K') D basic NMR spectra are transformed into (N−K−K') D phase-sensitively edited basic NMR spectra, wherein the $2^{K'}$ chemical shift multiplet components of the (N−K−K') D basic NMR spectra are edited to yield (N−K−K') D phase-sensitively edited basic NMR spectra having individual chemical shift multiplet components. The above-mentioned steps of selecting, jointly sampling, independently cosine and sine modulating, and transforming can be repeated one or more times, where m' is modified for each repetition.

In an alternate embodiment, the method of conducting a (N,N−K)D GFT NMR experiment can further involve repeating one or more times the steps of selecting, jointly sampling, independently cosine and sine modulating, and transforming, where, for each repetition, the selecting involves selecting m−j indirect chemical shift evolution periods out of the m indirect chemical shift evolution periods, wherein j ranges from 1 to K, under conditions effective to generate $2^{K-j}$ jth order central peak NMR spectra.

The method of conducting a (N,N−K)D GFT NMR experiment can also involve applying radiofrequency pulses of N-dimensional nuclear Overhauser enhancement spectroscopy (NOESY) (Ernst et al., *Principles of Nuclear Magnetic Resonance in One and Two Dimensions*, Clarendon, Oxford (1987), which is hereby incorporated by reference in its entirety). Alternatively, the method can involve applying radiofrequency pulses of N-dimensional transverse relaxation optimized spectroscopy (TROSY) (Pervushin et al., *Proc. Natl. Acad. Sci. USA*, 94:12366–12371 (1997), which is hereby incorporated by reference in its entirety). In addition, the method can involve applying radiofrequency pulses so that spin-spin couplings are measured (Ernst et al., *Principles of Nuclear Magnetic Resonance in One and Two Dimensions*, Clarendon, Oxford (1987), which is hereby incorporated by reference in its entirety). The spin-spin couplings can be residual dipolar spin-spin coupling constants (Bax, *Protein Sci.*, 12:1–16 (2003), which is hereby incorporated by reference in its entirety). The method can also involve applying radiofrequency pulses so that nuclear spin relaxation times are measured by sampling nuclear spin relaxation delays (Palmer, *Annu. Rev. Biophys. Biomol. Struct.*, 30:129–155 (2001), which is hereby incorporated by reference in its entirety). The spin relaxation delays can be further jointly sampled with chemical shift evolution periods (Ernst et al., *Principles of Nuclear Magnetic Resonance in One and Two Dimensions*, Clarendon, Oxford (1987), which is hereby incorporated by reference in its entirety). In another embodiment, the jointly sampling the m indirect chemical shift evolution periods is achieved with a single continuous acquisition (Frydman et al., *Proc. Natl. Acad. Sci., U.S.A.*, 99:15858–15862 (2002), which is hereby incorporated by reference in its entirety).

The present invention also discloses specific GFT NMR experiments and different combinations of those experiments which allows one to obtain sequential backbone chemical shift assignments for determining the secondary structure of a protein molecule and complete assignments of chemical shift values for a protein molecule including aliphatic and aromatic sidechain spin systems.

Specific GFT NMR Experiments

Figure 4:
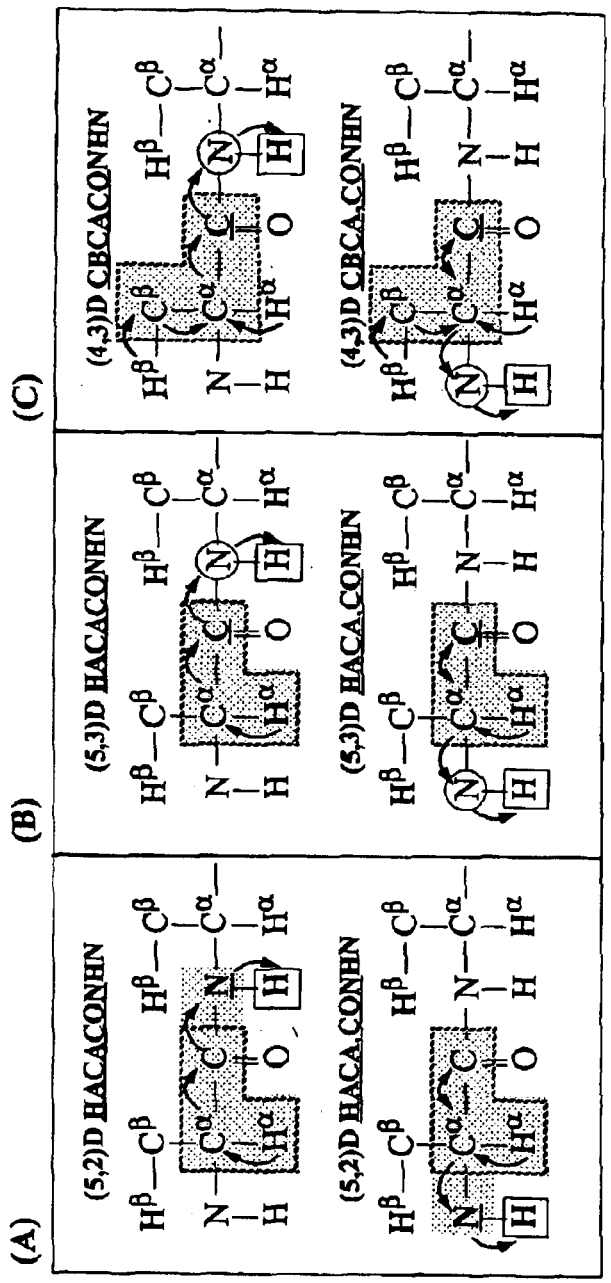
FIGS. 4A–C illustrate magnetization transfer pathways of the following GFT NMR experiments: (5,2)D HACACONHN and (5,2)D HACA,CONHN (FIG. 4A); (5,3)D HACACONHN and (5,3)D HACA,CO NHN (FIG. 4B); and (4,3)D CBCACONHN and (4,3)D CBCA,CO NHN (FIG. 4C). INEPT-type polarization transfers (Cavanagh et al., *Protein NMR spectroscopy*, Wiley, New York (1996), which is hereby incorporated by reference in its entirety) are indicated by arrows, and Löhr's "en passant" frequency labeling module is indicated by a double arrow. The nuclei for which the chemical shift is detected in quadrature are shown in bold and are underlined. The nuclei with a grey background are simultaneously sampled in the GFT NMR dimension, and the chemical shifts of the boxed nuclei are used to establish sequential connectivities.

The present invention discloses the following six (N,N−K)D GFT NMR experiments for the assignment of polypeptide backbone and $^{13}C^{\beta}$ resonance: (i) with K=3, (5,2)D [HACACONHN] GFT NMR experiment and (5,2)D [HACA,CONHN] GFT NMR experiment for sequential assignment, (ii) with K=2, (5,3)D [HACA,CONHN GFT NMR experiment and (5,3)D [HACACONHN] GFT NMR experiment, where, in contrast to the (5,2)D experiments in (i), the $^{15}N$ chemical shifts evolve separately, and (iii) with K=1, (4,3)D [CBCACONHN] GFT NMR experiment and (4,3)D [CBCA,CONHN] GFT NMR. The underlined letters indicate which chemical shifts that are jointly sampled. After G-matrix transformation, one obtains $2^{3+1}-1=15$ 2D planes for the (5,2)D experiments (K=3), seven 3D spectra for the (5,3)D experiments (K=2) and three 3D spectra for the (4,3)D experiments (K=1). FIG. 4 illustrates the magnetization transfer pathways of the specific embodiments of these six GFT NMR experiments. (5,2)D [HACA, CONHN]/(5,2)D [HACACONHN] GFT NMR experiments and (5,3)D [HACA,CONH]/(5,3)D [HACACONHN] GFT NMR experiments correlate the backbone amide $^{15}N$ and $^1HN$ chemical shifts of residue i with the $^{13}C'$, $^{13}C^{\alpha}$ and $^1H^{\alpha}$ chemical shifts of residue i–1 and i, respectively, via one-bond scalar couplings (FIGS. 4A-B). In addition, the often smaller two-bond scalar couplings between the $^{15}N_i$ and $^{13}C^{\alpha}_{i-1}$ may yield sequential connectivities in the HACA, CONHN experiments. The comma separating "CA" from "CO" indicates that the intraresidue $^{13}C'$ chemical shift is obtained by creating two-spin coherence involving $^{13}C'$ and $^{13}C'$ during the intraresidue polarization transfer from $^{13}C^{\alpha}$ to $^{15}N$ (Löhr et al., *J. Biomol. NMR* 6:189–197 (1995), which is hereby incorporated by reference in its reference). (4,3)D [CBCACONHN] and (4,3)D [CBCA,CONHN] GFT NMR experiments correlate the backbone amide $^{15}N$ and $^1HN$ chemical shifts of residue i with the $^{13}C'$, $^{13}C^{\alpha}$ and $^{13}C^{\beta}$ chemical shifts of residue i–1 and i, respectively, via one-bond scalar couplings (FIG. 4C), and the often smaller two-bond scalar couplings between the $^{15}N_i$ and $^{13}C^{\alpha}_{i-1}$ may yield additional sequential connectivities in (4,3)D [CBCA,CONHN].

Thus, the present invention relates to the above method of conducting a (N,N−K)D GFT NMR experiment, where N equals 5 and K equals 3 to conduct a (5,2)D [HACACONHN] GFT NMR experiment. In this method, (a) the sample is a protein molecule having two consecutive amino acid residues, i–1 and i, and the chemical shift values for the following nuclei are measured: (1) an α-proton of amino acid residue i–1, $^1H^{\alpha}_{i-1}$; (2) an α-carbon of amino acid residue i–1, $^{13}C^{\alpha}_{i-1}$; (3) a polypeptide backbone carbonyl carbon of amino acid residue i–1, $^{13}C'_{i-1}$; (4) a polypeptide backbone amide nitrogen of amino acid residue i, $^{15}N_i$; and (5) a polypeptide backbone amide proton of amino acid residue i, $^1H^N_i$, (b) the selecting involves selecting 4 chemical shift evolution periods of the 5D FT NMR experiment, $^1H^{\alpha}_{i-1}$, $^{13}C^{\alpha}_{i-1}$, $^{13}C'_{i-1}$, and $^{15}N_i$, and (c) the jointly sampling involves jointly sampling the 4 chemical shift evolution periods in an indirect time domain dimension, $t_1(^1H^{\alpha}_{i-1}, ^{13}C^{\alpha}_{i-1}, ^{13}C'_{i-1}, ^{15}N_i)$. One specific embodiment of this method ((5,2)D HACACONHN) involves applying radiofrequency pulses for a 5D FT NMR experiment according to the scheme shown in FIG. 6.

The present invention also relates to the above method of conducting a (N,N−K)D GFT NMR experiment, where N equals 5 and K equals 3 to conduct a (5,2)D [HACA, CONHN] GFT NMR experiment. In this method, (a) the sample is a protein molecule having an amino acid residue, i, and the chemical shift values for the following nuclei are measured: (1) an α-proton of amino acid residue i–1, $^1H^{\alpha}_{i-1}$; (2) an α-carbon of amino acid residue i–1, $^{13}C^{\alpha}_{i-1}$; (3) a polypeptide backbone carbonyl carbon of amino acid residue i–1, $^{13}C'_{i-1}$; (4) a polypeptide backbone amide nitrogen of amino acid residue i–1, $^{15}N_{i-1}$; and (5) a polypeptide backbone amide proton of amino acid residue i–1, $^1H^N_{i-1}$, (b) the selecting involves selecting 4 chemical shift evolution periods of the 5D FT NMR experiment, $^1H^{\alpha}_{i-1}$, $^{13}C^{\alpha}_{i-1}$, $^{13}C'_{i-1}$, and $^{15}N_{i-1}$, and (c) the jointly sampling involves jointly sampling the 4 chemical shift evolution periods in an indirect time domain dimension, $t_1(^1H^{\alpha}_{i-1}, ^{13}C^{\alpha}_{i-1}, ^{13}C'_{i-1}, ^{15}N_{i-1})$. One specific embodiment of this method ((5,2)D HACA,CONHN) involves applying radiofrequency pulses for a 5D FT NMR experiment according to the scheme shown in FIG. 7A.

Another aspect of the present invention relates to the above method of conducting a (N,N−K)D GFT NMR experiment, where N equals 5 and K equals 2 to conduct a (5,3)D [HACACONHN] GFT NMR experiment. In this method, (a) the sample is a protein molecule having two consecutive amino acid residues, i–1 and i, and the chemical shift values for the following nuclei are measured: (1) an α-proton of amino acid residue i–1, $^1H^{\alpha}_{i-1}$; (2) an α-carbon of amino acid residue i–1, $^{13}C^{\alpha}_{i-1}$; (3) a polypeptide backbone carbonyl carbon of amino acid residue i–1, $^{13}C'_{i-1}$; (4) a polypeptide backbone amide nitrogen of amino acid residue i, $^{15}N_i$; and (5) a polypeptide backbone amide proton of amino acid residue i, $^1H^N_i$, (b) the selecting involves selecting 3 chemical shift evolution periods of the 5D FT NMR experiment, $^1H^{\alpha}_{i-1}$, $^{13}C^{\alpha}_{i-1}$, and $^{13}C'_{i-1}$, and (c) the jointly sampling involves jointly sampling the 3 chemical shift evolution periods in an indirect time domain dimension, $t_1(^1H^\alpha_{i-1}, ^{13}C^\alpha_{i-1}, ^{13}C'_{i-1})$.

Yet another aspect of the present invention relates to the above method of conducting a (N,N−K)D GFT NMR experiment, where N equals 5 and K equals 2 to conduct a (5,3)D [HACA,CONHN] GFT NMR experiment. In this method, (a) the sample is a protein molecule having an amino acid residue, i−1, and the chemical shift values for the following nuclei are measured: (1) an α-proton of amino acid residue i−1, $^1H^\alpha_{i-1}$; (2) an α-carbon of amino acid residue i−1, $^{13}C^\alpha_{i-1}$; (3) a polypeptide backbone carbonyl carbon of amino acid residue i−1, $^{13}C'_{i-1}$; (4) a polypeptide backbone amide nitrogen of amino acid residue i−1, $^{15}N_{i-1}$; and (5) a polypeptide backbone amide proton of amino acid residue i−1, $^1H^N_i$, (b) the selecting involves selecting 3 chemical shift evolution periods of the 5D FT NMR experiment, $^1H^\alpha_{i-1}$, $^{13}C^\alpha_{i-1}$, and $^{13}C'_{i-1}$, and (c) the jointly sampling involves jointly sampling the 3 chemical shift evolution periods in an indirect time domain dimension, $t_1(^1H^\alpha_{i-1}, ^{13}C^\alpha_{i-1}, ^{13}C'_{i-1})$.

Figure 8:
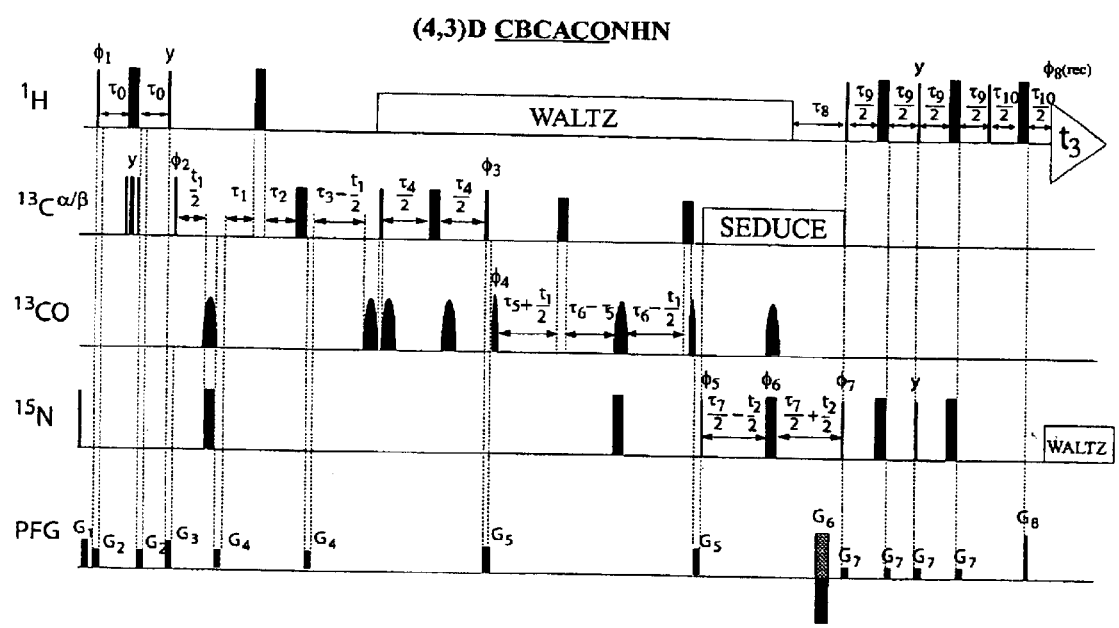
FIG. 8 depicts the experimental scheme for recording the (4,3)D CBCACONHN GFT NMR experiment. Rectangular 90° and 180° pulses are indicated by filled and open vertical bars or shaped pulses, respectively, and phases are indicated above the pulses. Where no radio-frequency (rf) phase is marked, the pulse is applied along x. The high power 90° pulse lengths were: 5.8 µs for $^1$H and 15.4 µs for $^{13}$C, and 38 µs for $^{15}$N. Pulses on $^{13}$C prior to $t_1$($^{13}$C) are applied at high power. Subsequently, the 90° and 180° pulse lengths applied for $^{13}$C$^{\alpha/\beta}$ are adjusted to 47.5 µs is and 42.5 µs, respectively, to minimize perturbation of $^{13}$CO spins. The width of the 90° pulse applied on $^{13}$CO pulse is 52 µs and the corresponding 180° pulses are applied with same power. A SEDUCE (Cavanagh et al., *Protein NMR spectroscopy*, Wiley, New York (1996), which is hereby incorporated by reference in its entirety) 180° pulse with a length of 200 µs is used to decouple $^{13}$CO during $t_1$ and $\tau_4$. The length of the spin-lock purge pulses SL$_x$ and SL$_y$ are 1.2 ms and 0.6 ms, respectively. WALTZ16 (Cavanagh et al., *Protein NMR spectroscopy*, Wiley, New York (1996), which is hereby incorporated by reference in its entirety) is employed to decouple $^1$H (rf field strength=9.2 kHz) during the heteronuclear magnetization transfers as well as to decouple $^{15}$N during acquisition (rf=1.78 kHz) during acquisition. The SEDUCE sequence is used for decoupling of $^{13}$C$^\alpha$ during $^{15}$N evolution period (rf=1.0 kHz). The $^1$H rf carrier is placed at the water line at 4.78 ppm. Initially, the $^{13}$C and $^{15}$N rf carriers are set to 41.3 ppm and 119.3 ppm, respectively. The $^{13}$C carrier is set to 56 ppm during the second $\tau_4/2$ delay. The $^{13}$C' carrier position is set to 174.3 ppm. The duration and strengths of the pulsed z-field gradients (PFGs) are: G1 (1 ms, 24 G/cm); G2 (100 µs, 16 G/cm); G3 (250 µs, 29.5 G/cm); G4 (250 µs, 30 G/cm); G5 (1.5 ms, 20 G/cm); G6 (1.25 ms, 30 G/cm); G7 (500 µs, 8 G/cm); G8 (125 µs, 29.5 G/cm). All PFG pulses are of rectangular shape. The delays are: $\tau_1$=800 µs, $\tau_2$=3.1 ms, $\tau_3$=3.6 ms, $\tau_4$32 7.2 ms, $\tau_5$=4.4 ms, $\tau_6$=24.8 ms, $\tau_7$=24.8 ms, $\tau_8$=5.5 ms, $\tau_9$=4.6 ms, $\tau_{10}$=1.0 ms. Phase cycling for artefact suppression: $\phi_1$=x; $\phi_2$=x,x,-x,-x; $\phi_3$=x, -x; $\phi_4$=x, -x; $\phi_5$=-x; $\phi_6$=x, x, -x, -x; $\phi_7$=x; $\phi_8$(receiver)=x, -x, -x, x. The sensitivity enhancement scheme of Kay et al., *J. Am. Chem. Soc.* 114:10663–10665 (1992), which is hereby incorporated by reference in its entirety, is employed, i.e., the sign of $G_6$ is inverted in concert with a 180° shift of $\phi_7$ Quadrature detection in $t_1$($^{13}$C') is accomplished by altering the phase $\phi_4$ according to States-TPPI. GFT NMR super phase-cycle for acquisition of the two basic spectra: $\phi_2$=x,y (the G-matrix required for time domain editing is shown in equation 17 of Example 5). For first order central peak detection an HNNCO pulse scheme (Cavanagh et al., *Protein NMR spectroscopy*, Wiley, New York (1996), which is hereby incorporated by reference in its entirety) is employed.

A further aspect of the present invention relates to the above method of conducting a (N,N−K)D GFT NMR experiment, where N equals 4 and K equals 1 to conduct a (4,3)D [CBCACONHN] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$; (3) a polypeptide backbone amide nitrogen of amino acid residue i, $^{15}N_i$; and (4) a polypeptide backbone amide proton of amino acid residue i, $^1H^N_i$, (b) the selecting involves selecting 2 chemical shift evolution periods of the 4D FT NMR experiment, $^{13}C^{\alpha/\beta}_{i-1}$ and $^{13}C'_{i-1}$, and (c) the jointly sampling involves jointly sampling the 2 chemical shift evolution periods in an indirect time domain dimension, $t_1(^{13}C^{\alpha/\beta}_{i-1}, ^{13}C'_{i-1})$. One specific embodiment of this method ((4,3)D CBCACONHN) involves applying radiofrequency pulses for a 4D FT NMR experiment according to the scheme shown in FIG. 8.

The present invention also relates to the above method of conducting a (N,N−K)D GFT NMR experiment, where N equals 4 and K equals 1 to conduct a (4,3)D [CBCA,CONHN] GFT NMR experiment. In this method, (a) the sample is a protein molecule having an amino acid residue, i−1, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$; (3) a polypeptide backbone amide nitrogen of amino acid residue i−1, $^{15}N_{i-1}$; and (4) a polypeptide backbone amide proton of amino acid residue i−1, $^1H^N_{i-1}$, (b) the selecting involves selecting 2 chemical shift evolution periods of the 4D FT NMR experiment, $^{13}C^{\alpha/\beta}_{i-1}$ and $^{13}C'_{i-1}$, and (c) the jointly sampling involves jointly sampling the 2 chemical shift evolution periods in an indirect time domain dimension, $t_1(^{13}C^{\alpha/\beta}_{i-1}, ^{13}C'_{i-1})$. One specific embodiment of this method ((4,3)D CBCA,CONHN) involves applying radiofrequency pulses for a 4D FT NMR experiment according to the scheme shown in FIG. 7B.

In addition, the present invention discloses the following GFT NMR experiments for the assignment of polypeptide backbone and sidechain resonances: (i) (4,3)D [HNN CACBCA] GFT NMR experiment, (ii) (4,3)D [CBCACA(CO)NHN]/(4,3)D [HNN(CO)CACBCA] GFT NMR experiments, (iii) (5,3)D [HBHACBCACA(CO)NHN] GFT NMR experiment, (iv) (5,3)D [HCC,CH-COSY] GFT NMR experiment, (v) (5,3)D [HBCBCGCDHD] GFT NMR experiment, (vi) (4,2)D [HCCH-COSY] GFT NMR experiment, and (vii) (5,2)D [HCCCH-COSY] GFT NMR experiment. Experiment (i) and (ii)/(iii) form pairs to sequentially assign backbone $^{13}C^\alpha$ and $^{13}C^\beta$ resonances. Experiment (iii) also provides $^1H^{\alpha/\beta}$ chemical shifts. The $^{13}C^{\alpha/\beta}$ and $^1H^{\alpha/\beta}$ chemical shifts, in turn, allow one to assign more peripheral spins of the aliphatic side-chain of a given amino acid residue using experiment (iv). Experiments (v) and (vi) can be used for resonance assignments of aromatic side-chain spins. The assignment of the side-chain chemical shifts can be further supported with experiment (vii). The magnetization transfer pathways of specific embodiments of these GFT NMR experiments (i)-(vii) are depicted in FIGS. 5A-G, respectively.

Figure 9:
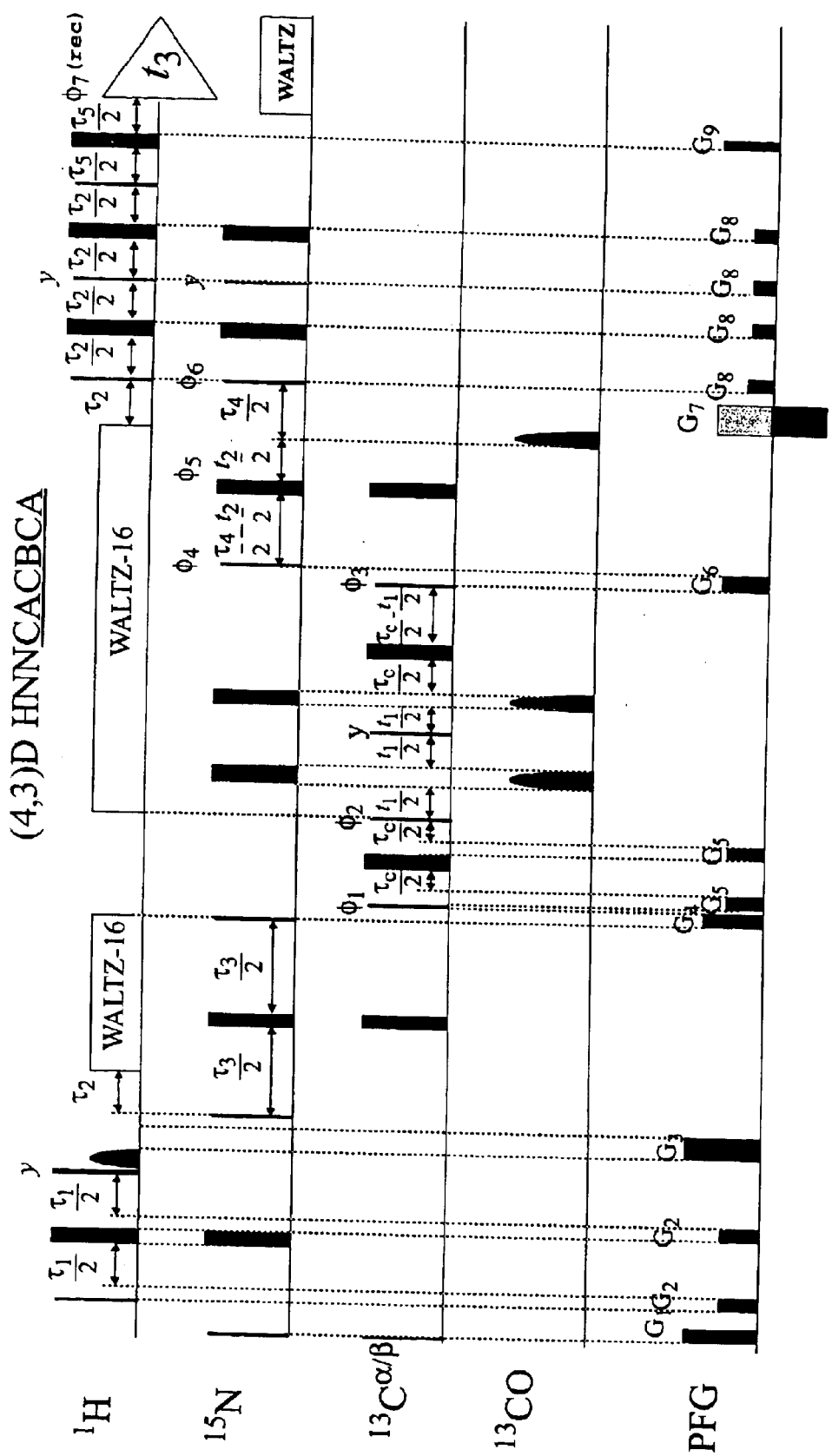
FIG. 9 depicts the experimental scheme for the (4,3)D HNNCACBCA experiment. Rectangular 90° and 180° pulses are indicated by thin and thick vertical bars, respectively, and phases are indicated above the pulses. Where no radio-frequency (rf) phase is marked, the pulse is applied along x. The high-power 90° pulse lengths were: 6.0 µs for $^1$H, 15.0 µs for $^{13}$C and 42 µs for $^{15}$N. The 90° and 180° pulse lengths applied on $^{13}$C$^{\alpha/\beta}$ are adjusted to 40 µs and 36 µs, respectively, to minimize perturbation of $^{13}$CO spins. One lobe sinc pulses of duration 65 µs were applied on $^{13}$CO with null at $^{13}$C$^\alpha$ to decouple $^{13}$CO from $^{13}$C$^\alpha$ spins during $t_1$ and from $^{15}$N spins during $t_2$. The selective 90° $^1$H pulse used to flip back the water magnetization is applied for 1.8 ms duration before the first 90° pulse on $^{13}$C$^\alpha$. WALTZ16 is employed to decouple $^1$H (rf field strength=9.2 kHz) during the heteronuclear magnetization transfers as well as to decouple of $^{15}$N (rf=1.78 kHz) during acquisition. The $^1$H rf carrier is placed at the position of the solvent line at 4.78 ppm. The $^{13}$C$^\alpha$ and $^{15}$N carriers are set to 43.0 ppm and 120.9 ppm, respectively. The $^{13}$C carrier is switched to 56 ppm during the second $t_1$ delay. The duration and strengths of the pulsed z-field gradients (PFGs) are: G1 (1.0 µs, 24 G/cm); G2 (100 µs, 16 G/cm); G3 (500 µs, 29.5 G/cm); G5 (100 µs, 16 G/cm); G4 (1.5 ms, 20 G/cm); G6(1.5 ms, 20 G/cm); G7 (1.25 ms, 30 G/cm); G8 (500 µs, 8 G/cm); G9 (125 µs, 29.5 G/cm). All PFG pulses are of rectangular shape. A recovery delay of at least 100 µs duration is inserted between a PFG pulse and an rf pulse. The delays have the following values: $\tau_1$=4.6 ms, $\tau_2$=5.4 ms, $\tau_3$=24 ms, $\tau_4$=24 ms, $\tau_5$=4.8 ms, $\tau_c$=7.0 ms. Phase cycling: $\phi_1$=x, -x; $\phi_2$=y; $\phi_3$=x,x, -x, -x; $\phi_4$=x, $\phi_5$=4(x), 4(-x); $\phi_6$=x; $\phi_7$(receiver)=x, -x, -x, x. The sensitivity enhancement scheme of Kay et al., *J. Am. Chem. Soc.* 114:10663–10665 (1992), which is hereby incorporated by reference in its entirety, is employed, i.e., the sign of G7 is inverted in concert with a 180° shift of $\phi_6$. Quadrature detection in $t_1$($^{13}$C$^\alpha$) and $t_2$($^{15}$N) is accomplished by altering the phases $\phi_3$ and $\phi_4$, respectively, according to States-TPPI. GFT-NMR super phase-cycling for recording the 2 basic spectra are: $\phi_1$=x,y; $\phi_2$=y,x.

Thus, the present invention also relates to the above method of conducting a (N,N−K)D GFT NMR experiment, where N equals 4 and K equals 1 to conduct a (4,3)D [HNN CACBCA] GFT NMR experiment. In this method, (a) the sample is a protein molecule having two consecutive amino acid residues, i−1 and i, and the chemical shift values for the following nuclei are measured: (1) α- and β-carbons of amino acid residues i and i−1, $^{13}C^{\alpha/\beta}_{i/i-1}$; (2) a polypeptide backbone amide nitrogen of amino acid residue i, $^{15}N_i$; and (3) a polypeptide backbone amide proton of amino acid residue i, $^1H^N_i$, (b) the selecting involves selecting 2 chemical shift evolution periods of the 4D FT NMR experiment, $^{13}C^{\alpha/\beta}_{i/i-1}$ and $^{13}C^\alpha_{i/i-1}$, and (c) the jointly sampling involves jointly sampling the 2 chemical shift evolution periods in an indirect time domain dimension, $t_1(^{13}C^{\alpha/\beta}_{i/i-1}, ^{13}C^\alpha_{i/i-1})$. One specific embodiment of this method ((4,3)D HNNCACBCA) involves applying radiofrequency pulses for a 4D FT NMR experiment according to the scheme shown in FIG. 9.

In an alternate embodiment, the above method can be modified, where N equals 4 and K equals 2, to conduct a (4,2)D [HNNCACBCA] GFT NMR experiment. In this method, (a) the sample is a protein molecule having two consecutive amino acid residues, i−1 and i, and the chemical shift values for the following nuclei are measured: (1) α- and β-carbons of amino acid residues i and i−1, $^{13}C^{\alpha/\beta}_{i/i-1}$; (2) a polypeptide backbone amide nitrogen of amino acid residue i, $^{15}N_i$; and (3) a polypeptide backbone amide proton of amino acid residue i, $^1H^N_i$, (b) the selecting involves selecting 3 chemical shift evolution periods of the 4D FT NMR experiment, $^{13}C^{\alpha/\beta}_{i/i-1}$, $^{13}C^\alpha_{i/i-1}$, and $^{15}N_i$, and (c) the jointly sampling involves jointly sampling the 3 chemical shift evolution periods in an indirect time domain dimension, $t_1(^{13}C^{\alpha/\beta}_{i/i-1}, ^{13}C^\alpha_{i/i-1}, ^{15}N_i)$.

Figure 10:
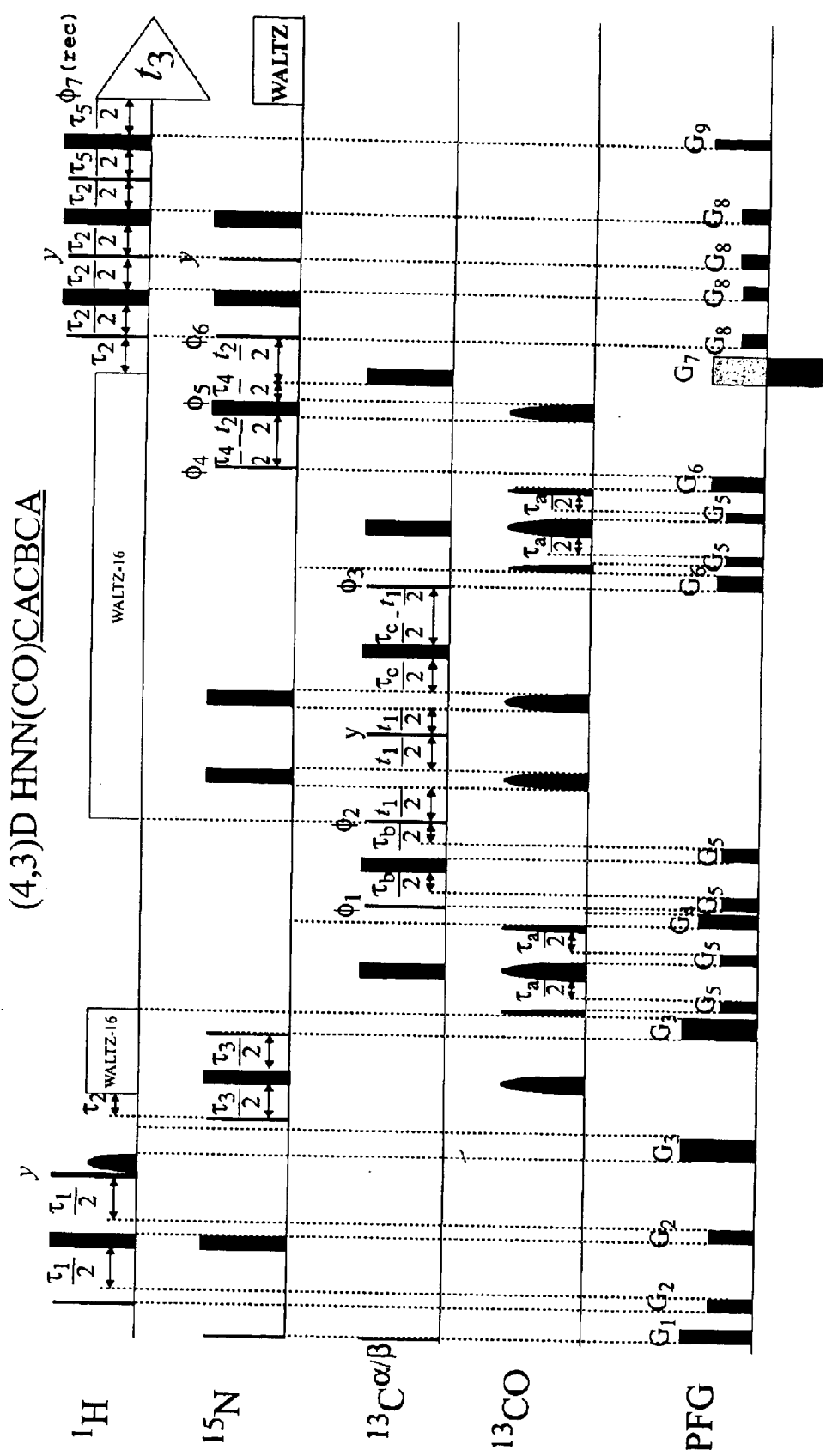
FIG. 10 depicts the experimental scheme for the (4,3)D HNN(CO)CACBCA experiment. Rectangular 90° and 180° pulses are indicated by thin and thick vertical bars, respectively, and phases are indicated above the pulses. Where no radio-frequency (rf) phase is marked, the pulse is applied along x. The high-power 90° pulse lengths were: 6.0 µs for $^1$H, 15.0 µs for $^{13}$C and 42 µs for $^{15}$N. The 90° and 180° pulse lengths applied on $^{13}$C$^{\alpha/\beta}$ are adjusted to 40 µs and 36 μs, respectively, to minimize perturbation of $^{13}CO$ spins. One lobe sinc pulses of duration 65 μs and with null at $^{13}C^\alpha$ were applied on $^{13}CO$ to decouple from $^{13}C^\alpha$ spins during $t_1$ and from $^{15}N$ spins during $t_2$. The 90° pulse lengths for the one lobe sinc pulse on $^{13}CO$ was 71 μs. The selective 90° $^1H$ pulse used to flip back the water magnetization is applied for 1.8 ms duration before the first 90° pulse on $^{13}C^\alpha$. WALTZ16 is employed to decouple $^1H$ (rf field strength=9.2 kHz) during the heteronuclear magnetization transfers as well as to decouple of $^{15}N$ (rf=1.78 kHz) during acquisition. The $^1H$ rf carrier is placed at the position of the solvent line at 4.78 ppm. The $^{13}C^\alpha$ and $^{15}N$ carriers are set to 43 ppm and 120.9 ppm, respectively. The $^{13}C$ carrier is switched to 56 ppm during the second $t_1$ delay. The duration and strengths of the pulsed z-field gradients (PFGs) are: G1 (1.0 ms, 24 G/cm); G2 (100 μs, 16 G/cm); G3 (1.0 ms, 29.5 G/cm); G4 (1.5 ms, 20 G/cm); G5 (100 μs, 16 G/cm); G6(1.5 ms, 20 G/cm); G7 (1.25 ms, 30 G/cm); G8 (500 μs, 8 G/cm); G9 (125 μs, 29.5 G/cm). All PFG pulses are of rectangular shape. A recovery delay of at least 100 μs duration is inserted between a PFG pulse and an rf pulse. The delays have the following values: $\tau_1$=4.4 ms, $\tau_2$=5.4 ms, $\tau_3$=24 ms, $\tau_4$=24 ms, $\tau_5$=4.8 ms, $\tau_a$=4.6 ms, $\tau_b$=6.8 ms, $\tau_c$=6.9 ms. Phase cycling: $\phi_1$=x, -x; $\phi_2$=y; $\phi_3$=x,x, -x, -x; $\phi_4$=x, $\phi_5$=4(x), 4(-x); $\phi_6$=x; $\phi_7$(receiver)=x, -x, -x, x. The sensitivity enhancement scheme of Kay et al., *J. Am. Chem. Soc.* 114:10663–10665 (1992), which is hereby incorporated by reference in its entirety, is employed, i.e., the sign of G7 is inverted in concert with a 180° shift of $\phi_6$ Quadrature detection in $t_1(^{13}C)$ and $t_2(^{15}N)$ is accomplished by altering the phases $\phi_3$ and $\phi_4$, respectively, according to States-TPPI. GFT-NMR super phase-cycle for recording the 2 basic spectra are: $\phi_1$=x,y; $\phi_2$=y,x.

In another alternate embodiment, the above method can be modified, where N equals 4 and K equals 1 to conduct a (4,3)D [HNN(CO)CACBCA] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone amide nitrogen of amino acid residue i, $^{15}N_i$; and (3) a polypeptide backbone amide proton of amino acid residue i, $^1H^N_i$, (b) the selecting involves selecting 2 chemical shift evolution periods of the 4D FT NMR experiment, $^{13}C^{\alpha/\beta}_{i-1}$ and $^{13}C^\alpha_{i-1}$, and (c) the jointly sampling involves jointly sampling the 2 chemical shift evolution periods in an indirect time domain dimension, $t_1(^{13}C^{\alpha/\beta}_{i-1}, ^{13}C^\alpha_{i-1})$. One specific embodiment of this method ((4,3)D HNN(CO)CACBCA) involves applying radiofrequency pulses for a 4D FT NMR experiment according to the scheme shown in FIG. 10.

In yet another alternate embodiment, the above method can be modified, where N equals 4 and K equals 2 to conduct a (4,2)D [HNN(CO)CACBCA] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone amide nitrogen of amino acid residue i, $^{15}N_i$; and (3) a polypeptide backbone amide proton of amino acid residue i, $^{1}H^{N}_i$, (b) the selecting involves selecting 3 chemical shift evolution periods of the 4D FT NMR experiment, $^{13}C^{\alpha/\beta}_{i-1}$, $^{13}C^{\alpha}_{i-1}$, and $^{15}N_i$; and (c) the jointly sampling involves jointly sampling the 3 chemical shift evolution periods in an indirect time domain dimension, $t_1(^{13}C^{\alpha/\beta}_{i-1}, ^{13}C^{\alpha}_{i-1}, ^{15}N_i)$.

In another alternate embodiment, the above method can be modified, where N equals 5 and K equals 2 to conduct a (5,3)D [HNNCOCACBCA] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$, (3) a polypeptide backbone amide nitrogen of amino acid residue i, $^{15}N_i$; and (4) a polypeptide backbone amide proton of amino acid residue i, $^{1}H^{N}_i$, (b) the selecting involves selecting 3 chemical shift evolution periods of the 5D FT NMR experiment, $^{13}C^{\alpha/\beta}_{i-1}$, $^{13}C^{\alpha}_{i-1}$, and $^{13}C'_{i-1}$, (c) the jointly sampling involves jointly sampling the 3 chemical shift evolution periods in an indirect time domain dimension, $t_1(^{13}C^{\alpha/\beta}_{i-1}, ^{13}C^{\alpha}_{i-1}, ^{13}C'_{i-1})$.

Figure 11:
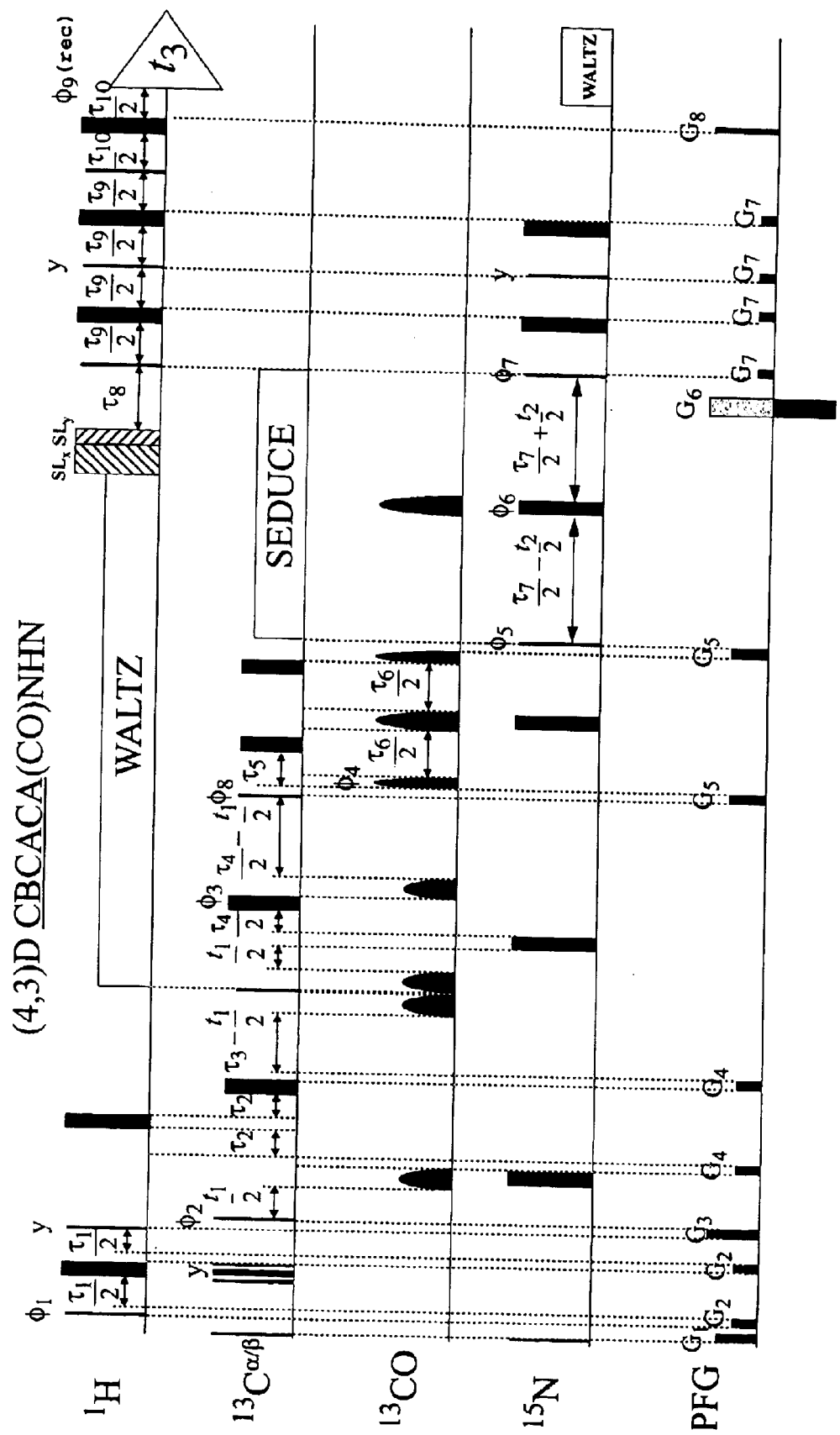
FIG. 11 depicts the experimental scheme for the (4,3)D CBCACA(CO)NHN experiment. Rectangular 90° and 180° pulses are indicated by thin and thick vertical bars, respectively, and phases are indicated above the pulses. Where no radio-frequency (rf) phase is marked, the pulse is applied along x. The high-power 90° pulse lengths were: 5.9 μs for $^1H$, 15.4 μs for $^{13}C$, and 38 μs for $^{15}N$. Pulses on $^{13}C$ prior to $t_1(^{13}C)$ are applied at high power, and $^{13}C$ decoupling during $t_1(^1H)$ is achieved using a ($90_x$-$180_y$-$90_x$) composite pulse. Subsequently, the 90° and 180° pulse lengths applied for $^{13}C^{\alpha/\beta}$ are adjusted to 47.5 μs and 42.5 μs, respectively, to minimize perturbation of $^{13}CO$ spins. The width of the 90° pulse applied on $^{13}CO$ pulse is 52 μs and the corresponding 180° pulses are applied with same power. A SEDUCE 180° pulse with a length of 200 μs is used to decouple $^{13}CO$ during $t_1$ and $\tau_4$. The length of the spin-lock purge pulses $SL_x$ and $SL_y$ are 1.2 ms and 0.6 ms, respectively. WALTZ16 is employed to decouple $^1H$ (rf field strength=9.2 kHz) during the heteronuclear magnetization transfers as well as to decouple $^{15}N$ during acquisition (rf=1.78 kHz) during acquisition. The SEDUCE sequence is used for decoupling of $^{13}C^\alpha$ during $^{15}N$ evolution period (rf=1.0 kHz). The $^1H$ rf carrier is placed at 4.78 ppm. Initially, the $^{13}C$ and $^{15}N$ r. f. carriers are set to 43 ppm and 120.9 ppm, respectively. The $^{13}C$ carrier is set to 56 ppm before the first $\tau_4$/2 delay period. The duration and strengths of the pulsed z-field gradients (PFGs) are: G1 (1 ms, 24 G/cm); G2 (100 μs, 16 G/cm); G3 (250 μs, 29.5 G/cm); G4 (250 μs, 30 G/cm); G5 (1.5 ms, 20 G/cm); G6 (1.25 ms, 30 G/cm); G7 (500 μs, 8 G/cm); G8 (125 μs, 29.5 G/cm). All PFG pulses are of rectangular shape. A recovery delay of at least 100 μs duration is inserted between a PFG pulse and an rf pulse. The delays are: $\tau_1$=600 μs, $\tau_2$=3.1 ms, $\tau_3$=3.35 ms, $\tau_4$=6.8 ms, $\tau_5$=4.4 ms, $\tau_6$=24.6 ms, $\tau_7$=24.6 ms, $\tau_8$=5.5 ms, $\tau_9$=4.6 ms, $\tau_{10}$=1.0 ms. Phase cycling: $\phi_1$=x; $\phi_2$=x,x,-x,-x; $\phi_3$=x, -x; $\phi_4$=x, -x; $\phi_5$=x; $\phi_6$=x, x, -x, -x; $\phi_7$=x; $\phi_8$=x; $\phi_9$(receiver)=x, -x, -x, x. The sensitivity enhancement scheme of Kay et al., *J. Am. Chem. Soc.* 114:10663–10665 (1992), which is hereby incorporated by reference in its entirety, is employed, i.e., the sign of G6 is inverted in concert with a 180° shift of $\phi_7$. GFT-NMR super phase-cycling for recording the 2 basic spectra are: $\phi_2$=x,y. Quadrature detection in $t_1(^{13}C)$ and $t_2(^{15}N)$ is accomplished by altering the phases 48 and 45, respectively, according to States-TPPI.

In yet another alternate embodiment, the above method can be modified, where N equals 5 and K equals 3 to conduct a (5,2)D [HNNCOCACBCA] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$, (3) a polypeptide backbone amide nitrogen of amino acid residue i, $^{15}N_i$; and (4) a polypeptide backbone amide proton of amino acid residue i, $^{1}H^{N}_i$, (b) the selecting involves selecting 4 chemical shift evolution periods of the 5D FT NMR experiment, $^{13}C^{\alpha/\beta}_{i-1}$, $^{13}C^{\alpha}_{i-1}$, $^{13}C'_{i-1}$, and $^{15}N_i$; and (c) the jointly sampling involves jointly sampling the 4 chemical shift evolution periods in an indirect time domain dimension, Another aspect of the present invention relates to the above method of conducting a (N,N−K)D GFT NMR experiment, where N equals 4 and K equals 1 to conduct a (4,3)D [CBCACA(CO)NHN] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone amide nitrogen of amino acid residue i, $^{15}N_i$; and (3) a polypeptide backbone amide proton of amino acid residue i, $^{1}H^{N}_i$, (b) the selecting involves selecting 2 chemical shift evolution periods of the 4D FT NMR experiment, $^{13}C^{\alpha/\beta}_{i-1}$ and $^{13}C^{\alpha}_{i-1}$, and (c) the jointly sampling involves jointly sampling the 2 chemical shift evolution periods in an indirect time domain dimension, $t_1(^{13}C^{\alpha/\beta}_{i-1}, ^{13}C^{\alpha}_{i-1})$. One specific embodiment of this method ((4,3)D CBCACA(CO)NHN) involves applying radiofrequency pulses for a 4D FT NMR experiment according to the scheme shown in FIG. 11.

In an alternate embodiment, the above method can be modified, where N equals 4 and K equals 2 to conduct a (4,2)D [CBCACA(CO)NHN] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone amide nitrogen of amino acid residue i, $^{15}N_i$; and (3) a polypeptide backbone amide proton of amino acid residue i, $^{1}H^{N}_i$, (b) the selecting involves selecting 3 chemical shift evolution periods of the 4D FT NMR experiment, $^{13}C^{\alpha/\beta}_{i-1}$, $^{13}C^{\alpha}_{i-1}$, and $^{15}N_i$, and (c) the jointly sampling involves jointly sampling the 3 chemical shift evolution periods in an indirect time domain dimension, $t_1(^{13}C^{\alpha/\beta}_{i-1}, ^{13}C^{\alpha}_{i-1}, ^{15}N_i)$.

In another alternate embodiment, the above method can be modified, where N equals 5 and K equals 2 to conduct a (5,3)D [CBCACACONHN] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$, (3) a polypeptide backbone amide nitrogen of amino acid residue i, $^{15}N_i$; and (4) a polypeptide backbone amide proton of amino acid residue i, $^{1}H^{N}_i$, (b) the selecting involves selecting 3 chemical shift evolution periods of the 5D FT NMR experiment, $^{13}C^{\alpha/\beta}_{i-1}$, $^{13}C^{\alpha}_{i-1}$, and $^{13}C'_{i-1}$, (c) the jointly sampling involves jointly sampling the 3 chemical shift evolution periods in an indirect time domain dimension, $t_1(^{13}C^{\alpha/\beta}_{i-1}, ^{13}C^{\alpha}_{i-1}, ^{13}C'_{i-1})$.

In yet another alternate embodiment, the above method can be modified, where N equals 5 and K equals 3 to conduct a (5,2)D [CBCACACONHN] GFT NMR experiment. In this method, (a) the sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$, (3) a polypeptide backbone amide nitrogen of amino acid residue i, $^{15}N_i$; and (4) a polypeptide backbone amide proton of amino acid residue i, 1 $H^{N}_i$, (b) the selecting involves selecting 4 chemical shift evolution periods of the 5D FT NMR experiment, $^{13}C^{\alpha/\beta}_{i-1}$, $^{13}C^{\alpha}_{i-1}$, $^{13}C'_{i-1}$ and $^{15}N_i$; (c) the jointly sampling involves jointly sampling the 4 chemical shift evolution periods in an indirect time domain dimension, $t_1(^{13}C^{\alpha/\beta}_{i-1}, ^{13}C^{\alpha}_{i-1}, ^{13}C'_{i-1}, ^{15}N_i)$.

Figure 12:
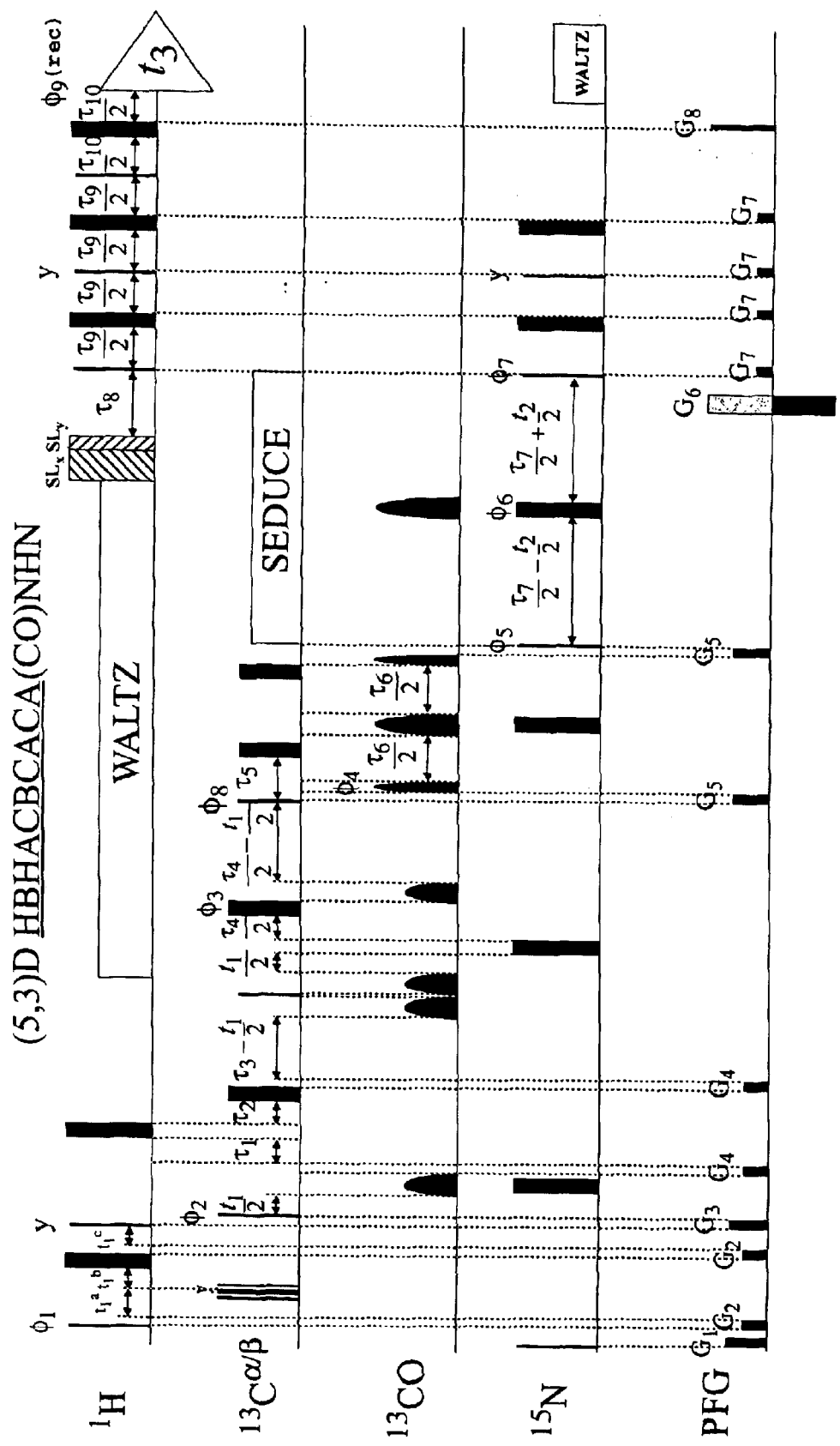
FIG. 12 depicts the experimental scheme for the (5,3)D HBHACBCACA(CO)NHN experiment. Rectangular 90° and 180° pulses are indicated by thin and thick vertical bars, respectively, and phases are indicated above the pulses. Where no radio-frequency (rf) phase is marked, the pulse is applied along x. The scaling factor K, for $^1H$ chemical shift evolution during $t_1$ is set to 1.0. The high-power 90° pulse lengths were: 5.9 μs for $^1H$, 15.4 μs for $^{13}C$, and 38 μs for $^{15}N$. Pulses on $^{13}C$ prior to $t_1(^{13}C)$ are applied at high power, and $^{13}C$ decoupling during $t_1(^1H)$ is achieved using a ($90_x$-$180_y$-$90_x$) composite pulse. Subsequently, the 90° and 180° pulse lengths applied for $^{13}C^{\alpha/\beta}$ are adjusted to 47.5 μs and 42.5 μs, respectively, to minimize perturbation of $^{13}CO$ spins. The width of the 90° pulse applied on $^{13}CO$ pulse is 52 μs and the corresponding 180° pulses are applied with same power. A SEDUCE 180° pulse with a length of 200 μs is used to decouple $^{13}CO$ during $t_1$ and $\tau_4$. The length of the spin-lock purge pulses $SL_x$ and $SL_y$ are 1.2 ms and 0.6 ms, respectively. WALTZ16 is employed to decouple $^1H$ (rf field strength=9.2 kHz) during the heteronuclear magnetization transfers as well as to decouple $^{15}N$ during acquisition (rf=1.78 kHz) during acquisition. The SEDUCE sequence is used for decoupling of $^{13}C^\alpha$ during $^{15}N$ evolution period (rf=1.0 kHz). The $^1H$ rf carrier is placed at −1 ppm before the start of the semi constant time $^1H$ chemical shift evolution period, and then switched to the water line at 4.78 ppm after the second 90° $^1H$ pulse. Initially, the $^{13}C$ and $^{15}N$ r. f. carriers are set to 43 ppm and 120.9 ppm, respectively. The $^{13}C$ carrier is set to 56 ppm during the second $\tau_4$/2 delay. The duration and strengths of the pulsed z-field gradients (PFGs) are: G1 (1 ms, 24 G/cm); G2 (100 μs, 16 G/cm); G3 (250 μs, 29.5 G/cm); G4 (250 μs, 30 G/cm); G5 (1.5 ms, 20 G/cm); G6 (1.25 ms, G/cm); G7 (500 μms, 8 G/cm); G8 (125 μs, 29.5 G/cm). All PFG pulses are of rectangular shape. A recovery delay of at least 100 μs duration is inserted between a PFG pulse and an rf pulse. The delays are: $\tau_1$=600 μs, $\tau_2$=3.1 ms, $\tau_3$=3.35 ms, $\tau_4$=6.8 ms, $\tau_5$=4.4 ms, $\tau_6$=24.6 ms, $\tau_7$=24.6 ms, $\tau_8$=5.5 ms, $\tau_9$=4.6 ms, $\tau_{10}$=1.0 ms. $^1H$-frequency labeling, at a $^1H$ resonance frequency of 600 MHz is achieved in a semi constant-time fashion with $t_1^a$(0)=1.7 ms, $t_1^b$(0)=1 μs, $t_1^c$(0)=1.701 ms, $\Delta t_1^a$=33.3 μs, $\Delta t_1^b$=19.3 μs, $\Delta t_1^c$=−14 μs. Hence, the fractional increase of the semi constant-time period with $t_1$ equals to k=1+$\Delta t_1^c$/$\Delta t_1^a$=0.58. Phase cycling: $\phi_1$=x; $\phi_2$=x,x,-x,-x; $\phi_3$=x, -x; $\phi_4$=x, -x; $\phi_5$=x; $\phi_6$=x, x, -x, -x; $\phi_7$=x; $\phi_8$=x; $\phi_9$(receiver)=x, -x, -x, x. The sensitivity enhancement scheme of Kay et al., *J. Am. Chem. Soc.* 114:10663–10665 (1992), which is hereby incorporated by reference in its entirety, is employed, i.e., the sign of G6 is inverted in concert with a 180° shift of $\phi_7$. Quadrature detection in $t_1(^{13}C)$ and $t_2(^{15}N)$ is accomplished by altering the phases $\phi_8$ and $\phi_5$, respectively, according to States-TPPI. GFT-NMR super phase-cycling for recording the 4 basic spectra are: $\phi_1$=x,y; $\phi_2$=x,y. For acquisition of central peaks derived from $^{13}C$ steady state magnetization, a second data set with he shifted by 180°, is collected.

Another aspect of the present invention relates to the above method of conducting a (N,N−K)D GFT NMR experiment, where N equals 5 and K equals 2 to conduct a (5,3)D [HBHACBCACA(CO)NHN] GFT NMR experiment. In this method, (a) the sample is a protein molecule having two amino acid residues, i and i−1, and the chemical shift values for the following nuclei are measured: (1) α- and β-protons of amino acid residue i−1, $^{1}H^{\alpha/\beta}_{i-1}$; (2) α- and β-carbons of amino acid residue i−1, $^{13}C^{\alpha/\beta}_{i-1}$; (3) a polypeptide backbone amide nitrogen of amino acid residue i, $^{15}N_i$; and (4) a polypeptide backbone amide proton of amino acid residue i, $H^{N}_i$, (b) the selecting involves selecting 3 chemical shift evolution periods of the 5D FT NMR experiment, $^{1}H^{\alpha/\beta}_{i-1}$, $^{13}C^{\alpha/\beta}_{i-1}$, and $^{13}C^{\alpha}_{i-1}$, and (c) the jointly sampling involves jointly sampling the 3 chemical shift evolution periods in an indirect time domain dimension, $t_1(^{1}H^{\alpha/\beta}_{i-1}, ^{13}C^{\alpha/\beta}_{i-1}, ^{13}C^{\alpha}_{i-1})$. One specific embodiment of this method ((5,3)D HBHACBCACA(CO)NHN) involves applying radiofrequency pulses for a 5D FT NMR experiment according to the scheme shown in FIG. 12.

In an alternate embodiment, the above method can be modified, where N equals 6 and K equals 3 to conduct a (6,3)D [HBHACBCACACONHN] GFT NMR experiment. In this method, (a) the sample is a protein molecule having two amino acid residues, i and i−1, and the chemical shift values for the following nuclei are measured: (1) α- and β protons of amino acid residue i−1, $^1H^{\alpha/\beta}_{i-1}$; (2) α- and β-carbons of amino acid residue i−1, $^{13}C^{\alpha/\beta}_{i-1}$; (3) a polypeptide backbone carbonyl carbon of amino acid residue i−1, $^{13}C'_{i-1}$; (4) a polypeptide backbone amide nitrogen of amino acid residue i, $^{15}N_i$; and (5) a polypeptide backbone amide proton of amino acid residue i, $^1H^N_i$, (b) the selecting involves selecting 4 chemical shift evolution periods of the 6D FT NMR experiment, $^1H^{\alpha/\beta}_{i-1}$, $^{13}C^{\alpha/\beta}_{i-1}$, $^{13}C^{\alpha}_{i-1,\ and}\ ^{13}C'_{i-1}$, and (c) the jointly sampling involves jointly sampling the 4 chemical shift evolution periods in an indirect time domain dimension, $t_1(^1H^{\alpha/\beta}_{i-1}, ^{13}C^{\alpha/\beta}_{i-1}, ^{13}C^{\alpha}_{i-1}, ^{13}C'_{i-1})$.

In another alternate embodiment, the above method can be modified, where N equals 5 and K equals 3 to conduct a (5,2)D [HBHACBCACA(CO)NHN] GFT NMR experiment. In this method, (a) the sample is a protein molecule having two amino acid residues, i and i−1, and the chemical shift values for the following nuclei are measured: (1) α- and β protons of amino acid residue i−1, $^1H^{\alpha/\beta}_{i-1}$; (2) α- and β-carbons of amino acid residue i−1, $^{13}C^{\alpha/\beta}_{i-1}$; (3) a polypeptide backbone amide nitrogen of amino acid residue i, $^{15}N_i$; and (4) a polypeptide backbone amide proton of amino acid residue i, $^1H^N_i$, (b) the selecting involves selecting 4 chemical shift evolution periods of the 5D FT NMR experiment, $^1H^{\alpha/\beta}_{i-1}$, $^{13}C^{\alpha/\beta}_{i-1}$, $^{13}C^{\alpha}_{i-1}$, and $^{15}N_i$, and (c) the jointly sampling involves jointly sampling the 4 chemical shift evolution periods in an indirect time domain dimension, $t_1(^1H^{\alpha/\beta}_{i-1}, ^{13}C^{\alpha/\beta}_{i-1}, ^{13}C^{\alpha}_{i-1}, ^{15}N_i)$.

In yet another alternate embodiment, the above method can be modified, where N equals 6 and K equals 4 to conduct a (6,2)D [HBHACBCACACONHN] GFT NMR experiment. In this method, (a) the sample is a protein molecule having two amino acid residues, i and i−1, and the chemical shift values for the following nuclei are measured: (1) α- and β protons of amino acid residue i−1, $^1H^{\alpha/\beta}_{i-1}$; (2) α- and β-carbons of amino acid residue i−1, $^{13}C^{\alpha/\beta}_{i-1}$; (3) a polypeptide backbone carbonyl carbon of amino acid residue i−1, $^{13}C'_{i-1}$; (4) a polypeptide backbone amide nitrogen of amino acid residue i, $^{15}N_i$; and (5) a polypeptide backbone amide proton of amino acid residue i, $^1H^N_i$, (b) the selecting involves selecting 5 chemical shift evolution periods of the 6D FT NMR experiment, $^1H^{\alpha/\beta}_{i-1}$, $^{13}C^{\alpha/\beta}_{i-1}$, $^{13}C^{\alpha}_{i-1}$, $^{13}C'_{i-1}$, and $^{15}N_i$, and (c) the jointly sampling involves jointly sampling the 5 chemical shift evolution periods in an indirect time domain dimension, $t_1(^1H^{\alpha/\beta}_{i-1}, ^{13}C^{\alpha/\beta}_{i-1}, ^{13}C^{\alpha}_{i-1}, ^{13}C'_{i-1}, ^{15}N_i)$.

Figure 13:
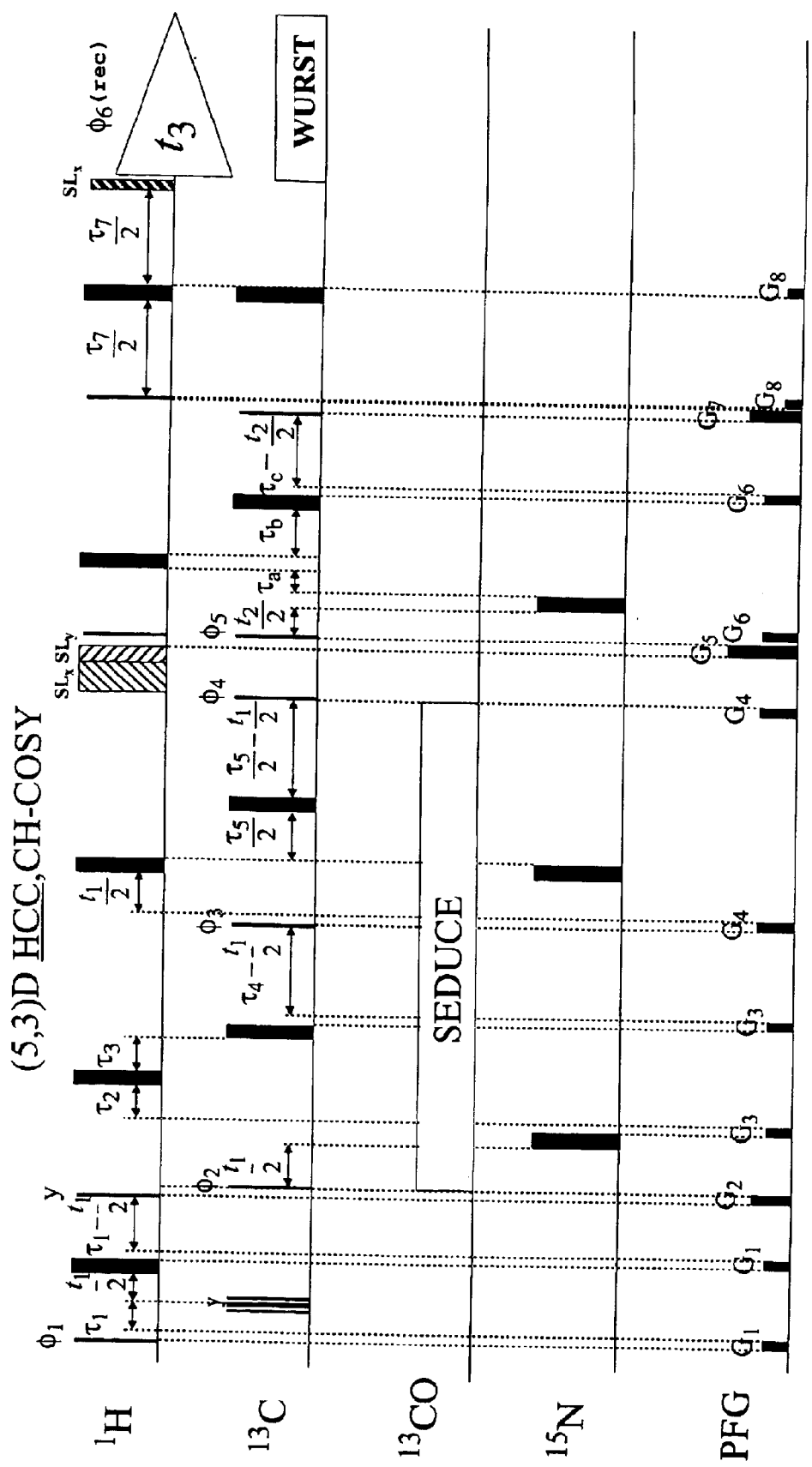
FIG. 13 depicts the experimental scheme for the (5,3)D HCC,CH-COSY experiment. Rectangular 90° and 180° pulses are indicated by thin and thick vertical bars, respectively, and phases are indicated above the pulses. Where no radio-frequency (rf) phase is marked, the pulse is applied along x. The scaling factor κ for $^1$H chemical shift evolution during $t_1$ is set to 1.0. The high power 90° pulse lengths were: 5.8 μs for $^1$H and 15.4 μs for $^{13}$C, and 38 μs for $^{15}$N. The lengths of the $^1$H spin-lock purge pulses are: first $SL_x$, 2.8 ms; second $SL_x$, 1.7 ms; $SL_y$: 4.9 ms. SEDUCE is used for decoupling of $^{13}$CO during $t_1$ and $t_2$ (rf field strength=1 kHz). WURST is used for decoupling of $^{13}$C during acquisition. The $^1$H carrier is placed at the position of the solvent line at 0 ppm before the start of the first semi constant time $^1$H evolution period, and then switched to the water line at 4.78 ppm after the second 90° $^1$H pulse. The $^{13}$C and $^{15}$N rf carriers are set to 43 ppm and 120.9 ppm, respectively. The duration and strengths of the pulsed z-field gradients (PFGs) are: G1 (500 μs, 6 G/cm); G2 (500 μs, 11 G/cm); G3 (100 μs, 12 G/cm); G4 (100 μs, 12.5 G/cm); G5 (4.0 ms, 22 G/cm); G6 (500 μs, 5 G/cm); G7 (3.0 ms, 22 G/cm); G8 (400 μs, 6 G/cm). All gradients are applied along z-axis and are of rectangular shape. All PFG pulses are of rectangular shape. A recovery delay of at least 100 μs duration is inserted between a PFG pulse and an rf pulse. The delays are: $\tau_1$=1.6 ms, $\tau_2$=750 μs, $\tau_3$=2.65 ms, $\tau_4$=3.4 ms, $\tau_5$=6.8 ms, $\tau_6$=1.6 ms, $\tau_7$=2.4 ms, $\tau_a$=350 μs, $\tau_b$=1.65 ms and $\tau_c$=2.4 ms. Phase cycling: $\phi_1$=x; $\phi_2$=x, -x; $\phi_3$=x, -x; $\phi_4$=x; $\phi_5$=y; $\phi_6$(receiver)=x, -x. Quadrature detection in $t_1(^{13}C/^1H)$ and $t_2(^{13}C)$ is accomplished by altering the phases $\phi_4$ and $\phi_5$, respectively, according to States-TPPI. Water suppression is accomplished by coherence pathway rejection using spin-lock purge pulses and pulsed field z-gradients. GFT-NMR super phase-cycle for recording the 4 basic spectra are: $\phi_1$=x,y; $\phi_2$=x,y. For acquisition of central peaks derived from $^{13}$C steady state magnetization, a second data set with 4) shifted by 180° is collected.

Yet another aspect of the present invention relates to the above method of conducting a (N,N−K)D GFT NMR experiment, where N equals 5 and K equals 2 to conduct a (5,3)D [HCC,CH-COSY] GFT NMR experiment. In this method, (a) the chemical shift values for the following nuclei are measured: (1) a proton, $^1H$; (2) a carbon coupled to $^1H$, $^{13}C$; and (3) a carbon coupled to $^{13}C$, $^{13}C^{coupled}$; and (4) a proton coupled to $^{13}C^{coupled}$, $^1H^{coupled}$, (b) the selecting involves selecting 3 chemical shift evolution periods of the 5D FT NMR experiment, $^1H$, $^{13}C$, and $^{13}C^{coupled}$, and (c) the jointly sampling involves jointly sampling the 3 chemical shift evolution periods in an indirect time domain dimension, $t_1(^1H, ^{13}C, ^{13}C^{coupled})$. The sample in this method can be any molecule such as (metallo)-organic molecules and complexes, nucleic acid molecules such as DNA and RNA, lipids, or polymers. In one embodiment, the chemical shift evolution periods for $^{13}C$ and $^{13}C^{coupled}$ can be correlated using total correlation spectroscopy (TOCSY) (Ernst et al., *Principles of Nuclear Magnetic Resonance in One and Two Dimensions*, Clarendon, Oxford (1987), which is hereby incorporated by reference in its entirety). In another embodiment, (a) the sample is a protein molecule having an amino acid residue, i, and the chemical shift values for the following nuclei are measured: (1) a proton of amino acid residue i, $^1H_i$; (2) a carbon of amino acid residue i coupled to $^1H_i$, $^{13}C_i$; and (3) a carbon coupled to $^{13}C_i$, $^{13}C_i^{coupled}$; and (4) a proton coupled with $^{13}C_i^{coupled}$, $^1H_i^{coupled}$, (b) the selecting involves selecting 3 chemical shift evolution periods of the 5D FT NMR experiment, $^1H_i$, $^{13}C_i$, and $^{13}C_i^{coupled}$, and (c) the jointly sampling involves jointly sampling the 3 chemical shift evolution periods in an indirect time domain dimension, $t_1(^1H_i, ^{13}C_i, ^{13}C_i^{coupled})$. One specific embodiment of this method ((5,3)D HCC,CH-COSY) involves applying radiofrequency pulses for a 5D FT NMR experiment according to the scheme shown in FIG. 13.

Figure 14:
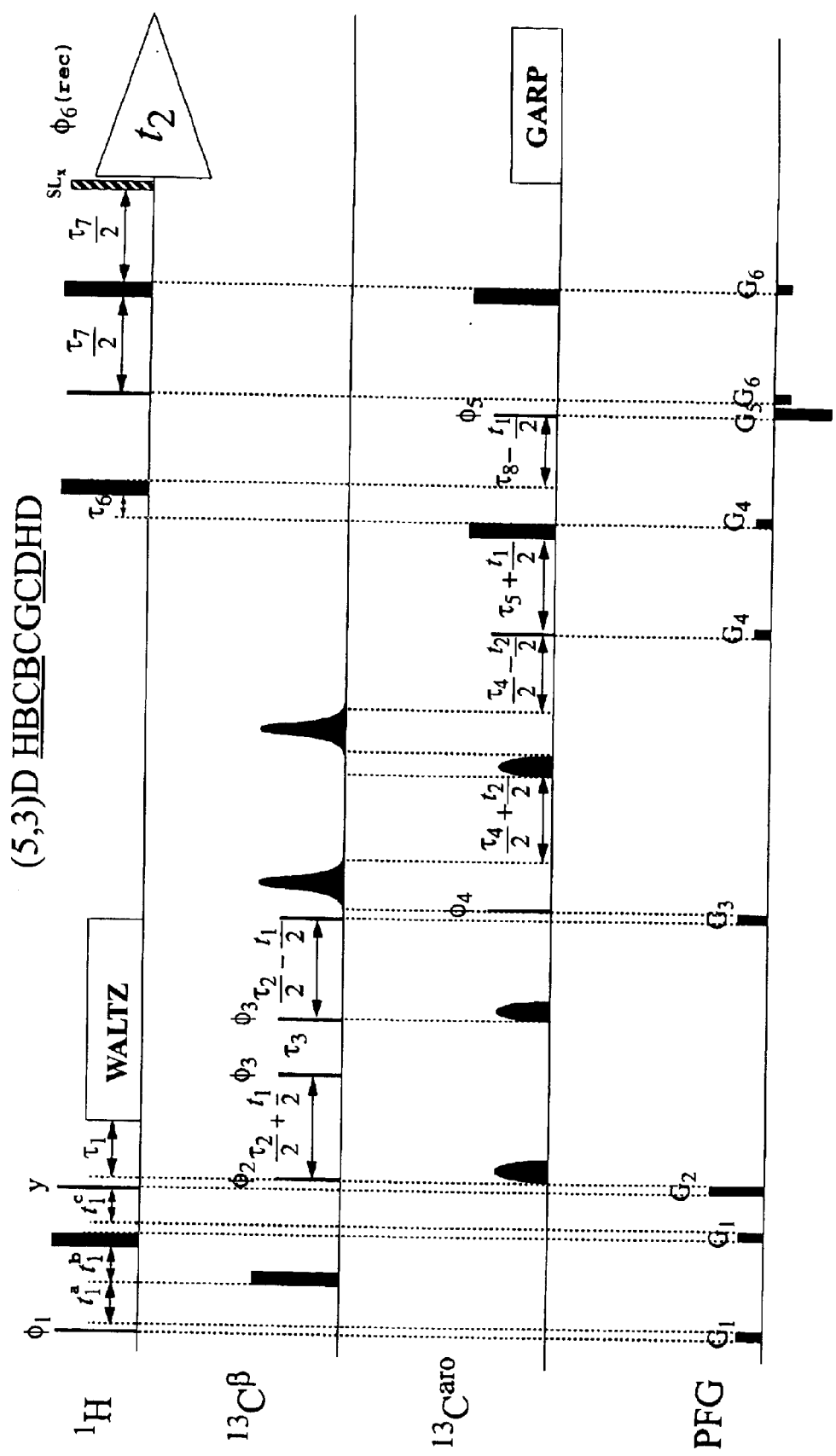
FIG. 14 depicts the experimental scheme for the (5,3)D HBCBCGCDHD experiment. Rectangular 90° and 180° pulses are indicated by thin and thick vertical bars, respectively, and phases are indicated above the pulses. Where no radio-frequency (rf) phase is marked, the pulse is applied along x. The scaling factor K for $^1$H chemical shift evolution during $t_1$ is set to 1.0. The high power 90° pulse lengths were: 5.8 μs for $^1$H and 15.4 μs for $^{13}$C. The first 180° pulse on $^{13}$C prior to $t_1(^{13}C)$ is applied at high power. Subsequently, the 90° pulse lengths of $^{13}C^\beta$ is adjusted to 66 μs. The 180° $^{13}C^\beta$ and $^{13}C^{aro}$ pulses are of gaussian-3 shape and 375 μs duration. WALTZ16 is used for decoupling of $^1$H (rf field strength=4.5 kHz) during the magnetization transfer from $^{13}C^\alpha$ to $^{13}C^{aro}$, and GARP is employed to decouple $^{13}C^{aro}$ (rf=2.5 kHz) during acquisition. The $^1$H rf carrier is placed at 4.78 ppm. The $^{13}$C rf carrier is set to 38 ppm during $\omega_0(^{13}C)$ and then switched to 135 ppm before the first 90° pulse on $^{13}C^{aro}$ (pulse labeled with $\phi_4$). The $^{13}$C rf carrier is switched back to 125 ppm before the second 90° pulse on $^{13}C^{aro}$. The duration and strengths of the pulsed z-field gradients (PFGs) are: G1 (500 μs, 2 G/cm); G2 (1 ms, 22 G/cm); G3 (2 ms, 10 G/cm); G4 (500 μs, 4 G/cm); G5 (1 ms, −14 G/cm); G6 (500 μs, −2 G/cm). All PFG pulses are of rectangular shape. A recovery delay of at least 100 μs duration is inserted between a PFG pulse and an rf pulse. The delays are: $\tau_1$=1.8 ms, $\tau_2$=8.8 ms, $\tau_3$=71 μs, $\tau_4$=4.3 ms, $\tau_5$=2.1 ms, $\tau_6$=710 μs, $\tau_8$=1.4 ms, $\tau_7$=2.5 ms. $^1$H-frequency labeling, at a $^1$H resonance frequency of 600 MHz is achieved in a semi constant-time fashion with $t_1(0)$=1.7 ms, $t_1^b(0)$=1 82 s, $t_1^c(0)$=1.701 $\Delta t_1^a$=33.3 μs, $\Delta t_1^b$=19.3 μs, $\Delta t_1^c$=−14 μs. Hence, the fractional increase of the semi constant-time period with $t_1$ equals to $\lambda$=1+$\Delta t_1^c$/$\Delta t_1^a$=0.58. Phase cycling: $\phi_1$=x; $\phi_2$=x; $\phi_3$=x, y, −x, −y; $\phi_4$=4(x), 4(−x); $\phi_5$=x; $\phi_6$ (receiver)=x, −x, x, −x, −x, −x, Quadrature detection in $t_1(^{13}C^\delta)$ and $t_2(^{13}C^\gamma)$ is accomplished by altering the phases $\phi_4$ and $\phi_5$, respectively, according to States-TPPI. Water suppression is accomplished by presaturation of the water line during the relaxation delay and coherence pathway rejection using spin-lock purge pulses and pulsed field z-gradients. GFT-NMR super phase-cycling for recording the 4 basic spectra are: $\phi_1$=x,y; $\phi_2$=x,y. For acquisition of central peaks derived from $^{13}$C steady state magnetization, a second data set with $\phi_1$ shifted by 180° is collected.

The present invention also relates to the above method of conducting a (N,N−K)D GFT NMR experiment, where N equals 5 and K equals 2 to conduct a (5,3)D [HBCBCG CDHD] GFT NMR experiment. In this method, (a) the sample is a protein molecule having an amino acid residue, i, with an aromatic side chain, and the chemical shift values for the following nuclei are measured: (1) a β-proton of amino acid residue i, $^1H^{\beta}_i$; (2) a β-carbon of amino acid residue i, $^{13}C^{\beta}_i$; (3) a γ-carbon of amino acid residue i, $^{13}C^{\gamma}_i$; (4) a δ-carbon of amino acid residue i, $^{13}C^{\delta}_i$; and (5) a δ-proton of amino acid residue i, $^1H^{\delta}_i$, (b) the selecting involves selecting 3 chemical shift evolution periods of the 5D FT NMR experiment, $^1H^{\beta}_i$, $^{13}C^{\beta}_i$, and $^{13}C^{\delta}_i$, and (c) the jointly sampling involves jointly sampling the 3 chemical shift evolution periods in an indirect time domain dimension, $t_1(^1H^{\beta}_i, ^{13}C^{\beta}_i, ^{13}C^{\delta}_i)$. One specific embodiment of this method ((5,3)D HBCBCGCDHD) involves applying radiofrequency pulses for a 5D FT NMR experiment according to the scheme shown in FIG. 14.

In an alternate embodiment, the above method can be modified, where N equals 5 and K equals 3 to conduct a (5,2)D [HBCBCGCDHD] GFT NMR experiment. In this method, (a) the sample is a protein molecule having an amino acid residue, i, with an aromatic side chain, and the chemical shift values for the following nuclei are measured: (1) a β-proton of amino acid residue i, $^1H^{\beta}_i$; (2) a β-carbon of amino acid residue i, $^{13}C^{\beta}_i$; (3) a γ-carbon of amino acid residue i; (4) a δ-carbon of amino acid residue i, $^{13}C^{\delta}_i$; and (5) a δ-proton of amino acid residue i, $^1H^{\delta}_i$, (b) the selecting involves selecting 4 chemical shift evolution periods of the 5D FT NMR experiment, $^1H^{\beta}_i$, $^{13}C^{\beta}_i$, $^{13}C^{\gamma}_i$, and $^{13}C^{\delta}_i$, and (c) the jointly sampling involves jointly sampling the 4 chemical shift evolution periods in an indirect time domain dimension, $t_1(^1H^{\beta}_i, ^{13}C^{\beta}_i, ^{13}C^{\gamma}_i, ^{13}C^{\delta}_i)$.

Figure 15:
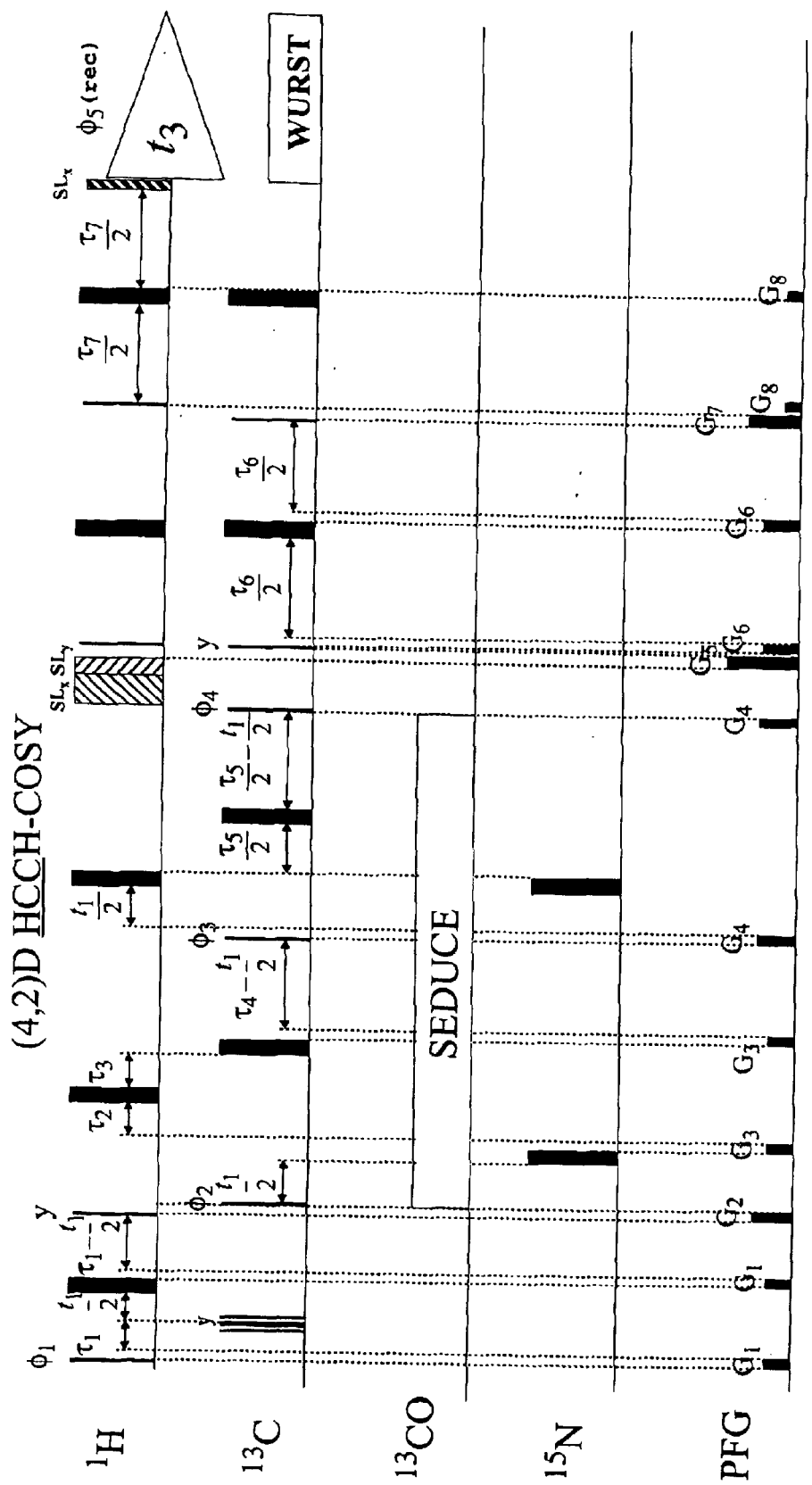
FIG. 15 depicts the experimental scheme for the (4,2)D HCCH-COSY experiment. Rectangular 90° and 180° pulses are indicated by thin and thick vertical bars, respectively, and phases are indicated above the pulses. Where no radio-frequency (rf) phase is marked, the pulse is applied along x. The high power 90° pulse lengths were: 5.8 μs for $^1$H and 15.4 μs for $^{13}$C, and 38 μs for $^{15}$N. The lengths of the $^1$H spin-lock purge pulses are: first $SL_x$, 2.8 ms; second $SL_x$, 1.7 ms; $SL_y$: 4.9 ms. SEDUCE is used for decoupling of $^{13}$CO during $t_1$ and $t_2$ (rf field strength=1 kHz). WURST is used for decoupling of $^{13}$C during acquisition. The $^1$H carrier is placed at 4.78 ppm. The $^{13}$C and $^{15}$N rf carriers are set to 43 ppm and 120.9 ppm, respectively. The duration and strengths of the pulsed z-field gradients (PFGs) are: G1 (500 is, 6 G/cm); G2 (500 is, 11 G/cm); G3 (100 μs, 12 G/cm); G4 (100 μs, 12.5 G/cm); G5 (4 ms, 22 G/cm); G6 (500 μs, 5 G/cm); G7 (3 ms, 30 G/cm); G8 (400 μs, 6 G/cm). All gradients are applied along z-axis and are of rectangular shape. All PFG pulses are of rectangular shape. A recovery delay of at least 100 μs duration is inserted between a PFG pulse and an rf pulse. The delays are: $\tau_1$=1.6 ms, $\tau_2$=750 μs, $\tau_3$=2.65 ms, $\tau_4$=3.4 ms, $\tau_5$=6.8 ms, $\tau_6$=0.7 ms, $\tau_7$=3.2 ms. Phase cycling: $\phi_1$=x; $\phi_2$=x, −x; $\phi_3$=x, −x; $\phi_4$=x; $\phi_5$=y; $\phi_6$(receiver)=x, −x. Quadrature detection in $t_1(^{13}C)$ is accomplished by altering the phases $\phi_4$ according to States-TPPI. Water suppression is accomplished by coherence pathway rejection using spin-lock purge pulses and pulsed field z-gradients. GFT-NMR super phase-cycle for recording the 4 basic spectra are: $\phi_1$=x,y; $\phi_2$=x,y. For acquisition of central peaks derived from $^{13}$C steady state magnetization, a second data set with $\phi_1$ shifted by 180° is collected.

Another aspect of the present invention relates to the above method of conducting a (N,N−K)D GFT NMR experiment, where N equals 4 and K equals 2 to conduct a (4,2)D [HCCH-COSY] GFT NMR experiment. In this method, (a) the chemical shift values for the following nuclei are measured: (1) a proton, $^1H$; (2) a carbon coupled to $^1H$, $^{13}C$; and (3) a carbon coupled to $^{13}C$, $^{13}C^{coupled}$; and (4) a proton coupled to $^{13}C^{coupled}$, $^1H^{coupled}$, (b) the selecting involves selecting 3 chemical shift evolution periods of the 4D FT NMR experiment, $^1H$, $^{13}C$, and $^{13}C^{coupled}$, and (c) the jointly sampling involves jointly sampling the 3 chemical shift evolution periods in an indirect time domain dimension, $t_1(^1H, ^{13}C, ^{13}C^{coupled})$. The sample in this method can be any molecule such as (metallo)-organic molecules and complexes, nucleic acid molecules such as DNA and RNA, lipids, or polymers. In one embodiment, the chemical shift evolution periods for $^{13}C$ and $^{13}C^{coupled}$ are correlated using total correlation spectroscopy (TOCSY). In another embodiment, (a) the sample is a protein molecule having an amino acid residue, i, and the chemical shift values for the following nuclei are measured: (1) a proton of amino acid residue i, $^1H_i$; (2) a carbon of amino acid residue i coupled to $^1H_i$, $^{13}C_i$; (3) a carbon coupled to $^{13}C_i$, $^{13}C_i^{coupled}$; and (4) a proton coupled to $^{13}C_i^{coupled}$, $^1H_i^{coupled}$, (b) the selecting involves selecting 3 chemical shift evolution periods of the 4D FT NMR experiment, $^1H_i$, $^{13}C_i$, and $^{13}C_i^{coupled}$, and (c) the jointly sampling involves jointly sampling the 3 chemical shift evolution periods in an indirect time domain dimension, $t_1(^1H_i, ^{13}C_i, ^{13}C_i^{coupled})$. One specific embodiment of this method ((4,2)D HCCH-COSY) involves applying radiofrequency pulses for a 4D FT NMR experiment according to the scheme shown in FIG. 15.

Yet another aspect of the present invention relates to the above method of conducting a (N,N−K)D GFT NMR experiment, where N equals 5 and K equals 3 to conduct a (5,2)D [HCCCH-COSY] GFT NMR experiment. In this method, (a) the chemical shift values for the following nuclei are measured: (1) a proton $^1H$; (2) a carbon coupled to $^1H$, $^{13}C$; (3) a carbon coupled to $^{13}C$, $^{13}C^{coupled}$; (4) a carbon coupled to $^{13}C^{coupled}$, $^{13}C^{coupled-2}$; and (5) a proton coupled with $^{13}C^{coupled-2}$, $^1H^{coupled-2}$, (b) the selecting involves selecting 4 chemical shift evolution periods of the 5D FT NMR experiment, H, $^{13}C$, $^{13}C^{coupled}$, and $^{13}C^{coupled-2}$ and (c) the jointly sampling involves jointly sampling the 4 chemical shift evolution periods in an indirect time domain dimension, $t_1(^1H, ^{13}C, ^{13}C^{coupled}, ^{13}C^{coupled-2})$. The sample in this method can be any molecule such as (metallo)-organic molecules and complexes, nucleic acid molecules such as DNA and RNA, lipids, or polymers. In one embodiment, (a) the sample is a protein molecule having an amino acid residue, i, and the chemical shift values for the following nuclei are measured: (1) a proton of amino acid residue i, $^1H_i$; (2) a carbon of amino acid residue i coupled to $^1H_i$, $^{13}C_i$; (3) a carbon coupled to $^{13}C_i$, $^{13}C_i^{coupled}$; (4) a carbon coupled to $^{13}C_i^{coupled}$, $^{13}C_i^{coupled2}$; and (5) a proton coupled with $^{13}C_i^{coupled-2}$, $^1H_i^{coupled-2}$, (b) the selecting involves selecting 4 chemical shift evolution periods of the 5D FT NMR experiment, $^1H_i$, $^{13}C_i$, $^{13}C_i^{coupled}$ and $^{13}C_i^{coupled-2}$, and (c) the jointly sampling involves jointly sampling the 4 chemical shift evolution periods in an indirect time domain dimension, $t_1(^1H_i, ^{13}C_i, ^{13}C_i^{coupled}, ^{13}C_i^{coupled-2})$.

In an alternate embodiment, the above method can be modified, where N equals 5 and K equals 3 to conduct a (5,3)D [HCCCH-COSY] GFT NMR experiment. In this method, (a) the chemical shift values for the following nuclei are measured: (1) a proton, $^1H$; (2) a carbon coupled to $^1H$, $^{13}C$; (3) a carbon coupled to $^{13}C$, $^{13}C^{coupled}$; (4) a carbon coupled to $^{13}C^{coupled}$, $^{13}C^{coupled-2}$; and (5) a proton coupled with $^{13}C^{coupled-2}$, $^1H^{coupled-2}$, (b) the selecting involves selecting 3 chemical shift evolution periods of the 5D FT NMR experiment, $^1H$, $^{13}C$, and $^{13}C^{coupled}$, and (c) the jointly sampling involves jointly sampling the 3 chemical shift evolution periods in an indirect time domain dimension, $t_1(^1H, ^{13}C, ^{13}C^{coupled})$. The sample in this method can be any molecule such as (metallo)-organic molecules and complexes, nucleic acid molecules such as DNA and RNA, lipids, or polymers. In another embodiment, (a) the sample is a protein molecule having an amino acid residue, i, and the chemical shift values for the following nuclei are measured: (1) a proton of amino acid residue i, $^1H_i$; (2) a carbon of amino acid residue i coupled to $^1H_i$, $^{13}C_i$; (3) a carbon coupled to $^{13}C_i$, $^{13}C_i^{coupled}$; (4) a carbon coupled to $^{13}C_i^{coupled}$, $^{13}C_i^{coupled-2}$; and (5) a proton coupled with $^{13}C_i^{coupled-2}$, $^1H_i^{coupled-2}$, (b) the selecting involves selecting 3 chemical shift evolution periods of the 5D FT NMR experiment, $^1H_i$, $^{13}C_i$, and $^{13}C_i^{coupled}$ (c) the jointly sampling involves jointly sampling the 3 chemical shift evolution periods in an indirect time domain dimension, $t_1(^1H_i, ^{13}C_i^{coupled})$.

Combinations of GFT NMR Experiments

A set of multidimensional GFT NMR experiments enables one to devise strategies for GFT NMR-based (high throughput) resonance assignment of proteins or other molecules.

Thus, another aspect of the present invention relates to a method for sequentially assigning chemical shift values of an α-proton, $^1H^\alpha$ an α-carbon, $^{13}C^\alpha$, a polypeptide backbone carbonyl carbon, $^{13}C'$, a polypeptide backbone amide nitrogen, $^{15}N$, and a polypeptide backbone amide proton, $^1H$, of a protein molecule. The method involves providing a protein sample and conducting a set of G matrix Fourier transformation (GFT) nuclear magnetic resonance (NMR) experiments on the protein sample including: (1) a (5,2)D [HACACONHN] GFT NMR experiment to measure and connect the chemical shift values of the α-proton of amino acid residue i−1, $^1H^\alpha_{i-1}$, the α-carbon of amino acid residue i−1, $^{13}C^\alpha_{i-1}$, the polypeptide backbone carbonyl carbon of amino acid residue i−1, $^{13}C'_{i-1}$, the polypeptide backbone amide nitrogen of amino acid residue i, $^{15}N_i$, and the polypeptide backbone amide proton of amino acid residue i, $^1H^N_i$ and (2) a (5,2)D [HACA,CONHN] GFT NMR experiment to measure and connect the chemical shift values of $^1H^\alpha_{i-1}$, $^{13}C^\alpha_{i-1}$, $^{13}C'_{i-1}$, the polypeptide backbone amide nitrogen of amino acid residue i−1, $^{15}N_{i-1}$, and the polypeptide backbone amide proton of amino acid residue i−1, $^1H^N_{i-1}$. Then, sequential assignments of the chemical shift values of $^1H^\alpha$, $^{13}C^\alpha$, $^{13}C'$, $^{15}N$, and $^1H^N$ are obtained by (i) matching the chemical shift values of $^1H^\alpha_{i-1}$, $^{13}C^\alpha_{i-1}$, and $^{13}C'_{i-1}$ measured by the (5,2)D [HACACONHN] GFT NMR experiment with the chemical shift values of $^1H^\alpha_{i-1}$, $^{13}C^\alpha_{i-1}$, and $^{13}C'_{i-1}$ measured by the (5,2)D [HACA,CONHN] GFT NMR experiment, (ii) using the chemical shift values of $^1H^\alpha_{i-1}$, $^{13}C^\alpha_{i-1}$, and $^{13}C'_{i-1}$ to identify the type of amino acid residue i−1 (Wüthrich, *NMR of Proteins and Nucleic Acids*, Wiley, New York (1986); Grzesiek et al., *J. Biomol. NMR*, 3: 185–204 (1993), which are hereby incorporated by reference in their entirety), and (iii) mapping sets of sequentially connected chemical shift values to the amino acid sequence of the polypeptide chain and using the chemical shift values to locate secondary structure elements (such as α-helices and β-sheets) within the polypeptide chain (Spera et al., *J. Am. Chem. Soc.*, 113:5490–5492 (1991); Wishart et al., *Biochemistry*, 31:1647–1651 (1992), which are hereby incorporated by reference in their entirety).

Yet another aspect of the present invention relates to a method for sequentially assigning chemical shift values of an α-proton, $^1H^\alpha$, an α-carbon, $^{13}C^\alpha$, a polypeptide backbone carbonyl carbon, $^{13}C'$, a polypeptide backbone amide nitrogen, $^{15}N$, and a polypeptide backbone amide proton, $^1H^N$, of a protein molecule. The method involves providing a protein sample and conducting a set of G matrix Fourier transformation (GFT) nuclear magnetic resonance (NMR)

experiments on the protein sample including: (1) a (5,3)D [HACACONHN] GFT NMR experiment to measure and connect the chemical shift values of the α-proton of amino acid residue i−1, $^1H^\alpha_{i-1}$, the α-carbon of amino acid residue i−1, $^{13}C^\alpha_{i-1}$, the polypeptide backbone carbonyl carbon of amino acid residue i−1, $^{13}C'_{i-1}$, the polypeptide backbone amide nitrogen of amino acid residue i, $^{15}N_i$, and the polypeptide backbone amide proton of amino acid residue i, $^1H^N_i$ and (2) a (5,3)D [HACA,CONHN]0 GFT NMR experiment to measure and connect the chemical shift values of $^1H^\alpha_{i-1}$, $^{13}C^\alpha_{i-1}$, $^{13}C'_{i-1}$, the polypeptide backbone amide nitrogen of amino acid residue i−1, $^{15}N_{i-1}$, and the polypeptide backbone amide proton of amino acid residue i−1, $^1H^N_{i-1}$. Then, sequential assignments of the chemical shift values of $^1H^\alpha$, $^{13}C^\alpha$, $^{13}C'$, $^{15}N$, and $^1H^N$ are obtained by (i) matching the chemical shift values of $^1H^\alpha_{i-1}$, $^{13}C^\alpha_{i-1}$, and $^{13}C'_{i-1}$ measured by the (5,3)D [HACACONHN] GFT NMR experiment with the chemical shift values of $^1H^\alpha_{i-1}$, $^{13}C^\alpha_{i-1}$, and $^{13}C'_{i-1}$ measured by the (5,3)D [HACA,CONHN] GFT NMR experiment, (ii) using the chemical shift values of $^1H^\alpha_{i-1}$, $^{13}C^\alpha_{i-1}$, and $^{13}C'_{i-1}$ to identify the type of amino acid residue i−1 (Wüthrich, *NMR of Proteins and Nucleic Acids*, Wiley, New York (1986); Grzesiek et al., *J. Biomol. NMR*, 3: 185–204 (1993), which are hereby incorporated by reference in their entirety), and (iii) mapping sets of sequentially connected chemical shift values to the amino acid sequence of the polypeptide chain and using the chemical shift values to locate secondary structure elements (such as α-helices and β-sheets) within the polypeptide chain (Spera et al., *J. Am. Chem. Soc.*, 113:5490–5492 (1991); Wishart et al., *Biochemistry*, 31:1647–1651 (1992), which are hereby incorporated by reference in their entirety).

A further aspect of the present invention relates to a method for sequentially assigning chemical shift values of α- and β-carbons, $^{13}C^{\alpha/\beta}$, a polypeptide backbone carbonyl carbon, $^{13}C'$, a polypeptide backbone amide nitrogen, $^{15}N$, and a polypeptide backbone amide proton, $^1H^N$, of a protein molecule. The method involves providing a protein sample and conducting a set of G matrix Fourier transformation (GFT) nuclear magnetic resonance (NMR) experiments on the protein sample including: (1) a (4,3)D [CBCACONHN] GFT NMR experiment to measure and connect the chemical shift values of the α- and β-carbons of amino acid residue i−1, $^{13}C^{\alpha/\beta}_{i-1}$, the polypeptide backbone carbonyl carbon of amino acid residue i−1, $^{13}C'_{i-1}$, the polypeptide backbone amide nitrogen of amino acid residue i, $^{15}N_i$, and the polypeptide backbone amide proton of amino acid residue i, $^1H^N_i$ and (2) a (4,3)D [CBCA,CONHN] GFT NMR experiment to measure and connect the chemical shift values of $^{13}C^{\alpha/\beta}_{i-1}$, $^{13}C'_{i-1}$, the polypeptide backbone amide nitrogen of amino acid residue i−1, $^{15}N_{i-1}$, and the polypeptide backbone amide proton of amino acid residue i−1, $H^N_{i-1}$. Then, sequential assignments of the chemical shift values of $^{13}C^{\alpha/\beta}$, $^{13}C'$, $^{15}N$, and $^1H^N$ are obtained by (i) matching the chemical shift values of $^{13}C^{\alpha/\beta}_{i-1}$ and $^{13}C'_{i-1}$ measured by the (4,3)D [CBCACONHN] GFT NMR experiment with the chemical shift values of $^{13}C^{\alpha/\beta}_{i-1}$ and $^{13}C'_{i-1}$ measured by the (4,3)D [CBCA, CONHN] GFT NMR experiment, (ii) using the chemical shift values of $^{13}C^{\alpha/\beta}_{i-1}$ and $^{13}C'_{i-1}$ to identify the type of amino acid residue i−1 (Wüthrich, *NMR of Proteins and Nucleic Acids*, Wiley, New York (1986); Grzesiek et al., *J. Biomol. NMR*. 3: 185–204 (1993), which are hereby incorporated by reference in their entirety), and (iii) mapping sets of sequentially connected chemical shift values to the amino acid sequence of the polypeptide chain and using the chemical shift values to locate secondary structure elements (such as α-helices and β-sheets) within the polypeptide chain (Spera et al., *J. Am. Chem. Soc.*, 113:5490–5492 (1991); Wishart et al., *Biochemistry*, 31:1647–1651 (1992), which are hereby incorporated by reference in their entirety).

The present invention also relates to a method for sequentially assigning chemical shift values of α- and β-carbons, $^{13}C^{\alpha/\beta}$, a polypeptide backbone amide nitrogen, $^{15}N$, and a polypeptide backbone amide proton, $^1H^N$, of a protein molecule. The method involves providing a protein sample and conducting a set of G matrix Fourier transformation (GFT) nuclear magnetic resonance (NMR) experiments on the protein sample including: (1) a (4,3)D [HNNCACBCA] GFT NMR experiment to measure and connect the chemical shift values of the α- and β-carbons of amino acid residue i−1, $^{13}C^{\alpha/\beta}_{i-1}$, the α-carbon of amino acid residue i−1, $^{13}C^\alpha_{i-1}$, the polypeptide backbone amide nitrogen of amino acid residue i−1, $^{15}N_{i-1}$, and the polypeptide backbone amide proton of amino acid residue i−1, $^1H^N_{i-1}$ and (2) a GFT NMR experiment selected from the group consisting of a (4,3)D [HNN(CO)CACBCA] GFT NMR experiment, a (4,3)D [CBCACA(CO)NHN] GFT NMR experiment, and a (5,3)D [HBHACBCACA(CO)NHN] GFT NMR experiment to measure and connect the chemical shift values of $^{13}C^{\alpha/\beta}_{i-1}$, $^{13}C^\alpha_{i-1}$, the polypeptide backbone amide nitrogen of amino acid residue i, $^{15}N_i$, and the polypeptide backbone amide proton of amino acid residue i, $^1H^N_i$. Then, sequential assignments of the chemical shift values of $^{13}C^{\alpha/\beta}$, $^{15}N$, and $^1H^N$ are obtained by (i) matching the chemical shift values of $^{13}C^{\alpha/\beta}_{i-1}$ measured by the GFT NMR experiment selected from the group consisting of a (4,3)D [HNN(CO)CACBCA] GFT NMR experiment, a (4,3)D [CBCACA(CO)NHN] GFT NMR experiment, and a (5,3)D [HBHACBCACA(CO)NHN] GFT NMR experiment with the chemical shift values of $^{13}C^{\alpha/\beta}_{i-1}$ measured by the (4,3)D [HNNCACBCA] GFT NMR experiment, (ii) using the chemical shift values of $^{13}C^{\alpha/\beta}_{i-1}$ to identify the type of amino acid residue i−1 (Wüthrich, *NMR of Proteins and Nucleic Acids*, Wiley, New York (1986); Grzesiek et al., *J. Biomol. NMR*, 3: 185–204 (1993), which are hereby incorporated by reference in their entirety), and (iii) mapping sets of sequentially connected chemical shift values to the amino acid sequence of the polypeptide chain and using the chemical shift values to locate secondary structure elements (such as α-helices and β-sheets) within the polypeptide chain (Spera et al., *J. Am. Chem. Soc.*, 113:5490–5492 (1991); Wishart et al., *Biochemistry*, 31:1647–1651 (1992), which are hereby incorporated by reference in their entirety).

Another aspect of the present invention relates to a method for assigning chemical shift values of γ-, δ-, and ε-aliphatic sidechain protons, $^1H^{\gamma/\delta/\epsilon}$, and chemical shift values of γ-, δ-, and ε-aliphatic sidechain carbons located peripheral to β-carbons, $^{13}C^{\gamma/\delta/\epsilon}$, of a protein molecule. The method involves providing a protein sample and conducting a set of G matrix Fourier transformation (GFT) nuclear magnetic resonance (NMR) experiments on the protein sample including: (1) a (5,3)D [HCC,CH-COSY] GFT NMR experiment to measure and connect the chemical shift values of a proton of amino acid residue i−1, $^1H_{i-1}$, a carbon of amino acid residue i−1 coupled to $^1H_{i-1}$, $^{13}C_{i-1}$, a carbon coupled to $^{13}C_{i-1}$, $^{13}C^\alpha_{i-1}{}^{coupled}$, and a proton coupled to $^{13}C\text{-}1^{coupled}$, $^1H^N_{i-1}{}^{coupled}$, and (2) a (5,3)D [HBHACBCACA(CO)NHN] GFT NMR experiment to measure and connect the chemical shift values of α- and β-protons of amino acid residue i−1, $^1H^{\alpha/\beta}_{i-1}$, and α- and β-carbons of amino acid residue i−1, $^{13}C^{\alpha/\beta}_{i-1}$. Then, assignments of the chemical shift values of $^1H^{\gamma/\delta/\epsilon}$ and $^{13}C^{\gamma/\delta/\epsilon}$ are obtained by (i) identifying $^{1}H_{i-1}$, $^{13}C_{i-1}$, $^{13}C_{i-1}^{coupled}$, and $^{1}H_{i-1}^{coupled}$ measured by the (5,3)D [HCC,CH-COSY] GFT NMR experiment as $^{1}H^{\alpha}_{i-1}$, $^{13}C^{\alpha}_{i-1}$, $^{13}C^{\beta}_{i-1}$, and $^{1}H^{\beta}_{i-1}$, respectively, and thereby matching the chemical shift values of $^{1}H^{\alpha/\beta}_{i-1}$ and $^{13}C^{\alpha/\beta}_{i-1}$ with the chemical shift values of $^{1}H^{\alpha/\beta}_{i-1}$ and $^{13}C^{\alpha/\beta}_{i-1}$ measured by the (5,3)D HBHACBCACA(CO)NHN] GFT NMR experiment, and (ii) using the chemical shift values of $^{1}H^{\alpha/\beta}_{i-1}$ and $^{13}C^{\alpha/\beta}_{i-1}$ in conjunction with other chemical shift connections from the (5,3)D [HCC,CH-COSY] GFT NMR experiment to measure the chemical shift values of $^{1}H^{\gamma/\delta/\epsilon}_{i-1}$ and $^{13}C^{\gamma/\delta/\epsilon}_{i-1}$.

Yet another aspect of the present invention relates to a method for assigning chemical shift values of γ-, δ-, and ε-aliphatic sidechain protons, $^{1}H^{\gamma/\delta/\epsilon}$, and chemical shift values of γ-, δ-, and ε-aliphatic sidechain carbons located peripheral to β-carbons, $^{13}C^{\gamma/\delta/\epsilon}$, of a protein molecule. The method involves providing a protein sample and conducting a set of G matrix Fourier transformation (GFT) nuclear magnetic resonance (NMR) experiments on the protein sample including: (1) a (4,2)D [HCCH-COSY] GFT NMR experiment to measure and connect the chemical shift values of a proton of amino acid residue i–1, $^{1}H_{i-1}$, a carbon of amino acid residue i–1 coupled to $^{1}H_{i-1}$, $^{13}C_{i-1}$, a carbon coupled to $^{13}C_{i-1}$, $^{13}C_{i-1}^{coupled}$, and a proton coupled to $^{13}C_{i-1}^{coupled}$, $^{1}H_{i-1}^{coupled}$, and (2) a (5,3)D [HBHACBCACA(CO)NHN] GFT NMR experiment to measure and connect the chemical shift values of α- and β-protons of amino acid residue i–1, $^{1}H^{\alpha/\beta}_{i-1}$, and α- and β-carbons of amino acid residue i–1, $^{13}C^{\alpha/\beta}_{i-1}$. Then, assignments of the chemical shift values of $^{1}H^{\gamma/\delta/\epsilon}$ and $^{13}C^{\gamma/\delta/\epsilon}$ are obtained by (i) identifying $^{1}H_{i-1}$, $^{13}C_{i-1}$, $^{13}C_{i-1}^{coupled}$, and $^{1}H^{N}_{i-1}^{coupled}$ measured by the (4,2)D [HCCH-COSY] GFT NMR experiment as $^{1}H^{\alpha}_{i-1}$, $^{13}C^{\alpha}_{i-1}$, $^{13}C^{\beta}_{i-1}$, and $^{1}H^{\beta}_{i-1}$, respectively, and thereby matching the chemical shift values of $^{1}H^{\alpha/\beta}_{i-1}$ and $^{13}C^{\alpha/\beta}_{i-1}$ with the chemical shift values of $^{1}H^{\alpha/\beta}_{i-1}$ and $^{13}C^{\alpha/\beta}_{i-1}$ measured by the (5,3)D HBHACBCACA(CO)NHN] GFT NMR experiment, and (ii) using the chemical shift values of $^{1}H^{\alpha/\beta}_{i-1}$, and $^{13}C^{\alpha/\beta}_{i-1}$ in conjunction with other chemical shift connections from the (4,2)D [HCCH-COSY] GFT NMR experiment to measure the chemical shift values of $^{1}H^{\gamma/\delta/\epsilon}_{i-1}$ and $^{13}C^{\gamma/\delta/\epsilon}_{i-1}$.

A further aspect of the present invention relates to a method for assigning chemical shift values of a γ-carbon, $^{13}C^{\gamma}$, a δ-carbon, $^{13}C^{\delta}$, and a δ-proton, $^{1}H\delta$, of an amino acid residue containing an aromatic spin system in a protein molecule. The method involves providing a protein sample and conducting a set of G matrix Fourier transformation (GFT) nuclear magnetic resonance (NMR) experiments on the protein sample including: (1) a (5,3)D [HBCBCGCDHD] GFT NMR experiment to measure and connect the chemical shift values of a β-proton of amino acid residue i–1, $^{1}H^{\beta}_{i-1}$, a β-carbon of amino acid residue i–1, $^{13}C^{\beta}_{i-1}$, a δ-carbon of amino acid residue i–1, $^{13}C^{\gamma}_{i-1}$, a δ-carbon of amino acid residue i–1, $^{13}C^{\delta}_{i-1}$, and a δ-proton of amino acid residue i–1, $^{1}H^{\delta}_{i-1}$, and (2) a (5,3)D [HBHACBCACA(CO)NHN] GFT NMR experiment to measure and connect the chemical shift values of $^{1}H^{\beta}_{i-1}$ and $^{13}C^{\beta}_{i-1}$. Then, assignments of the chemical shift values of $^{13}C^{\gamma}$, $^{13}C^{\delta}$, and $^{1}H^{\delta}$ are obtained by (i) matching the chemical shift values of $^{1}H^{\beta}_{i-1}$ and $^{13}C^{\beta}_{i-1}$ measured by the (5,3)D HBCBCACA(CO)NHN GFT NMR experiment with the chemical shift values of $^{1}H^{\beta}_{i-1}$ and $^{13}C^{\beta}_{i-1}$ measured by the (5,3)D [HBCBCGCDHD] GFT NMR experiment, and (ii) using the chemical shift values of $^{13}C^{\gamma}$, $^{13}C^{\delta}$, and $^{1}H^{\delta}$ to identify the type of amino acid residue containing the aromatic spin system.

The present invention also relates to a method for assigning chemical shift values of aliphatic and aromatic protons and aliphatic and aromatic carbons of an amino acid residue containing aliphatic and aromatic spin systems in a protein molecule. The method involves providing a protein sample and conducting a set of G matrix Fourier transformation (GFT) nuclear magnetic resonance (NMR) experiments on the protein sample including: (1) a first GFT NMR experiment, which is selected from the group consisting of a (5,3)D [HCC,CH-COSY] GFT NMR experiment, a (4,2)D [HCCH-COSY] GFT NMR experiment, a (5,2)D [HCCCH-COSY] GFT NMR experiment, and a (5,3)D [HCCCH-COSY] GFT NMR experiment and is acquired for the aliphatic spin system, to measure and connect the chemical shift values of α- and β-protons of amino acid residue i, $^{1}H^{\alpha/\beta}_{i}$, α- and β-carbons of amino acid residue i, $^{13}C^{\alpha/\beta}_{i}$, a γ-carbon of amino acid residue i, $^{13}C^{\gamma}_{i}$, and (2) a second GFT NMR experiment, which is selected from the group consisting of a (5,3)D [HCC,CH-COSY] GFT NMR experiment, a (4,2)D [HCCH-COSY] GFT NMR experiment, a (5,2)D [HCCCH-COSY] GFT NMR experiment, and a (5,3)D [HCCCH-COSY] GFT NMR experiment and is acquired for the aromatic spin system, to measure and connect the chemical shift values of $^{13}C^{\gamma}_{i}$ and other aromatic protons and carbons of amino acid residue i. Then, assignments of the chemical shift values of the aliphatic and aromatic protons and aliphatic and aromatic carbons are obtained by matching the chemical shift value of $^{13}C^{\gamma}_{i}$ measured by the first GFT NMR experiment with the chemical shift value of $^{13}C^{\gamma}_{i}$ measured by the second GFT NMR experiment. In another embodiment, the set of GFT NMR experiments can be conducted by using $^{13}C^{\gamma}$ steady state magnetization to generate first order central peaks.

The above-described methods for assigning chemical shift values in a protein molecule can involve further subjecting the protein sample to nuclear Overhauser enhancement spectroscopy (NOESY) (Wüthrich, *NMR of Proteins and Nucleic Acids*, Wiley, New York (1986), which is hereby incorporated by reference in its entirety), to NMR experiments that measure scalar coupling constants (Eberstadt et al., *Angew. Chem. Int. Ed. Engl.*, 34:1671–1695 (1995); Cordier et al., *J. Am. Chem. Soc.*, 121:1601–1602 (1999), which are hereby incorporated by reference in their entirety), or to NMR experiments that measure residual dipolar coupling constants (Prestegard, *Nature Struct. Biol.*, 5:517–522 (1998); Tjandra et al., *Science*, 278:1111–1114 (1997), which are hereby incorporated by reference in their entirety), to deduce the tertiary fold or tertiary structure of the protein molecule.

Another aspect of the present invention relates to a method for obtaining assignments of chemical shift values of $^{1}H$, $^{13}C$, and $^{15}N$ of a protein molecule. The method involves providing a protein sample and conducting five G matrix Fourier transformation (GFT) nuclear magnetic resonance (NMR) experiments on the protein sample, where (1) a first experiment is a (4,3)D [HNNCACBCA] GFT NMR experiment for obtaining intraresidue correlations of chemical shift values; (2) a second experiment is a (5,3)D [HBHACBCACA(CO)NHN] GFT NMR experiment for obtaining interresidue correlations of chemical shift values; (3) a third experiment is a (5,3)D [HCC,CH-COSY] GFT NMR experiment for obtaining assignments of aliphatic sidechain chemical shift values; (4) a fourth experiment is a (5,3)D [HBCBCGCDHD] GFT NMR experiment for linking chemical shift values of aliphatic protons, $^{1}H^{\beta}$ and $^{13}C^{\beta}$, and aromatic protons, $^{13}C^{\delta}$ and $^{1}H^{\delta}$; and (5) a fifth experiment is a (4,2)D [HCCH-COSY] GFT NMR experiment for obtaining assignments of aromatic sidechain chemical shift values. These five GFT NMR experiments can be employed for obtaining nearly complete resonance assignments of proteins including aliphatic and aromatic side chain spin systems.

EXAMPLES

The following examples are provided to illustrate embodiments of the present invention but are by no means intended to limit its scope.

Example 1

Frequency Domain Editing of Chemical Shift Multiplets and Relation to the Formalism for Time Domain Editing When designing a GFT NMR experiment (FIG. 1), one first identifies a "target" dimensionality, $N_t$, at which the majority of the peaks are resolved. The dimensionality N of a given FT NMR spectrum is then adapted to $N_t$ by jointly sampling K+1 chemical shifts (K=N−$N_t$) in a hypercomplex manner, while $N_t$−1 dimensions are sampled in a conventional fashion. As outlined, this yields $2^K$ $N_t$D spectra. As an example, the case of K=3 in the frequency domain (FIGS. 2, 16, and 17) is described in this example. The indirect evolution time shall be t, and $\Omega_0$ shall be the chemical shift detected in quadrature in each of the $N_t$D spectra. $\Omega_1$, $\Omega_2$ and $\Omega_3$ are the three jointly sampled shifts. The phases of the 90° pulses generating transverse magnetization for frequency labeling are chosen so that the transfer amplitudes of the real parts of the $2^K$=8 spectra, Sjr (=1 ... 8) are proportional to:

S1r ∝ cos($\Omega_0$t) cos($\Omega_1$t) cos($\Omega_2$t) cos($\Omega_3$t)
S2r ∝ cos($\Omega_0$t) sin($\Omega_1$t) cos($\Omega_2$t) cos($\Omega_3$t)
S3r ∝ cos($\Omega_0$t) cos($\Omega_1$t) sin($\Omega_2$t) cos($\Omega_3$t)
S4r ∝ cos($\Omega_0$t) sin($\Omega_1$t) sin($\Omega_2$t) cos($\Omega_3$t)
S5r ∝ cos($\Omega_0$t) cos($\Omega_1$t) cos($\Omega_2$t) sin($\Omega_3$t)
S6r ∝ cos($\Omega_0$t) sin($\Omega_1$t) cos($\Omega_2$t) sin($\Omega_3$t)
S7r ∝ cos($\Omega_0$t) cos($\Omega_1$t) sin($\Omega_2$t) sin($\Omega_3$t)
S8r ∝ cos($\Omega_0$t) sin($\Omega_1$t) sin($\Omega_2$t) sin($\Omega_3$t).

FT and, depending on the number n of chemical shift sine modulations the application of a zero-order phase correction of n·90° yields the frequency domain spectra A1 ... A8. These spectra encode $\Omega_1$, $\Omega_2$, and $\Omega_3$ in signal splittings of "chemical shift multiplets" each comprising $2^K$=8 components. Cosine and sine modulations give rise (Ernst et al., *Principles of Nuclear Magnetic Resonance in One and Two Dimensions*, Clarendon, Oxford (1987), which is hereby incorporated by reference in its entirety) to in-phase and anti-phase splittings, respectively, and linear combinations of spectra A1 ... A8 provide spectra B1 ... B8 with peaks only at the frequencies of the individual multiplet components. Spectrum B1: $\Omega_0+\Omega_1+\Omega_2+\Omega_3$, B2: $\Omega_0-\Omega_1+\Omega_2+\Omega_3$, B3: $\Omega_0+\Omega_1-\Omega_2+\Omega_3$, B4: $\Omega_0-\Omega_1-\Omega_2+\Omega_3$, B5: $\Omega_0+\Omega_1+\Omega_2-\Omega_3$, B6: $\Omega_0-\Omega_1+\Omega_2-\Omega_3$, B7: $\Omega_0+\Omega_1-\Omega_2-\Omega_3$, and B8: $\Omega_0-\Omega_1-\Omega_2-\Omega_3$ (FIG. 2). Spectra B1 to B8 are the "basic spectra", and the selection of chemical shift multiplet components represents the phase-sensitive "editing of chemical shift multiplets".

Acquisition of peaks defining the centers of the chemical shift splittings ("central peaks") is required for unambiguous assignment, if two chemical shift quartets, ($\Omega_0$, $\Omega_1$, $\Omega_2$, $\Omega_3$) and ($\Omega'_0$, $\Omega'_1$, $\Omega'_2$, $\Omega'_3$), are correlated with degenerate chemical shifts in the other $N_t$−1 dimensions. Furthermore, degeneracy may occur between two or more shifts of the quartet itself, e.g., one may have that $\Omega_1=\Omega_1$. The information of the ND experiment resolving degeneracy in up to N−1 dimensions, is made available if central peaks are detected. First, spectra with transfer amplitudes of the real parts of $2^{K-1}$=4 spectra, Sjr (j=9 ... 12), encode $\Omega_1$ and $\Omega_2$, but no $\Omega_3$ signal splittings, S9r ∝ cos($\Omega_0$t) cos($\Omega_1$t) cos($\Omega_2$t)

S10r ∝ cos($\Omega_0$t) sin($\Omega_1$t) cos($\Omega_2$t)

S11r ∝ cos($\Omega_0$t) cos($\Omega_1$t) sin($\Omega_2$t)

S12r ∝ cos($\Omega_0$t) sin($\Omega_1$t) sin($\Omega_2$t)

and provide the centers of the $\Omega_3$-splittings. S9 ... S12 yield, as described, spectra B9 ... B12 with peaks at: B9: $\Omega_0+\Omega_1+\Omega_2$, B10: $\Omega_0-\Omega_2+\Omega_2$, B11: $\Omega_0+\Omega_1-\Omega_2$, B12: $\Omega_0-\Omega_2$. Second, spectra with transfer amplitudes for the real parts $2^{K-2}$=2 spectra, Sjr (l=13, 14), encode only $\Omega_1$-signal splittings S13r ∝ cos($\Omega_0$t) cos($\Omega_1$t)

S14r ∝ cos($\Omega_0$t) sin($\Omega_2$t)

and provide the centers of the $\Omega_2$-splittings. S13 and S14 yield B13 and B14 comprising peaks at: B13: $\Omega_0+\Omega_1$, B14: $\Omega_0-\Omega_1$. Third, $2^{K-3}$=1 spectrum, S15 with a transfer amplitude for the real part encoding no signal splittings, S15r ∝ cos($\Omega_0$t)

provides the centers of the $\Omega_1$-splittings.

GFT NMR data acquisition (FIG. 1) requires recording of a total of $$p = \sum_{k=0}^{K} 2^k = 2^{K+1} - 1$$

$N_t$D spectra (e.g., S1 ... S15 for K=3) with $2^K$ basic spectra and a total of $2^{K-1}$ central peak spectra. This set of p data sets is designated an "(N,$N_t$)D GFT NMR experiment", and central peaks due to omission of m chemical shifts are denoted to be of m-th order (e.g., B9 ... B12, B13, B14, and B15 represent first, second and third order central peaks, respectively).

For frequency domain editing, the data sets S1 ... S15 are Fourier transformed to yield spectra A1 ... A15 (FIG. 2), and, depending on the number n of chemical shift sine modulations, a zero-order phase correction of n·90° is applied. Subsequent linear combination yields the edited spectra B1 ... B15 (FIGS. 16 and 17) according to $$\hat{B}(K) = \hat{F}(K) \cdot \hat{A}(K) \quad (4),$$

where $\hat{F}(K)$ can be readily obtained from $\hat{F}(K-1)$ by tensor product formation:

$$\hat{F}(K) = \hat{F}(K-1) \oplus \hat{F}(1) \quad \text{with}$$

$$\hat{F}(1) = \begin{bmatrix} 1 & 1 \\ 1 & -1 \end{bmatrix}. \quad (5)$$

One thus obtains for K=2

$$\begin{bmatrix} B9 \\ B10 \\ B11 \\ B12 \end{bmatrix} = \begin{bmatrix} 1 & 1 & 1 & 1 \\ 1 & -1 & 1 & -1 \\ 1 & 1 & -1 & -1 \\ 1 & -1 & -1 & 1 \end{bmatrix} \cdot \begin{bmatrix} A9 \\ A10 \\ A11 \\ A12 \end{bmatrix}, \quad (6)$$

and for $K = 3$ $$\begin{bmatrix} B1 \\ B2 \\ B3 \\ B4 \\ B5 \\ B6 \\ B7 \\ B8 \end{bmatrix} = \begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix} \cdot \begin{bmatrix} A1 \\ A2 \\ A3 \\ A4 \\ A5 \\ A6 \\ A7 \\ A8 \end{bmatrix}. \quad (7)$$

The equations for K=1

$$\begin{bmatrix} B13 \\ B14 \end{bmatrix} = \begin{bmatrix} 1 & 1 \\ 1 & -1 \end{bmatrix} \cdot \begin{bmatrix} A13 \\ A14 \end{bmatrix}, \quad (8)$$

and for K=0

$$B15 = A15 \quad (9),$$

are likewise given here.

The matrices $\hat{G}(K)$ and $\hat{F}(K)$ for time and frequency domain editing of chemical shift multiplets (FIGS. 1 and 2) are related to each other according to $\hat{G}(K) = \hat{H}(K) \cdot \hat{P}(K)$ with $$\tilde{H}(K) = \hat{F}(K) \otimes \begin{bmatrix} 1 & 0 \\ 0 & 1 \end{bmatrix} \cdot \tilde{H}(K)$$

applies the addition scheme of $\hat{F}(K)$ (equation 5) to both real and imaginary parts. To derive $\hat{P}(K)$, $$\tilde{P}'(1) = \begin{bmatrix} \tilde{E} & 0 \\ 0 & \hat{P} \end{bmatrix}$$

is first defined with $$\tilde{E} = \begin{bmatrix} 1 & 0 \\ 0 & 1 \end{bmatrix} \text{ and } \hat{P} = \begin{bmatrix} 0 & -1 \\ 1 & 0 \end{bmatrix}.$$

The matrix $\hat{P}$ maps the real onto the imaginary, and the imaginary onto the negative real part. This corresponds to a zero-order 90° phase correction in the frequency domain. Accordingly, application of $\hat{P}^n$ corresponds to applying the n·90° zero-order phase correction alluded to above. $\hat{P}'(K+1)$ can be constructed from the $\hat{P}'(K)$ according to $$\tilde{P}'(K+1) = \tilde{P}'(K) \otimes \begin{bmatrix} \tilde{E} & 0 \\ 0 & \hat{P} \end{bmatrix}.$$

Expansion of the products of $\hat{E}$ and $\hat{P}$ resulting "after" (multiple) tensor product formation yields $\hat{P}(K)$, a matrix with a 2×2 block diagonal form.

For K=3, 2, and 1, thus, the following is obtained for $\hat{H}(K)$ and $\hat{P}(K)$.

$$\tilde{H}(3) = \begin{bmatrix} 1 & 0 & 1 & 0 & 1 & 0 & 1 & 0 & 1 & 0 & 1 & 0 & 1 & 0 & 1 & 0 \\ 0 & 1 & 0 & 1 & 0 & 1 & 0 & 1 & 0 & 1 & 0 & 1 & 0 & 1 & 0 & 1 \\ 1 & 0 & -1 & 0 & 1 & 0 & -1 & 0 & 1 & 0 & -1 & 0 & 1 & 0 & -1 & 0 \\ 0 & 1 & 0 & -1 & 0 & 1 & 0 & -1 & 0 & 1 & 0 & -1 & 0 & 1 & 0 & -1 \\ 1 & 0 & 1 & 0 & -1 & 0 & -1 & 0 & 1 & 0 & 1 & 0 & -1 & 0 & -1 & 0 \\ 0 & 1 & 0 & 1 & 0 & -1 & 0 & -1 & 0 & 1 & 0 & 1 & 0 & -1 & 0 & -1 \\ 1 & 0 & -1 & 0 & -1 & 0 & 1 & 0 & 1 & 0 & -1 & 0 & -1 & 0 & 1 & 0 \\ 0 & 1 & 0 & -1 & 0 & -1 & 0 & 1 & 0 & 1 & 0 & -1 & 0 & -1 & 0 & 1 \\ 1 & 0 & 1 & 0 & 1 & 0 & 1 & 0 & -1 & 0 & -1 & 0 & -1 & 0 & -1 & 0 \\ 0 & 1 & 0 & 1 & 0 & 1 & 0 & 1 & 0 & -1 & 0 & -1 & 0 & -1 & 0 & -1 \\ 1 & 0 & -1 & 0 & 1 & 0 & -1 & 0 & -1 & 0 & 1 & 0 & -1 & 0 & 1 & 0 \\ 0 & 1 & 0 & -1 & 0 & 1 & 0 & -1 & 0 & -1 & 0 & 1 & 0 & -1 & 0 & 1 \\ 1 & 0 & 1 & 0 & -1 & 0 & -1 & 0 & -1 & 0 & -1 & 0 & 1 & 0 & 1 & 0 \\ 0 & 1 & 0 & 1 & 0 & -1 & 0 & -1 & 0 & -1 & 0 & -1 & 0 & 1 & 0 & 1 \\ 1 & 0 & -1 & 0 & -1 & 0 & 1 & 0 & -1 & 0 & 1 & 0 & 1 & 0 & -1 & 0 \\ 0 & 1 & 0 & -1 & 0 & -1 & 0 & 1 & 0 & -1 & 0 & 1 & 0 & 1 & 0 & -1 \end{bmatrix},$$

$$\tilde{H}(2) = \begin{bmatrix} 1 & 0 & 1 & 0 & 1 & 0 & 1 & 0 \\ 0 & 1 & 0 & 1 & 0 & 1 & 0 & 1 \\ 1 & 0 & -1 & 0 & 1 & 0 & -1 & 0 \\ 0 & 1 & 0 & -1 & 0 & 1 & 0 & -1 \\ 1 & 0 & 1 & 0 & -1 & 0 & -1 & 0 \\ 0 & 1 & 0 & 1 & 0 & -1 & 0 & -1 \\ 1 & 0 & -1 & 0 & -1 & 0 & 1 & 0 \\ 0 & 1 & 0 & -1 & 0 & -1 & 0 & 1 \end{bmatrix}, \tilde{H}(1) = \begin{bmatrix} 1 & 0 & 1 & 0 \\ 0 & 1 & 0 & 1 \\ 1 & 0 & -1 & 0 \\ 0 & 1 & 0 & -1 \end{bmatrix} \text{ and}$$

$$\tilde{P}(3) = \begin{bmatrix} 1 & 0 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 & 0 \\ 0 & 0 & 0 & -1 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 & 0 \\ 0 & 0 & 0 & 0 & 0 & -1 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 \\ 0 & 0 & 0 & 0 & 0 & 0 & -1 & 0 & 0 & 0 & 0 & 0 & 0 & 0 & 0 & 0 \\ 0 & 0 & 0 & 0 & 0 & 0 & 0 & -1 & 0 & 0 & 0 & 0 & 0 & 0 & 0 & 0 \\ 0 & 0 & 0 & 0 & 0 & 0 & 0 & 0 & 0 & -1 & 0 & 0 & 0 & 0 & 0 & 0 \\ 0 & 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 0 & 0 & 0 & -1 & 0 & 0 & 0 & 0 & 0 \\ 0 & 0 & 0 & 0 & 0 & 0 & 0 & 0 & 0 & 0 & 0 & -1 & 0 & 0 & 0 & 0 \\ 0 & 0 & 0 & 0 & 0 & 0 & 0 & 0 & 0 & 0 & 0 & 0 & -1 & 0 & 0 & 0 \\ 0 & 0 & 0 & 0 & 0 & 0 & 0 & 0 & 0 & 0 & 0 & 0 & 0 & -1 & 0 & 0 \\ 0 & 0 & 0 & 0 & 0 & 0 & 0 & 0 & 0 & 0 & 0 & 0 & 0 & 0 & 0 & 1 \\ 0 & 0 & 0 & 0 & 0 & 0 & 0 & 0 & 0 & 0 & 0 & 0 & 0 & 0 & -1 & 0 \end{bmatrix},$$

$$\tilde{P}(2) = \begin{bmatrix} 1 & 0 & 0 & 0 & 0 & 0 & 0 & 0 \\ 0 & 1 & 0 & 0 & 0 & 0 & 0 & 0 \\ 0 & 0 & 0 & -1 & 0 & 0 & 0 & 0 \\ 0 & 0 & 1 & 0 & 0 & 0 & 0 & 0 \\ 0 & 0 & 0 & 0 & 0 & -1 & 0 & 0 \\ 0 & 0 & 0 & 0 & 1 & 0 & 0 & 0 \\ 0 & 0 & 0 & 0 & 0 & 0 & -1 & 0 \\ 0 & 0 & 0 & 0 & 0 & 0 & 0 & -1 \end{bmatrix}, \tilde{P}(1) = \begin{bmatrix} 1 & 0 & 0 & 0 \\ 0 & 1 & 0 & 0 \\ 0 & 0 & 0 & -1 \\ 0 & 0 & 1 & 0 \end{bmatrix}.$$

Example 2

Options to Implement Central Peak Acquisition in GFT NMR

The successive identification of peak pairs belonging to central peaks of decreasing order ensures the unambiguous assignment of chemical shift multiplet components (FIGS. 2 and 3). Such central peak acquisition can be achieved in three different ways. First, the p spectra constituting the (N,N$_t$)D GFT NMR experiment can be acquired by successive omission of shift evolution periods from the ND FT NMR radiofrequency pulse scheme affording the basic spectra (Option 1). Alternatively, central peaks can be obtained from incomplete polarization transfer (Option 2) (Szyperski et al., J. Magn. Reson. B 108:197–203 (1995), which is hereby incorporated by reference in its entirety). The exclusive use of this approach corresponds to their simultaneous acquisition in the $2^K$ basic spectra. Alternatively, heteronuclear steady state magnetization can be recruited (Option 3) (Szyperski et al., J. Am. Chem. Soc. 118:8146–8147 (1996); Szyperski et al., J. Biomol NMR, 11:387–405 (1998), which are hereby incorporated by reference in there entirety). For each order of central peaks obtained in such a way a recording of two subspectra is required so that the number of data sets increases twofold. The exclusive use of this approach would require recording of $_4{}^K$ different N$_t$D data sets. These yield, after data processing, the desired $p=2^{K+1}-1$ spectra.

Depending on the particular magnetization transfer pathway and practical constraints, one can combine the three options for central peak detection. The second and third option offer that (i) magnetization yielding unwanted "axial peaks" in the conventional experiment is used, (Szyperski et al., J. Am. Chem. Soc. 118:8146–8147 (1996), which is hereby incorporated by reference in its entirety) and that (ii) central peaks are registered even if the resonances in the higher-order spectra are broadened. Overall, $2^K < p < _4{}^K$ data sets thus need to be recorded to obtain the (N,N$_t$)D GFT NMR experiment: the resulting "sampling demand" is equivalent to recording an ND FT NMR experiment with only "one ($2^K$ data sets) to two ($_4{}^K$ data sets) complex points" in each of the K dimensions.

Example 3

Formula to Calculate the Reductions in Minimal Measurement Times for Different Options for Central Peak Acquisition

With respect to Option 1 for central peak acquisition (see Example 2), if the p data sets defining the (N,N$_t$)D experiment are separately recorded, the ratio $\epsilon_1$ is as defined in equation 3:

$$\varepsilon_1 = \frac{T_m(FT)}{T_m(GFT)} = (2^K/(2^{K+1}-1)) \cdot \left(\prod_{j=0}^{K} n_j\right) \bigg/ \left(\sum_{j=0}^{K} n_j\right), \quad (3), (10)$$

With respect to Option 2 for central peak acquisition (see Example 2), if the basic spectra are recorded with simultaneous acquisition of central peaks from incomplete INEPT, one obtains $\epsilon_2$:

$$\varepsilon_2 = \frac{T_m(FT)}{T_m(GFT)} = \left(2^{K+1} \cdot \prod_{j=0}^{K} n_j\right) \bigg/ \left(2^K \cdot 2 \cdot \sum_{j=0}^{K} n_j\right) \quad (11)$$

$$= \left(\prod_{j=0}^{K} n_j\right) \bigg/ \left(\sum_{j=0}^{K} n_j\right),$$

i.e., the ratio becomes simply the product of the number of points over the corresponding sum.

With respect to Option 3 for central peak acquisition (see Example 2), if heteronuclear magnetization is exclusively used for central peak detection, one obtains $\epsilon_3$:

$$\varepsilon_3 = \frac{T_m(FT)}{T_m(GFT)} = (1/2^K) \cdot \left(\prod_{j=0}^{K} n_j\right) \bigg/ \left(\sum_{j=0}^{K} n_j\right). \quad (12)$$

Table 1 illustrates the representative calculations of the reductions in minimal measurement times in GFT NMR.

TABLE 1

The Reduction of Minimal Measurement Times, $\epsilon$, for K = 1, 2, 3 and Different Approaches for Central Peak Detection Assuming That Each of the Projected K + 1 Dimensions are Sampled with 16(32) Complex Points

|  | $2^K$ basic data sets[a] equation 11 | $2^{K+1} - 1$ data sets[b] equation 3 | $4^K$ data sets[c] equation 12 |
|---|---|---|---|
| K = 1 | $\epsilon_2$ = 8 (16) | $\epsilon_1$ = 5.3 (10.7) | $\epsilon_3$ = 4 (8) |
| K = 2 | $\epsilon_2$ = 85 (341) | $\epsilon_1$ = 48.6 (195) | $\epsilon_3$ = 21 (85) |
| K = 3 | $\epsilon_2$ = 1024 (8192) | $\epsilon_1$ = 546 (4369) | $\epsilon_3$ = 128 (1024) |

[a]Central peaks obtained exclusively from incomplete polarization transfer (Szyperski et al., J. Magn. Reson. B 108: 197–203 (1995), which is hereby incorporated by reference in its entirety).
[b]Central peaks obtained by successive omission of chemical shift evolution periods in the parent experiment.
[c]Central peaks exclusively obtained from heteronuclear steady-state magnetization (Szyperski et al., J. Am. Chem. Soc. 118: 8146–8147 (1996), which is hereby incorporated by reference in its entirety).

For the implementation of (5,2)D HACACONHN, $^{13}C^\alpha$ steady state magnetization was used to detect the first order central peaks defining the $\Omega_1(^1H^\alpha)$ splittings (see Examples 4 and 5), which yields a second set of 8 data sets. Second and third order central peaks defining, respectively, the $\Omega_2(^{13}C^\alpha)$ and $\Omega_1(^{13}C')$ splittings were obtained from separate recording of somewhat higher resolved reduced-dimensionality (Szyperski et al., Proc. Natl. Acad. Sci. USA, 99:8009–8014 (2002); Szyperski et al. J. Biomol. NMR. 3:127–132 (1993); Szyperski et al., J. Am. Chem. Soc. 115:9307–9308 (1993); Szyperski et al., J. Magn. Reson. B 105:188–191 (1994); Brutscher et al., J. Magn. Reson. B 105:77–82 (1994); Szyperski et al., J. Magn. Reson. B 108:197–203 (1995); Brutscher et al., J. Magn. Reson. B 109:238–242 (1995); Szyperski et al., J. Am. Chem. Soc. 118:8146–8147 (1996); Bracken et al., J. Biomol. NMR 9:94–100 (1997); Szyperski et al., J. Biomol NMR, 11:387–405 (1998); Astrof et al., J. Magn. Reson. 152:303–307 (2001); Xia et al., J. Biomol. NMR 24:41–40 (2002), which are hereby incorporated by reference in their entirety). 2D HNNCO, an experiment derived from the HNNCO scheme (Cavanagh et al., Protein NMR Spectroscopy, Academic Press, San Diego (1996), which is hereby incorporated by reference in its entirety) (two data sets), and 2D [$^{15}$N, $^1$H]-HSQC (Ernst et al., Principles of Nuclear Magnetic Resonance in One and Two Dimensions, Clarendon, Oxford (1987), which is hereby incorporated by reference in its entirety), respectively (FIG. 16). The use of $^{13}C^\alpha$ steady-state magnetization for first order central peak detection yields $\epsilon$=250 being intermediate between F (equation 3) and $\epsilon_3$ (equation 12).

Example 4

NMR Spectroscopy

For the 76-residue protein ubiquitin nearly all signals of 2D [$^{15}$N, $^1$H]-HSQC (Ernst et al., Principles of Nuclear Magnetic Resonance in One and Two Dimensions, Clarendon, Oxford (1987), which is hereby incorporated by reference in its entirety) are resolved so that N$_t$=2 is an obvious choice. As an application, a (5,2)D HACACONHN GFT NMR experiment (K=3) was, thus, recorded within 138 minutes on a VARIAN INOVA 600 spectrometer using the HACACONHN rf pulse sequence shown in FIG. 6. This experiment correlates the polypeptide backbone $^1H^\alpha$, $^{13}C^\alpha$ and $^{13}C'$ chemical shifts of residue i with the backbone amide $^{15}$N and $^1H^N$ chemical shifts of residue i+1. The underlined letters denote that $\Omega_3(^1H^\alpha)$, $\Omega_2(^{13}C^\alpha)$, $\Omega_1(^{13}C')$ and $\Omega_0(^{15}N)$ are measured in a single dimension. A 2 mM solution of $^{15}$N/$^{13}$C doubly labeled ubiquitin in 90% H$_2$O/10% D$_2$O (50 mM K—PO$_4$; pH=5.8) was used at T=25° C.

Figure 6:
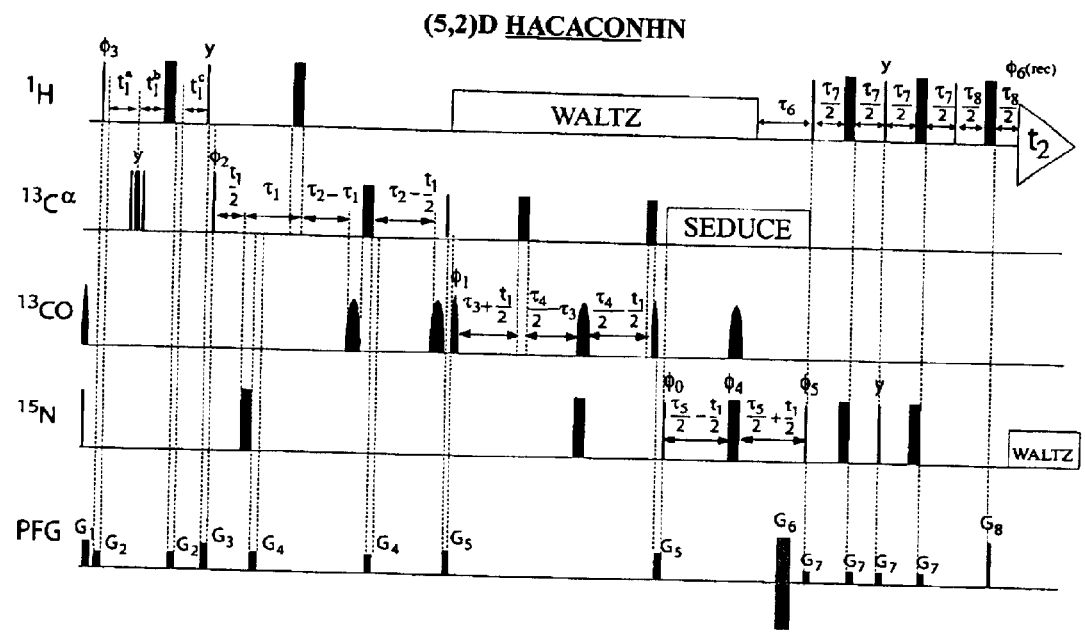
FIG. 6 illustrates the rf pulse sequence used to record the (5,2)D HACACONHN GFT NMR experiment. Rectangular 90° and 180° pulses are indicated by thin and thick vertical bars, respectively, and phases are indicated above the pulses. Where no rf phase is marked, the pulse is applied along x. The high power 90° pulse lengths were: 5.6 μs for $^1H$ and 15.3 μs for $^{13}C$, and 39 μs for $^{15}N$. Pulses on $^{13}C$ prior to $t_1(^{13}C)$ are applied at high power, and $^{13}C$ decoupling during $t_1(^1H)$ is achieved using a ($90_x$-$180_y$-$90_x$) composite pulse (Ernst et al., *Principles of Nuclear Magnetic Resonance in One and Two Dimensions*, Clarendon, Oxford 1987), which is hereby incorporated by reference in its entirety). Subsequently, the 90° and 180° pulse lengths of $^{13}C^\alpha$ are adjusted to 51.6 μs and 46 μs, respectively, to minimize perturbation of the $^{13}CO$ spins (Cavanagh et al., *Protein NMR Spectroscopy*, Academic Press, San Diego (1996), which is hereby incorporated by reference in its entirety). The width of the 90° pulses applied to $^{13}CO$ pulse is 51.6 μs and the corresponding 180° pulses are applied with same power. A SEDUCE (Cavanagh et al., *Protein NMR Spectroscopy*, Academic Press, San Diego (1996), which is hereby incorporated by reference in its entirety) 180° pulse with a length 252 μs is used to decouple $^{13}CO$ during $t_1$. WALTZ16 (Ernst et al., *Principles of Nuclear Magnetic Resonance in One and Two Dimensions*, Clarendon, Oxford (1987), which is hereby incorporated by reference in its entirety) is employed to decouple $^1H$ (rf field strength=9.2 kHz) during the heteronuclear magnetization transfers as well as to decouple $^{15}N$ (rf=1.78 kHz) during acquisition. The SEDUCE sequence (rf=1.0 kHz) is used for decoupling of $^{13}C^\alpha$ during the $^{15}N$ chemical shift evolution period. The $^1H$ rf carrier is placed at 4.78 ppm. The $^{13}C^\alpha$, $^{13}C'$ and $^{15}N$ rf carriers are set to 56.3 ppm, 174.3 ppm and 119.3 ppm, respectively. The duration and strengths of the pulsed z-field gradients (PFGs) are: G1 (1 ms, 24 G/cm); G2 (100 μs, 16 G/cm); G3 (1 ms, 24 G/cm); G4 (250 μs, 30 G/cm); G5 (1.5 ms, 20 G/cm); G6 (1.25 ms, 30 G/cm); G7 (500 μs, 8 G/cm); G8 (125 μs, 29.5 G/cm). All PFG pulses are of rectangular shape. The delays are: $\tau_1$=1.6 ms, $\tau_2$=3.6 ms, $\tau_3$=4.4 ms, $\tau_4$=$\tau_5$=24.8 ms, $\tau_6$=5.5 ms, $\tau_7$=4.6 ms, $\tau_8$=1 ms. $^1H$-frequency labeling is achieved in a semi constant-time fashion with $t_1^a$ (0)=1.79 ms, $t_1^b$ (0)=1 μs, $t_1^c$ (0)=1.791 ms, $\Delta t_1^a$=62.5 μs, $\Delta t_1^b$=32.9 μs, $\Delta t_1^c$=29.6 μs. Hence, the fractional increase of the semi constant-time period with $t_1$ equals to $\lambda$=1+$\Delta t_1^c$/$\Delta t_1^a$=0.53. Phase cycling: $\phi_0$=x; $\phi_1$=x, -x; $\phi_2$=x, x, -x, -x; $\phi_3$=x; $\phi_4$=4x,4(-x); $\phi_6$(receiver)= 2(x,-x,-x,x). The sensitivity enhancement scheme of Kay et al., *J. Am. Chem. Soc.* 114:10663–10665 (1992), which is hereby incorporated by reference in its entirety, is employed, i.e., the sign of G6 is inverted in concert with a 180° shift of $\phi_5$. In case this enhancement scheme is not employed, quadrature detection is accomplished by altering the phase 4o according to States-TPPI (Cavanagh et al., *Protein NMR Spectroscopy*, Academic Press, San Diego (1996), which is hereby incorporated by reference in its entirety). For the setting of the phases $\phi_0$, $\phi_1$, $\phi_2$ and $\phi_3$ see Example 4.

With the HACACONHN rf pulse scheme of FIG. 6, sixteen individual data sets R1-R16 (to provide basic and first-order central peaks) were acquired in 6.9 minutes each, with SW$_1$($^{15}$N/$^{13}$C'/C$^{13}$C$^\alpha$/$^1H^\alpha$)=8,000 Hz and 53(t$_1$)*512 (t$_2$) complex points [t$_{1,max}$($^{15}$N/$^{13}$C'/$^{13}$C$^\alpha$/$^1H^\alpha$)=6.5 ms; t$_{2,max}$($^1H^N$)=73.2 ms], yielding after data processing (see Example 5) the twelve planes B1–B12 containing basic and first-order central peaks. The phase of the 90° rf pulses generating transverse $^{15}$N, $^{13}$C', $^{13}C^\alpha$ and $^1H^\alpha$ magnetization for frequency labeling are $\phi_0$, $\phi_1$, $\phi_2$, and $\phi_3$, respectively (FIG. 6). $\phi_0$ is altered between 0° and 90° for phase sensitive acquisition (Ernst et al., Principles of Nuclear Magnetic Resonance in One and Two Dimensions, Clarendon, Oxford (1987), which is hereby incorporated by reference in its entirety) of $\Omega_0(^{15}N)$ along t$_1$. The three phases $\phi_1$, $\phi_2$ and $\phi_3$ are independently altered between 0° and 90° for frequency discrimination of $\Omega_1(^{13}C')$, $\Omega_2(^{13}C^\alpha)$, and $\Omega_3(^1H^\alpha)$ in the first eight data sets R1-R8. For first order central peak detection using $^{13}$C steady-state magnetization (Szyperski et al., J. Am. Chem. Soc. 118:8146–8147 (1996); Szyperski et al., J. Biomol NMR, 11:387–405 (1998), which are hereby incorporated by reference in their entirety), the eight measurements are repeated with the first 90° pulse on $^1H^\alpha$ being shifted by 180°. This yields the following phase cycle for the 16 data sets R1-R16: $\phi_1$=8(x, y); $\phi_2$=4(2x, 2y); $\phi_3$=4x, 4y, 4(-x), 4(-y) with the receiver phase being unchanged. A reduced dimensionality (Szyperski et al., *Proc. Natl. Acad. Sci. USA*, 99:8009–8014 (2002); Szyperski et al., *J. Am. Chem. Soc.* 115:9307–9308 (1993), which are hereby incorporated by reference in their entirety) 2D HNNCO spectrum (second order central peaks) derived from a HNNCO scheme (Cavanagh et al., *Protein NMR Spectroscopy*, Academic Press, San Diego (1996), which is hereby incorporated by reference in its entirety) was acquired in 13.8 minutes with SW($^{15}$N/$^{13}$C')=8,000 Hz and 128($t_1$)*512($t_2$) complex points [$t_{1,max}$($^{15}$N/$^{13}$C')=15.9 ms; $t_{2,max}$($^1$H$^N$)=73.2 ms], yielding data sets R17 and R18 (B13 and B14 after data processing; see Example 5) with phase $\phi_3$=(x, y). A 2D [$^{15}$N, $^1$H]-HSQC spectrum (Ernst et al., *Principles of Nuclear Magnetic Resonance in One and Two Dimensions*, Clarendon, Oxford (1987), which is hereby incorporated by reference in its entirety) (third order central peaks) was acquired in 13.8 minutes with SW($^{15}$N)=8,000 Hz, and 256($t_1$)*512($t_2$) complex points [$t_{1,max}$($^{15}$N)=26 ms; $t_{2,max}$($^1$H$^N$)=73.2 ms], yielding the data set R19 (B15 after data processing; see Example 5). For larger systems requiring longer measurements, it might be advisable to derive second and third order central peaks from $^{13}$C' and $^{15}$N steady state magnetization, respectively. The total measurement time of the 19 data sets was 138 minutes. To obtain pure phases, zero first-order phase corrections must be ensured along $\omega_1$ by, for example, starting sampling at $t_1$=0 for all of the combined chemical shift evolution periods. Editing of chemical shift multiplets in the time domain is advantageous, because the extension of the time domain data by linear prediction (Ernst et al., *Principles of Nuclear Magnetic Resonance in One and Two Dimensions*, Clarendon, Oxford (1987), which is hereby incorporated by reference in its entirety) (from 53 to 106 complex points for data sets T1 to T12 and from 128 to 192 for data sets T13 and T14) profits from both maximizing the signal-to-noise of the time domain data and reducing the number of chemical shifts ("oscillators") to be predicted. The digital resolution after FT and zero-filling was 7.8 Hz/point along $\omega_1$ and 6.9 Hz/point along $\omega_2$.

A 5D FT HACACONHN spectrum acquired with the same maximal evolution times as the basic spectra of (5,2)D HACACONHN would require sampling of 10($t_1$)*11($t_2$)*22($t_3$)*13($t_4$)*512($t_5$) complex points [i.e., $$\left[\text{i.e., } n = \left(\sum_{j=0}^{K} n_j\right) - K\right]$$

with spectral widths of SW$_1$($^{15}$N)=1,440 Hz, SW$_2$($^{13}$C')=1,500 Hz, SW$_3$($^{13}$C$^\alpha$)=3,260 Hz, and SW$_4$($^1$H$^\alpha$)=1,800 Hz (i.e., $$\left[\text{i.e., } SW = \sum_{j=0}^{K} SW_j\right]$$

in 5.83 days of spectrometer time. For comparison of digital resolution in FT and GFT NMR, 2D [$\omega_1$, $\omega_5$]-, [$\omega_2$, $\omega_5$]-, [$\omega_3$, $\omega_5$]- and [$\omega_4$, $\omega_5$]-planes of the 5D FT HACACONHN experiment were recorded in 1.3, 1.4, 2.9 and 1.7 minutes, respectively. For line width comparisons with (5,2)D GFT HACACONHN, the same planes were also acquired with spectral widths of SW=8,000 Hz in the indirect dimension.

Example 5

Data Processing of the (5,2)D HACACONHN GFT NMR Spectrum

First order central peaks were derived from $^{13}$C steady state magnetization. (Szyperski et al., *J. Am. Chem. Soc.* 118:8146–8147 (1996); Szyperski et al., *J. Biomol NMR*, 11:387–405 (1998), which are hereby incorporated by reference in their entirety). This requires a "pre-processing" prior to G-matrix transformation. The data sets R1-R16 are combined to yield the basic data sets, S1 . . . S8, and first order central peak data sets, S9 . . . S12, respectively, according to:

$$\begin{bmatrix} S1 \\ S2 \\ S3 \\ S4 \\ S5 \\ S6 \\ S7 \\ S8 \end{bmatrix} = \begin{bmatrix} 1 & 0 & 0 & 0 & 0 & 0 & 0 & 0 & -1 & 0 & 0 & 0 & 0 & 0 & 0 & 0 \\ 0 & 1 & 0 & 0 & 0 & 0 & 0 & 0 & 0 & -1 & 0 & 0 & 0 & 0 & 0 & 0 \\ 0 & 0 & 1 & 0 & 0 & 0 & 0 & 0 & 0 & 0 & -1 & 0 & 0 & 0 & 0 & 0 \\ 0 & 0 & 0 & 1 & 0 & 0 & 0 & 0 & 0 & 0 & 0 & -1 & 0 & 0 & 0 & 0 \\ 0 & 0 & 0 & 0 & 1 & 0 & 0 & 0 & 0 & 0 & 0 & 0 & -1 & 0 & 0 & 0 \\ 0 & 0 & 0 & 0 & 0 & 1 & 0 & 0 & 0 & 0 & 0 & 0 & 0 & -1 & 0 & 0 \\ 0 & 0 & 0 & 0 & 0 & 0 & 1 & 0 & 0 & 0 & 0 & 0 & 0 & 0 & -1 & 0 \\ 0 & 0 & 0 & 0 & 0 & 0 & 0 & 1 & 0 & 0 & 0 & 0 & 0 & 0 & 0 & -1 \end{bmatrix} \cdot [R1 \ \ldots\ R8\ R9\ \ldots\ R16]^T. \quad (13)$$

and $$\begin{bmatrix} S9 \\ S10 \\ S11 \\ S12 \end{bmatrix} = \begin{bmatrix} 0 & 0 & 1 & 0 & 0 & 0 & 1 & 0 & 0 & 0 & 1 & 0 & 0 & 0 & 1 & 0 \\ 0 & 0 & 0 & 1 & 0 & 0 & 0 & 1 & 0 & 0 & 0 & 1 & 0 & 0 & 0 & 1 \\ 1 & 0 & 0 & 0 & 1 & 0 & 0 & 0 & 1 & 0 & 0 & 0 & 1 & 0 & 0 & 0 \\ 0 & 1 & 0 & 0 & 0 & 1 & 0 & 0 & 0 & 1 & 0 & 0 & 0 & 1 & 0 & 0 \end{bmatrix} \cdot [R1 \ \ldots\ R8\ R9\ \ldots\ R16]^T. \quad (14)$$

This corresponds to the difference and sum formation for central peak acquisition using $^{13}$C$^\alpha$ steady state magnetization (Szyperski et al., *J. Am. Chem. Soc.* 118:8146–8147 (1996); Szyperski et al., *J. Biomol NMR*, 11:387–405 (1998), which are hereby incorporated by reference in their entirety). Transverse $^{13}$C magnetization originating from $^{13}$C longitudinal steady state magnetization is 90° out of phase relative to transverse $^{13}$C magnetization originating from $^1$H magnetization. (Szyperski et al., *J. Am. Chem. Soc.* 118:8146–8147 (1996); Szyperski et al., *J. Biomol NMR*, 11:387–405 (1998), which are hereby incorporated by reference in their entirety). Hence, sin [$\Omega$($^{13}$C)t] and cos [$\Omega$($^{13}$C$^\alpha$)t] modulation are "swapped" for central peak acquisition and rows 1 and 2, and 3 and 4 in equation 14 are exchanged compared to equation 13. With S13 and S14 from 2D HNNCO, and S15 from 2D [$^{15}$N, $^1$H]-HSQC, the p=$2^{K+}$ 1−1=15 data sets constituting the (5,2)D HACACONHN experiment become available. The required phase sensitive editing of the chemical shift multiplet components can be achieved either in the frequency (see Example 1) or the time domain (equation 1).

$\hat{G}_c(K)$, as defined by equation 1, can be decomposed into real and imaginary part, $\hat{G}_c(K)=\hat{R}(K)+i\cdot\hat{I}(K)$. With $\hat{R}_j(K)$ and $\hat{I}_j(K)$ denoting the corresponding j-th row vectors, one then obtains the real $2^{K+1} \times 2^{K+1}$ square G-matrix, $\hat{G}(K)=[\hat{R}_1 \hat{I}_1 \hat{R}_2 \hat{I}_2 \ldots \hat{I}_{2^K} \hat{I}_{2^K}]^T$, which transforms $\hat{S}(K)$ into $\hat{T}(K)=[T1r\ T1i\ T2r\ Tri \ldots T2^K r\ T2^K i]^T$ according to $\hat{T}(K)=\hat{G}(K)\cdot\hat{S}(K)$. For time domain editing of the (5,2)D HACACONHN experiment, one thus obtains the following real G-matrices for K=3 (basic spectra):

$$\begin{bmatrix} T1r \\ T1i \\ T2r \\ T2i \\ T3r \\ T3i \\ T4r \\ T4i \\ T5r \\ T5i \\ T6r \\ T6i \\ T7r \\ T7i \\ T8r \\ T8i \end{bmatrix} = \begin{bmatrix} 1 & 0 & 0 & -1 & 0 & -1 & -1 & 0 & 0 & -1 & -1 & 0 & -1 & 0 & 0 & 1 \\ 0 & 1 & 1 & 0 & 1 & 0 & 0 & -1 & 1 & 0 & 0 & -1 & 0 & -1 & -1 & 0 \\ 1 & 0 & 0 & 1 & 0 & -1 & 1 & 0 & 0 & -1 & 1 & 0 & -1 & 0 & 0 & -1 \\ 0 & 1 & -1 & 0 & 1 & 0 & 0 & 1 & 1 & 0 & 0 & 1 & 0 & -1 & 1 & 0 \\ 1 & 0 & 0 & -1 & 0 & 1 & 1 & 0 & 0 & -1 & -1 & 0 & 1 & 0 & 0 & -1 \\ 0 & 1 & 1 & 0 & -1 & 0 & 0 & 1 & 1 & 0 & 0 & -1 & 0 & 1 & 1 & 0 \\ 1 & 0 & 0 & 1 & 0 & 1 & -1 & 0 & 0 & -1 & 1 & 0 & 1 & 0 & 0 & 1 \\ 0 & 1 & -1 & 0 & -1 & 0 & 0 & -1 & 1 & 0 & 0 & 1 & 0 & 1 & -1 & 0 \\ 1 & 0 & 0 & -1 & 0 & -1 & -1 & 0 & 0 & 1 & 1 & 0 & 1 & 0 & 0 & -1 \\ 0 & 1 & 1 & 0 & 1 & 0 & 0 & -1 & -1 & 0 & 0 & 1 & 0 & 1 & 1 & 0 \\ 1 & 0 & 0 & 1 & 0 & -1 & 1 & 0 & 0 & 1 & -1 & 0 & 1 & 0 & 0 & 1 \\ 0 & 1 & -1 & 0 & 1 & 0 & 0 & 1 & -1 & 0 & 0 & -1 & 0 & 1 & -1 & 0 \\ 1 & 0 & 0 & -1 & 0 & 1 & 1 & 0 & 0 & 1 & 1 & 0 & -1 & 0 & 0 & 1 \\ 0 & 1 & 1 & 0 & -1 & 0 & 0 & 1 & -1 & 0 & 0 & 1 & 0 & -1 & -1 & 0 \\ 1 & 0 & 0 & 1 & 0 & 1 & -1 & 0 & 0 & 1 & -1 & 0 & -1 & 0 & 0 & -1 \\ 0 & 1 & -1 & 0 & -1 & 0 & 0 & -1 & -1 & 0 & 0 & -1 & 0 & -1 & 1 & 0 \end{bmatrix} \cdot \begin{bmatrix} S1r \\ S1i \\ S2r \\ S2i \\ S3r \\ S3i \\ S4r \\ S4i \\ S5r \\ S5i \\ S6r \\ S6i \\ S7r \\ S7i \\ S8r \\ S8i \end{bmatrix} \quad (15)$$

for K=2 (first order central peaks):

$$\begin{bmatrix} T9r \\ T9i \\ T10r \\ T10i \\ T11r \\ T11i \\ T12r \\ T12i \end{bmatrix} = \begin{bmatrix} 1 & 0 & 0 & -1 & 0 & -1 & -1 & 0 \\ 0 & 1 & 1 & 0 & 1 & 0 & 0 & -1 \\ 1 & 0 & 0 & 1 & 0 & -1 & 1 & 0 \\ 0 & 1 & -1 & 0 & 1 & 0 & 0 & 1 \\ 1 & 0 & 0 & -1 & 0 & 1 & 1 & 0 \\ 0 & 1 & 1 & 0 & -1 & 0 & 0 & 1 \\ 1 & 0 & 0 & 1 & 0 & 1 & -1 & 0 \\ 0 & 1 & -1 & 0 & -1 & 0 & 0 & -1 \end{bmatrix} \cdot \begin{bmatrix} S9r \\ S9i \\ S10r \\ S10i \\ S11r \\ S11i \\ S12r \\ S12i \end{bmatrix} \quad (16)$$

for K=1 (second order central peaks):

$$\begin{bmatrix} T13r \\ T13i \\ T14r \\ T14i \end{bmatrix} = \begin{bmatrix} 1 & 0 & 0 & -1 \\ 0 & 1 & 1 & 0 \\ 1 & 0 & 0 & 1 \\ 0 & 1 & -1 & 0 \end{bmatrix} \cdot \begin{bmatrix} S13r \\ S13i \\ S14r \\ S14i \end{bmatrix}, \quad (17)$$

and for K=0 (third order central peaks):

$$\begin{bmatrix} T15r \\ T14i \end{bmatrix} = \begin{bmatrix} 1 & 0 \\ 0 & 1 \end{bmatrix} \cdot \begin{bmatrix} S15r \\ S15i \end{bmatrix}. \quad (18)$$

Since real and imaginary parts are recorded for all four chemical shifts $\Omega_0$, $\Omega_1$, $\Omega_2$, and $\Omega_3$ in the basic spectra (equation 15), the particular choice of $\Omega_0$ is, in principle, arbitrary. A suitable rearrangement of the FIDs allows one to exchange $\Omega_0$ with any of the other three chemical shifts after data acquisition. However, the order chosen for central peak detection defines $\Omega_0$. For the (5,2)D HACACONHN experiment, 2D [$^{15}$N, $^1$H]-HSQC is the most sensitive choice for third order central peak detection so that $\Omega_0 = \Omega$ ($^{15}$N).

Example 6

Peak Assignment and Calculation of Chemical Shifts

The chemical shift multiplets encoded in the edited spectra B1 . . . B15 of (5,2)D HACACONHN were identified starting from an assigned [$^{15}$N, $^1$H]-HSQC peak list in the "bottom-up" manner described in FIG. 3. The resulting peak lists of B1 . . . B15 were then used as input for a least squares fitting routine (Eadie et al., *Statistical Methods in Experimental Physics*, North-Holland, N.Y. (1982); Lau, *A Numerical Library in C for Scientists and Engineers*, CRC Press, Boca Raton (1995), which are hereby incorporated by reference in their entirety) solving an overdetermined system of 15 equations resulting from the $\Omega_1$-frequencies of the 15 peaks. This yielded the correlations involving $\Omega(^1\text{H}^\alpha_i)$, $\Omega(^{13}\text{C}^\alpha_i)$, $\Omega(^{13}\text{C}'_i)$, $\Omega(^{15}\text{N}_{i+1})$, and $\Omega(^1\text{H}^N_{i+1})$ (Table 2). A Monte Carlo simulation of error propagation (see description of FIG. 19 for details) served to provide an estimate for the standard deviations for the chemical shift measurements based on the measurements of line widths.

TABLE 2

Chemical Shifts[a] of Ubiquitin Measured in (5, 2)D HACACONHN.
The Following Standard Deviations Were Obtained (FIGS. 16–19);
$\sigma(^{15}\text{N}) = \pm 0.043$ ppm (2.4 Hz), $\sigma(^1\text{H}^N)$[b] = $\pm 0.006$ ppm (3.3 Hz),
$\sigma(^{13}\text{C}') = \pm 0.017$ ppm (2.6 Hz), $\sigma(^{13}\text{C}^\alpha) = \pm 0.019$ ppm
(2.9 Hz), $\sigma(^1\text{H}^\alpha) = \pm 0.006$ ppm (3.7 Hz).

| Residue | $\delta(^{15}\text{N})$ | $\delta(^1\text{H}^N)$[a] | $\delta(^{13}\text{C}')$ | $\delta(^{13}\text{C}^\alpha)$ | $\delta(^1\text{H}^\alpha)$ |
|---|---|---|---|---|---|
| M1 | | | 170.500 | 54.505 | 4.220 |
| Q2 | 122.911 | 8.965 | 176.021 | 55.178 | 5.289 |
| I3 | 115.095 | 8.328 | 172.351 | 59.678 | 4.161 |
| F4 | 118.498 | 8.624 | 175.151 | 55.162 | 5.642 |
| V5 | 121.256 | 9.317 | 174.775 | 60.430 | 4.815 |
| K6 | 127.847 | 8.954 | 177.095 | 54.682 | 5.293 |
| T7 | 115.413 | 8.762 | 176.890 | 60.564 | 4.932 |
| L8 | 121.248 | 9.129 | 178.821 | 57.561 | 4.302 |
| T9 | 105.850 | 7.656 | 175.494 | 61.463 | 4.423 |

TABLE 2-continued

Chemical Shifts[a] of Ubiquitin Measured in (5, 2)D HACACONHN. The Following Standard Deviations Were Obtained (FIGS. 16–19); σ($^{15}$N) = ±0.043 ppm (2.4 Hz), σ($^1$H$^N$)[b] = ±0.006 ppm (3.3 Hz), σ($^{13}$C') = ±0.017 ppm (2.6 Hz), σ($^{13}$C$^α$) = ±0.019 ppm (2.9 Hz), σ($^1$H$^α$) = ±0.006 ppm (3.7 Hz).

| Residue | δ($^{15}$N) | δ($^1$H$^N$)[a] | δ($^{13}$C') | δ($^{13}$C$^α$) | δ($^1$H$^α$) |
|---|---|---|---|---|---|
| G10 | 109.192 | 7.845 | 173.952 | 45.428 | 3.612/4.344 |
| K11 | 121.890 | 7.286 | 175.722 | 56.318 | 4.359 |
| T12 | 120.604 | 8.657 | 174.334 | 62.380 | 5.051 |
| I13 | 127.688 | 9.562 | 175.149 | 60.029 | 4.522 |
| T14 | 121.650 | 8.757 | 173.731 | 62.043 | 4.977 |
| L15 | 125.150 | 8.751 | 174.525 | 52.827 | 4.754 |
| E16 | 122.459 | 8.139 | 175.802 | 54.968 | 4.889 |
| V17 | 117.511 | 8.956 | 174.039 | 58.479 | 4.694 |
| E18 | 119.306 | 8.679 | | | |
| P19 | | | 175.261 | 65.330 | 4.124 |
| S20 | 103.394 | 7.048 | 174.592 | 57.431 | 4.360 |
| D21 | 123.869 | 8.070 | 176.285 | 55.924 | 4.687 |
| T22 | 108.971 | 7.895 | 176.760 | 59.658 | 4.905 |
| I23 | 121.290 | 8.538 | | | |
| E24[c] | | | 178.964 | 60.734 | 3.890 |
| N25 | 121.406 | 7.942 | 178.288 | 56.068 | 4.558 |
| V26 | 122.156 | 8.118 | 177.918 | 67.684 | 3.398 |
| K27 | 118.967 | 8.580 | 180.483 | 59.222 | 4.592 |
| A28 | 123.484 | 7.994 | 180.214 | 55.419 | 4.161 |
| K29 | 120.211 | 7.875 | 180.257 | 59.793 | 4.202 |
| I30 | 121.352 | 8.301 | 178.151 | 66.124 | 3.487 |
| Q31 | 123.551 | 8.568 | 178.820 | 60.067 | 3.822 |
| D32 | 119.733 | 8.036 | 177.278 | 57.454 | 4.333 |
| K33 | 115.432 | 7.446 | 177.777 | 58.193 | 4.310 |
| E34 | 114.269 | 8.742 | 177.909 | 55.395 | 4.570 |
| G35 | 108.796 | 8.518 | 173.915 | 46.100 | 3.929/4.135 |
| I36 | 120.298 | 6.174 | | | |
| P38 | | | 178.246 | 66.138 | 4.116 |
| D39 | 113.588 | 8.546 | 177.032 | 55.819 | 4.411 |
| Q40 | 116.885 | 7.834 | 175.381 | 55.647 | 4.463 |
| Q41 | 118.029 | 7.498 | 176.133 | 56.684 | 4.223 |
| R42 | 123.033 | 8.524 | 173.854 | 55.186 | 4.483 |
| L43 | 124.390 | 8.843 | 175.257 | 53.051 | 5.367 |
| I44 | 122.295 | 9.119 | 175.795 | 58.972 | 4.943 |
| F45 | 125.055 | 8.866 | 174.578 | 56.597 | 5.161 |
| A46 | 132.938 | 8.993 | 177.317 | 52.598 | 3.697 |
| G47 | 102.422 | 8.138 | 173.732 | 45.412 | 3.450/4.100 |
| K48 | 121.961 | 7.999 | 174.627 | 54.640 | 4.598 |
| Q49 | 123.000 | 8.664 | 175.566 | 55.922 | 4.540 |
| L50 | 125.679 | 8.579 | 176.611 | 54.287 | 4.090 |
| E51 | 123.110 | 8.407 | 175.475 | 55.979 | 4.511 |
| D52 | 120.354 | 8.179 | | | |
| G53[c] | | | 174.754 | 45.245 | 4.062 |
| R54 | 119.329 | 7.482 | 175.316 | 54.338 | 4.725 |
| T55 | 108.815 | 8.847 | 176.490 | 59.700 | 5.237 |
| L56 | 118.016 | 8.168 | 180.752 | 58.673 | 4.053 |
| S57 | 113.484 | 8.499 | 178.282 | 61.149 | 4.242 |
| D58 | 124.505 | 7.954 | 177.401 | 57.440 | 4.291 |
| Y59 | 115.770 | 7.276 | 174.663 | 58.295 | 4.651 |
| N60 | 115.940 | 8.174 | 174.256 | 54.179 | 4.351 |
| I61 | 118.831 | 7.264 | 174.514 | 62.470 | 3.371 |
| Q62 | 124.948 | 7.642 | 175.751 | 53.653 | 4.477 |
| K63 | 120.514 | 8.505 | 175.694 | 57.905 | 3.979 |
| E64 | 114.574 | 9.335 | 175.205 | 58.419 | 3.330 |
| S65 | 114.914 | 7.683 | 172.008 | 60.931 | 4.632 |
| T66 | 117.439 | 8.742 | 173.741 | 62.506 | 5.291 |
| L67 | 127.691 | 9.432 | 175.314 | 53.866 | 5.085 |
| H68 | 119.271 | 9.255 | 173.703 | 56.002 | 5.141 |
| L69 | 123.921 | 8.311 | 175.356 | 53.848 | 5.184 |
| V70 | 126.737 | 9.202 | 174.033 | 60.654 | 4.378 |
| L71 | 123.087 | 8.125 | 177.806 | 54.030 | 5.021 |
| R72 | 123.792 | 8.620 | 175.284 | 55.713 | 4.262 |
| L73 | 124.533 | 8.372 | 177.388 | 54.846 | 4.396 |
| R74 | 121.936 | 8.453 | 176.837 | 56.613 | 4.303 |
| G75 | 111.089 | 8.505 | 173.633 | 45.331 | 3.966 |
| G76 | 115.040 | 7.959 | | | |

[a]Chemical shifts are in ppm and relative to 2,2-dimethyl-2-silapentane-5-sulfonate (DSS).
[b]Directly measured chemical shift.
[c]Glu 24 and Gly 53 show broadened $^{15}$N—$^1$H$^N$ resonances.

Example 7

Analysis of the (5,2)D HACACONHN GFT NMR Experiment

A (5,2)D HACACONHN GFT NMR experiment for the 8.6 kDa protein ubiquitin was acquired as an application of the GFT NMR spectroscopy. FIG. 16 shows the chemical shift multiplets as well as the resulting edited multiplet components, and FIG. 17 shows all 15 planes constituting the (5,2)D HACACONHN experiment. The bottom up identification (FIG. 3) of components forming a given shift multiplet allows one to retain the 5D correlations of the parent experiment. Peak detection was nearly complete so that a total of 67 chemical shift 5-tuples as well as 3 shift 6-tuples for glycines with non-degenerate $^1$H$^α$ shifts (Table 2) were obtained. The S/N ratios obtained in the GFT NMR experiment (The S/N ratios were between 6.4 and 12.0 in the basic spectra (FIG. 17A), and between 5.6 and 10.4 for first-order peaks (FIG. 17B), between 9.8 and 24.0 for second-order peaks (FIG. 17C), and between 44.0 and 108.0 for third-order central peaks (FIG. 17D).) demonstrate adequate adjustment of the measurement time to sensitivity requirements while the desired 5D chemical shift correlations were registered. The ratios also show that conventional 4D or 5D HACACONHN experiments had to be acquired in the sampling limited data collection regime because their minimal measurements are in the order of several days.

Because equivalent chemical shift correlations are provided by (5,2)D HACACONHN GFT and 5D HACACONHN FT NMR, these two experiments can be compared in terms of minimal measurement times and data sizes. An evident advantage of the GFT NMR experiment is the large reduction in $T_m$. Equation 3 predicts reductions in measurement times of about an order of magnitude for each dimension included into the joint sampling scheme (Table 1). In fact, the minimal measurement times with a single scan per FID each second (and the same $t_{max}$ for all chemical shift evolution periods as chosen for basic and first order central peak acquisition) are 33.5 min. and 5.83 days for (5,2)D HACACONHN GFT NMR (FIG. 17) and 5D HACACONHN FT NMR, revealing a 250-fold reduction in $T_m$ for the GFT experiment (note that this value deviates from ε=317 obtained with equation 2, due to the particular choice to implement central peak acquisition; see Example 3). Concomitantly, the data size is largely reduced when transformed data sets with equal digital resolution are compared (FIG. 18).

In order to assess the precision of the chemical shift measurements the resonance line widths need to be considered (Ernst et al., *Principles of Nuclear Magnetic Resonance in One and Two Dimensions*, Clarendon, Oxford (1987), which is hereby incorporated by reference in its entirety). In general, the joint sampling of K+1 "non constant-time" chemical shift evolution periods yields transfer amplitudes attenuated by $$\exp\left(-\sum_{j=0}^{K} R_{2,j} \cdot t\right),$$

where $R_{2,j}$ represents the transverse relaxation rate constant of the j-th dimension. However, higher-dimensional heteronuclear FT NMR shift correlation spectra are quite often recorded with frequency labeling being accomplished in a constant-time manner (Cavanagh et al., *Protein NMR Spectroscopy*. Academic Press, San Diego (1996), which is hereby incorporated by reference in its entirety) and/or with $t_{j,max} \ll 1/R_{2,j}$ for all j. As for the implementation of (5,2)D HACACONHN, the linewidth is then determined by the $t_{max}$ values but is not dependent on $R_{2j}$. Assuming for simplicity that all $t_{j,max}$ are identical, the $2^K$ lines of the chemical shift multiplets exhibit the same width as the corresponding single peak in ND FT NMR along each of the dimensions. Hence, peaks are not broadened in constant-time GFT NMR spectra with increasing K (The width at half height of the frequency domain sinc centre lobe resulting from truncation in the time domain at $t_{max}$ is given[2] by $0.604/t_{max}$. In the current implementation of (5,2)D HACACONHN (FIG. 6) all indirect evolution periods except for $\Omega(^1H^\alpha)$ are constant time periods. The evolution of $\Omega(^1H^\alpha)$ is implemented in a semi constant time manner (Cavanagh et al., *Protein NMR Spectroscopy*. Academic Press, San Diego (1996), which is hereby incorporated by reference in its entirety), so that signal losses due to transverse relaxation of $^1H^\alpha$ are negligible for 8.6 kDa ubiquitin at short $t_{max}$ values around 6.5 ms. For larger systems with short $T_2(^1H^\alpha)$, however, the semi constant time frequency labeling may lead to a detectable increase of $\omega_1$-linewidths in the basic when compared to central peak spectra.) This is neatly confirmed when comparing sol cross sections from (5,2)D HACACONHN with those taken from 2D HACACONHN spectra (FIGS. 18A–B).

Figure 19:
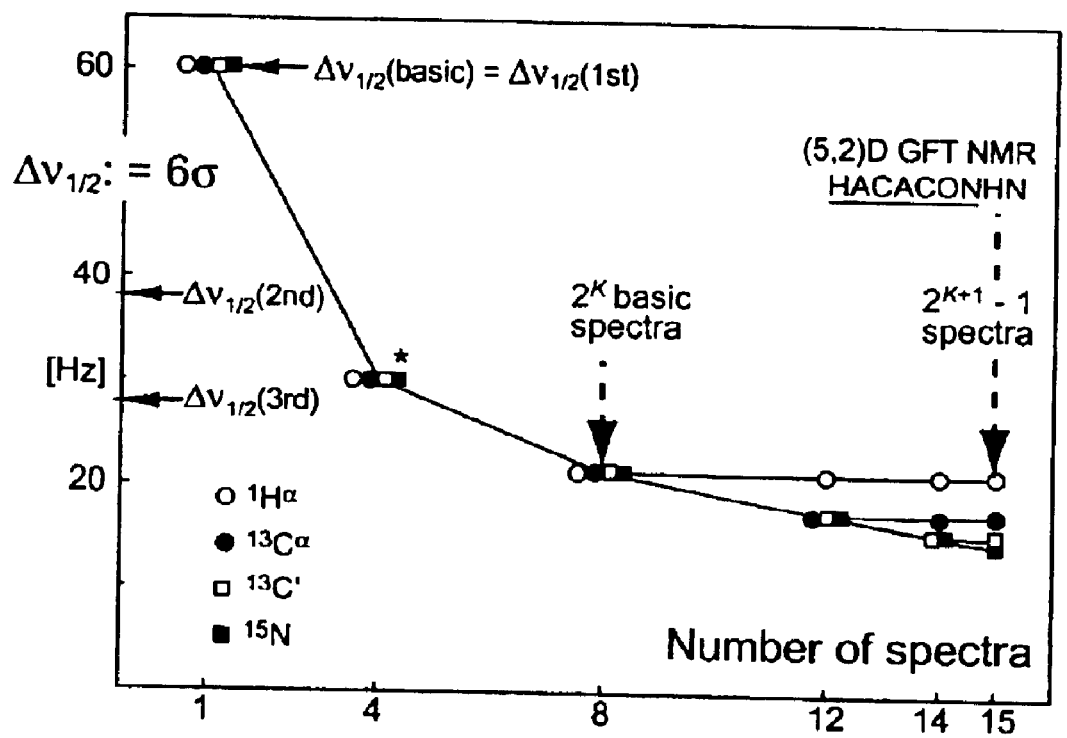
FIG. 19 illustrates Monte-Carlo simulations performed to assess the increased precision of chemical shift measurements in (5,2)D HACACONHN GFT NMR. Standard deviations for the chemical shift measurements are plotted versus the number of spectra selected from the 15 2D spectra constituting this experiment (FIG. 17) in order to calculate the chemical shifts. $\sigma(^1H^\alpha)$, $\sigma(^{13}C^\alpha)$, $\sigma(^{13}C')$ and $\sigma(^{15}N)$ represent the deviations for $\Omega_3(^1H^\alpha)$, $\Omega_2(^{13}C)$, $\Omega_1(^{13}C')$ and $\Omega_0(^{15}N)$ measurements, respectively. The following conservative statistical model is adopted. Line widths at half height, $\Delta v_{1/2}$, were measured along $\Omega_1$ in (i) B1–B12 (basic spectra and first order central peaks) providing $\Delta v_{1/2}$(basic)=$\Delta v_{1/2}$(first)=60.1 Hz, (ii) B13 and B14 (second order central peaks) providing $\Delta v_{1/2}$(second)=38.2 Hz and (iii) B15 (third order central peaks) providing $\Delta v_{1/2}$(3rd)=28.1 Hz [FIG. 17E; these values are close to those expected from the $t_{max}$ values obtained after linear prediction]. It is then assumed that the error for the identification of peak positions is associated with a Gaussian distribution, and that the Lorenzian line width, $\Delta v_{1/2}$, represents ±3σ (99.5% confidence interval), i.e., $\Delta v_{1/2}$=6σ. $\Delta v_{1/2}$(basic) is equal to the line widths in the indirect dimensions of conventional FT NMR spectra recorded with the same maximal evolution time (FIGS. 17E and 18). Hence, σ(basic) likewise represents the standard deviation obtained in FT NMR. Correspondingly are σ(second)=$\Delta v_{1/2}$(second)/6 and σ(third)=$\Delta v_{1/2}$(third)/6 the standard deviations for peak position identification in B13 and B14, and B15. The deviations $\sigma(^1H^\alpha)$, $\sigma(^{13}C^\alpha)$, $\sigma(^{13}C')$ and $\sigma(^{15}N)$ were obtained from Monte Carlo simulations of error propagation for which the following systems of equations were considered: (i) a minimal number of four out of the eight basic spectra (B1, B4, B6, B7.

The fact that the individual multiplet components possess the same line widths as the corresponding signals in the parent FT NMR experiment (FIGS. 18A–B) has a profound impact on the precision of the chemical shift measurement in constant time GFT NMR experiments such as (5,2)D HACACONHN. To relate line widths to errors of measurement, a conservative statistical model was adopted in which (i) the error for the identification of peak positions is associated with a Gaussian distribution and (ii) the Lorenzian line width, $\Delta v_{1/2}$, represents the corresponding 99.5% confidence interval (i.e., $\Delta v_{1/2}=6\sigma$). $\sigma$(basic), $\sigma$(first), $\sigma$(second) and $\sigma$(third) are the standard deviations for shift measurements in basic, first order, second order and third order central peak spectra, respectively. Considering (i) that lines do not broaden with increasing K (FIGS. 18A–B) and (ii) the different maximal evolution times (see Example 4), one has that $\sigma(\text{basic})=\sigma(\text{first})=\sigma^{FT}(^{13}C^\alpha)=\sigma^{FT}(^1H^\alpha)$, $\sigma(\text{second})=\sigma^{FT}(^{13}C')$ and $\sigma(\text{third})=\sigma^{FT}(^{15}N)$. $\sigma^{FT}(X)$ represents the standard deviation for the chemical shift measurement of nucleus X ($^1H^\alpha$, $^{13}C^\alpha$, $^{13}C'$, $^{15}N$) in conventional FT NMR spectra acquired with corresponding $t_{max}$. Monte Carlo simulations were performed to calculate the standard deviations $\sigma(^{13}C^\alpha)$, $\sigma(^1H^\alpha)$, $\sigma(^{13}C')$, and $\sigma(^{15}N)$ in (5,2)D HACACONHN GFT NMR for various selections of sub-spectra (FIGS. 19–20). If a minimal number of four basic spectra is selected to calculate $\Omega_3(^1H^\alpha)$, $\Omega_2(^{13}C^\alpha)$, $\sigma_1(^{13}C')$ and $\Omega_0(^{15}N)$, the precision depends on which four are selected (see FIG. 20 and its description for details). In the two most favorable cases, the standard deviations in the constant time GFT NMR experiment are reduced by a factor of $2=\sqrt{4}$, that is, $$\sigma(X) = \frac{1}{2}\sigma^{FT}(^1H^\alpha) = \frac{1}{2}\sigma^{FT}(^{13}C^\alpha) = \frac{1}{2}\sigma(\text{basic}).$$

If the 8 basic spectra are selected, the standard deviation is reduced by an additional factor of $\sqrt{2}$, yielding $$\sigma(X) = \frac{1}{\sqrt{8}} \cdot \sigma(\text{basic}).$$

Similarly, $$\sigma(X) = \frac{1}{\sqrt{12}} \cdot \sigma(\text{basic})$$

if both the 8 basic and 4 first order central peak spectra are chosen. The exact match between reductions by a factor of $\sqrt{n}$, where n represents the number of spectra, and the reductions obtained from the simulations (see descriptions of FIGS. 19–20 for details) reflects the well-known relation from statistics (Eadie et al., *Statistical Methods in Experimental Physics*, North-Holland, N.Y. (1982), which is hereby incorporated by reference in its entirety) stating that the standard deviation of an average arising from n multiple independent measurements is reduced by a factor of $\sqrt{n}$ (FIG. 1). For the implementation of (5,2)D HACACONHN, second- and third-order central peak spectra were acquired with longer maximal evolution times than the first-order central peak and basic spectra (FIG. 17E; see Example 4). Hence, $\sigma(^{13}C')$ and $\sigma(^{15}N)$ turned out to be somewhat smaller than $$\frac{1}{\sqrt{14}} \cdot \sigma(\text{basic}) \text{ and } \frac{1}{\sqrt{15}} \cdot \sigma(\text{basic}),$$

respectively, when 14 or all 15 spectra are considered (see description of FIG. 20 for details). When compared with $\sigma(\text{second})=\sigma^{FT}(^{13}C')$ and $\sigma(\text{third})=\sigma^{FT}(^{15}N)$, which reflect rather long maximal evolution times, the values of $\sigma(^{13}C')$ and $\sigma(^{15}N)$ are reduced by factors of 2.5 and 2.0, respectively. The Monte Carlo simulations are in neat agreement with analytical calculations of standard deviations using the Gaussian law of error propagation (Eadie et al., *Statistical Methods in Experimental Physics*, North-Holland, N.Y. (1982), which is hereby incorporated by reference in its entirety) (see description of FIG. 20) and are evidently a valuable tool to analyze the precision of shift measurements in more intricate future implementations of GFT NMR experiments.

Overall, the precision of the indirect shift measurements in the (5,2)D HACACONHN experiment [$\sigma(^1H^\alpha)$=3.7 Hz, $\sigma(^{13}C^\alpha)$=2.9 Hz, $\sigma(^{13}C')$=2.6 Hz, $\sigma(^{15}N)$=2.4 Hz] matched the one obtained in the direct dimension [$\sigma(^1H^N)$=3.3 Hz]. Remarkably, one can anticipate for molecules tumbling slower than ubiquitin at 25° C, that the precision of the indirectly detected shifts will be higher than for the directly detected amide proton shift. This is because the precision of shift measurements in the indirect constant-time evolution periods is determined by $t_{max}$ (which would not change for larger proteins), while the precision in the direct dimension is decreasing with increasing $R_{2,HN}$.

Example 8

Analytical Calculations Using the Gaussian Law of Error Propagation

Three different classes of combinations are identified.
(I) 2 combinations provide high precision $$\left[\sigma(X) = \frac{1}{2} \cdot \right.$$

$\sigma$(basic); X=$^1H^\alpha$, $^{13}C^\alpha$, $^{13}C'$, $^{15}N$] for all four chemical shifts:

$B1\ [\Omega_0+\Omega_1+\Omega_2+\Omega_3]$; $B4\ [\Omega_0-\Omega_1-\Omega_2+\Omega_3]$; $B6\ [\Omega_0-\Omega_1+\Omega_2-\Omega_3]$; and $B7\ [\Omega_0+\Omega_1-\Omega_2-\Omega_3]$, or $B2\ [\Omega_0-\Omega_1+\Omega_2+\Omega_3]$; $B3\ [\Omega_0+\Omega_1-\Omega_2+\Omega_3]$; $B5\ [\Omega_0+\Omega_1+\Omega_2-\Omega_3]$; and $B8\ [\Omega_0-\Omega_1-\Omega_2-\Omega_3]$.

(II) 26 combinations provide intermediate precision $$\left[\sigma(X) = \frac{1}{\sqrt{2}} \cdot \right.$$

$\sigma$(basic); X=$^1H^\alpha$, $^{13}C^\alpha$, $^{13}C'$, $^{15}N$] for all four chemical shifts.

(III) 37 combinations provide intermediate precision $$\left[\sigma = \frac{1}{\sqrt{2}} \cdot \right.$$

$\sigma$(basic)] for three of the shifts and low precision [$\sigma=\sigma$(basic)] for one of the four shifts.

The standard deviation depends on the number of equations that need to be linearly combined to calculate the shifts. This can be discussed for three examples, one representing each of the cases.

(I) $B2\ [\Omega_0-\Omega_1+\Omega_2+\Omega_3]$; $B3\ [\Omega_0+\Omega_1-\Omega_2+\Omega_3]$; $B5\ [\Omega_0+\Omega_1+\Omega_2-\Omega_3]$; and $B8\ [\Omega_0-\Omega_1-\Omega_2-\Omega_3]$ are selected. Then, the individual chemical shifts are obtained from:

$4\Omega_0(^{15}N)=B2+B3+B5+B8$ $4\Omega_1(^{13}C')=-B2+B3+B5-B8$ $4\Omega_2(^{13}C^\alpha)=B2-B3+B5-B8$ $4\Omega_3(^1H^\alpha)=B2+B3-B5-B8$ with "BX" representing the shifts extracted from the spectrum BX (X=2,3,5,8). Each shift from BX is associated with a standard deviation of $\sigma$(basic) Hence, the Gaussian law of error propagation (Eadie et al., *Statistical Methods in Experimental Physics*, North-Holland, N.Y. (1982), which is hereby incorporated by reference in its entirety) yields:

$\sigma[4\Omega_0(^{15}N)]=4\sigma[\Omega_0(^{15}N)]=\sqrt{4}\sigma(\text{basic})=2\cdot\sigma(\text{basic})$ $\sigma[4\Omega_0(^{13}C')]=4\sigma[\Omega_0(^{13}C')]=\sqrt{4}\sigma(\text{basic})=2\cdot\sigma(\text{basic})$ $\sigma[4\Omega_0(^{13}C^\alpha)]=4\sigma[\Omega_0(^{13}C^\alpha)]=\sqrt{4}\sigma(\text{basic})=2\cdot\sigma(\text{basic})$ $\sigma[4\Omega_0(^1H^\alpha)]=4\sigma[\Omega_0(^1H^\alpha)]=\sqrt{4}\sigma(\text{basic})=2\cdot\sigma(\text{basic})$, or equivalently, $$\sigma[\Omega_0(X)] = \frac{1}{\sqrt{4}}\sigma(\text{basic}) = \frac{1}{2}\cdot\sigma$$

(basic) for X=$^1H^\alpha$, $^{13}C^\alpha$, $^{13}C'$, $^{15}N$.

Thus, the resulting precision is equivalent to the one obtained from four statistically independent measurements.

(II) $B1\ [\Omega_0+\Omega_1+\Omega_2+\Omega_3]$; $B5\ [\Omega_0+\Omega_1+\Omega_2-\Omega_3]$; $B7\ [\Omega_0+\Omega_1-\Omega_2-\Omega_3]$; and $B8\ [\Omega_0-\Omega_1-\Omega_2-\Omega_3]$ are selected. Then, the individual chemical shifts are obtained from:

$2\ [\Omega_0(^{15}N)=B1+B8$ $2\Omega_1(^{13}C')=B7-B8$ $2\Omega_2(^{13}C^\alpha)=B5-B7$ $2\Omega_3(^1H^\alpha)=B1-B5$ with "BX" representing the shifts extracted from the spectrum BX (X=1,5,7,8). Each shift from BX is associated with a standard deviation of $\sigma$(basic). Hence, the Gaussian law of error propagation yields:

$\sigma[2\Omega_0(^{15}N)]=2\sigma[\Omega_0(^{15}N)]=\sqrt{2}\sigma(\text{basic})$ $\sigma[2\Omega_0(^{13}C')]=2\sigma[\Omega_0(^{13}C')]=\sqrt{2}\sigma(\text{basic})$ $\sigma[2\Omega_0(^{13}C^\alpha)]=2\sigma[\Omega_0(^{13}C^\alpha)]=\sqrt{2}\sigma(\text{basic})$ $\sigma[2\Omega_0(^1H^\alpha)]=2\sigma[\Omega_0(^1H^\alpha)]=\sqrt{2}\sigma(\text{basic})$, or equivalently, $$\sigma[\Omega_0(X)] = \frac{1}{\sqrt{2}}\sigma(\text{basic})$$

for X=$^1H^\alpha$, $^{13}C^\alpha$, $^{13}C'$, $^{15}N$.

Thus, the resulting precision is equivalent to the one obtained from two statistically independent measurements.

(III) $B1\ [\Omega_0+\Omega_1+\Omega_2+\Omega_3]$; $B4\ [\Omega_0-\Omega_1-\Omega_2+\Omega_3]$; $B5\ [\Omega_0+\Omega_1+\Omega_2-\Omega_3]$; and $B6\ [\Omega_0-\Omega_1+\Omega_2-\Omega_3]$ are selected. Then, the individual chemical shifts are obtained from:

$2\ [\Omega_0(^{15}N)=B4+B5$ $2\Omega_1(^{13}C')=B5-B6$ $2\Omega_2(^{13}C^\alpha)=B1-B4-B5+B6$ $2\Omega_3(^1H^\alpha)=B1-B5$ with "BX" representing the shifts extracted from the spectrum BX (X=1,4,5,6). Each shift from BX is associated with a standard deviation of $\sigma$(basic). Hence, the Gaussian law of error propagation yields:

$\sigma[2\Omega_0(^{15}N)]=2\sigma[\Omega_0(^{15}N)]=\sqrt{2}\sigma(\text{basic})$ $\sigma[2\Omega_0(^{13}C')]=2\sigma[\Omega_0(^{13}C')]=\sqrt{2}\sigma(\text{basic})$ $\sigma[2\Omega_0(^{13}C^\alpha)]=2\sigma[\Omega_0(^{13}C^\alpha)]=\sqrt{4}\sigma(\text{basic})=2\cdot\sigma(\text{basic})$ $\sigma[2\Omega_0(^1H^\alpha)]=2\sigma[\Omega_0(^1H^\alpha)]=\sqrt{2}\sigma(\text{basic})$ or equivalently, $$\sigma[\Omega_0(X)] = \frac{1}{\sqrt{2}} \sigma(\text{basic})$$

for $X = {}^1H^\alpha$, ${}^{13}C'$, ${}^{15}N$ and $\sigma[\Omega_0({}^{13}C^\alpha)] = \sigma(\text{basic})$ Thus, the resulting precision is equivalent to the one obtained from two statistically independent measurements for three of the chemical shifts, while it is equivalent to a single measurement for one of the shifts.

In case all 15 spectra constituting the constant time (5,2)D GFT NMR experiment are selected, similar considerations show that the resulting standard deviations can be calculated (Eadie et al., *Statistical Methods in Experimental Physics*, North-Holland, N.Y. (1982), which is hereby incorporated by reference in its entirety) according to the following equations.

(a) Survey of constant time spectra, standard deviations and chemical shift measurements

| Data | Number of Spectra | Standard Deviation | Chemical Shift Measurements |
|---|---|---|---|
| Basic | 8 | $\sigma(\text{basic})$ | $\Omega_0({}^{15}N) \pm \Omega_1({}^{13}C') \pm \Omega_2({}^{13}C^\alpha) \pm \Omega_3({}^1H^\alpha)$ |
| 1st | 4 | $\sigma(\text{1st})$ | $\Omega_0({}^{15}N) \pm \Omega_1({}^{13}C') \pm \Omega_2({}^{13}C^\alpha)$ |
| 2nd | 2 | $\sigma(\text{2nd})$ | $\Omega_0({}^{15}N) \pm \Omega_1({}^{13}C')$ |
| 3rd | 1 | $\sigma(\text{3rd})$ | $\Omega_0({}^{15}N)$ |

(b) Calculation of error propagation

| Chemical Shifts | Standard Deviations |
|---|---|
| $\Omega_0({}^{15}N)$ | $\sigma({}^{15}N) = \frac{\sqrt{8 \cdot \sigma^2(\text{basic}) + 4 \cdot \sigma^2(\text{1st}) + 2 \cdot \sigma^2(\text{2nd}) + \sigma^2(\text{3rd})}}{15}$ |
| $\Omega_1({}^{13}C')$ | $\sigma({}^{13}C') = \frac{\sqrt{8 \cdot \sigma^2(\text{basic}) + 4 \cdot \sigma^2(\text{1st}) + 2 \cdot \sigma^2(\text{2nd})}}{14}$ |
| $\Omega_2({}^{13}C^\alpha)$ | $\sigma({}^{13}C^\alpha) = \frac{\sqrt{8 \cdot \sigma^2(\text{basic}) + 4 \cdot \sigma^2(\text{1st})}}{12}$ |
| $\Omega_3({}^1H^\alpha)$ | $\sigma({}^1H^\alpha) = \frac{\sqrt{8 \cdot \sigma^2(\text{basic})}}{8}$ |

The validity of these equations is neatly confirmed by the Monte Carlo simulation performed with input from all 15 spectra:

| $\sigma$ | 6$\sigma$ (simulated) | 6$\sigma$ (calculated) |
|---|---|---|
| $\sigma({}^{15}N)$ | 14.50 | 14.46 |
| $\sigma({}^{13}C')$ | 15.35 | 15.37 |
| $\sigma({}^{13}C^\alpha)$ | 17.41 | 17.36 |
| $\sigma({}^1H^\alpha)$ | 21.24 | 21.26 |

Example 9

Implementation of the (5,2)D HACA,CONHN, (5,3)D HACA,CONHN/(5,3)D HACACONHN, and (4,3)D CBCACONHN/(4,3)D CBCA,CONHN GFT NMR Experiments The following GFT NMR experiments were implemented (FIG. 4): (i) with K=3, (5,2)D HACA,CONHN complementing (5,2)D HACACONHN for sequential assignment, (ii) with K=2, (5,3)D HACA,CONHN and (5,3)D HACACONHN, where, in contrast to the (5,2)D experiments in (i), the ${}^{15}N$ chemical shifts evolve separately, and (iii) with K=1, (4,3)D CBCACONHN and (4,3)D CBCA,CONHN. The underlined letters indicate which chemical shifts that are jointly sampled. After G-matrix transformation one obtains $2^{3+1} - 1 = 15$ 2D planes for the (5,2)D experiments (K=3), seven 3D spectra for the (5,3)D experiments (K=2) and three 3D spectra for the (4,3)D experiments (K=1). The magnetization transfer pathways are depicted in FIGS. 4A-C. Spectra were acquired for the 8.6 kDa protein ubiquitin and for the 14 kDa protein TT212 from the protein structure production pipeline of the Northeast Structural Genomics Consortium (http://www.nesg.org, which is hereby incorporated by reference in its entirety).

(5,2)D HACA,CONHN/(5,2)D HACACONHN and (5,3)D HACA,CONHN/(5,3)D HACACONHN correlate the backbone amide ${}^{15}N$ and ${}^1HN$ chemical shifts of residue i with the ${}^{13}C'$, ${}^{13}C^\alpha$ and ${}^1H^\alpha$ chemical shifts of residue i-1 and i, respectively, via one-bond scalar couplings (FIGS. 4A-B). In addition, the often smaller two-bond scalar couplings between the ${}^{15}N_i$ and ${}^{13}C^\alpha_{i-1}$, may yield sequential connectivities in the HACA,CONHN experiments. The comma separating "CA" from "CO" indicates that the intraresidue ${}^{13}C'$ chemical shift is obtained by creating two-spin coherence involving ${}^{13}C^\alpha$ and ${}^{13}C'$ during the intraresidue polarization transfer from ${}^{13}C^\alpha$, to ${}^{15}N$ (Löhr et al., *J. Biomol. NMR* 6:189–197 (1995), which is hereby incorporated by reference in its reference). The (5,2)D HACA,CONHN experiment was recorded with the radio-frequency (rf) pulse scheme of FIG. 7A. Löhr et al., *J. Biomol. NMR* 6:189–197 (1995), which is hereby incorporated by reference in its entirety, can be referred to for a product operator description of the experiment. Since rf pulses on ${}^{13}C'$ are employed as laminar shifted pulses (Cavanagh et al., *Protein NMR Spectroscopy*, Wiley, New York (1996), which is hereby incorporated by reference in its entirety), the spectral width of the indirect dimension was set to one half of the difference of the ${}^{13}C^\alpha$ and ${}^{13}C'$ carrier frequencies (8,897 Hz at 600 MHz) in order to fold the ${}^{13}C'$ onto the ${}^{13}C^\alpha$ carrier frequency. In the current implementation of (5,2)D HACA,CONHN, $\Omega({}^{15}N)$ was detected in quadrature in the GFT dimension $\omega_1$. With the GFT NMR super phase-cycle given in the legend of FIG. 7A, this yields (i) eight basic 2D spectra with peaks at $\Omega_0({}^{15}N) \pm \Omega_1({}^{13}C') \pm \Omega_2({}^{13}C^\alpha) \pm \Omega_3({}^1H^\alpha)$ along $\omega_1$, (ii) four 2D first order central peak spectra with peaks at $\Omega_0({}^{15}N) \pm \Omega_1({}^{13}C') \pm \Omega_2({}^{13}C^\alpha)$, (iii) two 2D second order central peak spectra with peaks at $\Omega_0({}^{15}N) \pm \Omega_1({}^{13}C')$ and (iv) one 2D third order central peak spectrum with peaks at $\Omega_0({}^{15}N)$. The choice for the order of central peak detection is primarily guided by sensitivity considerations. First order central peaks were derived from ${}^{13}C^\alpha$ magnetization, which allows one to detect these central peaks while the basic spectra are acquired. Hence, when the basic spectra are acquired with at least two scans per increment, the first order central peaks are obtained from ${}^{13}C$ steady state magnetization without investment of additional measurement time. In case single scan acquisition is chosen for the basic spectra, first order central peak detection would be best implemented by simply omitting the ${}^1H^\alpha$ shift evolution. Second order central peak were derived from ${}^1H^\alpha$ magnetization using the scheme of FIG. 7A, i.e., by omitting both the ${}^1H^\alpha$ and ${}^{13}C^\alpha$ chemical shift evolution periods. This approach is more sensitive than using 2D HNN(CA)CO. Finally, sensitive 2D [${}^{15}N$, ${}^1H$]-HSQC provided the third order central peaks. To match (5,2)D HACA,CONHN, (5,2)D HACACONHN (FIG. 4A) was acquired with the same order for central peak detection as in (5,2)D HACA,CONHN, except that the spectral width of the indirect GFT dimension was set to 8,897 Hz.

(5,3)D HACACONHN and HACA,CONHN were recorded using the pulse scheme and a correspondingly reduced GFT NMR super phase cycle of the (5,2)D congeners (FIG. 7A); $\Omega(^{13}C')$ was detected in quadrature in the GFT dimension and $\Omega(^{15}N)$ was sampled in a separate chemical shift evolution along $\omega_2$. This yields (i) four basic 3D spectra with peaks at $\Omega_0(^{13}C')\pm\Omega_1(^{13}C^\alpha)\pm\Omega_2(^1H^\alpha)$, (ii) two first order central peak spectra with peaks at $\Omega_0(^{13}C')$ $\pm\Omega_1(^{13}C^\alpha)$ and (ii) one second order central peak spectrum with peaks at $\Omega_0(^{13}C')$.

(4,3)D CBCACONHN and (4,3)D CBCA,CONHN correlate the backbone amide $^{15}N$ and $^1HN$ chemical shifts of residue i with the $^{13}C'$, $^{13}C^\alpha$ and $^{13}C^\beta$ chemical shifts of residue i–1 and i, respectively, via one-bond scalar couplings (FIG. 4C), and the often smaller two-bond scalar couplings between the $^{15}N_i$ and $^{13}C^\alpha_{i-1}$ may yield additional sequential connectivities in (4,3)D CBCA,CONHN. $\Omega(^{13}C')$ was detected in quadrature in the GFT dimension thus yielding (i) two basic 3D spectra with peaks at $\Omega_0(^{13}C')\pm\Omega_1$ $(^{13}C^\alpha)$ and $\Omega_0(^{13}C')\pm\Omega_1(^{13}C^\beta)$ and (ii) one central peak spectrum with peaks at $\Omega_0(^{13}C')$. (4,3)D CBCACONHN was recorded by modifying the $H^{\alpha/\beta}C^{\alpha/\beta}$(CO)NHN pulse scheme (derived from CBCA(CO)NHN; Grzesiek et al., *J. Am. Chem. Soc.* 114:6291–6293 (1992), which is hereby incorporated by reference in its entirety) described in Szyperski et al., *Proc. Natl. Acad. Sci. USA* 99:8009–8014 (2002), which is hereby incorporated by reference in its entirety: the $^1H^{\alpha/\beta}$ chemical shift evolution was eliminated and a $^{13}C'$ chemical shift evolution was introduced in a constant-time manner (see FIG. 8 for the rf pulse scheme). (4,3)D CBCA,CONHN was recorded with the new pulse scheme shown in FIG. 7B, that is, $^{13}C'$-$^{13}C^\alpha$ two-spin coherence is created for simultaneous $^{13}C'$ and $^{13}C^\alpha$ frequency labeling during the polarization transfer from $^{13}C'$ to $^{15}N$.

Example 10

Analyses of the (5,2)D HACA,CONHN, (5,3)D HACA,CONHN/(5,3)D HACACONHN, and (4,3)D CBCACONHN/(4,3)D CBCA,CONHN GFT NMR Experiments On a VARIAN Inova 600 MHz spectrometer at 25° C, (i) (5,2)D HACACONHN (2.5 hrs. measurement time), (5,2)D HACA,CONHN (8.1 hrs.), (ii) (5,3)D HACACONHN (10.4 hrs.) and (5,3)D HACA,CONHN (10.4 hrs.), and (iii) (4,3)D CBCACONHN (5.6 hrs.) and (4,3)D CBCA,CONHN (5.6 hrs.) were acquired for a 2 mM solution (pH=5.8, 50 mM K—PO$_4$, 90% H2O/10% D$_2$O) of the 8.6 kDa protein ubiquitin. (5,3)D HACACONHN (20.8 hrs.) and (5,3)D HACA,CONHN (41.8 hrs) were also acquired for a 1 mM solution (pH=6.5, 450 mM NaCl, 10 mM DTT, 20 mM Zn$^{2+}$, 0.01% NaN$_3$, 95% H$_2$O/5% D$_2$O) of the 14 kDa protein structural genomics target protein TT212.

The yield of peak detection, i.e. the ratio of observed peaks over the total number of expected peaks, was (virtually) complete throughout. Reductions in minimal measurement time, $\epsilon$, achievable in GFT NMR are given by the ratio of the number of free induction decays (FIDs) of an (N,N—K)D GFT NMR experiment over and the number FIDs of the ND FT NMR experiment.

For ubiquitin, the following was obtained: (i) (5,2)D HACACONHN ($\epsilon$=225; 100% yield; S/N for peaks in basic spectra: 6.9–14.8; in first order central peak spectra: 8.1–10.4), (5,2)D HACA,CONHN ($\epsilon$=225; intraresidue correlations: 100% yield; S/N for peaks in basic spectra: 4.0–6.8; in first order central peak spectra: 3.3–5.3), (ii) (5,3)D HACACONHN ($\epsilon$=25; 100% yield; S/N for peaks in basic spectra: 27.5–61.2; in first order central peak spectra: 26.2–41.3) and (5,3)D HACA,CONHN ($\epsilon$=25; intraresidue correlations: 100% yield; S/N for peaks in basic spectra: 14.7–23.6; 93% in first order central peak spectra: 13.1–22.6), (iii) (4,3)D CBCA,CONHN ($\epsilon$=6.4; $^{13}C^\alpha$ correlations in basic spectra: 100% yield; S/N: 31.1–72.3; $^{13}C^\beta$ correlations in basic spectra: 100% yield; S/N: 23.8–81.1) and (4,3)D CBCA,CONHN ($\epsilon$=6.4; intraresidue $^{13}C^\alpha$ correlations in basic spectra: 100% yield; S/N: 3.7–23.9; intraresidue $^{13}C^\beta$ correlations in basic spectra: 99% yield; S/N: 2.7–9.7).

For TT212, the following was obtained: (5,3)D HACACONHN (δ=25; 100% yield; S/N for peaks in basic spectra: 3.0–44.6; in first order central peak spectra: 2.5–34.4) and (5,3)D HACA,CONHN ($\epsilon$=25; intraresidue correlations: 96% yield; S/N for peaks in basic spectra: 1.5–14.0; 93% in first order central peak spectra: 1.5–14.7). (S/N ratios not reported for other central peak spectra are larger than those of the first order central peaks.)

When using (5,2)D HACACONHN/HACA,CONHN (FIG. 21) or (5,3)D HACACONHN and HACA,CONHN (FIG. 22), the sequential assignment is based on the three chemical shifts $\Omega(^{13}C'),\Omega(^{13}C^\alpha)$ and $\Omega(^1H^\alpha)$. The use of(4, 3)D CBCACONHN/(4,3)D CBCA,CONHN (FIG. 23) corresponds to having two 4D experiments in which the number of correlations is increased by a $^{13}C^\beta$-$^{13}C^\alpha$ relay step. Hence, the (4,3)D experiments likewise provide assignments based on three chemical shifts, i.e. $\Omega(^{13}C'),\Omega(^{13}C^\alpha)$ and $\Omega(^{13}C^\beta)$. Note, however, that $\Omega(^{13}C^\alpha)$ and $\Omega(^{13}C^\beta)$ of a given residue are not directly correlated. FIGS. 21–23 show that the exhaustive sampling of linear combinations of chemical shifts yields an extended set of sequential connectivities when compared with conventional FT NMR. For example, in (5,3)D HACACONHN/HACA,CONHN seven peaks located at $\Omega_0(^{13}C')\pm\Omega_1(^{13}C^\alpha)\pm\Omega_2(^1H^\alpha)$ (spectra B1 to B4 in FIG. 22), $\Omega_0(^{13}C')\pm\Omega_1(^{13}C^\alpha)$ (spectra B5 and B6 in FIG. 22) and $\Omega_1(^{13}C')$ (spectrum B7 in FIG. 22) serve as sequential matching constraints. Recording of 3D HA(CACO)NHN, 3D (HA)CA(CO)NHN and 3D (HACA) CONHN spectra in conjunction with their intraresidue counterparts would yield only 3 constraints, which are devoid of direct correlations between the shifts of $^{13}C'$, $^{13}C^\alpha$ and $^1H^\alpha$ (as provided by the (5,3)D GFT NMR experiment).

Furthermore, the experimental error of chemical shift measurements in constant time GFT NMR experiments scales with $1/(\sqrt{n})$, where n is the number of linear combinations contributing to the determination of a shift (assuming, for simplicity, that the same maximal evolution times have been chosen). The increased accuracy of the measurement is documented by comparing the shifts of the same nuclei measured in intra- and interresidue GFT data. Tables 3 to 5 afford a detailed analysis of the shift measurements associated with sequential connectivities shown in FIGS. 21 to 23, respectively. These tables provide both the measured linear combinations of shifts and the single-quantum shifts obtained from a linear least-squares fit. The experimental errors for the measurement of the linear combinations of the chemical shifts were estimated as described above. The comparison of shifts for the same nucleus as obtained from two different GFT NMR spectra shows that the accuracy is indeed high: the shift differences in Tables 3 to 5 (underlined values; see also Table 6 with the shift analysis corresponding to FIG. 24) are smaller than 0.081 ppm for all cases in (5,3)D and (5,2)D GFT NMR spectra, and smaller than 0.154 ppm in the (4,3)D spectra.

TABLE 3

Chemical Shifts Measured in (5,2)D HACA,CONHN/ (5,2)D HACACONHN Recorded for Ubiquitin (see FIG. 21). The Underlined Values in the Lower Right Represent the Differences of Single-Quantum Shifts Obtained from (5,2)D HACA,CONHN and (5,2)D HACACONHN.

(A) (5,2)D HACA,CONHN

Linear combinations of shifts (Glu 64) measured along $\omega_1$ [ppm]

| | | |
|---|---|---|
| $\Omega_0(^{15}N) + \Omega_1(^{13}C') + \Omega_2(^{13}C^\alpha) + \Omega_3(^1H^\alpha)$ | 108.075 ± 0.167 | B1 |
| $\Omega_0(^{15}N) - \Omega_1(^{13}C') + \Omega_2(^{13}C^\alpha) + \Omega_3(^1H^\alpha)$ | 103.697 ± 0.167 | B2 |
| $\Omega_0(^{15}N) + \Omega_1(^{13}C') - \Omega_2(^{13}C^\alpha) + \Omega_3(^1H^\alpha)$ | 97.120 ± 0.167 | B3 |
| $\Omega_0(^{15}N) - \Omega_1(^{13}C') - \Omega_2(^{13}C^\alpha) + \Omega_3(^1H^\alpha)$ | 92.937 ± 0.167 | B4 |
| $\Omega_0(^{15}N) + \Omega_1(^{13}C') + \Omega_2(^{13}C^\alpha) - \Omega_3(^1H^\alpha)$ | 136.303 ± 0.167 | B5 |
| $\Omega_0(^{15}N) - \Omega_1(^{13}C') + \Omega_2(^{13}C^\alpha) - \Omega_3(^1H^\alpha)$ | 131.989 ± 0.167 | B6 |
| $\Omega_0(^{15}N) + \Omega_1(^{13}C') - \Omega_2(^{13}C^\alpha) - \Omega_3(^1H^\alpha)$ | 125.512 ± 0.167 | B7 |
| $\Omega_0(^{15}N) - \Omega_1(^{13}C') - \Omega_2(^{13}C^\alpha) - \Omega_3(^1H^\alpha)$ | 121.182 ± 0.167 | B8 |
| $\Omega_0(^{15}N) + \Omega_1(^{13}C') + \Omega_2(^{13}C^\alpha)$ | 122.043 ± 0.167 | B9 |
| $\Omega_0(^{15}N) - \Omega_1(^{13}C') + \Omega_2(^{13}C^\alpha)$ | 117.721 ± 0.167 | B10 |
| $\Omega_0(^{15}N) + \Omega_1(^{13}C') - \Omega_2(^{13}C^\alpha)$ | 111.432 ± 0.167 | B11 |
| $\Omega_0(^{15}N) - \Omega_1(^{13}C') - \Omega_2(^{13}C^\alpha)$ | 107.122 ± 0.167 | B12 |
| $\Omega_0(^{15}N) + \Omega_1(^{13}C')$ | 116.832 ± 0.106 | B13 |
| $\Omega_0(^{15}N) - \Omega_1(^{13}C')$ | 112.351 ± 0.106 | B14 |
| $\Omega_0(^{15}N)$ | 114.577 ± 0.078 | B15 |

Single-quantum shifts [ppm]

| | |
|---|---|
| $\Omega_0(^{15}N)$ | 114.593 ± 0.040 |
| $\Omega_1(^{13}C')$ | 175.133 ± 0.017 |
| $\Omega_2(^{13}C^\alpha)$ | 58.427 ± 0.019 |
| $\Omega_3(^1H^\alpha)$ | 3.347 ± 0.006 |

(B) (5,2)D HACACONHN

Linear combinations of shifts [$\Omega_0(^{15}N)$ of Ser 65 and of Glu 64 otherwise] measured along $\omega_1$ [ppm]

| | | |
|---|---|---|
| $\Omega_0(^{15}N) + \Omega_1(^{13}C') + \Omega_2(^{13}C^\alpha) + \Omega_3(^1H^\alpha)$ | 108.510 ± 0.167 | B1 |
| $\Omega_0(^{15}N) - \Omega_1(^{13}C') + \Omega_2(^{13}C^\alpha) + \Omega_3(^1H^\alpha)$ | 103.758 ± 0.167 | B2 |
| $\Omega_0(^{15}N) + \Omega_1(^{13}C') - \Omega_2(^{13}C^\alpha) + \Omega_3(^1H^\alpha)$ | 97.642 ± 0.167 | B3 |
| $\Omega_0(^{15}N) - \Omega_1(^{13}C') - \Omega_2(^{13}C^\alpha) + \Omega_3(^1H^\alpha)$ | 92.982 ± 0.167 | B4 |
| $\Omega_0(^{15}N) + \Omega_1(^{13}C') + \Omega_2(^{13}C^\alpha) - \Omega_3(^1H^\alpha)$ | 136.891 ± 0.167 | B5 |
| $\Omega_0(^{15}N) - \Omega_1(^{13}C') + \Omega_2(^{13}C^\alpha) - \Omega_3(^1H^\alpha)$ | 131.088 ± 0.167 | B6 |
| $\Omega_0(^{15}N) + \Omega_1(^{13}C') - \Omega_2(^{13}C^\alpha) - \Omega_3(^1H^\alpha)$ | 125.054 ± 0.167 | B7 |
| $\Omega_0(^{15}N) - \Omega_1(^{13}C') - \Omega_2(^{13}C^\alpha) - \Omega_3(^1H^\alpha)$ | 121.270 ± 0.167 | B8 |
| $\Omega_0(^{15}N) + \Omega_1(^{13}C') + \Omega_2(^{13}C^\alpha)$ | 122.727 ± 0.167 | B9 |
| $\Omega_0(^{15}N) + \Omega_1(^{13}C') - \Omega_2(^{13}C^\alpha)$ | 111.894 ± 0.167 | B10 |
| $\Omega_0(^{15}N) - \Omega_1(^{13}C') + \Omega_2(^{13}C^\alpha)$ | 117.984 ± 0.167 | B11 |
| $\Omega_0(^{15}N) - \Omega_1(^{13}C') - \Omega_2(^{13}C^\alpha)$ | 107.206 ± 0.167 | B12 |
| $\Omega_0(^{15}N) + \Omega_1(^{13}C')$ | 116.198 ± 0.106 | B13 |
| $\Omega_0(^{15}N) - \Omega_1(^{13}C')$ | 112.608 ± 0.106 | B14 |
| $\Omega_0(^{15}N)$ | 114.886 ± 0.078 | B15 |

Single-quantum shifts [ppm]

| | | |
|---|---|---|
| $\Omega_0(^{15}N)$ (Ser 65) | 114.913 ± 0.040 | |
| $\Omega_1(^{13}C')$ | 175.210 ± 0.017 | −0.077 |
| $\Omega_2(^{13}C^\alpha)$ | 58.440 ± 0.019 | −0.013 |
| $\Omega_3(^1H^\alpha)$ | 3.344 ± 0.006 | +0.003 |

TABLE 4

Chemical Shifts Measured in (5,3)D HACA,CONHN/ (5,3)DHACACO NHN Recorded for TT212 (see FIG. 22). The Underlined Values in the Lower Right Represent the Differences of Single-Quantum Shifts Obtained from (5,3)D HACA,CO NHN and (5,3)D HACACONHN.

(A) (5,3)D HACA,CONHN

Linear combinations of shifts (Ile 25) measured along $\omega_1$ [ppm]

| | | |
|---|---|---|
| $\Omega_0(^{13}C') + \Omega_1(^{13}C^\alpha) + \Omega_2(^1H^\alpha)$ | 180.354 ± 0.067 | B1 |
| $\Omega_0(^{13}C') - \Omega_1(^{13}C^\alpha) + \Omega_2(^1H^\alpha)$ | 167.916 ± 0.067 | B2 |
| $\Omega_0(^{13}C') + \Omega_1(^{13}C^\alpha) - \Omega_2(^1H^\alpha)$ | 185.688 ± 0.067 | B3 |
| $\Omega_0(^{13}C') - \Omega_1(^{13}C^\alpha) - \Omega_2(^1H^\alpha)$ | 173.824 ± 0.067 | B4 |
| $\Omega_0(^{13}C') + \Omega_1(^{13}C^\alpha)$ | 183.169 ± 0.067 | B5 |
| $\Omega_0(^{13}C') - \Omega_1(^{13}C^\alpha)$ | 170.699 ± 0.067 | B6 |
| $\Omega_0(^{13}C')$ | 177.140 ± 0.045 | B7 |

Single-quantum shifts [ppm]

| | |
|---|---|
| $\Omega_0(^{13}C')$ | 176.970 ± 0.024 |
| $\Omega_1(^{13}C^\alpha)$ | 62.389 ± 0.027 |
| $\Omega_2(^1H^\alpha)$ | 4.073 ± 0.009 |

(B) (5,3)D HACACONHN

Linear combinations of shifts (Ile 25) measured along $\omega_1$ [ppm]

| | | |
|---|---|---|
| $\Omega_0(^{13}C') + \Omega_1(^{13}C^\alpha) + \Omega_2(^1H^\alpha)$ | 180.223 ± 0.067 | B1 |
| $\Omega_0(^{13}C') - \Omega_1(^{13}C^\alpha) + \Omega_2(^1H^\alpha)$ | 168.256 ± 0.067 | B2 |
| $\Omega_0(^{13}C') + \Omega_1(^{13}C^\alpha) - \Omega_2(^1H^\alpha)$ | 185.907 ± 0.067 | B3 |
| $\Omega_0(^{13}C') - \Omega_1(^{13}C^\alpha) - \Omega_2(^1H^\alpha)$ | 173.603 ± 0.067 | B4 |
| $\Omega_0(^{13}C') + \Omega_1(^{13}C^\alpha)$ | 183.052 ± 0.067 | B5 |
| $\Omega_0(^{13}C') - \Omega_1(^{13}C^\alpha)$ | 170.933 ± 0.067 | B6 |
| $\Omega_0(^{13}C')$ | 177.075 ± 0.045 | B7 |

Single-quantum shifts [ppm]

| | | |
|---|---|---|
| $\Omega_0(^{13}C')$ | 177.007 ± 0.024 | −0.037 |
| $\Omega_1(^{13}C^\alpha)$ | 62.325 ± 0.027 | +0.064 |
| $\Omega_2(^1H^\alpha)$ | 4.087 ± 0.009 | −0.014 |

TABLE 5

Chemical Shifts Measured in (4,3)D CB,CACONHN/ (4,3)D CBCACO NHN Recorded for Ubiquitin (see FIG. 23). The Underlined Values in the Lower Right Represent the Differences of Single-Quantum Shifts Obtained from (4,3)D CB,CACONHN and (4,3)D CBCACONHN.

(A) (4,3)D CBCA,CO NHN

Linear combinations of shifts (Ser 65) measured along $\omega_1$ [ppm]

| | | |
|---|---|---|
| $\Omega_0(^{13}C') + \Omega_1(^{13}C^\alpha)$ | 191.359 ± 0.067 | B1 |
| $\Omega_0(^{13}C') + \Omega_1(^{13}C^\beta)$ | 195.451 ± 0.067 | B1 |
| $\Omega_0(^{13}C') - \Omega_1(^{13}C^\alpha)$ | 152.401 ± 0.067 | B2 |
| $\Omega_0(^{13}C') - \Omega_1(^{13}C^\beta)$ | 148.249 ± 0.067 | B2 |
| $\Omega_0(^{13}C')$ | 171.848 ± 0.045 | B3 |

Single-quantum shifts [ppm]

| | |
|---|---|
| $\Omega_0(^{13}C')$ | 171.862 ± 0.027 |
| $\Omega_1(^{13}C^\alpha)$ | 60.789 ± 0.047 |
| $\Omega_1(^{13}C^\beta)$ | 64.911 ± 0.047 |

(B) (4,3)D CBCACONHN

Linear combinations of shifts (Ser 65) measured along $\omega_1$ [ppm]

| | | |
|---|---|---|
| $\Omega_0(^{13}C') + \Omega_1(^{13}C^\alpha)$ | 191.533 ± 0.067 | B1 |
| $\Omega_0(^{13}C') + \Omega_1(^{13}C^\beta)$ | 195.530 ± 0.067 | B1 |
| $\Omega_0(^{13}C') - \Omega_1(^{13}C^\alpha)$ | 152.267 ± 0.067 | B2 |
| $\Omega_0(^{13}C') - \Omega_1(^{13}C^\beta)$ | 148.225 ± 0.067 | B2 |
| $\Omega_0(^{13}C')$ | 171.887 ± 0.045 | B3 |

TABLE 5-continued

Chemical Shifts Measured in (4,3)D CB,CACONHN/
(4,3)D CBCACO NHN Recorded for Ubiquitin (see
FIG. 23). The Underlined Values in the Lower Right
Represent the Differences of Single-Quantum Shifts
Obtained from (4,3)D CB,CACONHN and
(4,3)D CBCACONHN.

Single-quantum shifts [ppm]

| | | |
|---|---|---|
| $\Omega_0(^{13}C')$ | 171.888 ± 0.027 | −0.026 |
| $\Omega_1(^{13}C^\alpha)$ | 60.943 ± 0.047 | −0.154 |
| $\Omega_1(^{13}C^\beta)$ | 64.962 ± 0.047 | −0.051 |

TABLE 6

Chemical Shifts Measured in (5,3)D HACA,CONHN/
(5,3)D HACACO NHN Recorded for Ubiquitin (see FIG. 24).
The Underlined Numbers in the Lower Right Represent
the Differences of Single-Quantum Shifts Obtained from
(5,3)D HACA,CONHN and (5,3)D HACACONHN.

(A) (5,3)D HACA,CONHN

Linear combinations of shifts (Ser 65)
measured along $\omega_1$ [ppm] (FIG. 21)

| | | |
|---|---|---|
| $\Omega_0(^{13}C') + \Omega_1(^{13}C^\alpha) + \Omega_2(^1H^\alpha)$ | 176.020 ± 0.067 | B1 |
| $\Omega_0(^{13}C') - \Omega_1(^{13}C^\alpha) + \Omega_2(^1H^\alpha)$ | 166.513 ± 0.067 | B2 |
| $\Omega_0(^{13}C') + \Omega_1(^{13}C^\alpha) - \Omega_2(^1H^\alpha)$ | 177.233 ± 0.067 | B3 |
| $\Omega_0(^{13}C') - \Omega_1(^{13}C^\alpha) - \Omega_2(^1H^\alpha)$ | 167.684 ± 0.067 | B4 |
| $\Omega_0(^{13}C') + \Omega_1(^{13}C^\alpha)$ | 176.656 ± 0.067 | B5 |
| $\Omega_0(^{13}C') - \Omega_1(^{13}C^\alpha)$ | 167.090 ± 0.067 | B6 |
| $\Omega_0(^{13}C')$ | 171.848 ± 0.045 | B7 |

Single-quantum shifts [ppm]

| | |
|---|---|
| $\Omega_0(^{13}C')$ | 171.863 ± 0.024 |
| $\Omega_1(^{13}C^\alpha)$ | 61.030 ± 0.027 |
| $\Omega_2(^1H^\alpha)$ | 4.630 ± 0.009 |

(B) (5,3)D HACACONHN [ubiquitin]

Linear combinations of shifts (Ser 65)
measured along $\omega_1$ [ppm] (FIG. 21)

| | | |
|---|---|---|
| $\Omega_0(^{13}C') + \Omega_1(^{13}C^\alpha) + \Omega_2(^1H^\alpha)$ | 175.975 ± 0.067 | B1 |
| $\Omega_0(^{13}C') + \Omega_1(^{13}C^\alpha) - \Omega_2(^1H^\alpha))$ | 177.140 ± 0.067 | B2 |
| $\Omega_0(^{13}C') - \Omega_1(^{13}C^\alpha) - \Omega_2(^1H^\alpha)$ | 167.770 ± 0.067 | B3 |
| $\Omega_0(^{13}C') - \Omega_1(^{13}C^\alpha) + \Omega_2(^1H^\alpha)$ | 166.610 ± 0.067 | B4 |
| $\Omega_0(^{13}C') + \Omega_1(^{13}C^\alpha)$ | 176.598 ± 0.067 | B5 |
| $\Omega_0(^{13}C') - \Omega_1(^{13}C^\alpha)$ | 167.197 ± 0.067 | B6 |
| $\Omega_0(^{13}C')$ | 171.887 ± 0.045 | B7 |

Single-quantum shifts [ppm]

| | | |
|---|---|---|
| $\Omega_0(^{13}C')$ | 171.882 ± 0.024 | −0.019 |
| $\Omega_1(^{13}C^\alpha)$ | 60.949 ± 0.027 | +0.081 |
| $\Omega_2(^1H^\alpha)$ | 4.634 ± 0.009 | −0.004 |

Automated resonance assignment (Szyperski et al., *J. Biomol. NMR* 11:387–405 (1998); Moseley et al., *Meth. Enzymol.* 339:91–108 (2002), which are hereby incorporated by reference in their entirety), for high-throughput structure determination in structural genomics (Montelione et al., *Nature Struc. Biol.* 7:982–984 (2000), which is hereby incorporated by reference in its entirety) may profit from employment of GFT NMR in either of the two ways described in the following. First, peak lists of GFT NMR spectra may be used directly to establish sequential connectivities. Then, the extended set of connectivities (see FIGS. 21–23) corresponding to the matching of $2^m-1$ "linear combinations" of shifts is redundant and contains ND information. Notably, automated resonance assignment protocols are rather sensitive to the lack of even a smaller number of sequential connectivities. Hence, one can expect to establish more reliable strategies when compared to the use of conventional spectroscopy, also for smaller proteins with molecular weights around 10 kDa. Alternatively, the GFT NMR peak lists can be used to calculate ND peak lists containing precise single-quantum shifts. Subsequently, sequential connectivities are established based on matching of single-quantum shifts. Due to the increased accuracy of the GFT shift measurements, correspondingly reduced matching tolerances (defined as the chemical shift difference between two shift values below which these are considered to be identical) can be employed. For example, the program AUTOASSIGN (Monleon et al., *J. Struc. Func. Genomics* 2:93–101 (2002), which is hereby incorporated by reference in its entirety) is routinely executed with matching tolerances of 0.4 ppm for $^{13}C^{\alpha/\beta}$ shifts, 0.25 ppm for $^{13}C'$ shifts and 0.04 ppm for $^1H^\alpha$ shifts measured in indirect dimensions of FT triple resonance NMR spectra. Setting the matching tolerance for analysis of (5,2)D and (5,3)D GFT NMR derived ND peak list to about 2 times the maximal shift difference (Tables 3 to 5), one obtains as a first estimate: ~0.15 ppm for $^{13}C^\alpha$ shifts, ~0.15 ppm for $^{13}C'$ shifts and ~0.02 ppm for $^1H^\alpha$ shifts. Future statistical analysis of several GFT NMR spectra and the use of AUTOASSIGN for GFT NMR data have to reveal the magnitude of the reduction of matching tolerances more accurately, but the estimates presented herein clearly show that a significant reduction can be anticipated. Notably, the accuracy of shift measurements using constant time GFT NMR experiments is independent of transverse relaxation rates (which solely determine the peak intensity) and thus independent of the molecular weight.

In principle, with respect to the detection of sequential peaks in the experiments providing the intraresidue connectivities, one may "filter out" the sequential connectivities (e.g., Brutscher, *J. Magn. Reson.* 156:155–159 (2002), which is hereby incorporated by reference in its entirety). However, for some applications, it is preferable not to eliminate sequential peaks, since (i) such filtering compromises on the sensitivity, (ii) the sequential peaks can be readily identified in the sequential congener, and (iii) the sequential peaks in the intraresidue experiment can be used to accurately adjust the calibration of the two GFT NMR spectra used in conjunction. For automated assignment protocols, the procedure of point (iii) is of outstanding value to reduce matching tolerances and is thus routinely employed. At highest magnetic fields (900° MHz $^1H$ resonance frequency), it might be advantageous to design GFT experiments providing the sequential connectivities in a manner suggested by Meissner et al., *J. Magn. Reson.* 150:100–104 (2001), which is hereby incorporated by reference in its entirety.

In view of the introduction of cryogenic probes, which reduce NMR measurement times by a factor of 10 or more (Monleon et al., *J. Struc. Func. Genomics* 2:93–101 (2002), which is hereby incorporated by reference in its entirety), GFT NMR experiments providing 4D and 5D NMR spectral information are highly attractive also for larger systems. For example, (5,2)D HACACONHN/HACA,CONHN and (4,3)D CBCACONHN/CBCA,CONEN were acquired in only 10.6 and 11.2 hours, respectively, for an 8.6 kDa protein and it can thus be expected that similarly short measurement times are feasible for medium-sized protein up to about 20 kDa when using cryogenic probes. In fact, the (5,3)D data sets of 14 kDa TT212 (FIG. 22) were acquired in about 60 hours, so that the same data could have been recorded within a few hours with a cryogenic probe. Apart from sensitivity, spectral resolution is critical for employment of multidimensional NMR. At high magnetic fields, (4,3)D and (5,3)D $^{15}$N-resolved GFT NMR experiments are well suited to approach large proteins, at least to the extent such conventional $^{15}$N-resolved 3D spectra are currently used. For the (5,2)D experiments, one needs to consider that peak dispersion increases linearly from third order (2D [$^{15}$N, $^1$H]-HSQC), to second order to first order and to basic spectra (see FIG. 17). Moreover, future research needs to show how effectively computer supported "bottom-up" identification of chemical shift multiplets restores the 5D dispersion. Certainly, the dispersion of the 2D [$^{15}$N, $^1$H]-HSQC provides a good initial indication with respect to the degree of overlap that needs to be resolved during the "bottom-up" assignment. At 90° MHz $^1$H resonance frequency, 20–25 kDa proteins often exhibit rather well resolved 2D [$^{15}$N, $^1$H]-TROSY (Pervushin et al., *Proc. Natl. Acad. Sci. USA* 99:8009–8014 (1997), which is hereby incorporated by reference in its entirety) spectra, and thus it is expected that proteins up to a least 20 kDa might well be approached using (5,2)D GFT-TROSY NMR at such highest field strengths.

Finally, future research will show to which extent the acquisition speed of GFT NMR can be further increase (Frydman et al., *Proc. Natl. Acad. Sci. USA* 99:15858–15862 (2002), which is hereby incorporated by reference in its entirety), or Hadamard-type sampling schemes (Kupce et al., *J. Magn. Reson. Ser. A* 105 310–315 (1993); Kupce et al., *J. Biomol. NMR* 25:349–354 (2003), which are hereby incorporated by reference in their entirety). Moreover, it is conceivable that the "sampling demand" of GFT NMR can be further reduced by (i) non-linear sampling (Schmieder et al., *J. Biomol. NMR* 4:483–490° (1994), which is hereby incorporated by reference in its entirety), (ii) the employment of the filter diagonalization approach for data processing (Wall et al., *J. Chem. Phys.* 112:8011–8022 (1995); Hu et al., *J. Magn. Reson.* 134:76–87 (1998), which are hereby incorporated by reference in their entirety), or (iii) the use of "three-way decomposition" (Gutmanas et al., *J. Biomol. NMR* 24:191–201 (2002), which is hereby incorporated by reference in its entirety).

EXAMPLE 11

Figure 5:
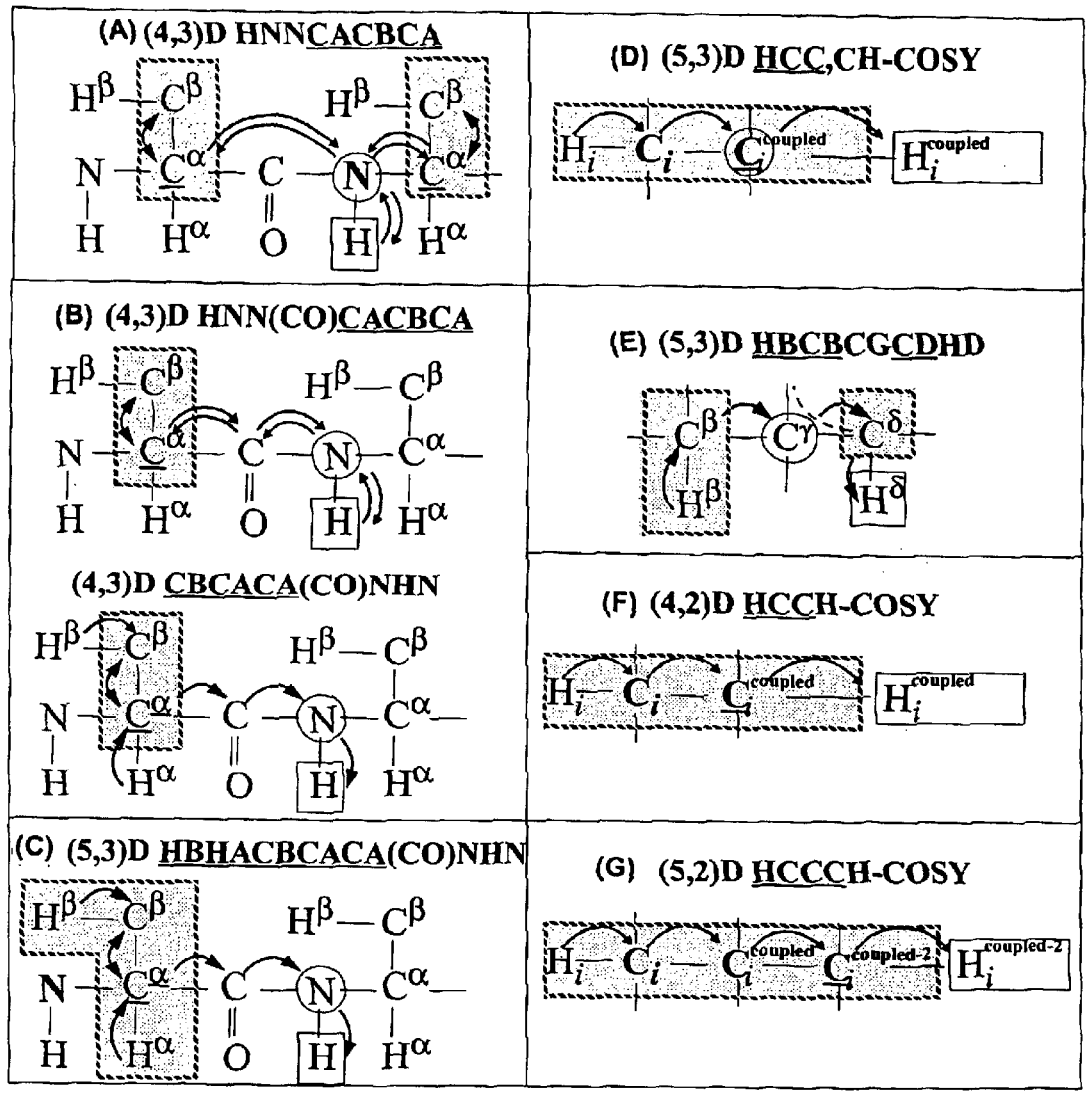
FIGS. 5A–G illustrate magnetization transfer pathways generating the basic spectra of GFT NMR experiments: (i) (4,3)D HNNCACBCA (FIG. 5A), (ii) (4,3)D HNN(CO)CACBCA and (4,3)D CBCACA(CO)NHN (FIG. 5B), (iii) (5,3)D HBHACBCACA(CO)NHN (FIG. 5C), (iv) (5,3)D HCC,CH-COSY (FIG. 5D), (v) (5,3)D HBCBCGCDHD (FIG. 5E), (vi) (4,2) HCC,CH-COSY (FIG. 5F), and (vii) (5,2)D HCCCH-COSY (FIG. 5G). In experiments (iv) and (vi), only magnetization transfer pathways corresponding to cross peaks in a 4D HCCH-COSY are shown. In experiment (vii), only the magnetization transfer pathway corresponding to cross peaks in a relayed 5D HCCCH-COSY is shown. INEPT-type polarization transfer are indicated by double arrows for "out-and-back" type experiments and single arrows for "out-and-stay" type experiments. The nucleus for which the chemical shift is detected in quadrature in all spectra constituting the GFT NMR experiment is underlined. The nuclei with grey background are simultaneously sampled in a single GFT NMR dimension, and the chemical shifts of the boxed nuclei are measured in the direct dimension. The chemical shifts of nitrogen spins (shown in circles) are measured in a separate dimension in experiments (i), (ii), and (iii), and the chemical shifts of $^{13}C^\delta$ and $^{13}C_i^{coupled}$ (shown in circles) are measured in a separate dimension in experiments (iv) and (v), respectively. The double headed arrows between $^{13}C^\alpha$ and $^{13}C^\beta$ in experiments (i), (ii), and (iii) indicate that the chemical shifts of $^{13}C^{\alpha/\beta}$ [and $^1H^{\alpha/\beta}$ in (iii)] first evolve independently, prior to transferring to $^{13}C^\alpha$ for frequency labeling.

Implementation and Analyses of the (4,3)D HNN<u>CACBCA</u>, (4,3)D HNN(CO)<u>CACBCA</u>/(4,3)D <u>CBCACA</u>(CO)NHN, (5,3)D <u>HBHACBCACA</u>(CO)NHN, (5,3)D <u>HCC</u> CH-COSY, (5,3)D <u>HBCBCGCD</u>HD, and (4,2)D <u>HCC</u>H-COSY GFT NMR Experiments The following GFT NMR experiments were conducted for the assignment of polypeptide backbone and sidechain resonances: (i) (4,3)D HNN<u>CACBCA</u> GFT NMR experiment (FIG. 5A), (ii) (4,3)D <u>CBCACA</u>(CO)NHN/(4,3)D HNN(CO)<u>CACBCA</u> GFT NMR experiments (FIG. 5B), (iii) (5,3)D <u>HBHACBCACA</u>(CO)NHN GFT NMR experiment (FIG. 5C), (iv) (5,3)D <u>HCC</u>,CH-COSY GFT NMR experiment (FIG. 5D), (v) (5,3)D <u>HBCBCGCD</u>HD GFT NMR experiment (FIG. 5E), (vi) (4,2)D <u>HCC</u>H-COSY GFT NMR experiment (FIG. 5F), and (vii) (5,2)D <u>HCCC</u>H-COSY GFT NMR experiment (FIG. 5G).

In the (4,3)D HNN<u>CACBCA</u> GFT NMR experiment, after independent frequency labeling of $^{13}$C$^\alpha$ and $^{13}$C$^\beta$ spins of both amino acid residues i and i−1 (hereinafter referred to as i/i−1), magnetization is transferred to the respective $^{13}$C$^\alpha_{i/i-1}$ spin, which is then frequency labeled and detected in quadrature in each of the 3D spectra constituting the (4,3)D experiment. Thus, for a given $^{15}$N$_i$ and $^1$H$^N_i$ chemical shift, the 2 basic spectra comprise peaks at $\Omega_0(^{13}$C$^\alpha_i)\pm\Omega_1$ ($^{13}$C$^{\alpha/\beta}_i$) and $\Omega_0(^{13}$C$^\alpha_{i-1})\pm\Omega_1$ ($^{13}$C$^{\alpha/\beta}_{i-1}$). The first order central peak spectrum for (4,3)D HNN<u>CACBCA</u> was acquired using a 3D HNNCA pulse sequence comprising peaks at $\Omega_0(^{13}$C$^\alpha_i)$ and $\Omega_0(^{13}$C$^\alpha_{i-1})$.

In the (4,3)D HNN(CO)<u>CACBCA</u>/(4,3)D <u>CBCACA</u>(CO)NHN GFT NMR experiments, the same principle as described in the (4,3)D HNN<u>CACBCA</u> GFT NMR experiment was used, except that the 2 basic spectra comprise, for a given $^{15}$N$_i$ and $^1$H$^N_i$ chemical shift, peaks from only amino acid residue i−1 at $\Omega_0(^{13}$C$^\alpha_{i-1})\pm\Omega_1(^{13}$C$^{\alpha/\beta}_{i-1})$ chemical shifts. (4,3)D HNN(CO)<u>CACBCA</u> GFT NMR experiment is an "out-and-back" type of experiment, while (4,3)D <u>CBCACA</u>(CO)NHN GFT NMR experiment is an "out-and-stay" type. The first order central peak spectrum for (4,3)D HNN(CO)<u>CACBCA</u>/(4,3)D <u>CBCACA</u>(CO)NHN GFT NMR experiments comprising peaks at $\Omega_0(^{13}$C$^\alpha_{i-1})$ was acquired using a 3D HNN(CO)CA pulse sequence.

Using the above-described (4,3)D HNN<u>CACBCA</u> GFT NMR experiment and the (4,3)D HNN(CO)<u>CACBCA</u>/(4,3)D <u>CBCACA</u>(CO)NHN GFT NMR experiments in a combined fashion, one can sequentially assign residue pairs (i/i−1) in a polypeptide chain, as illustrated in FIG. 25 for Glu 73 of the 17 kDa protein ER75. FIG. 26 illustrates the sequential walk for residues Val 27 to Ile 30 of the 7 kDa protein GR2 using the (4,3)D HNN<u>CACBCA</u> GFT NMR experiment and the (4,3)D HNN(CO)<u>CACBCA</u>/(4,3)D <u>CBCACA</u>(CO)NHN GFT NMR experiments.

Having obtained the chemical shifts of $^{13}$C$^{\alpha/\beta}$ spins for a given amino acid residue, the (5,3)D <u>HBHACBCACA</u>(CO)NHN GFT NMR experiment can be used to obtain $^1$H$^{\alpha/\beta}$ chemical shifts. In this experiment, frequency labeling of the $^1$H$^{\alpha/\beta}$ spin was carried out simultaneously with that of $^{13}$C$^{\alpha/\beta}$ spins. Thus, for a given $^{15}$N$_i$ and $^1$H$^N_i$ chemical shift, the 4 basic spectra comprise peaks at $\Omega_0(^{13}$C$^\alpha_{i-1})\pm\Omega_1(^{13}$C$^\alpha_{i-1})\pm\Omega_2(^1$H$^\alpha_{i-1})$ and $\Omega_0(^{13}$C$^\alpha_{i-1})\pm\Omega_1(^{13}$C$^\beta_{i-1})\pm\Omega_2(^1$H$^\beta_{i-1})$. The $^{13}$C$^{\alpha/\beta}$ steady-state magnetization was used to obtain the two first order central peak spectra comprising peaks at $\Omega_0(^{13}$C$^\alpha_{i-1})\pm\Omega_1(^{13}$C$^{\alpha/\beta}_{i-1})$. The second order central peak spectrum was acquired using a 3D HNN(CO)CA pulse sequence comprising peaks at $\Omega_0(^{13}$C$^\alpha_{i-1})$. FIG. 27 illustrates peak patterns observed in the (5,3)D <u>HBHACBCACA</u>(CO)NHN GFT NMR spectra, as well as the identity in the peak patterns observed in the basic spectra of the (4,3)D <u>CBCACA</u>(CO)NHN GFT NMR experiment and the first order central peak spectra of the (5,3)D <u>HBHACBCACA</u>(CO)NHN GFT NMR experiment.

The information of $^1$H$^{\alpha/\beta}$ and $^{13}$C$^{\alpha/\beta}$ chemical shifts can be used to assign the more peripheral spins of the aliphatic sidechain of a given amino acid residue by employing the (5,3)D <u>HCC</u>, CH-COSY GFT NMR experiment. For a given $^{13}$C$_i$ and $^1$H$_i$ chemical shift, the 4 basic spectra comprise peaks at $\Omega_0(^{13}$C$_i)\pm\Omega_1(^{13}$C$_i)\pm\Omega_2(^1$H$_i)$ and $\Omega_0(^{13}$C$_i)\pm\Omega_1$ ($^{13}$C$^{coupled}_i)\pm\Omega_2(^1$H$^{coupled}_i)$. The peak pattern observed in the (5,3)D <u>HCC</u>, CH-COSY GFT NMR experiment is illustrated in FIG. 28. $^{13}$C steady-state magnetization was used to obtain the two first order central peak spectra comprising peaks at $\Omega_0(^{13}$C$_i)\pm\Omega_1(^{13}$C$_i)$ and $\Omega_0(^{13}$C$_i)\pm\Omega_1$ ($^{13}$C$^{coupled}_i$). The second order central peak spectrum was acquired using a 3D (H)C,CH-COSY pulse sequence and comprises peaks at $\Omega_0(^{13}$C$_i)$. The same pulse scheme as used for the (5,3)D <u>HCC</u>, CH-COSY GFT NMR experiment can also be used for assigning aromatic sidechain resonances in proteins by tuning the constant time delay to a value suited for transferring magnetization between aromatic $^{13}$C-spins.

Resonance assignments of aromatic sidechain spins can be achieved by using a (5,3)D HBCBCGCDHD GFT NMR experiment and (4,2)D HCCH-COSY GFT NMR experiment. In the (5,3)D HBCBCGCDHD GFT NMR experiment, for a given $^{13}C^\delta$ and $^1H^\delta$ chemical shift, the 4 basic spectra comprise peaks at $\Omega_0(^{13}C^\delta)\pm\Omega_1(^{13}C^\beta)\pm\Omega_2(^1H^\beta)$. In the $(^{4,2})$D HCCH-COSY GFT NMR experiment, for a given $^1H_i$ chemical shift, the 4 basic spectra comprise peaks at $\Omega_0(^{13}C_i)\pm\Omega_1(^{13}C_i)\pm\Omega_2(^1H_i)$ and $\Omega_0(^{13}C_i)\pm\Omega_2(^{13}C_i^{coupled})\pm\Omega_2(^1H_i^{coupled})$. The peak patterns observed in these spectra are illustrated in FIG. 29 and 30, respectively, for the 8.6 kDa protein ubiquitin. The $^{13}C$ steady-state magnetization was used to obtain the two first order central peak spectra comprising peaks for the (5,3)D HBCBCG CDHD GFT NMR experiment at $\Omega_0(^{13}C^\delta)\pm\Omega_1(^{13}C^\beta)$ and for the (4,2)D HCCH-COSY GFT NMR experiment at $\Omega_0(^{13}C_i)\pm\Omega_1(^{13}C_i)$ and $\Omega_0(^{13}C_i)\pm\Omega_1(^{13}C_i^{coupled})$. In the (5,3)D HBCBCGCDHD experiment, the chemical shift of the $^{13}C^\delta$ spin of aromatic amino acid residues was detected in quadrature along the $\omega_1$ dimension in all the 3D spectra constituting the (5,3)D experiment. The second order central peak spectra for the (4,2)D HCCH-COSY and (5,3)D HBCBCGCDHD were acquired using the pulse sequence for a 2D [$^{13}C$-$^1H$] HSQC (comprising peaks at $\Omega_0(^{13}C_i)$) and 3D (HBCB)CGCDHD-COSY (comprising peaks at $\Omega_0(^{13}C^\delta)$), respectively. The same pulse scheme as used for the (4,2)D HCCH-COSY experiment can also be used for assigning aliphatic side-chain resonances in proteins by tuning the constant time delay to a value suited for transferring magnetization between aliphatic $^{13}C$-spins.

The assignment of the side-chain chemical shifts can be further supported with the (5,2)D HCCCH-COSY experiment. In this experiment, for a $^{13}C_i$ and a $^1H_i$ chemical shift, the 8 basic spectra comprise peaks at: $\Omega_0(^{13}C_i)\pm\Omega_1(^{13}C_i)\pm\Omega_2(^{13}C_i)\pm\Omega_3(^1H_i)$, $\Omega_0(^{13}C_i)\pm\Omega_1(^{13}C_i)\pm\Omega_2(^{13}C_i^{coupled})\pm\Omega_3(^1H_i^{coupled})$, and $\Omega_0(^{13}C_i)\pm\Omega_1(^{13}C_i^{coupled})\pm\Omega_2(^{13}C_i^{coupled-2})\pm\Omega_3(^1H_i^{coupled-2})$. $^{13}C$ steady-state magnetization can be used to obtain the 4 first order central peak spectra comprising peaks at: $\Omega_0(^{13}C_i)\pm\Omega_1(^{13}C_i)\pm\Omega_2(^{13}C_i)$, $\Omega_0(^{13}C_i)\pm\Omega_1(^{13}C_i)\pm\Omega_2(^{13}C_i^{coupled})$, and $\Omega_0(^{13}C_i)\pm\Omega_1(^{13}C_i^{coupled})\pm\Omega_2(^{13}C_i^{coupled-2})$. The first order central peak spectra of (4,2)D HCCH-COSY represent the second order central peak spectra for the (5,2)D HCCCH-COSY experiment, comprising peaks at: $\Omega_0(^{13}C_i)\pm\Omega_1(^{13}C_i)$ and $\Omega_0(^{13}C_i)\pm\Omega_1(^{13}C_i^{coupled})$. The third order central peak spectrum is acquired using a 2D [$^{13}C$-$^1H$] HSQC pulse sequence comprising peaks at $\Omega_0(^{13}C_i)$.

The radiofrequency pulse schemes for the experiments described in this example are shown in FIGS. 9–15. Tables 7–9 list the experiments and all the relevant experimental parameters used in implementation for the proteins GR2, ubiquitin and ER75.

TABLE 7

Acquisition Parameters for GFT NMR Experiments Recorded for the 7 kDa Protein GR2.

| | (4,3)D HNNCACBCA | (4,3)D CBCACA(CO)NHN | (5,3)D HBHACBCACA(CO)NHN | (5,3)D HCC,CH-COSY |
|---|---|---|---|---|
| $^1H$ Resonance Frequency | 600 MHz | 600 MHz | 600 MHz | 600 MHz |
| No. of Points[a] ($t_1, t_2, t_3$) | | | | |
| Collected: | 64, 24 512 | 64, 24 512 | 64, 24 512 | 100, 22, 512 |
| After LP: | 64, 24, 512 | 64, 24, 512 | 64, 24, 512 | 100, 22, 512 |
| After Zero Filling | 256, 64, 1024 | 256, 64, 1024 | 256, 64, 1024 | 256, 64, 1024 |
| Window Functions[b] | sine 90/90/70 | sine 90/90/70 | sine 90/90/70 | sine 90/90/70 |
| No. of Transients[c] | 2 | 2 | 2 | 2 |
| Spectral Width[d] ($\omega_1, \omega_2, \omega_3$; Hz) | 12000, 1600, 6000 | 12000, 1600, 6000 | 25000, 1600, 6000 | 25000, 4500, 6000 |
| $t_{max}^e$ (ms) | 5.3, 15.0, 85.2 | 5.3, 15.0, 85.2 | 2.7, 15.0, 85.2 | 5.0, 4.0, 85.2 |
| Carrier Position[f] ($\omega_1, \omega_2, \omega_3$; ppm) | 43.0, 120.4, 4.78 | 43.0, 120.4, 4.78 | -1.0($^1H$)/43.0($^{13}C$)/56.3 ($^{13}C$), 120.4, 4.78 | 0.0($^1H$)/43.0($^{13}C$), 43.0, 4.78 |
| Recycle Delay[g] (s) | 0.7 | 0.7 | 1.0 | 0.7 |
| Collection Time (hrs)[h] | 6.5 | 6.5 | 32 | 22 |

[a]"No. of Points" represents the number of complex data points used to sample indirect dimensions. Before Fourier transformation, the time domain points are extended by linear prediction (LP).
[b]The "Window Function" is a mathematical function multiplied with the FID along each indirect dimension before zero-filling and Fourier transformation.
[c]"No. of Transients" represents the number of FIDs acquired for each real increment.
[d]"Spectral Width" is the frequency range covered in each dimension.
[e]"$t_{max}$" is the maximum chemical shift evolution time.
[f]"Carrier Position" refers to the frequency (in ppm) of the center point of the spectrum along each dimension.
[g]"Recycle Delay" denotes the relaxation delay between acquisitions of FIDs.
[h]"Collection Time" is the total measurement time.

TABLE 8

Acquisition Parameters for GFT NMR Experiments Recorded for the 17 kDa Protein ER75.

|  | (4, 3) D HNNCACBCA | (4, 3) D HNN(CO)CACBCA | (5,3) D HCC,CH-COSY |
|---|---|---|---|
| Spectrometer | 750 MHz | 750 MHz | 750 MHz |
| No. of Points[a] ($t_1, t_2, t_3$) |  |  |  |
| Collected: | 64, 32, 512 | 64, 32, 512 | 100, 24, 512 |
| After LP: | 64, 32, 512 | 64, 32, 512 | 100, 24, 512 |
| After Zero Filling | 256, 64, 1024 | 256, 64, 1024 | 256, 64, 1024 |
| Window Functions[b] | sine 90/90/70 | sine 90/90/70 | sine 90/90/70 |
| No. of Transients[c] | 8 | 8 | 4 |
| Spectral Width[d] ($\omega_1, \omega_2, \omega_3$; Hz) | 14000, 2200, 9000 | 14000, 2200, 9000 | 30000, 5400, 9000 |
| $t_{max}$ (ms)[e] | 4.6, 14.1, 56.8 | 4.6, 14.1, 56.8 | 3.3, 4.4, 56.8 |
| Carrier Position[f] ($\omega_1, \omega_2, \omega_3$; ppm) | 42.5, 117.2, 4.78 | 42.5, 117.2, 4.78 | 0.0 ($^1$H)/ 42.5 ($^{13}$C), 42.5, 4.78 4.78 |
| Recycly Delay[g] (s) | 1.0 | 1.0 | 1.0 |
| Collection Time (hrs)[h] | 42 | 42 | 96 |

[a]"No. of Points" represents the number of complex data points used to sample indirect dimemsions. Before Fourier transformation, the time domain points are extended by linear prediction (LP).
[b]The "Window Function" is a mathematical function multiplied with the FID along each indirect dimension before zero-filling and Fourier transformation.
[c]"No. of Transients" represents the number of FIDs acquired for each real increment.
[d]"Spectral Width" is the frequency range covered in each dimension.
[e]"$t_{max}$" is the maximum chemical shift evolution time.
[f]"Carrier Position" refers to the frequency (in ppm) of the center point of the spectrum along each dimension.
[g]"Recycle Delay" denotes the relaxation delay between acquisitions of FIDs.
[h]"Collection Time" is the total measurement time.

TABLE 9

Acquisition Parameters for GFT NMR Experiments Recorded for the 8.6 kDa Protein Ubiquitin

|  | (4, 2) D HCCH-COSY | (5, 3) D HBCBCGCDHD |
|---|---|---|
| Spectrometer | 600 MHz | 600 MHz |
| No. of Points[a] ($t_1, t_2, t_3$) |  |  |
| Collected: | 64, 1024 | 30, 10, 512 |
| After LP: | 64, 1024 | 30, 10, 512 |
| After Zero Filling | 256, 1024 | 256, 32, 1024 |
| Window Functions[b] | sine 90/70 | sine 90/90/70 |
| No. of Transients[c] | 4 | 4 |
| Spectral Width[d] ($\omega_1, \omega_2, \omega_3$; HZ) | 14000, 6794 | 8000, 2500, 6794 |
| $t_{max}$ (ms)[e] | 4.5, 150.5 | 3.75, 4.0, 150.5 |
| Carrier Position[f] ($\omega_1, \omega_2, \omega_3$; ppm) | 4.78 ($^1$H)/125 ($^{13}$C), 4.78 | 4.78 ($^1$H)/38.0 ($^{13}$C)/125.0($^{13}$C), 135.0, 4.78 |
| Recycle Delay (s)[g] | 1.0 | 1.0 |
| Collection Time (hrs)[h] | 2.5 | 12 |

[a]"No. of Points" represents the number of complex data points used to sample indirect dimensions. Before Fourier transformation, the time domain points are extended by linear prediction (LP).
[b]The "Window Function" is a mathematical function multiplied with the FID along each indirect dimension before zero-filling and Fourier transformation.
[c]"No. of Transients" represents the number of FIDs acquired for each real increment.
[d]"Spectral Width" is the frequency range covered in each dimension.
[e]"$t_{max}$" is the maximum chemical shift evolution time.
[f]"Carrier Position" refers to the frequency (in ppm) of the center point of the spectrum along each dimension.
[g]"Recycle Delay" denotes the relaxation delay between acquisitions of FIDs.
[h]"Collection Time" is the total measurement time.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed is:

1. A method of conducting a (N,N−K) dimensional (D) G-matrix Fourier transformation (GFT) nuclear magnetic resonance (NMR) experiment, wherein N is the dimensionality of an N-dimensional (ND) Fourier transformation (FT) NMR experiment and K is the desired reduction in dimensionality relative to N, said method comprising:

providing a sample;

applying radiofrequency pulses for the ND FT NMR experiment to the sample;

selecting m indirect chemical shift evolution periods of the ND FT NMR experiment, wherein m equals K+1;

jointly sampling the m indirect chemical shift evolution periods;

independently cosine and sine modulating NMR signals detected in a direct dimension to generate (N−K)D basic NMR spectra comprising frequency domain signals with $2^K$ chemical shift multiplet components, thereby enabling phase-sensitive sampling of all jointly sampled m indirect chemical shift evolution periods; and transforming the (N−K) D basic NMR spectra into (N−K) D phase-sensitively edited basic NMR spectra, wherein the $2^K$ chemical shift multiplet components of the (N−K) D basic NMR spectra are edited to yield (N−K) D phase-sensitively edited basic NMR spectra having individual chemical shift multiplet components.

2. The method according to claim 1, wherein said transforming is carried out by applying a G-matrix defined as $$\hat{G}(K) = \left[\begin{bmatrix} 1 & i \\ 1 & -i \end{bmatrix} \otimes \ldots \otimes \begin{bmatrix} 1 & i \\ 1 & -i \end{bmatrix} \otimes [1 \ i]\right],$$

wherein $i=\sqrt{-1}$, under conditions effective to edit the chemical shift multiplet components in a time domain.

3. The method according to claim 1, wherein said transforming is carried out by applying a F-matrix defined as $\hat{F}(K)=\hat{F}(K-1)\otimes\hat{F}(1)$, wherein $$\hat{F}(1) = \begin{bmatrix} 1 & 1 \\ 1 & -1 \end{bmatrix},$$

under conditions effective to edit the chemical shift multiplet components in a frequency domain.

4. The method according to claim 1 further comprising:
selecting m' indirect chemical shift evolution periods of the (N–K)D FT NMR experiment, wherein m' equals K'+1;
jointly sampling the m' indirect chemical shift evolution periods;
independently cosine and sine modulating NMR signals detected in a direct dimension to generate (N–K–K')D basic NMR spectra comprising frequency domain signals with $2^{K'}$ chemical shift multiplet components, thereby enabling phase-sensitive sampling of all jointly sampled m' indirect chemical shift evolution periods; and
transforming the (N–K–K') D basic NMR spectra into (N–K–K') D phase-sensitively edited basic NMR spectra, wherein the $2^{K'}$ chemical shift multiplet components of the (N–K–K') D basic NMR spectra are edited to yield (N–K–K') D phase-sensitively edited basic NMR spectra having individual chemical shift multiplet components.

5. The method according to claim 4 further comprising:
repeating one or more times said selecting, said jointly sampling, said independently cosine and sine modulating, and said transforming, wherein m' is modified for each repetition.

6. The method according to claim 1 further comprising:
repeating one or more times said selecting, said jointly sampling, said independently cosine and sine modulating, and said transforming, wherein, for each repetition, said selecting comprises selecting m-j indirect chemical shift evolution periods out of the m indirect chemical shift evolution periods, wherein j ranges from 1 to K, under conditions effective to generate $2^{K-j}$ jth order central peak NMR spectra.

7. The method according to claim 1, wherein said applying radiofrequency pulses is carried out by applying radiofrequency pulses of N-dimensional nuclear Overhauser enhancement spectroscopy (NOESY).

8. The method according to claim 1, wherein said applying radiofrequency pulses is carried out by applying radiofrequency pulses of N-dimensional transverse relaxation optimized spectroscopy (TROSY).

9. The method according to claim 1, wherein said applying radiofrequency pulses is carried out so that spin-spin couplings are measured.

10. The method according to claim 9, wherein said spin-spin couplings are residual dipolar spin-spin coupling constants.

11. The method according to claim 1, wherein said jointly sampling the m indirect chemical shift evolution periods is achieved with a single continuous acquisition.

12. The method according to claim 1, wherein said applying radiofrequency pulses is carried out so that nuclear spin relaxation times are measured by sampling nuclear spin relaxation delays.

13. The method according to claim 12 further comprising:
jointly sampling said spin relaxation delays with chemical shift evolution periods.

14. The method according to claim 1, wherein N equals 5 and K equals 3 to conduct a (5,2)D [HACACONHN] GFT NMR experiment, wherein (a) said sample is a protein molecule having two consecutive amino acid residues, i–1 and i, and the chemical shift values for the following nuclei are measured: (1) an α-proton of amino acid residue i–1, $^1H^\alpha_{i-1}$; (2) an α-carbon of amino acid residue i–1, $^{13}C^\alpha_{i-1}$; (3) a polypeptide backbone carbonyl carbon of amino acid residue i–1, $^{13}C'_{i-1}$; (4) a polypeptide backbone amide nitrogen of amino acid residue i, $^{15}N_i$; and (5) a polypeptide backbone amide proton of amino acid residue i, $^1H^N_i$, (b) said selecting comprises selecting 4 chemical shift evolution periods of the 5D FT NMR experiment, $^1H^\alpha_{i-1}$, $^{13}C^\alpha_{i-1}$, $^{13}C'_{i-1}$, and $^{15}N_i$, and (c) said jointly sampling comprises jointly sampling the 4 chemical shift evolution periods in an indirect time domain dimension, $t_1(^1H^\alpha_{i-1}, ^{13}C^\alpha_{i-1}, ^{13}C'_{i-1}, ^{15}N_i)$.

15. The method according to claim 14, wherein said applying radiofrequency pulses comprises applying radiofrequency pulses for a 5D FT NMR experiment according to the scheme shown in FIG. 6.

16. The method according to claim 1, wherein N equals 5 and K equals 3 to conduct a (5,2)D [HACA,CONHN] GFT NMR experiment, wherein (a) said sample is a protein molecule having an amino acid residue, i, and the chemical shift values for the following nuclei are measured: (1) an α-proton of amino acid residue i–1, $^1H^\alpha_{i-1}$; (2) an α-carbon of amino acid residue i–1, $^{13}C^\alpha_{i-1}$; (3) a polypeptide backbone carbonyl carbon of amino acid residue i–1, $^{13}C'_{i-1}$; (4) a polypeptide backbone amide nitrogen of amino acid residue i–1, $^{15}N_{i-1}$; and (5) a polypeptide backbone amide proton of amino acid residue i–1, $^1H^N_{i-1}$, (b) said selecting comprises selecting 4 chemical shift evolution periods of the 5D FT NMR experiment, $^1H^\alpha_{i-1}$, $^{13}C^\alpha_{i-1}$, $^{13}C'_{i-1}$, and $^{15}N_{i-1}$, and (c) said jointly sampling comprises jointly sampling the 4 chemical shift evolution periods in an indirect time domain dimension, $t_1(^1H^\alpha_{i-1}, ^{13}C^\alpha_{i-1}, ^{13}C'_{i-1}, ^{15}N_{i-1})$.

17. The method according to claim 16, wherein said applying radiofrequency pulses comprises applying radiofrequency pulses for a 5D FT NMR experiment according to the scheme shown in FIG. 7A.

18. The method according to claim 1, wherein N equals 5 and K equals 2 to conduct a (5,3)D [HACACONHN] GFT NMR experiment, wherein (a) said sample is a protein molecule having two consecutive amino acid residues, i–1 and i, and the chemical shift values for the following nuclei are measured: (1) an α-proton of amino acid residue i–1, $^1H^\alpha_{i-1}$; (2) an α-carbon of amino acid residue i–1, $^{13}C^\alpha_{i-1}$; (3) a polypeptide backbone carbonyl carbon of amino acid residue i–1, $^{13}C'_{i-1}$; (4) a polypeptide backbone amide nitrogen of amino acid residue i, $^{15}N_i$; and (5) a polypeptide backbone amide proton of amino acid residue i, $^1H^N_i$, (b) said selecting comprises selecting 3 chemical shift evolution periods of the 5D FT NMR experiment, $^1H^\alpha_{i-1}$, $^{13}C^\alpha_{i-1}$, and $^{13}C'_{i-1}$, and (c) said jointly sampling comprises jointly sampling the 3 chemical shift evolution periods in an indirect time domain dimension, $t_1(^1H^\alpha_{i-1}, ^{13}C^\alpha_{i-1}, ^{13}C'_{i-1})$.

19. The method according to claim 1, wherein N equals 5 and K equals 2 to conduct a (5,3)D [HACA,CONHN] GFT NMR experiment, wherein (a) said sample is a protein molecule having an amino acid residue, i–1, and the chemical shift values for the following nuclei are measured: (1) an α-proton of amino acid residue i–1, $^1H^\alpha_{i-1}$; (2) an α-carbon of amino acid residue i–1, $^{13}C^\alpha_{i-1}$; (3) a polypeptide backbone carbonyl carbon of amino acid residue i–1, $^{13}C'_{i-1}$; (4) a polypeptide backbone amide nitrogen of amino acid residue i−1, $^{15}N_{i-1}$; and (5) a polypeptide backbone amide proton of amino acid residue i−1, $^{1}H^{N}_{i-1}$, (b) said selecting comprises selecting 3 chemical shift evolution periods of the 5D FT NMR experiment, $^{1}H^{\alpha}_{i-1}$, $^{13}C^{\alpha}_{i-1}$, and $^{13}C'_{i-1}$, and (c) said jointly sampling comprises jointly sampling the 3 chemical shift evolution periods in an indirect time domain dimension, $t_1(^{1}H^{\alpha}_{i-1}, ^{13}C^{\alpha}_{i-1}, ^{13}C'_{i-1})$.

20. The method according to claim 1, wherein N equals 4 and K equals 1 to conduct a (4,3)D [CBCACONHN] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$; (3) a polypeptide backbone amide nitrogen of amino acid residue i, $^{15}N_i$; and (4) a polypeptide backbone amide proton of amino acid residue i, $^{1}H^{N}_i$, (b) said selecting comprises selecting 2 chemical shift evolution periods of the 4D FT NMR experiment, $^{13}C^{\alpha/\beta}_{i-1}$ and $^{13}C'_{i-1}$, and (c) said jointly sampling comprises jointly sampling the 2 chemical shift evolution periods in an indirect time domain dimension, $t_1(^{13}C^{\alpha/\beta}_{i-1}, ^{13}C'_{i-1})$.

21. The method according to claim 20, wherein said applying radiofrequency pulses comprises applying radiofrequency pulses for a 4D FT NMR experiment according to the scheme shown in FIG. 8.

22. The method according to claim 1, wherein N equals 4 and K equals 1 to conduct a (4,3)D [CBCA,CONHN] GFT NMR experiment, wherein (a) said sample is a protein molecule having an amino acid residue, i−1, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$; (3) a polypeptide backbone amide nitrogen of amino acid residue i−1, $^{15}N_{i-1}$; and (4) a polypeptide backbone amide proton of amino acid residue i−1, $^{1}H^{N}_{i-1}$, (b) said selecting comprises selecting 2 chemical shift evolution periods of the 4D FT NMR experiment, $^{13}C^{\alpha/\beta}_{i-1}$ and $^{13}C'_{i-1}$, and (c) said jointly sampling comprises jointly sampling the 2 chemical shift evolution periods in an indirect time domain dimension, $t_1(^{13}C^{\alpha/\beta}_{i-1}, ^{13}C'_{i-1})$.

23. The method according to claim 22, wherein said applying radiofrequency pulses comprises applying radiofrequency pulses for a 4D FT NMR experiment according to the scheme shown in FIG. 7B.

24. The method according to claim 1, wherein N equals 4 and K equals 1 to conduct a (4,3)D [HNNCACBCA] GFT NMR experiment, wherein (a) said sample is a protein molecule having two consecutive amino acid residues, i−1 and i, and the chemical shift values for the following nuclei are measured: (1) α- and β-carbons of amino acid residues i and i−1, $^{13}C^{\alpha/\beta}_{i/i-1}$; (2) a polypeptide backbone amide nitrogen of amino acid residue i, $^{15}N_i$; and (3) a polypeptide backbone amide proton of amino acid residue i, $^{1}H^{N}_i$, (b) said selecting comprises selecting 2 chemical shift evolution periods of the 4D FT NMR experiment, $^{13}C^{\alpha/\beta}_{i/i-1}$ and $^{13}C^{\alpha}_{i/i-1}$, and (c) said jointly sampling comprises jointly sampling the 2 chemical shift evolution periods in an indirect time domain dimension, $t_1(^{13}C^{\alpha/\beta}_{i/i-1}, ^{13}C^{\alpha}_{i/i-1})$.

25. The method according to claim 24, wherein said applying radiofrequency pulses comprises applying radiofrequency pulses for a 4D FT NMR experiment according to the scheme shown in FIG. 9.

26. The method according to claim 1, wherein N equals 4 and K equals 2 to conduct a (4,2)D [HNNCACBCA] GFT NMR experiment, wherein (a) said sample is a protein molecule having two consecutive amino acid residues, i−1 and i, and the chemical shift values for the following nuclei are measured: (1) α- and β-carbons of amino acid residues i and i−1, $^{13}C^{\alpha/\beta}_{i/i-1}$; (2) a polypeptide backbone amide nitrogen of amino acid residue i, $^{15}N_i$; and (3) a polypeptide backbone amide proton of amino acid residue i, $^{1}H^{N}_i$, (b) said selecting comprises selecting 3 chemical shift evolution periods of the 4D FT NMR experiment, $^{13}C^{\alpha/\beta}_{i/i-1}$, $^{13}C^{\alpha}_{i/i-1}$, and $^{15}N_i$, and (c) said jointly sampling comprises jointly sampling the 3 chemical shift evolution periods in an indirect time domain dimension, $t_1(^{13}C^{\alpha/\beta}_{i/i-1}, ^{13}C^{\alpha}_{i/i-1}, ^{15}N_i)$.

27. The method according to claim 1, wherein N equals 4 and K equals 1 to conduct a (4,3)D [HNN(CO)CACBCA] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone amide nitrogen of amino acid residue i, $^{15}N_i$; and (3) a polypeptide backbone amide proton of amino acid residue i, $^{1}H^{N}_i$, (b) said selecting comprises selecting 2 chemical shift evolution periods of the 4D FT NMR experiment, $^{13}C^{\alpha/\beta}_{i-1}$ and $^{13}C^{\alpha}_{i-1}$, and (c) said jointly sampling comprises jointly sampling the 2 chemical shift evolution periods in an indirect time domain dimension, $t_1(^{13}C^{\alpha/\beta}_{i-1}, ^{13}C^{\alpha}_{i-1})$.

28. The method according to claim 27, wherein said applying radiofrequency pulses comprises applying radiofrequency pulses for a 4D FT NMR experiment according to the scheme shown in FIG. 10.

29. The method according to claim 1, wherein N equals 4 and K equals 2 to conduct a (4,2)D [HNN(CO)CACBCA] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone amide nitrogen of amino acid residue i, $^{15}N_i$; and (3) a polypeptide backbone amide proton of amino acid residue i, $^{1}H^{N}_i$, (b) said selecting comprises selecting 3 chemical shift evolution periods of the 4D FT NMR experiment, $^{13}C^{\alpha/\beta}_{i-1}$, $^{13}C^{\alpha}_{i-1}$, and $^{15}N_i$; and (c) said jointly sampling comprises jointly sampling the 3 chemical shift evolution periods in an indirect time domain dimension, $t_1(^{13}C^{\alpha/\beta}_{i-1}, ^{13}C^{\alpha}_{i-1}, ^{15}N_i)$.

30. The method according to claim 1, wherein N equals 5 and K equals 2 to conduct a (5,3)D [HNNCOCACBCA] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$, (3) a polypeptide backbone amide nitrogen of amino acid residue i, $^{15}N_i$; and (4) a polypeptide backbone amide proton of amino acid residue i, $^{1}H^{N}_i$, (b) said selecting comprises selecting 3 chemical shift evolution periods of the 5D FT NMR experiment, $^{13}C^{\alpha/\beta}_{i-1}$, $^{13}C^{\alpha}_{i-1}$, and $^{13}C'_{i-1}$, (c) said jointly sampling comprises jointly sampling the 3 chemical shift evolution periods in an indirect time domain dimension, $t_1(^{13}C^{\alpha/\beta}_{i-1}, ^{13}C^{\alpha}_{i-1}, ^{13}C'_{i-1})$.

31. The method according to claim 1, wherein N equals 5 and K equals 3 to conduct a (5,2)D [HNNCOCACBCA] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$, (3) a polypeptide backbone amide nitrogen of amino acid residue i, $^{15}N_i$; and (4) a polypeptide backbone amide proton of amino acid residue i, $^1H^N_i$, (b) said selecting comprises selecting 4 chemical shift evolution periods of the 5D FT NMR experiment, $^{13}C^{\alpha/\beta}_{i-1}$, $^{13}C^\alpha_{i-1}$, $^{13}C'_{i-1}$, and $^{15}N_i$; and (c) said jointly sampling comprises jointly sampling the 4 chemical shift evolution periods in an indirect time domain dimension, $t_1(^{13}C^{\alpha/\beta}_{i-1}, ^{13}C^\alpha_{i-1}, ^{13}C'_{i-1}, ^{15}N_i)$.

32. The method according to claim 1, wherein N equals 4 and K equals 1 to conduct a (4,3)D [CBCACA(CO)NHN] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone amide nitrogen of amino acid residue i, $^{15}N_i$; and (3) a polypeptide backbone amide proton of amino acid residue i, $^1H^N_i$, (b) said selecting comprises selecting 2 chemical shift evolution periods of the 4D FT NMR experiment, $^{13}C^{\alpha/\beta}_{i-1}$ and $^{13}C^\alpha_{i-1}$, and (c) said jointly sampling comprises jointly sampling the 2 chemical shift evolution periods in an indirect time domain dimension, $t_1(^{13}C^{\alpha/\beta}_{i-1}, ^{13}C^\alpha_{i-1})$.

33. The method according to claim 32, wherein said applying radiofrequency pulses comprises applying radiofrequency pulses for a 4D FT NMR experiment according to the scheme shown in FIG. 11.

34. The method according to claim 1, wherein N equals 4 and K equals 2 to conduct a (4,2)D [CBCACA(CO)NHN] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone amide nitrogen of amino acid residue i, $^{15}N_i$; and (3) a polypeptide backbone amide proton of amino acid residue i, $^1H^N_i$, (b) said selecting comprises selecting 3 chemical shift evolution periods of the 4D FT NMR experiment, $^{13}C^{\alpha/\beta}_{i-1}$, $^{13}C^\alpha_{i-1}$, and $^{15}N_i$, and (c) said jointly sampling comprises jointly sampling the 3 chemical shift evolution periods in an indirect time domain dimension, $t_1(^{13}C^{\alpha/\beta}_{i-1}, ^{13}C^\alpha_{i-1}, ^{15}N_i)$.

35. The method according to claim 1, wherein N equals 5 and K equals 2 to conduct a (5,3)D [CBCACACONHN] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$, (3) a polypeptide backbone amide nitrogen of amino acid residue i, $^{15}N_i$; and (4) a polypeptide backbone amide proton of amino acid residue i, $^1H^N_i$, (b) said selecting comprises selecting 3 chemical shift evolution periods of the 5D FT NMR experiment, $^{13}C^{\alpha/\beta}_{i-1}$, $^{13}C^\alpha_{i-1}$, and $^{13}C'_{i-1}$, (c) said jointly sampling comprises jointly sampling the 3 chemical shift evolution periods in an indirect time domain dimension, $t_1(^{13}C^{\alpha/\beta}_{i-1}, ^{13}C^\alpha_{i-1}, ^{13}C'_{i-1})$.

36. The method according to claim 1, wherein N equals 5 and K equals 3 to conduct a (5,2)D [CBCACACONHN] GFT NMR experiment, wherein (a) said sample is a protein molecule having two consecutive amino acid residues, i−1 and i, and the chemical shift values for the following nuclei are measured: (1) α- and β-carbons of amino acid residue i−1, $^{13}C^{\alpha/\beta}_{i-1}$; (2) a polypeptide backbone carbonyl carbon of amino acid residue i−1, $^{13}C'_{i-1}$, (3) a polypeptide backbone amide nitrogen of amino acid residue i, $^{15}N_i$; and (4) a polypeptide backbone amide proton of amino acid residue i, $^1H^N_i$, (b) said selecting comprises selecting 4 chemical shift evolution periods of the 5D FT NMR experiment, $^{13}C^{\alpha/\beta}_{i-1}$, $^{13}C^\alpha_{i-1}$, $^{13}C'_{i-1}$, and $^{15}N_i$; (c) said jointly sampling comprises jointly sampling the 4 chemical shift evolution periods in an indirect time domain dimension, $t_1(^{13}C^{\alpha/\beta}_{i-1}, ^{13}C^\alpha_{i-1}, ^{13}C'_{i-1}, ^{15}N_i)$.

37. The method according to claim 1, wherein N equals 5 and K equals 2 to conduct a (5,3)D [HBHACBCACA(CO)NHN] GFT NMR experiment, wherein (a) said sample is a protein molecule having two amino acid residues, i and i−1, and the chemical shift values for the following nuclei are measured: (1) α- and β-protons of amino acid residue i−1, $^1H^{\alpha/\beta}_{i-1}$; (2) α- and β-carbons of amino acid residue i−1, $^{13}C^{\alpha/\beta}_{i-1}$; (3) a polypeptide backbone amide nitrogen of amino acid residue i, $^{15}N_i$; and (4) a polypeptide backbone amide proton of amino acid residue i, $^1H^N_i$, (b) said selecting comprises selecting 3 chemical shift evolution periods of the 5D FT NMR experiment, $^1H^{\alpha/\beta}_{i-1}$, $^{13}C^{\alpha/\beta}_{i-1}$, and $^{13}C^\alpha_{i-1}$, and (c) said jointly sampling comprises jointly sampling the 3 chemical shift evolution periods in an indirect time domain dimension, $t_1(^1H^{\alpha/\beta}_{i-1}, ^{13}C^{\alpha/\beta}_{i-1}, ^{13}C^\alpha_{i-1})$.

38. The method according to claim 37, wherein said applying radiofrequency pulses comprises applying radiofrequency pulses for a 5D FT NMR experiment according to the scheme shown in FIG. 12.

39. The method according to claim 1, wherein N equals 6 and K equals 3 to conduct a (6,3)D [HBHACBCACACONHN] GFT NMR experiment, wherein (a) said sample is a protein molecule having two amino acid residues, i and i−1, and the chemical shift values for the following nuclei are measured: (1) α- and β protons of amino acid residue i−1, $^1H^{\alpha/\beta}_{i-1}$; (2) α- and β-carbons of amino acid residue i−1, $^{13}C^{\alpha/\beta}_{i-1}$; (3) a polypeptide backbone carbonyl carbon of amino acid residue i−1, $^{13}C'_{i-1}$; (4) a polypeptide backbone amide nitrogen of amino acid residue i, $^{15}N_i$; and (5) a polypeptide backbone amide proton of amino acid residue i, $^1H^N_i$, (b) said selecting comprises selecting 4 chemical shift evolution periods of the 6D FT NMR experiment, $^1H^{\alpha/\beta}_{i-1}$, $^{13}C^{\alpha/\beta}_{i-1}$, $^{13}C^\alpha_{i-1}$, and $^{13}C'_{i-1}$, and (c) said jointly sampling comprises jointly sampling the 4 chemical shift evolution periods in an indirect time domain dimension, $t_1(^1H^{\alpha/\beta}_{i-1}, ^{13}C^{\alpha/\beta}_{i-1}, ^{13}C^\alpha_{i-1}, ^{13}C'_{i-1})$.

40. The method according to claim 1, wherein N equals 5 and K equals 3 to conduct a (5,2)D [HBHACBCACA(CO)NHN] GFT NMR experiment, wherein (a) said sample is a protein molecule having two amino acid residues, i and i−1, and the chemical shift values for the following nuclei are measured: (1) α- and β protons of amino acid residue i−1, $^1H^{\alpha/\beta}_{i-1}$; (2) α- and β-carbons of amino acid residue i−1, $^{13}C^{\alpha/\beta}_{i-1}$; (3) a polypeptide backbone amide nitrogen of amino acid residue i, $^{15}N_i$; and (4) a polypeptide backbone amide proton of amino acid residue i, $^1H^N_i$, (b) said selecting comprises selecting 4 chemical shift evolution periods of the 5D FT NMR experiment, $^1H^{\alpha/\beta}_{i-1}$, $^{13}C^{\alpha/\beta}_{i-1}$, $^{13}C^\alpha_{i-1}$, and $^{15}N_i$, and (c) said jointly sampling comprises jointly sampling the 4 chemical shift evolution periods in an indirect time domain dimension, $t_1(^1H^{\alpha/\beta}_{i-1}, ^{13}C^{\alpha/\beta}_{i-1}, ^{13}C^\alpha_{i-1}, ^{15}N_i)$.

41. The method according to claim 1, wherein N equals 6 and K equals 4 to conduct a (6,2)D [HBHACBCACACONHN] GFT NMR experiment, wherein (a) said sample is a protein molecule having two amino acid residues, i and i−1, and the chemical shift values for the following nuclei are measured: (1) α- and β protons of amino acid residue i−1, $^1H^{\alpha/\beta}_{i-1}$; (2) α- and β-carbons of amino acid residue i−1, $^{13}C^{\alpha/\beta}_{i-1}$; (3) a polypeptide backbone carbonyl carbon of amino acid residue i−1, $^{13}C'_{i-1}$; (4) a polypeptide backbone amide nitrogen of amino acid residue i, $^{15}N_i$; and (5) a polypeptide backbone amide proton of amino acid residue i, $^{1}H^{N}_{i}$, (b) said selecting comprises selecting 5 chemical shift evolution periods of the 6D FT NMR experiment, $^{1}H^{\alpha/\beta}_{i-1}$, $^{13}C^{\alpha/\beta}_{i-1}$, $^{13}C^{\alpha}_{i-1}$, $^{13}C'_{i-1}$, and $^{15}N_i$, and (c) said jointly sampling comprises jointly sampling the 5 chemical shift evolution periods in an indirect time domain dimension, $t_1(^{1}H^{\alpha/\beta}_{i-1}, ^{13}C^{\alpha/\beta}_{i-1}, ^{13}C^{\alpha}_{i-1}, ^{13}C'_{i-1}, ^{15}N_i)$.

42. The method according to claim 1, wherein N equals 5 and K equals 2 to conduct a (5,3)D [HCC,CH-COSY] GFT NMR experiment, wherein (a) the chemical shift values for the following nuclei are measured: (1) a proton, $^{1}H$; (2) a carbon coupled to $^{1}H$, $^{13}C$; and (3) a carbon coupled to $^{13}C$, $^{13}C^{coupled}$; and (4) a proton coupled to $^{13}C^{coupled}$, $^{1}H^{coupled}$, (b) said selecting comprises selecting 3 chemical shift evolution periods of the 5D FT NMR experiment, $^{1}H$, $^{13}C$, and $^{13}C^{coupled}$, and (c) said jointly sampling comprises jointly sampling the 3 chemical shift evolution periods in an indirect time domain dimension, $t_1(^{1}H, ^{13}C, ^{13}C^{coupled})$.

43. The method according to claim 42, wherein said chemical shift evolution periods for $^{13}C$ and $^{13}C^{coupled}$ are correlated using total correlation spectroscopy (TOCSY).

44. The method according to claim 42, wherein (a) said sample is a protein molecule having an amino acid residue, i, and the chemical shift values for the following nuclei are measured: (1) a proton of amino acid residue i, $^{1}H_i$; (2) a carbon of amino acid residue i coupled to $^{1}H_i$, $^{13}C_i$; and (3) a carbon coupled to $^{13}C_i$, $^{13}C_i^{coupled}$; and (4) a proton coupled with $^{13}C_i^{coupled}$, $^{1}H_i^{coupled}$, (b) said selecting comprises selecting 3 chemical shift evolution periods of the 5D FT NMR experiment, $^{1}H_i$, $^{13}C_i$, and $^{13}C_i^{coupled}$, and (c) said jointly sampling comprises jointly sampling the 3 chemical shift evolution periods in an indirect time domain dimension, $t_1(^{1}H_i, ^{13}C_i, ^{13}C_i^{coupled})$.

45. The method according to claim 44, wherein said applying radiofrequency pulses comprises applying radiofrequency pulses for a 5D FT NMR experiment according to the scheme shown in FIG. 13.

46. The method according to claim 1, wherein N equals 5 and K equals 2 to conduct a (5,3)D [HBCBCGCDHD] GFT NMR experiment, wherein (a) said sample is a protein molecule having an amino acid residue, i, with an aromatic side chain, and the chemical shift values for the following nuclei are measured: (1) a β-proton of amino acid residue i, $^{1}H^{\beta}_{i}$; (2) a β-carbon of amino acid residue i, $^{13}C^{\beta}_{i}$; (3) a γ-carbon of amino acid residue i, $^{13}C^{\gamma}_{i}$; (4) a δ-carbon of amino acid residue i, $^{13}C^{\delta}_{i}$; and (5) a δ-proton of amino acid residue i, $^{1}H^{\delta}_{i}$, (b) said selecting comprises selecting 3 chemical shift evolution periods of the 5D FT NMR experiment, $^{1}H^{\beta}_{i}$, $^{13}C^{\beta}_{i}$, and $^{13}C^{\delta}_{i}$, and (c) said jointly sampling comprises jointly sampling the 3 chemical shift evolution periods in an indirect time domain dimension, $t_1(^{1}H^{\beta}_{i}, ^{13}C^{\beta i}, ^{13}C^{\delta}_{i})$.

47. The method according to claim 46, wherein said applying radiofrequency pulses comprises applying radiofrequency pulses for a 5D FT NMR experiment according to the scheme shown in FIG. 14.

48. The method according to claim 1, wherein N equals 5 and K equals 3 to conduct a (5,2)D [HBCBCGCDHD] GFT NMR experiment, wherein (a) said sample is a protein molecule having an amino acid residue, i, with an aromatic side chain, and the chemical shift values for the following nuclei are measured: (1) a β-proton of amino acid residue i, $^{1}H^{\beta}_{i}$; (2) a β-carbon of amino acid residue i, $^{13}C^{\beta}_{i}$; (3) a γ-carbon of amino acid residue i; (4) a δ-carbon of amino acid residue i, $^{13}C^{\delta}_{i}$; and (5) a δ-proton of amino acid residue i, $^{1}H^{\delta}_{i}$, (b) said selecting comprises selecting 4 chemical shift evolution periods of the 5D FT NMR experiment, $^{1}H^{\beta}_{i}$, $^{13}C^{\beta}_{i}$, $^{13}C^{\gamma}_{i}$, and $^{13}C^{\delta}_{i}$, and (c) said jointly sampling comprises jointly sampling the 4 chemical shift evolution periods in an indirect time domain dimension, $t_1(^{1}H^{\beta}_{i}, ^{13}C^{\beta}_{i}, ^{13}C^{\gamma}_{i}, ^{13}C^{\delta}_{i})$.

49. The method according to claim 1, wherein N equals 4 and K equals 2 to conduct a (4,2)D [HCCH-COSY] GFT NMR experiment, wherein (a) the chemical shift values for the following nuclei are measured: (1) a proton, $^{1}H$; (2) a carbon coupled to $^{1}H$, $^{13}C$; (3) a carbon coupled to $^{13}C$, $^{13}C^{coupled}$; and (4) a proton coupled to $^{13}C^{coupled}$, $^{1}H^{coupled}$, (b) said selecting comprises selecting 3 chemical shift evolution periods of the 4D FT NMR experiment, $^{1}H$, $^{13}C$, and $^{13}C^{coupled}$, and (c) said jointly sampling comprises jointly sampling the 3 chemical shift evolution periods in an indirect time domain dimension, $t_1(^{1}H, ^{13}C, ^{13}C^{coupled})$.

50. The method according to claim 49, wherein said chemical shift evolution periods for $^{13}C$ and $^{13}C^{coupled}$ are correlated using total correlation spectroscopy (TOCSY).

51. The method according to claim 49, wherein (a) said sample is a protein molecule having an amino acid residue, i, and the chemical shift values for the following nuclei are measured: (1) a proton of amino acid residue i, $^{1}H_i$; (2) a carbon of amino acid residue i coupled to $^{1}H_i$, $^{13}C_i$; (3) a carbon coupled to $^{13}C_i$, $^{13}C_i^{coupled}$; and (4) a proton coupled to $^{13}C_i^{coupled}$, $^{1}H_i^{coupled}$, (b) said selecting comprises selecting 3 chemical shift evolution periods of the 4D FT NMR experiment, $^{1}H_i$, $^{13}C_i$, and $^{13}C_i^{coupled}$, and (c) said jointly sampling comprises jointly sampling the 3 chemical shift evolution periods in an indirect time domain dimension, $t_1(^{1}H_i, ^{13}C_i, ^{13}C_i^{coupled})$.

52. The method according to claim 51, wherein said applying radiofrequency pulses comprises applying radiofrequency pulses for a 4D FT NMR experiment according to the scheme shown in FIG. 15.

53. The method according to claim 1, wherein N equals 5 and K equals 3 to conduct a (5,2)D [HCCCH-COSY] GFT NMR experiment, wherein (a) the chemical shift values for the following nuclei are measured: (1) a proton $^{1}H$; (2) a carbon coupled to $^{1}H$, $^{13}C$; (3) a carbon coupled to $^{13}C$, $^{13}C^{coupled}$; (4) a carbon coupled to $^{13}C^{coupled}$, $^{13}C^{coupled-2}$; and (5) a proton coupled with $^{13}C^{coupled-2}$, $^{1}H^{coupled-2}$, (b) said selecting comprises selecting 4 chemical shift evolution periods of the 5D FT NMR experiment, $^{1}H$, $^{13}C$, $^{13}C^{coupled}$, and $^{13}C^{coupled-2}$, and (c) said jointly sampling comprises jointly sampling the 4 chemical shift evolution periods in an indirect time domain dimension, $t_1(^{1}H, ^{13}C, ^{13}C^{coupled}, ^{13}C^{coupled-2})$.

54. The method according to claim 53, wherein (a) said sample is a protein molecule having an amino acid residue, i, and the chemical shift values for the following nuclei are measured: (1) a proton of amino acid residue i, $^{1}H_i$; (2) a carbon of amino acid residue i coupled to $^{1}H_i$, $^{13}C_i$; (3) a carbon coupled to $^{13}C_i$, $^{13}C_i^{coupled}$; (4) a carbon coupled to $^{13}C_i^{coupled}$, $^{13}C_i^{coupled-2}$; and (5) a proton coupled with $^{13}C_i^{coupled-2}$, $^{1}H_i^{coupled-2}$, (b) said selecting comprises selecting 4 chemical shift evolution periods of the 5D FT NMR experiment, $^{1}H_i$, $^{13}C_i$, $^{13}C_i^{coupled}$, and $^{13}C_i^{coupled-2}$, and (c) said jointly sampling comprises jointly sampling the 4 chemical shift evolution periods in an indirect time domain dimension, $t_1(^{1}H_i, ^{13}C_i, ^{13}C_i^{coupled}, ^{13}C_i^{coupled-2})$.

55. The method according to claim 1, wherein N equals 5 and K equals 3 to conduct a (5,3)D [HCCCH-COSY] GFT NMR experiment, wherein (a) the chemical shift values for the following nuclei are measured: (1) a proton, $^{1}H$; (2) a carbon coupled to $^1H$, $^{13}C$; (3) a carbon coupled to $^{13}C$, $^{13}C^{coupled}$; (4) a carbon coupled to $^{13}C^{coupled}$, $^{13}C^{coupled-2}$; and (5) a proton coupled with $^{13}C^{coupled-2}$, $^1H^{coupled-2}$, (b) said selecting comprises selecting 3 chemical shift evolution periods of the 5D FT NMR experiment, $^1H$, $^{13}C$, and $^{13}C^{coupled}$, and (c) said jointly sampling comprises jointly sampling the 3 chemical shift evolution periods in an indirect time domain dimension, $t_1(^1H, ^{13}C, ^{13}C^{coupled})$.

56. The method according to claim 55, wherein (a) said sample is a protein molecule having an amino acid residue, i, and the chemical shift values for the following nuclei are measured: (1) a proton of amino acid residue i, $^1H_i$; (2) a carbon of amino acid residue i coupled to $^1H_i$, $^{13}C_i$; (3) a carbon coupled to $^{13}C_i$, $^{13}C_i^{coupled}$; (4) a carbon coupled to $^{13}C_i^{coupled}$, $^{13}C_i^{coupled-2}$; and (5) a proton coupled with $^{13}C_i^{coupled-2}$, $^1H_i^{coupled-2}$, (b) said selecting comprises selecting 3 chemical shift evolution periods of the 5D FT NMR experiment, $^1H_i$, $^{13}C_i$, and $^{13}C_i^{coupled}$, (c) said jointly sampling comprises jointly sampling the 3 chemical shift evolution periods in an indirect time domain dimension, $t_1(^1H_i, ^{13}C_i, ^{13}C_i^{coupled})$.

* * * * *